(12) United States Patent
Kawano et al.

(10) Patent No.: US 11,889,712 B2
(45) Date of Patent: Jan. 30, 2024

(54) LIGHT-EMITTING DEVICE INCLUDING ORGANIC COMPOUND AND METAL COMPLEX

(71) Applicant: Semiconductor Energy Laboratory Co., Ltd., Kanagawa-ken (JP)

(72) Inventors: Yuta Kawano, Kanagawa (JP); Airi Ueda, Kanagawa (JP); Takeyoshi Watabe, Kanagawa (JP); Nobuharu Ohsawa, Kanagawa (JP); Keito Tosu, Kanagawa (JP); Harue Osaka, Kanagawa (JP); Satoshi Seo, Kanagawa (JP); Ryo Narukawa, Kanagawa (JP); Shiho Nomura, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 37 days.

(21) Appl. No.: 17/237,262

(22) Filed: Apr. 22, 2021

(65) Prior Publication Data

US 2021/0336176 A1   Oct. 28, 2021

(30) Foreign Application Priority Data

Apr. 28, 2020 (JP) .................................. 2020-078826
Jun. 5, 2020 (JP) .................................. 2020-098260
Dec. 7, 2020 (JP) .................................. 2020-202413

(51) Int. Cl.
  *H10K 50/16* (2023.01)
  *H10K 59/00* (2023.01)
  (Continued)

(52) U.S. Cl.
  CPC ............. *H10K 50/16* (2023.02); *H10K 59/00* (2023.02); *H10K 59/12* (2023.02); *H10K 85/00* (2023.02);
  (Continued)

(58) Field of Classification Search
  CPC ............. H01L 51/5072; H01L 51/5048; H01L 51/5056; H01L 51/5088; H01L 51/5092;
  (Continued)

(56) References Cited

U.S. PATENT DOCUMENTS 8,969,856 B2 * 3/2015 Liu ..................... H01L 51/5268
                                                    257/E51.001
9,887,368 B2    2/2018 Chun et al.
(Continued)

FOREIGN PATENT DOCUMENTS

JP         2014-519189     8/2014
WO    WO 2019/053559 A1    3/2019

OTHER PUBLICATIONS

Lee, J. et al., "Synergetic Electrode Architecture for Efficient Graphene-Based Flexible Organic Light-Emitting Diodes," Nature Communications, Jun. 2, 2016, vol. 7, pp. 11791-1-11791-9.

*Primary Examiner* — Ida M Soward
(74) *Attorney, Agent, or Firm* — Husch Blackwell LLP

(57) ABSTRACT

A light-emitting device with high emission efficiency is provided. The light-emitting device includes an anode, a cathode, and an EL layer positioned between the anode and the cathode. The EL layer includes a light-emitting layer and an electron-transport layer; the light-emitting layer includes a light-emitting material; the electron-transport layer includes an organic compound having an electron-transport property and a metal complex of an alkali metal; the ordinary refractive index of the organic compound having an electron-transport property in a peak wavelength of light emitted from the light-emitting material is greater than or equal to 1.50 and less than or equal to 1.75; and the ordinary refractive index of the metal complex of an alkali metal in the peak wavelength of the light emitted from the light-emitting material is greater than or equal to 1.45 and less than or equal to 1.70.

28 Claims, 51 Drawing Sheets

(51) Int. Cl.
*H10K 59/12* (2023.01)
*H10K 85/60* (2023.01)
*H10K 85/30* (2023.01)
*H10K 85/00* (2023.01)

(52) U.S. Cl.
CPC ........... *H10K 85/30* (2023.02); *H10K 85/615* (2023.02); *H10K 85/631* (2023.02); *H10K 85/654* (2023.02); *H10K 85/6572* (2023.02); *H10K 85/6574* (2023.02)

(58) Field of Classification Search
CPC ............. H01L 51/5096; H01L 51/5016; H01L 2251/5361; H01L 2251/55; H01L 27/3225; H01L 27/3244; H01L 27/3211; H01L 51/3213; C09K 11/06; C09K 2211/181; H10K 50/16; H10K 59/00; H10K 59/12; H10K 2102/00; H10K 85/30; H10K 85/00; H10K 85/615; H10K 85/631; H10K 85/654; H10K 85/6572; C07D 215/30; C07F 1/02; H01B 1/121
See application file for complete search history.

(56) References Cited

U.S. PATENT DOCUMENTS

| | | | |
|---|---|---|---|
| 10,950,805 B2 | 3/2021 | Watabe et al. | |
| 2009/0153972 A1* | 6/2009 | Nakamura | C03C 17/3644 |
| | | | 257/E21.003 |
| 2010/0230667 A1* | 9/2010 | Nakamura | H05B 33/10 |
| | | | 257/40 |
| 2011/0180308 A1* | 7/2011 | Nakamura | H01L 51/5268 |
| | | | 174/255 |
| 2016/0035983 A1 | 2/2016 | Kathirgamanathan | |
| 2016/0351833 A1* | 12/2016 | Hosoumi | H10K 50/11 |
| 2016/0372688 A1* | 12/2016 | Seo | C09K 11/06 |
| 2017/0025615 A1* | 1/2017 | Seo | H10K 50/11 |
| 2017/0025630 A1* | 1/2017 | Seo | H10K 50/15 |
| 2017/0125703 A1* | 5/2017 | Suzuki | C09K 11/02 |
| 2018/0033993 A1* | 2/2018 | Seo | H10K 85/626 |
| 2018/0076394 A1* | 3/2018 | Kawakami | C07D 307/77 |
| 2018/0138416 A1* | 5/2018 | Seo | G06F 3/045 |
| 2020/0216428 A1* | 7/2020 | Takeda | H01L 51/0061 |
| 2020/0343469 A1* | 10/2020 | Ohsawa | H01L 51/5028 |
| 2021/0005814 A1 | 1/2021 | Watabe et al. | |
| 2021/0193943 A1* | 6/2021 | Ohsawa | H01L 51/5012 |
| 2021/0384442 A1* | 12/2021 | Watabe | H05B 33/28 |

* cited by examiner

LIGHT-EMITTING DEVICE INCLUDING ORGANIC COMPOUND AND METAL COMPLEX

BACKGROUND OF THE INVENTION

1. Field of the Invention

One embodiment of the present invention relates to an organic compound, a light-emitting element, a light-emitting device, a display module, a lighting module, a display device, a light-emitting apparatus, an electronic apparatus, a lighting device, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

2. Description of the Related Art

Light-emitting devices (organic EL devices) utilizing electroluminescence (EL) of organic compounds have been put to more practical use. In the basic structure of such light-emitting devices, an organic compound layer containing a light-emitting material (an EL layer) is interposed between a pair of electrodes. Carriers are injected by application of voltage to the device, and recombination energy of the carriers is used, whereby light emission can be obtained from the light-emitting material.

Such light-emitting devices are of self-luminous type and thus have advantages over liquid crystal displays, such as high visibility and no need for backlight when used as pixels of a display, and are particularly suitable for flat panel displays. Displays including such light-emitting devices are also highly advantageous in that they can be thin and lightweight. Moreover, such light-emitting devices also have a feature of extremely fast response speed.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be applied to lighting devices and the like.

Displays or lighting devices including light-emitting devices are suitable for a variety of electronic apparatuses as described above, and research and development of light-emitting devices have progressed for more favorable characteristics.

Low outcoupling efficiency is often a problem in an organic EL device. In particular, the attenuation due to reflection which is caused by a difference in refractive index between adjacent layers is a main cause of a reduction in the efficiency of a light-emitting device. In order to reduce this effect, a structure including a layer formed using a low refractive index material in an EL layer has been proposed (see Non-Patent Document 1, for example).

REFERENCE

Non-Patent Document

[Non-Patent Document 1]
Jaeho Lee et al., "Synergetic electrode architecture for efficient graphene-based flexible organic light-emitting diodes", nature COMMUNICATIONS, Jun. 2, 2016, DOI: 10.1038/ncomms11791.

SUMMARY OF THE INVENTION

An object of one embodiment of the present invention is to provide a light-emitting device with high emission efficiency. Another object of one embodiment of the present invention is to provide any of a light-emitting device, a light-emitting apparatus, an electronic apparatus, a display device, and an electronic device each having low power consumption.

An object of another embodiment of the present invention is to provide a novel organometallic complex (metal complex). An object of another embodiment of the present invention is to provide a metal complex that can be used for a light-emitting device having a low driving voltage. An object of another embodiment of the present invention is to provide a metal complex that can be used for a light-emitting device having a low driving voltage and including an electron-transport layer with a low refractive index.

It is only necessary that at least one of the above-described objects be achieved in the present invention.

One embodiment of the present invention is a light-emitting device including an anode, a cathode, and an EL layer positioned between the anode and the cathode; the EL layer includes a light-emitting layer and an electron-transport layer; the light-emitting layer includes a light-emitting material; the electron-transport layer includes an organic compound having an electron-transport property and a metal complex of an alkali metal; the ordinary refractive index of the organic compound having an electron-transport property in a peak wavelength of light emitted from the light-emitting material is greater than or equal to 1.50 and less than or equal to 1.75; and the ordinary refractive index of the metal complex of an alkali metal in the peak wavelength of the light emitted from the light-emitting material is greater than or equal to 1.45 and less than or equal to 1.70.

Another embodiment of the present invention is a light-emitting device including an anode, a cathode, and an EL layer positioned between the anode and the cathode; the EL layer includes a light-emitting layer and an electron-transport layer; the light-emitting layer includes a light-emitting material; the electron-transport layer includes an organic compound having an electron-transport property and a metal complex of an alkali metal; and the value obtained by dividing by 2 the sum of the ordinary refractive index of the organic compound having an electron-transport property in a peak wavelength of light emitted from the light-emitting material and the ordinary refractive index of the metal complex of an alkali metal in the peak wavelength of the light emitted from the light-emitting material is greater than or equal to 1.50 and less than 1.75.

Another embodiment of the present invention is a light-emitting device including an anode, a cathode, and an EL layer positioned between the anode and the cathode; the EL layer includes a light-emitting layer and an electron-transport layer; the light-emitting layer includes a light-emitting material; the electron-transport layer includes an organic compound having an electron-transport property and a metal complex of an alkali metal; and the ordinary refractive index of the electron-transport layer in a peak wavelength of light emitted from the light-emitting material is greater than or equal to 1.50 and less than 1.75.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having an electron-transport property and a metal complex of an alkali metal; the ordinary refractive index of the organic compound having an electron-transport property with respect to light with any of wavelengths in the range of 455 nm to 465 nm is greater than or equal to 1.50 and less than or equal to 1.75; and the ordinary refractive index of the metal complex of an alkali metal with respect to light with any of wavelengths in the range of 455 nm to 465 nm is greater than or equal to 1.45 and less than or equal to 1.70.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having an electron-transport property and a metal complex of an alkali metal; and the value obtained by dividing by 2 the sum of the ordinary refractive index of the organic compound having an electron-transport property with respect to light with any of wavelengths in the range of 455 nm to 465 nm and the ordinary refractive index of the metal complex of an alkali metal with respect to light with any of wavelengths in the range of 455 nm to 465 nm is greater than or equal to 1.50 and less than 1.75.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having an electron-transport property and a metal complex of an alkali metal; and the ordinary refractive index of the electron-transport layer with respect to light with any of wavelengths in the range of 455 nm to 465 nm is greater than or equal to 1.50 and less than 1.75.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having an electron-transport property and a metal complex of an alkali metal; the ordinary refractive index of the organic compound having an electron-transport property with respect to light with a wavelength of 633 nm is greater than or equal to 1.45 and less than or equal to 1.70; and the ordinary refractive index of the metal complex of an alkali metal with respect to light with a wavelength of 633 nm is greater than or equal to 1.40 and less than or equal to 1.65.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having an electron-transport property and a metal complex of an alkali metal; and the value obtained by dividing by 2 the sum of the ordinary refractive index of the organic compound having an electron-transport property with respect to light with a wavelength of 633 nm and the ordinary refractive index of the metal complex of an alkali metal with respect to light with a wavelength of 633 nm is greater than or equal to 1.45 and less than 1.70.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having an electron-transport property and a metal complex of an alkali metal; and the ordinary refractive index of the electron-transport layer with respect to light with a wavelength of 633 nm is greater than or equal to 1.45 and less than 1.70.

Another embodiment of the present invention is a light-emitting device with any of the above structures, in which each of the organic compound having an electron-transport property and the metal complex of an alkali metal has an alkyl group or a cycloalkyl group.

Another embodiment of the present invention is a light-emitting device with any of the above structures, in which the alkyl group of the organic compound having an electron-transport property is any one of a branched alkyl group and an alkyl group having 3 or 4 carbon atoms, and the alkyl group of the metal complex of an alkali metal is an alkyl group having 1 to 3 carbon atoms.

Another embodiment of the present invention is a light-emitting device with any of the above structures, in which the alkyl group of the organic compound having an electron-transport property is a t-butyl group and the alkyl group of the metal complex of an alkali metal is a methyl group.

Another embodiment of the present invention is a light-emitting device with any of the above structures, in which a proportion of carbon atoms forming a bond by $sp^3$ hybrid orbitals in the total number of carbon atoms in the organic compound having the electron-transport property is higher than or equal to 10% and lower than or equal to 60%.

Another embodiment of the present invention is a light-emitting device with any of the above structures, in which the integral value of signals at lower than 4 ppm exceeds the integral value of signals at 4 ppm or higher in the results of $^1$H-NMR measurement conducted on the organic compound having an electron-transport property.

Another embodiment of the present invention is a light-emitting device with any of the above structures, in which the organic compound having an electron-transport property has a triazine skeleton or a diazine skeleton.

Another embodiment of the present invention is a light-emitting device in which an organic compound having an electron-transport property has a benzene ring.

Another embodiment of the present invention is a light-emitting device including an anode, a cathode, and an EL layer positioned between the anode and the cathode; the EL layer includes a light-emitting layer and an electron-transport layer; the light-emitting layer includes a light-emitting material; the electron-transport layer includes an organic compound having a π-electron deficient heteroaromatic ring skeleton and a metal complex of an alkali metal; and the value obtained by dividing by 2 the sum of the ordinary refractive index of the organic compound having a π-electron deficient heteroaromatic ring skeleton in a peak wavelength of light emitted from the light-emitting material and the ordinary refractive index of the metal complex of an alkali metal in the peak wavelength of the light emitted from the light-emitting material is greater than or equal to 1.50 and less than 1.75.

Another embodiment of the present invention is a light-emitting device including an anode, a cathode, and an EL layer positioned between the anode and the cathode; the EL layer includes a light-emitting layer and an electron-transport layer; the light-emitting layer includes a light-emitting material; the electron-transport layer includes an organic compound having a π-electron deficient heteroaromatic ring skeleton and a metal complex of an alkali metal; and the ordinary refractive index of the electron-transport layer in a peak wavelength of light emitted from the light-emitting material is greater than or equal to 1.50 and less than 1.75.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having a π-electron deficient heteroaromatic ring skeleton and a metal complex of an alkali metal; the ordinary refractive index of the organic compound having a π-electron deficient heteroaromatic ring skeleton with respect to light with any of wavelengths in the range of 455 nm to 465 nm is greater than or equal to 1.50 and less than or equal to 1.75; and the ordinary refractive index of the metal complex of an alkali metal with respect to light with any of wavelengths in the range of 455 nm to 465 nm is greater than or equal to 1.45 and less than or equal to 1.70.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having a π-electron deficient heteroaromatic ring skeleton and a metal complex of an alkali metal; and the value obtained by dividing by 2 the sum of the ordinary refractive index of the organic compound having a π-electron deficient heteroaromatic ring skeleton with respect to light with any of wavelengths in the range of 455 nm to 465 nm and the ordinary refractive index of the metal complex of an alkali metal with respect to light with any of wavelengths in the range of 455 nm to 465 nm is greater than or equal to 1.50 and less than 1.75.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having a π-electron deficient heteroaromatic ring skeleton and a metal complex of an alkali metal; and the ordinary refractive index of the electron-transport layer with respect to light with any of wavelengths in the range of 455 nm to 465 nm is greater than or equal to 1.50 and less than 1.75.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having a π-electron deficient heteroaromatic ring skeleton and a metal complex of an alkali metal; the ordinary refractive index of the organic compound having a π-electron deficient heteroaromatic ring skeleton with respect to light with a wavelength of 633 nm is greater than or equal to 1.45 and less than or equal to 1.70; and the ordinary refractive index of the metal complex of an alkali metal with respect to light with a wavelength of 633 nm is greater than or equal to 1.40 and less than or equal to 1.65.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having a π-electron deficient heteroaromatic ring skeleton and a metal complex of an alkali metal; and the value obtained by dividing by 2 the sum of the ordinary refractive index of the organic compound having a π-electron deficient heteroaromatic ring skeleton with respect to light with a wavelength of 633 nm and the ordinary refractive index of the metal complex of an alkali metal with respect to light with a wavelength of 633 nm is greater than or equal to 1.45 and less than 1.70.

Another embodiment of the present invention is a light-emitting device including an anode, a cathode, and an EL layer positioned between the anode and the cathode; the EL layer includes a light-emitting layer and an electron-transport layer; the electron-transport layer includes an organic compound having a π-electron deficient heteroaromatic ring skeleton and a metal complex of an alkali metal; and the ordinary refractive index of the electron-transport layer with respect to light with a wavelength of 633 nm is greater than or equal to 1.45 and less than 1.70.

Another embodiment of the present invention is a light-emitting device with any of the above structures, in which each of the organic compound having a π-electron deficient heteroaromatic ring skeleton and the metal complex of an alkali metal has an alkyl group or a cycloalkyl group.

Another embodiment of the present invention is a light-emitting device with any of the above structures, in which the alkyl group of the organic compound having a π-electron deficient heteroaromatic ring skeleton is any one of a branched alkyl group and an alkyl group having 3 or 4 carbon atoms, and the alkyl group of the metal complex of an alkali metal is an alkyl group having 1 to 3 carbon atoms.

Another embodiment of the present invention is a light-emitting device with any of the above structures, in which the alkyl group of the organic compound having a π-electron deficient heteroaromatic ring skeleton is a t-butyl group and the alkyl group of the metal complex of an alkali metal is a methyl group.

Another embodiment of the present invention is a light-emitting device with any of the above structures, in which carbon atoms forming a bond by $sp^3$ hybrid orbitals account for higher than or equal to 10% and lower than or equal to 60% of total carbon atoms in the organic compound having a π-electron deficient heteroaromatic ring skeleton.

Another embodiment of the present invention is a light-emitting device with any of the above structures, in which the integral value of signals at lower than 4 ppm exceeds the integral value of signals at 4 ppm or higher in the results of $^1$H-NMR measurement conducted on the organic compound having a π-electron deficient heteroaromatic ring skeleton.

Another embodiment of the present invention is a light-emitting device with any of the above structures, in which the organic compound having a π-electron deficient heteroaromatic ring skeleton has a triazine skeleton or a diazine skeleton.

Another embodiment of the present invention is a light-emitting device with any of the above structures, in which the metal complex of an alkali metal includes a ligand having an 8-quinolinolato structure.

Another embodiment of the present invention is a light-emitting device with any of the above structures, in which the metal complex of an alkali metal has an alkyl group and the alkyl group is an alkyl group having 1 to 3 carbon atoms.

Another embodiment of the present invention is a light-emitting device with any of the above structures, in which the metal complex of an alkali metal is a metal complex of lithium.

Another embodiment of the present invention is a light-emitting device with any of the above structures, in which the metal complex is represented by the following general formula (G0).

[Chemical Formula 1]

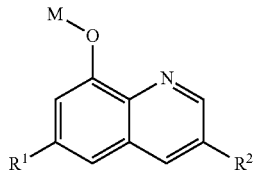

(G0)

Note that in the above general formula (G0), M represents an alkali metal, $R^1$ represents an alkyl group having 1 to 3 carbon atoms, and $R^2$ represents hydrogen or an alkyl group having 1 to 3 carbon atoms.

Another embodiment of the present invention is a light-emitting device with any of the above structures, in which $R^2$ is a methyl group.

Another embodiment of the present invention is a light-emitting device with any of the above structures, in which the metal complex is represented by any one of the following general formulae (G1) to (G3).

[Chemical Formula 2]

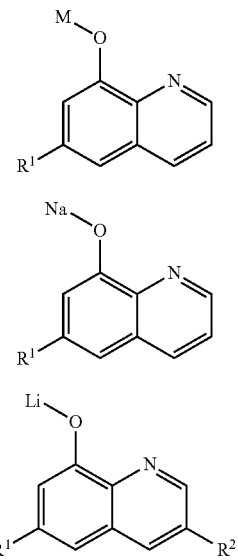

(G1)

(G2)

(G3)

Note that in the above general formulae (G1) to (G3), $R^1$ represents an alkyl group having 1 to 3 carbon atoms, and $R^2$ in (G3) represents an alkyl group having 1 to 3 carbon atoms.

Another embodiment of the present invention is a light-emitting device with any of the above structures, in which $R^1$ is a methyl group.

Another embodiment of the present invention is a light-emitting device with any of the above structures, in which $R^1$ is an ethyl group.

Another embodiment of the present invention is a light-emitting device with any of the above structures, in which M is lithium.

Another embodiment of the present invention is a light-emitting device with any of the above structures, in which M is sodium.

Another embodiment of the present invention is a metal complex represented by the following general formula (G0).

[Chemical Formula 3]

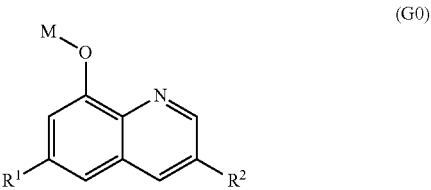

(G0)

Note that in the above general formula (G0), M represents an alkali metal, $R^1$ represents an alkyl group having 1 to 3 carbon atoms, and $R^2$ represents hydrogen or an alkyl group having 1 to 3 carbon atoms.

Another embodiment of the present invention is a metal complex with any of the above structures, in which $R^2$ is a methyl group.

Another embodiment of the present invention is a metal complex represented by any one of the following general formulae (G1) to (G3).

[Chemical Formula 4]

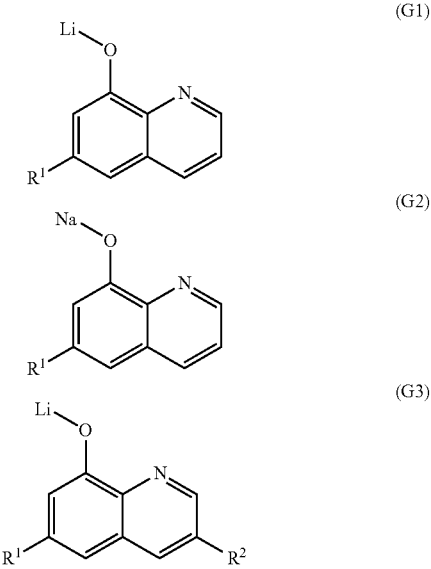

(G1)

(G2)

(G3)

Note that in the above general formulae (G1) to (G3), $R^1$ and $R^2$ each independently represent an alkyl group having 1 to 3 carbon atoms.

Another embodiment of the present invention is a metal complex with any of the above structures, in which $R^1$ is a methyl group.

Another embodiment of the present invention is a metal complex with any of the above structures, in which $R^1$ is an ethyl group.

Another embodiment of the present invention is a metal complex with any of the above structures, in which M is lithium.

Another embodiment of the present invention is a metal complex with any of the above structures, in which M is sodium.

Another embodiment of the present invention is a light-emitting device including any of the above metal complexes.

Another embodiment of the present invention is a light-emitting device in which the ordinary refractive index of the metal complex represented by the above general formula (G1) in a peak wavelength of light emitted from the light-emitting material is greater than or equal to 1.45 and less than or equal to 1.70.

Another embodiment of the present invention is a light-emitting device including any of the above metal complexes between a light-emitting layer and a cathode.

Another embodiment of the present invention is a light-emitting device including any of the above metal complexes in an electron-transport layer.

Another embodiment of the present invention is an electronic apparatus including any of the above light-emitting devices and at least one of a sensor, an operation button, a speaker, and a microphone.

Another embodiment of the present invention is a light-emitting apparatus including any of the above light-emitting devices and at least one of a transistor and a substrate.

Another embodiment of the present invention is a lighting device including any of the above light-emitting devices and a housing.

Note that the light-emitting apparatus in this specification includes, in its category, an image display device that uses a light-emitting device. The light-emitting apparatus may also include a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

According to one embodiment of the present invention, a light-emitting device with high emission efficiency can be provided. According to another embodiment of the present invention, any of a light-emitting device, a light-emitting apparatus, an electronic apparatus, a display device, and an electronic device each having low power consumption can be provided.

According to another embodiment of the present invention, a novel organometallic complex (metal complex) can be provided. According to another embodiment of the present invention, a metal complex that can be used for a light-emitting device having a low driving voltage can be provided. According to another embodiment of the present invention, a metal complex that can be used for a light-emitting device having a low driving voltage and including an electron-transport layer with a low refractive index can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 7A, 7B1, 7B2, and 7C illustrate electronic apparatuses.

DETAILED DESCRIPTION OF THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

Figure 1A:
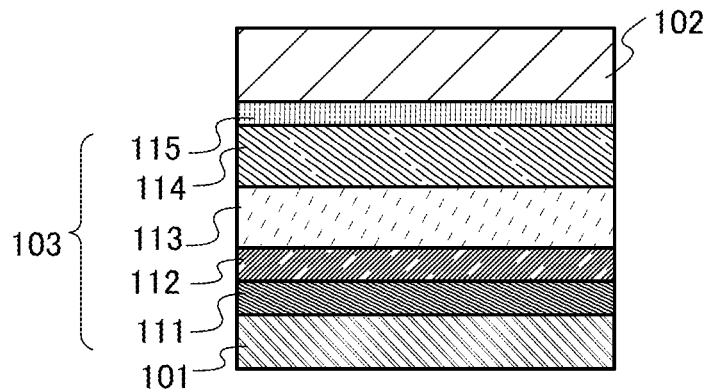
FIGS. 1A to 1C are schematic views of light-emitting devices.

FIG. 1A illustrates a light-emitting device of one embodiment of the present invention. The light-emitting device of one embodiment of the present invention includes an anode 101, a cathode 102, and an EL layer 103. The EL layer 103 includes a light-emitting layer 113 and an electron-transport layer 114.

The light-emitting layer 113 includes at least a light-emitting material. The electron-transport layer 114 includes an organic compound having an electron-transport property and a metal complex of an alkali metal.

In the light-emitting device of one embodiment of the present invention, the organic compound having an electron-transport property and the metal complex of an alkali metal included in the electron-transport layer 114 are preferably such a combination that the value obtained by dividing by 2 the sum of the ordinary refractive indices of the organic compound having an electron-transport property and the metal complex of an alkali metal in a peak wavelength ($\lambda$p) of light emitted from the light-emitting material included in the light-emitting layer 113 is greater than or equal to 1.50 and less than 1.75, preferably greater than or equal to 1.50 and less than 1.70.

Note that the refractive indices of the organic compound having an electron-transport property and the metal complex of an alkali metal are determined by measuring thin films made of these materials; in the case where the materials in the thin films have anisotropy, the refractive index with respect to ordinary light might differ from that with respect to extraordinary light. When a thin film to be measured is in such a state, anisotropy analysis can be performed to separately calculate the ordinary refractive index and the extraordinary refractive index. In the case where the measured material has both the ordinary refractive index and the extraordinary refractive index, the ordinary refractive index is used as an indicator in this specification.

The electron-transport layer 114 using these materials can have a low refractive index; the layer with a low refractive index included in the EL layer increases the light extraction efficiency to offer a light-emitting device with high emission efficiency. In general, the refractive index of an organic compound used in a light-emitting device is approximately 1.8 to 1.9. The light-emitting device of one embodiment of the present invention includes the electron-transport layer with a low refractive index and thus can have favorable emission efficiency.

In particular, the electron-transport layer 114 is provided between the light-emitting layer 113 and the cathode 102, which is suitable for a top emission light-emitting device.

In the light-emitting device of one embodiment of the present invention, the ordinary refractive index of the electron-transport layer 114 with respect to light with $\lambda$p is preferably greater than or equal to 1.50 and less than 1.75, further preferably greater than or equal to 1.50 and less than 1.70.

In particular, the organic compound having an electron-transport property included in the electron-transport layer 114 is preferably a substance whose ordinary refractive index in light with $\lambda$p is greater than or equal to 1.50 and less than or equal to 1.75, and the metal complex of an alkali metal is preferably a substance whose ordinary refractive index in light with $\lambda$p is greater than or equal to 1.45 and less than or equal to 1.70.

In a blue light-emitting device, the above light-emitting material emits light with any of wavelengths ($\lambda_B$) in the range of the blue light-emitting region (455 nm to 465 nm). Thus, the organic compound having an electron-transport property and the metal complex of an alkali metal in light with $\lambda_B$ are preferably such a combination that the value obtained by dividing by 2 the sum of their ordinary refractive indices is greater than or equal to 1.50 and less than 1.75, further preferably greater than or equal to 1.50 and less than 1.70.

Also in the blue light-emitting device, the ordinary refractive index of the electron-transport layer 114 with respect to light with $\lambda_B$ is preferably greater than or equal to 1.50 and less than 1.75, further preferably greater than or equal to 1.50 and less than 1.70. In particular, the ordinary refractive index of the organic compound having an electron-transport property in light with $\lambda_B$ is preferably greater than or equal to 1.50 and less than or equal to 1.75, further preferably greater than or equal to 1.50 and less than or equal to 1.70, and the ordinary refractive index of the metal complex of an alkali metal in light with $\lambda_B$ is preferably greater than or equal to 1.45 and less than or equal to 1.70.

In principle, the refractive index increases on a shorter wavelength side and decreases on a longer wavelength side. Hence, the organic compound having an electron-transport property and the metal complex of an alkali metal used in the electron-transport layer 114 of one embodiment of the present invention are preferably such a combination that the value obtained by dividing by 2 the sum of their ordinary refractive indices in light with a wavelength of 633 nm is greater than or equal to 1.45 and less than 1.70. The ordinary refractive index of the electron-transport layer 114 of one embodiment of the present invention in light with a wavelength of 633 nm is preferably greater than or equal to 1.45 and less than 1.70. In particular, the ordinary refractive index of the organic compound having an electron-transport property used in the electron-transport layer 114 of one embodiment of the present invention in light with a wavelength of 633 nm is preferably greater than or equal to 1.45 and less than or equal to 1.70, and the ordinary refractive index of the metal complex of an alkali metal used in the electron-transport layer 114 of one embodiment of the present invention in light with a wavelength of 633 nm is preferably greater than or equal to 1.40 and less than or equal to 1.65.

Each of the organic compound having an electron-transport property and the metal complex of an alkali metal used in the electron-transport layer 114 of one embodiment of the present invention preferably has an alkyl group or a cycloalkyl group. When these materials have an alkyl group or a cycloalkyl group, the refractive indices thereof can be reduced to achieve the electron-transport layer 114 with a low refractive index.

In general, the existence of the alkyl group or the cycloalkyl group is thought to hinder the interaction (also referred to as docking) between the organic compound having an electron-transport property and the metal complex of an alkali metal and cause an increase in driving voltage. In contrast, the light-emitting device of one embodiment of the present invention does not experience a large increase in driving voltage and can have good emission efficiency due to the electron-transport layer with a low refractive index.

The alkyl group of the organic compound having an electron-transport property is preferably a branched alkyl group, particularly preferably an alkyl group having 3 or 4 carbon atoms, and still further preferably a tert-butyl group. The alkyl group of the metal complex of an alkali metal preferably has any one of 1 to 3 carbon atoms, and is particularly preferably a methyl group.

The organic compound having an electron-transport property in the electron-transport layer 114 preferably includes at least one six-membered heteroaromatic ring having 1 to 3 nitrogen atoms, a plurality of aromatic hydrocarbon rings each of which has 6 to 14 carbon atoms forming a ring and at least two of which are benzene rings, and an organic compound having a plurality of hydrocarbon groups forming a bond by $sp^3$ hybrid orbitals.

In the above organic compound, carbon atoms forming a bond by $sp^3$ hybrid orbitals preferably account for higher than or equal to 10% and lower than or equal to 60%, further preferably higher than or equal to 10% and lower than or equal to 50% of total carbon atoms in molecules of the organic compound. Alternatively, when the above organic compound is subjected to $^1$H-NMR measurement, the integral value of signals at lower than 4 ppm is preferably ½ or more of the integral value of signals at 4 ppm or higher.

It is preferable that all the hydrocarbon groups forming a bond by $sp^3$ hybrid orbitals in the above organic compound be bonded to the aromatic hydrocarbon rings each having 6 to 14 carbon atoms forming a ring, and the LUMO of the organic compound not be distributed in the aromatic hydrocarbon rings.

The above organic compound corresponds to the organic compound having an electron-transport property included in the electron-transport layer 114.

The organic compound having an electron-transport property is preferably an organic compound represented by the following general formula (G1).

[Chemical Formula 5]

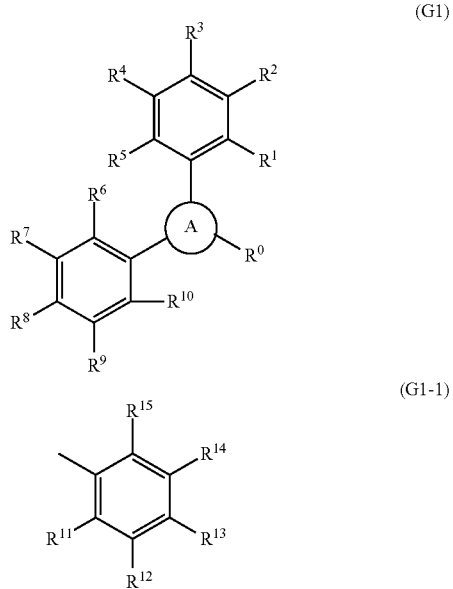

In the formula, A represents a six-membered heteroaromatic ring having 1 to 3 nitrogen atoms, and is preferably any one of a pyridine ring, a pyrimidine ring, a pyrazine ring, a pyridazine ring, and a triazine ring.

$R^0$ represents any one of hydrogen, an alkyl group having 1 to 6 carbon atoms, an alicyclic group having 3 to 10 carbon atoms, and a substituent represented by the formula (G1-1).

At least one of $R^1$ to $R^{15}$ represents a phenyl group having a substituent and the others independently represent any one of hydrogen, an alkyl group having 1 to 6 carbon atoms, an alicyclic group having 3 to 10 carbon atoms, a substituted or unsubstituted aromatic hydrocarbon group having 6 to 14 carbon atoms forming a ring, and a substituted or unsubstituted pyridyl group. Note that $R^1$, $R^3$, $R^5$, $R^6$, $R^8$, $R^{10}$, $R^{11}$, $R^{13}$ and $R^{15}$ are preferably hydrogen. The phenyl group having a substituent has one or two substituents, which independently represent any one of an alkyl group having 1 to 6 carbon atoms, an alicyclic group having 3 to 10 carbon atoms, and a substituted or unsubstituted aromatic hydrocarbon group having 6 to 14 carbon atoms forming a ring.

The organic compound represented by the above general formula (G1) has a plurality of hydrocarbon groups selected from an alkyl group having 1 to 6 carbon atoms and an alicyclic group having 3 to 10 carbon atoms, and carbon atoms forming a bond by $sp^3$ hybrid orbitals account for higher than or equal to 10% and lower than or equal to 60% of total carbon atoms in molecules of the organic compound.

The organic compound having an electron-transport property is preferably an organic compound represented by the following general formula (G3).

[Chemical Formula 6]

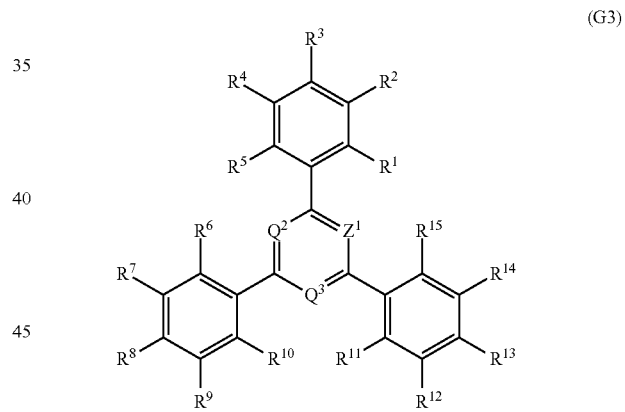

In the formula, two or three of $Q^1$ to $Q^3$ represent N; in the case where two of $Q^1$ to $Q^3$ are N, the rest represents CH.

At least one of $R^1$ to $R^{15}$ represents a phenyl group having a substituent and the others independently represent any one of hydrogen, an alkyl group having 1 to 6 carbon atoms, an alicyclic group having 3 to 10 carbon atoms, a substituted or unsubstituted aromatic hydrocarbon group having 6 to 14 carbon atoms forming a ring, and a substituted or unsubstituted pyridyl group. Note that $R^1$, $R^3$, $R^5$, $R^6$, $R^8$, $R^{10}$, $R^{11}$, $R^{13}$ and $R^{15}$ are preferably hydrogen. The phenyl group having a substituent has one or two substituents, which independently represent any one of an alkyl group having 1 to 6 carbon atoms, an alicyclic group having 3 to 10 carbon atoms, and a substituted or unsubstituted aromatic hydrocarbon group having 6 to 14 carbon atoms forming a ring.

The organic compound represented by the above general formula (G3) has a plurality of hydrocarbon groups selected from an alkyl group having 1 to 6 carbon atoms and an alicyclic group having 3 to 10 carbon atoms, and carbon atoms forming a bond by sp³ hybrid orbitals preferably account for higher than or equal to 10% and lower than or equal to 60% of total carbon atoms in molecules of the organic compound.

In the organic compound represented by the above general formula (G1) or (G3), the phenyl group having a substituent is preferably a group represented by the following formula (G1-2).

[Chemical Formula 7]

(G1-2)

In the formula, α represents a substituted or unsubstituted phenylene group and is preferably a meta-substituted phenylene group. In the case where the meta-substituted phenylene group has a substituent, the substituent is also preferably meta-substituted. The substituent is preferably an alkyl group having 1 to 6 carbon atoms or an alicyclic group having 3 to 10 carbon atoms, further preferably an alkyl group having 1 to 6 carbon atoms, and still further preferably a t-butyl group.

$R^{20}$ represents an alkyl group having 1 to 6 carbon atoms, an alicyclic group having 3 to 10 carbon atoms, or a substituted or unsubstituted aromatic hydrocarbon group having 6 to 14 carbon atoms forming a ring.

Furthermore, m and n represent 1 or 2. In the case where m is 2, a plurality of α may be the same or different. In the case where n is 2, a plurality of $R^{20}$ may be the same or different. $R^{20}$ is preferably a phenyl group, further preferably a phenyl group that has an alkyl group having 1 to 6 carbon atoms or an alicyclic group having 3 to 10 carbon atoms at one or both of the two meta-positons. The substituent at one or both of the two meta-positons of the phenyl group is preferably an alkyl group having 1 to 6 carbon atoms, further preferably a t-butyl group.

The metal complex of an alkali metal is preferably a metal complex of lithium or a metal complex of sodium. The ligand of the metal complex preferably has an 8-quinolinolato structure.

In the case where the lithium complex or the sodium complex having an 8-quinolinolato structure has an alkyl group, the complex preferably has one or two alkyl groups. It is possible that 8-quinolinolato-lithium having an alkyl group be a metal complex with a low refractive index. Specifically, the ordinary refractive index of the metal complex in a thin film state with respect to light with a wavelength in the range of 455 nm to 465 nm can be greater than or equal to 1.45 and less than or equal to 1.70, and the ordinary refractive index thereof with respect to light with a wavelength of 633 nm can be greater than or equal to 1.40 and less than or equal to 1.65.

In particular, the use of an alkali metal complex having an 8-quinolinolato ligand having an alkyl group at the 6 position results in lowering the driving voltage of a light-emitting device. An alkali metal complex having a 6-alkyl-8-quinolinolato ligand or an alkali metal complex having a 3,6-dialkyl-8-quinolinolato ligand is particularly preferably used in a light-emitting device because favorable characteristics can be obtained. Note that the alkyl group is preferably a methyl group or an ethyl group.

The alkali metal complex having an 8-quinolinolato ligand having an alkyl group at the 6 position can be represented by the following general formula (G0).

[Chemical Formula 8]

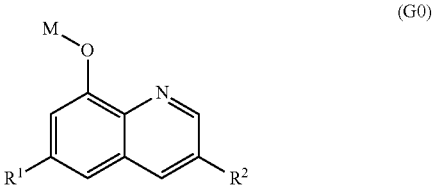

(G0)

Note that in the above general formula (G0), M represents an alkali metal, 1e represents an alkyl group having 1 to 3 carbon atoms, and $R^2$ represents hydrogen or an alkyl group having 1 to 3 carbon atoms.

The metal complex represented by the above general formula (G0) is particularly preferably a metal complex represented by any one of the following general formulae (G1) to (G3).

[Chemical Formula 9]

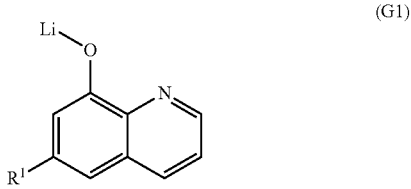

(G1)

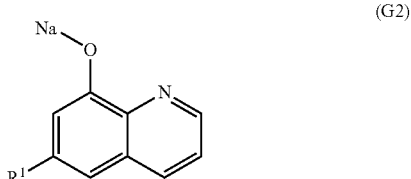

(G2)

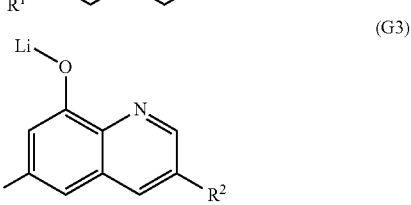

(G3)

Note that in the above general formulae (G1) to (G3), $R^1$ and $R^2$ each independently represent an alkyl group having 1 to 3 carbon atoms. The use of a metal complex with such a structure offers a light-emitting device having high emission efficiency and a low driving voltage. The metal complex represented by the general formula (G3) is preferable because it can be deposited by vacuum evaporation with a stable rate. It is further preferable that $R^1$ and $R^2$ each independently have a carbon atom, in which case the driving voltage can be lower than that in the case where $R^1$ and $R^2$ each independently have 2 or more carbon atoms.

Further preferably, the metal complex represented by any one of the above general formulae (G1) to (G3) is a metal complex represented by the following structural formula (100), (101), (102), or (200).

[Chemical Formula 10]

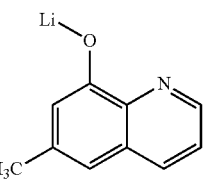

(100)

[Chemical Formula 11]

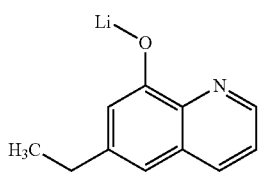

(101)

[Chemical Formula 12]

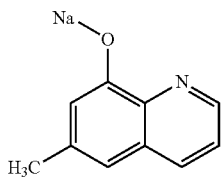

(102)

[Chemical Formula 13]

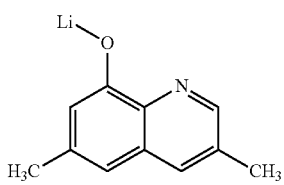

(200)

The organic compound having an electron-transport property used in the electron-transport layer 114 of the light-emitting device of one embodiment of the present invention preferably has an alkyl group having 3 or 4 carbon atoms as described above; in particular, the organic compound having an electron-transport property preferably has a plurality of the alkyl groups. In contrast, too many alkyl groups in molecules reduce the carrier-transport property; thus, carbon atoms forming a bond by sp$^3$ hybrid orbitals in the organic compound having an electron-transport property preferably account for higher than or equal to 10% and lower than or equal to 60%, further preferably higher than or equal to 10% and lower than or equal to 50% of total carbon atoms in the organic compound. The organic compound having an electron-transport property with such a structure can achieve a low refractive index with less influence on the electron-transport property.

When such an organic compound is measured by $^1$H-NMR (proton nuclear magnetic resonance), the integral value of signals at lower than 4 ppm exceeds the integral value of signals at 4 ppm or higher.

The organic compound having an electron-transport property used in the electron-transport layer 114 of the light-emitting device of one embodiment of the present invention preferably has a triazine skeleton or a diazine skeleton so as to achieve a favorable carrier-transport property.

As described above, the electron-transport layer can have a low refractive index without a large decrease in driving voltage or the like when including the organic compound having an electron-transport property with a low refractive index and the metal complex of an alkali metal with a low refractive index. As a result, the light extraction efficiency of the light-emitting layer 113 is improved so that the light-emitting device of one embodiment of the present invention can have high emission efficiency.

Next, examples of other structures and materials of the light-emitting device of one embodiment of the present invention will be described. The light-emitting device of one embodiment of the present invention includes, as described above, the EL layer 103 including a plurality of layers between the anode 101 and the cathode 102, and the EL layer 103 includes the light-emitting layer 113 containing a light-emitting material and the electron-transport layer 114 with the aforementioned structure.

The anode 101 is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used for the anode 101. Graphene can also be used for the anode 101. Note that when a composite material described later is used for a layer that is in contact with the anode 101 in the EL layer 103, an electrode material can be selected regardless of its work function.

Although the EL layer 103 preferably has a stacked-layer structure, there is no particular limitation on the stacked-layer structure, and various layers such as a hole-injection layer, a hole-transport layer, a light-emitting layer, an electron-transport layer, an electron-injection layer, a carrier-blocking layer (a hole-blocking layer and an electron-blocking layer), an exciton-blocking layer, and a charge-generation layer can be employed. Note that one or more of the above layers are not necessarily provided. Two kinds of structures are described in this embodiment: the structure illustrated in FIG. 1A, which includes a hole-injection layer 111 and a hole-transport layer 112 in addition to the electron-transport layer 114, an electron-injection layer 115, and the light-emitting layer 113; and the structure illustrated in FIG. 1B, which includes a charge-generation layer 116 in addition to the electron-transport layer 114, the light-emitting layer 113, the hole-injection layer 111, and the hole-transport layer 112. Materials for forming each layer will be specifically described below.

The hole-injection layer 111 includes a substance having an acceptor property. Either an organic compound or an inorganic compound can be used as the substance having an acceptor property.

As the substance having an acceptor property, it is possible to use a compound having an electron-withdrawing group (a halogen group or a cyano group); for example, 7,7,8,8-tetracyano-2,3,5,6-tetrafluoroquinodimethane (abbreviation: F$_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the sub stance having an acceptor property, molybdenum oxide, vanadium oxide, ruthenium oxide, tungsten oxide, manganese oxide, or the like can also be used, other than the above-described organic compounds. Alternatively, the hole-injection layer 111 can be formed using a phthalocyanine-based complex compound such as phthalocyanine (abbreviation: H$_2$Pc) and copper phthalocyanine (CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N-diphenyl-(1,1'-biphenyl)-4,4'-diamine (abbreviation: DNTPD), or a high molecular compound such as poly(3,4-ethylenedioxythiophene)/poly(styrenesulfonic acid) (PEDOT/PSS). The sub stance having an acceptor property can extract electrons from an adjacent hole-transport layer (or hole-transport material) by the application of an electric field.

Alternatively, a composite material in which a material having a hole-transport property contains any of the aforementioned acceptor substances can be used for the hole-injection layer 111. By using a composite material in which a material having a hole-transport property contains an acceptor substance, a material used to form an electrode can be selected regardless of its work function. In other words, besides a material having a high work function, a material having a low work function can be used for the anode 101.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1\times10^{-6}$ cm$^2$/Vs or higher. Organic compounds which can be used as the material having a hole-transport property in the composite material are specifically given below.

Examples of the aromatic amine compounds that can be used for the composite material include N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis {4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenylanthracen-9-yl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA). Note that the organic compound of one embodiment of the present invention can also be used.

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

The material having a hole-transport property that is used in the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to the nitrogen atom of amine through an arylene group may be used. Note that the second organic compound preferably has an N,N-bis(4-biphenyl)amino group because a light-emitting device having a long lifetime can be fabricated. Specific examples of the second organic compound include N-(4-biphenyl)-6,N-diphenylbenzo[b]naphtho[1,2-d]furan-8-amine (abbreviation: BnfABP), N,N'-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnffiB1BP), N,N'-bis(4-biphenyl)benzo[b]naphtho[1,2-d]furan-6-amine (abbreviation: BBABnf(6)), N,N'-bis(4-biphenyl)benzo[b]naphtho[1,2-d]furan-8-amine (abbreviation: BBABnf(8)), N,N'-bis(4-biphenyl)benzo[b]naphtho[2,3-d]furan-4-amine (abbreviation: BBABnf(II) (4)), N,N'-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation:

BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAlβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazol}triphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNB SF), N,N-bis(4-biphenylyl)-9,9'-spirobi[9H-fluoren]-2-amine (abbreviation: BBASF), N,N'-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi(9H-fluoren)-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(1,1'-biphenyl-4-yl)-9,9-dimethyl-N-[4-(9-phenyl-9H-carbazol-3-yl)phenyl]-9H-fluoren-2-amine (abbreviation: PCBBiF), N,N'-bis(9,9-dimethyl-9H-fluoren-2-yl)-9,9'-spirobi-9H-fluoren-4-amine, N,N'-bis(9,9-dimethyl-9H-fluoren-2-yl)-9,9'-spirobi-9H-fluoren-3-amine, N,N'-bis(9,9-dimethyl-9H-fluoren-2-yl)-9,9'-spirobi-9H-fluoren-2-amine, and N,N'-bis(9,9-dimethyl-9H-fluoren-2-yl)-9,9'-spirobi-9H-fluoren-1-amine.

Note that it is further preferable that the material having a hole-transport property to be used in the composite material have a relatively deep HOMO level higher than or equal to −5.7 eV and lower than or equal to −5.4 eV. When the material having a hole-transport property used in the composite material has a relatively deep HOMO level, injection of holes into the hole-transport layer 112 is facilitated so that a light-emitting device having a long lifetime can be easily obtained. In addition, when the material having a hole-transport property used in the composite material has a relatively deep HOMO level, induction of holes can be inhibited properly so that a light-emitting device having a longer lifetime can be easily obtained.

Note that mixing the above composite material with a fluoride of an alkali metal or an alkaline earth metal (the proportion of fluorine atoms in a layer using the mixed material is preferably greater than or equal to 20%) can lower the refractive index of the layer. This also enables a layer with a low refractive index to be formed in the EL layer 103, leading to higher external quantum efficiency of the light-emitting device.

The formation of the hole-injection layer 111 can improve the hole-injection property, which allows the light-emitting device to be driven at a low voltage.

Among substances having an acceptor property, the organic compound having an acceptor property is easy to use because it is easily deposited by evaporation.

The hole-transport layer 112 is formed using a material having a hole-transport property. The material having a hole-transport property preferably has a hole mobility of $1 \times 10^{-6}$ cm$^2$/Vs or higher.

Examples of the material having a hole-transport property include compounds having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferred because these compounds are highly reliable and have high hole-transport properties to contribute to a reduction in driving voltage. Note that any of the substances given as examples of the material having a hole-transport property which is used in the composite material for the hole-injection layer 111 can also be suitably used as the material included in the hole-transport layer 112.

The light-emitting layer 113 includes a light-emitting substance and a host material. The light-emitting layer 113 may additionally include other materials. Alternatively, the light-emitting layer 113 may be a stack of two layers with different compositions.

As the light-emitting substance, fluorescent substances, phosphorescent substances, substances exhibiting thermally activated delayed fluorescence (TADF), or other light-emitting substances may be used. Note that one embodiment of the present invention is more suitably used in the case where the light-emitting layer 113 emits fluorescence, specifically, blue fluorescence.

Examples of the material that can be used as a fluorescent substance in the light-emitting layer 113 are as follows. Other fluorescent substances can also be used.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenyl amine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl) perylene (abbreviation: TBP), 4-(10-phenyl-9-anthryl)-4'-(9-phenyl-9H-carbazol-3-yl)triphenyl amine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]rysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl] ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis (4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzok[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis {2-[4-(dimethylamino)phenyl] ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b] naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b'] bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of the material that can be used when a phosphorescent substance is used as the light-emitting substance in the light-emitting layer 113 are as follows.

The examples are as follows: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato) iridium(III) (abbreviation: [Ir(Mptz)$_3$]), and tris[4-(3-biphenyl)-5-isopropyl-3-phenyl-4H-1,2,4-triazolato]iridium (III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris (1-methyl-5-phenyl-3-propyl-1H-1,2,4-triazolato)iridium (III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole] iridium(III) (abbreviation: [Ir(iPrpmi)$_3$]) and tris[3-(2,6-dimethylphenyl)-7-methylimidaz[1,2-f]phenanthridinol] iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$]iridium (III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl) phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)). These compounds emit blue phosphorescence and have an emission peak at 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir (mppm)$_2$(acac)]), (acetylacetonato)bis(6-tert-butyl-4-phenylpyrimidinato)iridium(III) (abbreviation: [Ir(tBuppm)$_2$ (acac)]), (acetylacetonato)bis[6-(2-norbornyl)-4-phenylpyrimidinato]iridium(III) (abbreviation: [Ir(nbppm)$_2$ (acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato) bis(4,6-diphenylpyrimidinato)iridium(III) (abbreviation: [Ir (dppm)$_2$(acac)]); organometallic iridium complexes having a pyrazine skeleton, such as (acetylacetonato)bis(3,5-dimethyl-2-phenylpyrazinato)iridium(III) (abbreviation: [Ir (mppr-Me)$_2$(acac)]) and (acetylacetonato)bis(5-isopropyl-3- methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); and a rare earth metal complex such as tris(acetylacetonato) (monophenanthroline)terbium(III) (abbreviation: [Tb(acac)$_3$(Phen)]). These are mainly compounds that emit green phosphorescence and have an emission peak at 500 nm to 600 nm. Note that organometallic iridium complexes having a pyrimidine skeleton have distinctively high reliability and emission efficiency and thus are particularly preferable.

Other examples include organometallic iridium complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato](dipivaloylmethanato)iridium(III) (abbreviation: [Ir(d1npm)$_2$(dpm)]); organometallic iridium complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum (II) (abbreviation: [PtOEP]); and rare earth metal complexes such as tris(1,3-diphenyl-1,3-propanedionato) (monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). These compounds emit red phosphorescence having an emission peak in a wavelength region of 600 nm to 700 nm. Furthermore, the organometallic iridium complexes having a pyrazine skeleton can provide red light emission with favorable chromaticity.

Besides the above phosphorescent compounds, known phosphorescent compounds may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formula 14]

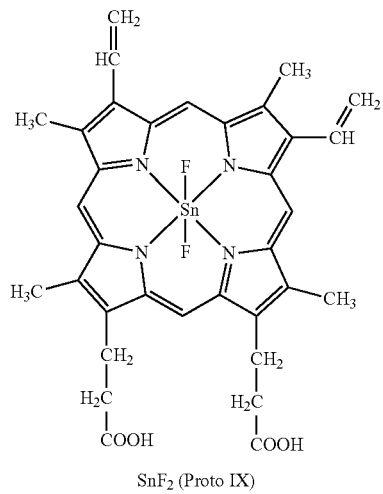

SnF$_2$ (Proto IX)

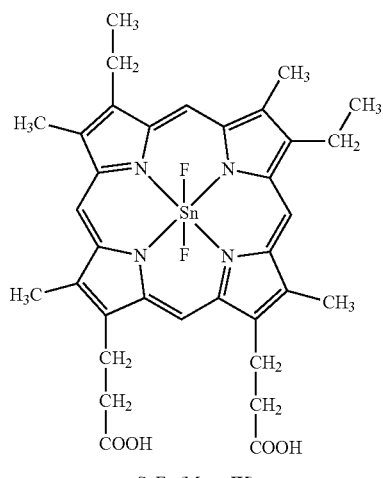

SnF$_2$ (Meso IX)

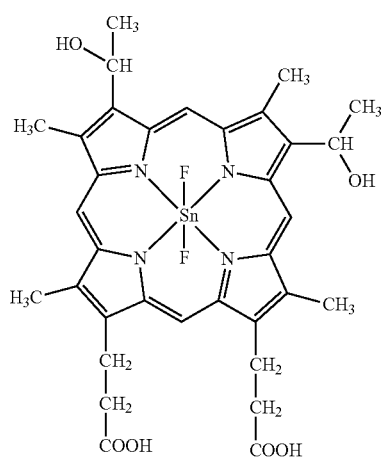

SnF$_2$ (Hemato IX)

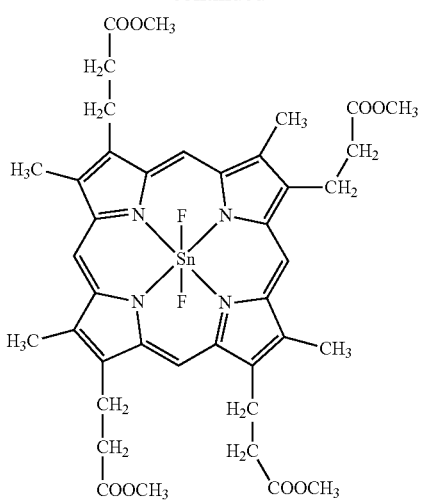

SnF₂ (Copro III-4Me)

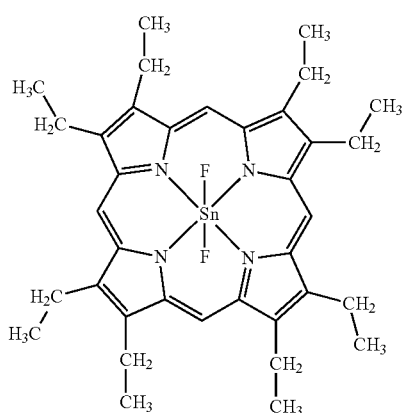

SnF₂ (OEP)

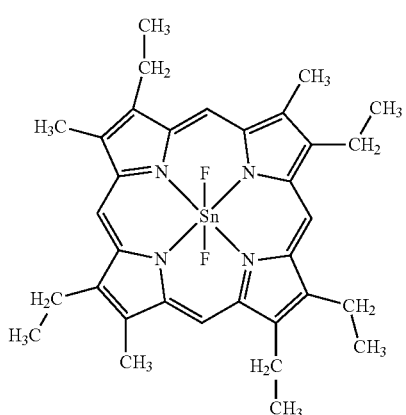

SnF₂ (Etio I)

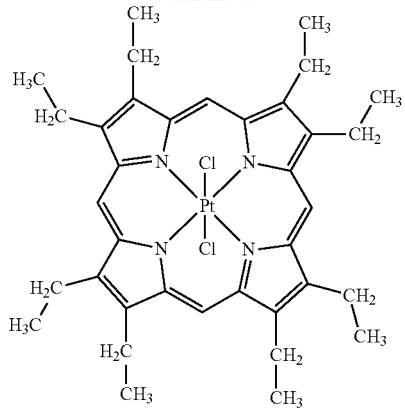

PtCl₂OEP

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a] carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazine-2-yl)phenyl]-9'-phenyl-9H,9'H-3,3'-bicarbazole (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring.

Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high accepting properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 15]

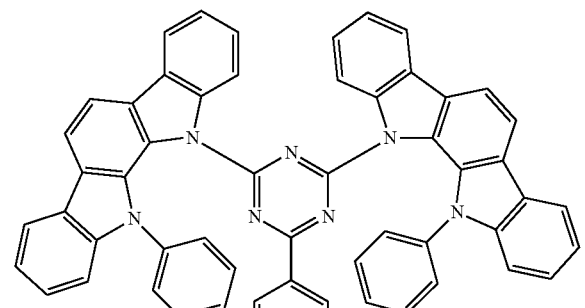

PIC-TRZ

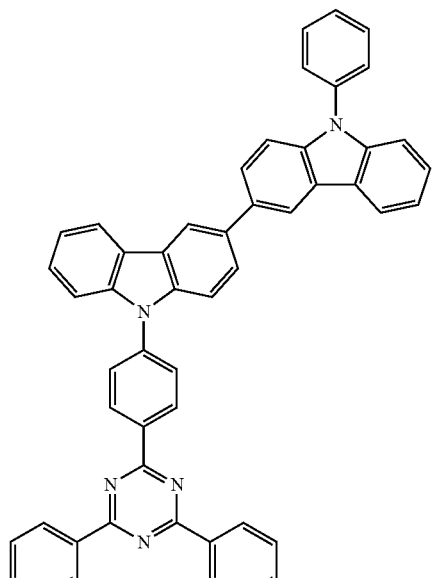

PCCzPTzn

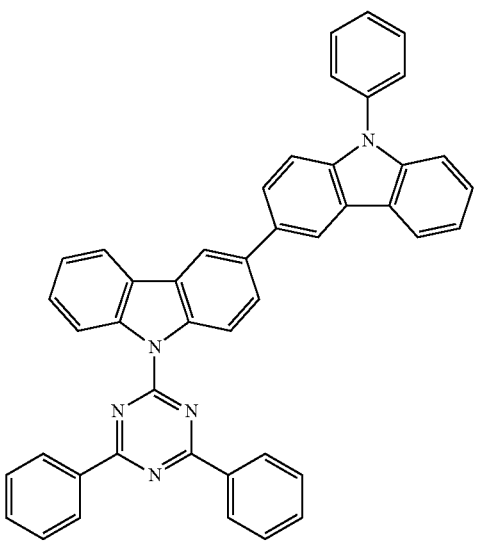

PCCzTzn

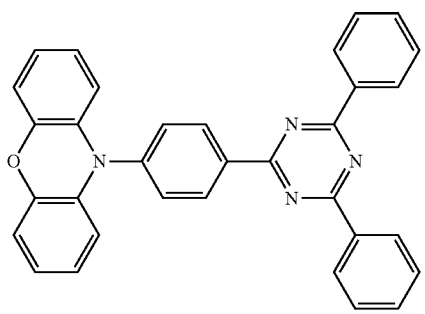

PXZ-TRZ

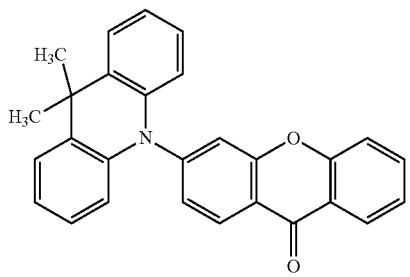

ACRXTN

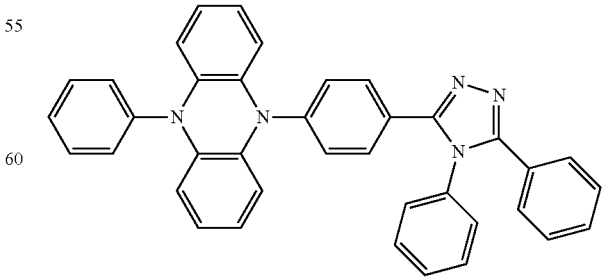

PPZ-3TPT

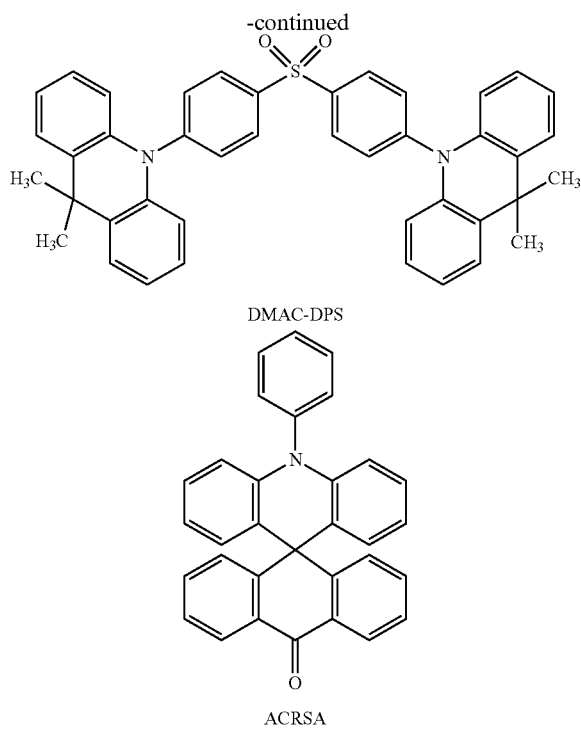

DMAC-DPS

ACRSA

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the host material in the light-emitting layer, various carrier-transport materials such as materials having an electron-transport property, materials having a hole-transport property, and the TADF materials can be used.

The material having a hole-transport property is preferably an organic compound having an amine skeleton or a π-electron rich heteroaromatic ring skeleton. Examples of the substance include compounds having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. It is also possible to use the organic compounds given as examples of the hole-transport materials in the hole-transport layer 112.

As the material having an electron-transport property, metal complexes such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); or an organic compound having a π-electron deficient heteroaromatic ring skeleton is preferable. Examples of the organic compound having a π-electron deficient heteroaromatic ring skeleton include heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); heterocyclic compounds having a pyridine skeleton, such as 3,5-bis[3-(9H-carbazol-9-yl)phenyl] pyridine (abbreviation: 35DCzPPy) and 1,3,5-tri[3-(3-pyridyl)phenyl]benzene (abbreviation: TmPyPB); and heterocyclic compounds having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), and 2-{3-[3-(benzo[b]naphtho[1,2-d]furan-6-yl)phenyl]phenyl}-4,6-diphenyl-1,3,5-triazine (abbreviation: mBnfBPTzn-02). Among the above materials, the heterocyclic compound having a diazine skeleton, the heterocyclic compound having a pyridine skeleton, and the heterocyclic compound having a triazine skeleton have high reliability and thus are preferable. In particular, the heterocyclic compound having a diazine (pyrimidine or pyrazine) skeleton and the heterocyclic compound having a triazine skeleton have a high electron-transport property to contribute to a reduction in driving voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is favorably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzo fluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). Note that CzPA, cgDBCzPA, 2mBnfPPA, and PCzPA have excellent characteristics and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. When these mixed materials are selected so as to form an exciplex that exhibits light emission whose wavelength overlaps with the wavelength on a lowest-energy-side absorption band of the light-emitting substance, energy can be transferred smoothly and light emission can be obtained efficiently, which is preferable. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by, for example, comparing the emission spectra of the material having a hole-transport property, the material having an electron-transport property, and the mixed film of these materials, and observing the phenomenon in which the emission spectrum of the mixed film is shifted to the longer wavelength side than the emission spectrum of each of the materials (or has another peak on the longer wavelength side). Alternatively, the formation of an exciplex can be confirmed by comparing the transient photoluminescence (PL) of the material having a hole-transport property, the transient PL of the material having an electron-transport property, and the transient PL of the mixed film of the materials, and observing a difference in transient response, such as a phenomenon in which the transient PL lifetime of the mixed film has more long lifetime components or has a larger proportion of delayed components than that of each of the materials. The transient PL can be rephrased as transient electroluminescence (EL). That is, the formation of an exciplex can also be confirmed by comparing the transient EL of the material having a hole-transport property, the material having an electron-transport property, and the mixed film of the materials, and observing a difference in transient response.

Since the electron-transport layer 114 with the structure of the present invention can have a low refractive index, a layer with a low refractive index can be formed in the EL layer 103 without a significant increase in driving voltage, leading to higher external quantum efficiency of the light-emitting device.

Note that the electron-transport layer 114 having the above structure also serves as the electron-injection layer 115.

The electron mobility of the electron-transport layer 114 in the case where the square root of the electric field strength [V/cm] is 600 is preferably higher than or equal to $1\times10^{-7}$ cm$^2$/Vs and lower than or equal to $5\times10^{-5}$ cm$^2$/Vs. The amount of electrons injected into the light-emitting layer can be controlled by the reduction in the electron-transport property of the electron-transport layer 114, preventing the light-emitting layer from having excess electrons. This structure is particularly preferably used when the hole-injection layer is formed using a composite material and a material having a hole-transport property in the composited material has a relatively deep HOMO level higher than or equal to −5.7 eV and lower than or equal to −5.4 eV, in which case the light-emitting device can have a long lifetime. In this case, the material having an electron-transport property preferably has a HOMO level of −6.0 eV or higher.

The electron-transport layer 114 preferably has a difference in concentration (including 0) between the alkali metal or the metal complex of an alkali metal in the thickness direction.

A layer including an alkali metal, an alkaline earth metal, a compound thereof, or a complex thereof such as lithium fluoride (LiF), cesium fluoride (CsF), calcium fluoride (CaF$_2$), or 8-hydroxyquinolinato-lithium (Liq) may be provided as the electron-injection layer 115 between the electron-transport layer 114 and the cathode 102. For example, an electride or a layer that is formed using a substance having an electron-transport property and that includes an alkali metal, an alkaline earth metal, or a compound thereof can be used as the electron-injection layer 115. Examples of the electride include a substance in which electrons are added at high concentration to calcium oxide-aluminum oxide.

Note that as the electron-injection layer 115, it is possible to use a layer including a substance that has an electron-transport property (preferably an organic compound having a bipyridine skeleton) and includes a fluoride of the alkali metal or the alkaline earth metal at a concentration higher than that at which the electron-injection layer 115 becomes in a microcrystalline state (50 wt % or higher). Since the layer has a low refractive index, a light-emitting device including the layer can have high external quantum efficiency.

Figure 1B:
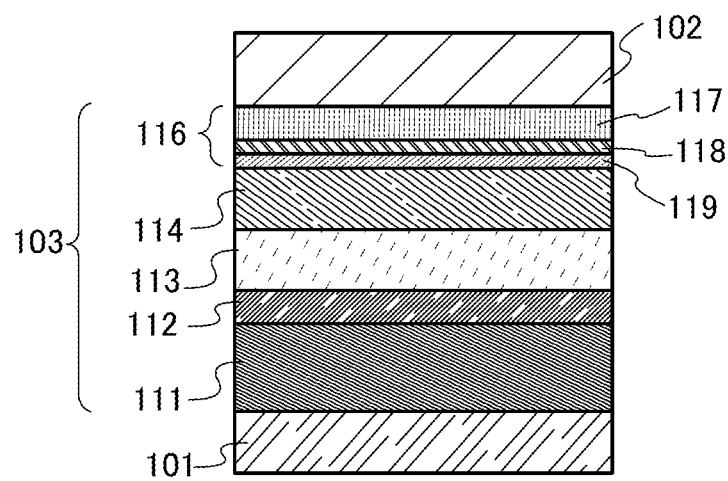

Instead of the electron-injection layer 115 in FIG. 1A, the charge-generation layer 116 may be provided (FIG. 1B). The charge-generation layer 116 refers to a layer capable of injecting holes into a layer in contact with the cathode side of the charge-generation layer and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film including the above-described acceptor material as a material included in the composite material and a film including a hole-transport material. When a potential is applied to the p-type layer 117, electrons are injected into the electron-transport layer 114 and holes are injected into the cathode 102; thus, the light-emitting device operates.

Note that the charge-generation layer 116 preferably includes one or both of an electron-relay layer 118 and an electron-injection buffer layer 119 in addition to the p-type layer 117.

The electron-relay layer 118 includes at least the substance having an electron-transport property and has a function of preventing an interaction between the electron-injection buffer layer 119 and the p-type layer 117 and smoothly transferring electrons. The LUMO level of the substance having an electron-transport property included in the electron-relay layer 118 is preferably between the LUMO level of the acceptor substance in the p-type layer 117 and the LUMO level of a substance included in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

The electron-injection buffer layer 119 can be formed using a substance having a high electron-injection property, e.g., an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)).

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)).

As the substance having an electron-transport property, a material similar to the above-described material for the electron-transport layer 114 can be used. Since the above-described material is an organic compound having a low refractive index, the use of the material for the electron-injection buffer layer 119 can offer a light-emitting device with high external quantum efficiency.

For the cathode 102, a metal, an alloy, an electrically conductive compound, or a mixture thereof each having a low work function (specifically, lower than or equal to 3.8 eV) or the like can be used. Specific examples of such a cathode material are elements belonging to Group 1 or 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode 102 and the electron-transport layer, a variety of conductive materials such as Al, Ag, ITO, or indium oxide-tin oxide containing silicon or silicon oxide can be used for the cathode 102 regardless of the work function. Films of these conductive materials can be deposited by a dry process such as a vacuum evaporation method or a sputtering method, an ink-jet method, a spin coating method, or the like. Alternatively, a wet process using a sol-gel method or a wet process using a paste of a metal material may be employed.

Any of a variety of methods can be used for forming the EL layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the anode 101 and the cathode 102 is not limited to the above-described structure. Preferably, a light-emitting region where holes and electrons recombine is positioned away from the anode 101 and the cathode 102 so as to inhibit quenching due to the proximity of the light-emitting region and a metal used for electrodes and carrier-injection layers.

Furthermore, in order that transfer of energy from an exciton generated in the light-emitting layer can be inhibited, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material included in the light-emitting layer.

Next, an embodiment of a light-emitting device with a structure in which a plurality of light-emitting units are stacked (this type of light-emitting device is also referred to as a stacked or tandem light-emitting device) is described with reference to FIG. 1C. This light-emitting device includes a plurality of light-emitting units between an anode and a cathode. One light-emitting unit has substantially the same structure as the EL layer 103 illustrated in FIG. 1A. In other words, the light-emitting device illustrated in FIG. 1A or 1B includes a single light-emitting unit, and the light-emitting device illustrated in FIG. 1C includes a plurality of light-emitting units.

Figure 1C:
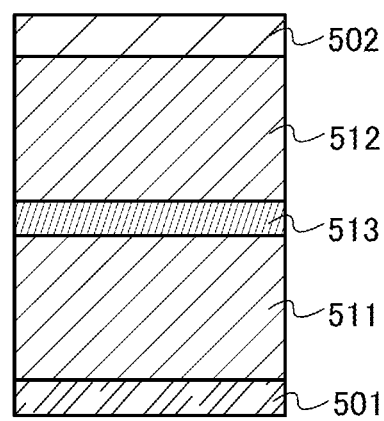

In FIG. 1C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the anode 101 and the cathode 102 illustrated in FIG. 1A, and the materials given in the description for FIG. 1A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied between the anode 501 and the cathode 502. That is, in FIG. 1C, the charge-generation layer 513 injects electrons into the first light-emitting unit 511 and holes into the second light-emitting unit 512 when a voltage is applied so that the potential of the anode becomes higher than the potential of the cathode.

The charge-generation layer 513 preferably has a structure similar to that of the charge-generation layer 116 described with reference to FIG. 1B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as the electron-injection layer in the light-emitting unit on the anode side and thus, an electron-injection layer is not necessarily formed in the light-emitting unit on the anode side.

The light-emitting device having two light-emitting units is described with reference to FIG. 1C; however, one embodiment of the present invention can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life device which can emit light with high luminance with a low current density maintained. A light-emitting apparatus which can be driven at a low voltage and has low power consumption can also be provided.

When the light-emitting units have different emission colors, light emission of a desired color can be obtained from the light-emitting device as a whole. For example, in a light-emitting device having two light-emitting units, the emission colors of the first light-emitting unit may be red and green and the emission color of the second light-emitting unit may be blue, so that the light-emitting device can emit white light as the whole.

The above-described layers and electrodes such as the EL layer 103, the first light-emitting unit 511, the second light-emitting unit 512, and the charge-generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

This embodiment can be freely combined with any of the other embodiments.

Embodiment 2

In this embodiment, a light-emitting apparatus including the light-emitting device described in Embodiment 1 is described.

Figure 2A:
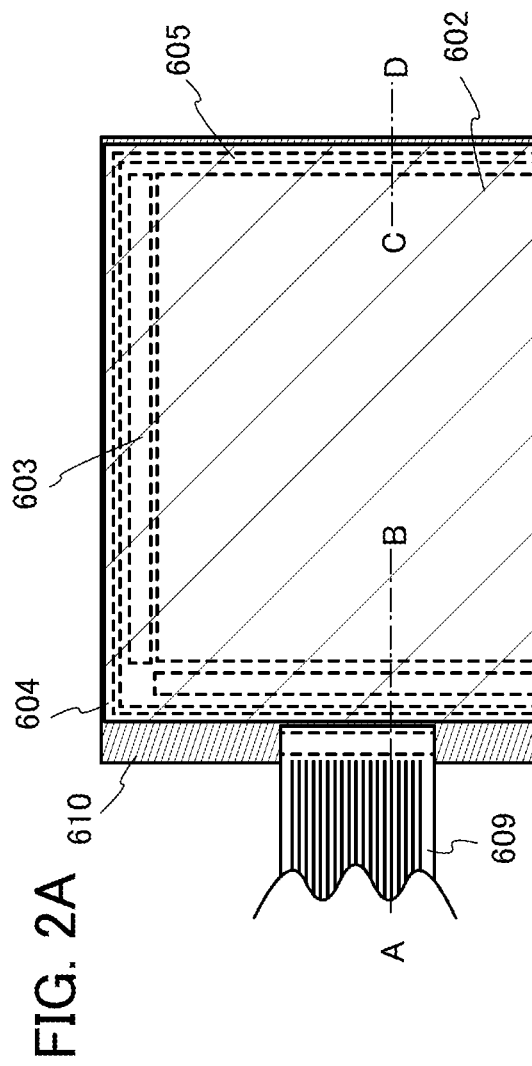
FIGS. 2A and 2B illustrate an active matrix light-emitting apparatus.
Figure 2B:
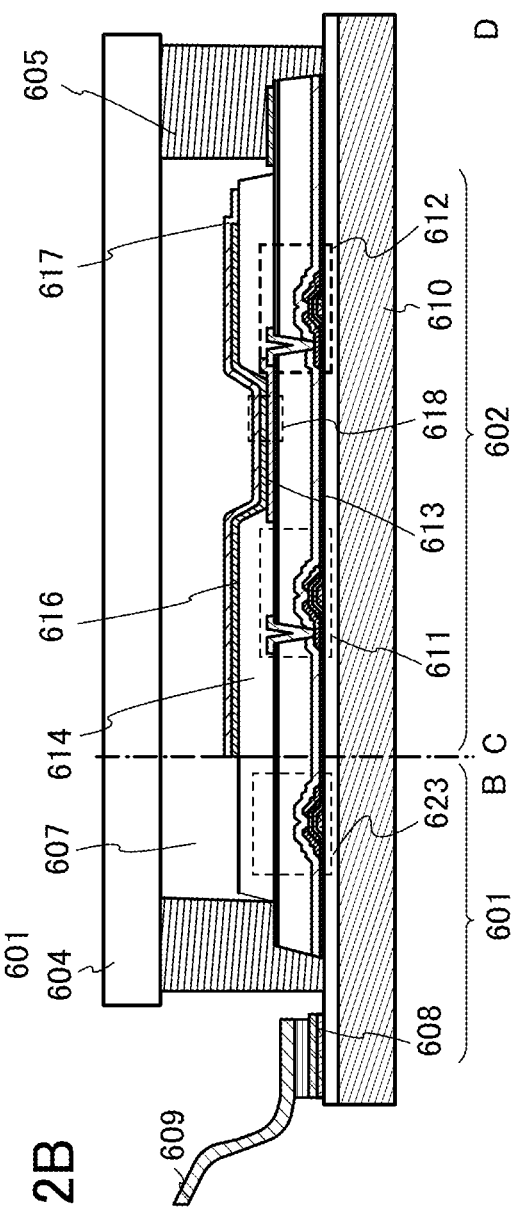

In this embodiment, the light-emitting apparatus manufactured using the light-emitting device described in Embodiment 1 is described with reference to FIGS. 2A and 2B. Note that FIG. 2A is a top view of the light-emitting apparatus and FIG. 2B is a cross-sectional view taken along the dashed-dotted lines A-B and C-D in FIG. 2A. This light-emitting apparatus includes a driver circuit portion (source line driver circuit) 601, a pixel portion 602, and a driver circuit portion (gate line driver circuit) 603, which are to control light emission of a light-emitting device and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in the present specification includes, in its category, not only the light-emitting apparatus itself but also the light-emitting apparatus provided with the FPC or the PWB.

Next, a cross-sectional structure is described with reference to FIG. 2B. The driver circuit portions and the pixel portion are formed over an element substrate 610; here, the source line driver circuit 601, which is a driver circuit portion, and one pixel in the pixel portion 602 are illustrated.

The element substrate 610 may be a substrate containing glass, quartz, an organic resin, a metal, an alloy, or a semiconductor or a plastic substrate formed of fiber reinforced plastic (FRP), poly(vinyl fluoride) (PVF), polyester, or acrylic resin.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic apparatus with extremely low power consumption can be obtained.

For stable characteristics of the transistor, a base film is preferably provided. The base film can be formed with a single layer or stacked layers using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. The driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and an anode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the anode 613. Here, the insulator 614 can be formed using a positive photosensitive acrylic resin film.

In order to improve the coverage with an EL layer or the like which is formed later, the insulator 614 is formed to have a curved surface with curvature at its upper or lower end portion. For example, in the case where a positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a cathode 617 are formed over the anode 613. Here, as a material used for the anode 613, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 1. As another material included in the EL layer 616, a low molecular compound or a high molecular compound (including an oligomer or a dendrimer) may be used.

As a material used for the cathode 617, which is formed over the EL layer 616, a material having a low work function (e.g., Al, Mg, Li, and Ca, or an alloy or a compound thereof, such as MgAg, MgIn, and AlLi) is preferably used. In the case where light generated in the EL layer 616 passes through the cathode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the cathode 617.

Note that the light-emitting device is formed with the anode 613, the EL layer 616, and the cathode 617. The light-emitting device is the light-emitting device described in Embodiment 1. In the light-emitting apparatus of this embodiment, the pixel portion, which includes a plurality of light-emitting devices, may include both the light-emitting device described in Embodiment 1 and a light-emitting device having a different structure.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case deterioration due to influence of moisture can be suppressed.

An epoxy-based resin or glass frit is preferably used for the sealing material 605. It is preferable that such a material transmit moisture or oxygen as little as possible. As the sealing substrate 604, a glass substrate, a quartz substrate, or a plastic substrate formed of fiber reinforced plastic (FRP), poly(vinyl fluoride) (PVF), polyester, and acrylic resin can be used.

Although not illustrated in FIGS. 2A and 2B, a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material that does not easily transmit an impurity such as water. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting apparatus manufactured using the light-emitting device described in Embodiment 1 can be obtained.

The light-emitting apparatus in this embodiment is manufactured using the light-emitting device described in Embodiment 1 and thus can have favorable characteristics. Specifically, since the light-emitting device described in Embodiment 1 has high emission efficiency, the light-emitting apparatus can achieve low power consumption.

Figures 3A, 3B:
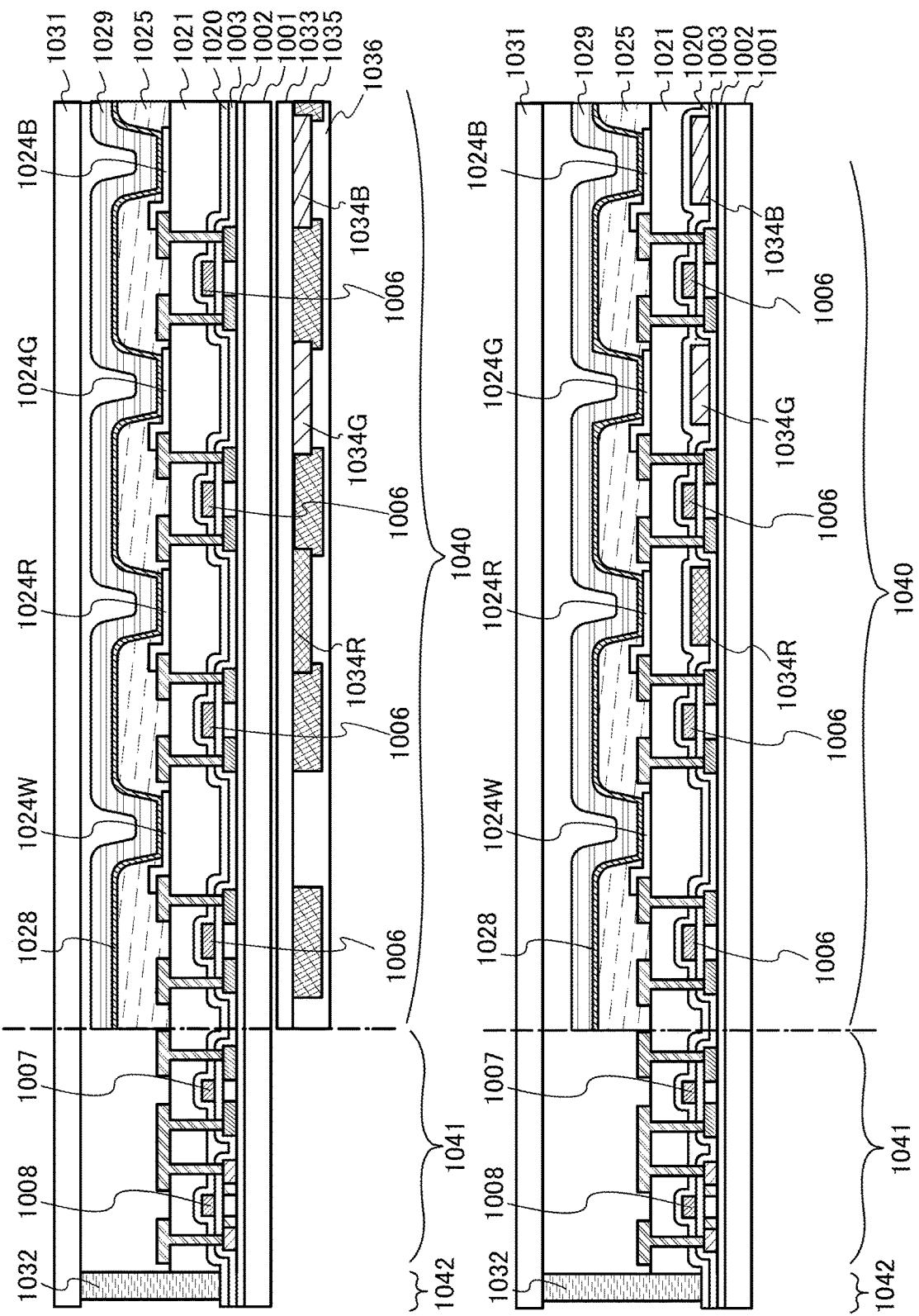
FIGS. 3A and 3B illustrate active matrix light-emitting apparatuses.

FIGS. 3A and 3B each illustrate an example of a light-emitting apparatus that includes a light-emitting device exhibiting white light emission and coloring layers (color filters) and the like to display a full-color image. FIG. 3A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024W, 1024R, 1024G, and 1024B of light-emitting devices, a partition 1025, an EL layer 1028, a cathode 1029 of the light-emitting devices, a sealing substrate 1031, a sealing material 1032, and the like.

In FIG. 3A, coloring layers (a red coloring layer 1034R, a green coloring layer 1034G, and a blue coloring layer 1034B) are provided on a transparent base material 1033.

A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 3A, light emitted from part of the light-emitting layer does not pass through the coloring layers, while light emitted from the other part of the light-emitting layer passes through the coloring layers. Since the light that does not pass through the coloring layers is white and the light that passes through any one of the coloring layers is red, green, or blue, an image can be displayed using pixels of the four colors.

FIG. 3B shows an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
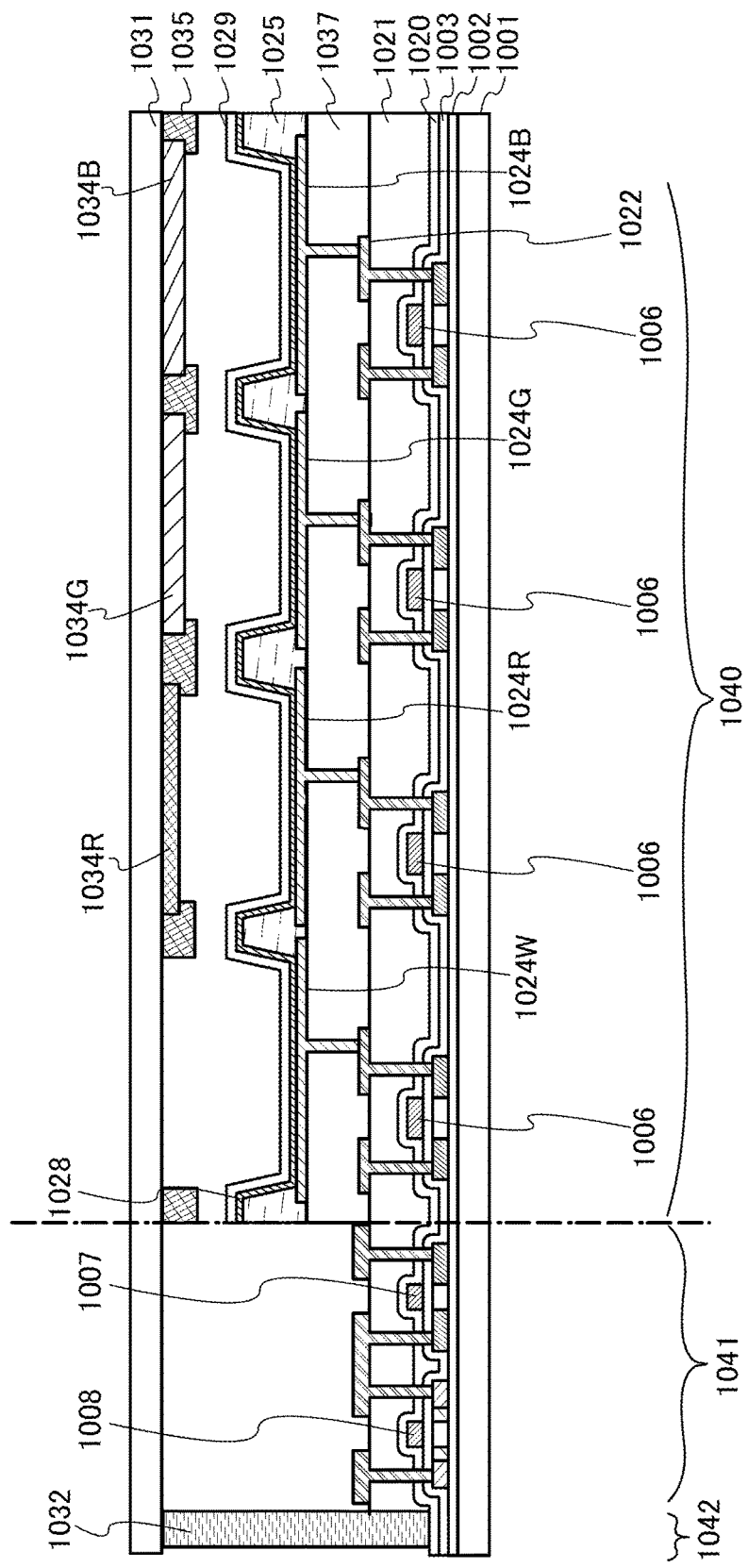
FIG. 4 illustrates an active matrix light-emitting apparatus.

The above-described light-emitting apparatus has a structure in which light is extracted from the substrate 1001 side where FETs are formed (a bottom emission structure), but may have a structure in which light is extracted from the sealing substrate 1031 side (a top emission structure). FIG. 4 is a cross-sectional view of a light-emitting apparatus having a top emission structure. In this case, a substrate that does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover the electrode 1022. This insulating film may have a planarization function. The third interlayer insulating film 1037 can be formed using a material similar to that of the second interlayer insulating film 1021, and can alternatively be formed using any of other known materials.

The anodes 1024W, 1024R, 1024G, and 1024B of the light-emitting devices may each serve as a cathode. Furthermore, in the case of a light-emitting apparatus having a top emission structure as illustrated in FIG. 4, the anodes are preferably reflective electrodes. The EL layer 1028 is formed to have a structure similar to the structure of the EL layer 103 described in Embodiment 1, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix 1035 may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be favorably employed. A light-emitting device with a microcavity structure is formed with the use of a reflective electrode as the anode and a transflective electrode as the cathode. The light-emitting device with a microcavity structure includes at least an EL layer between the reflective electrode and the transflective electrode, which includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the light-emitting device, by changing thicknesses of the transparent conductive film, the composite material, the carrier-transport material, and the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or larger and λ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided with a charge-generation layer provided therebetween, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus that displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured using the light-emitting device described in Embodiment 1 and thus can have favorable characteristics. Specifically, since the light-emitting device described in Embodiment 1 has high emission efficiency, the light-emitting apparatus can achieve low power consumption.

Figure 5A:
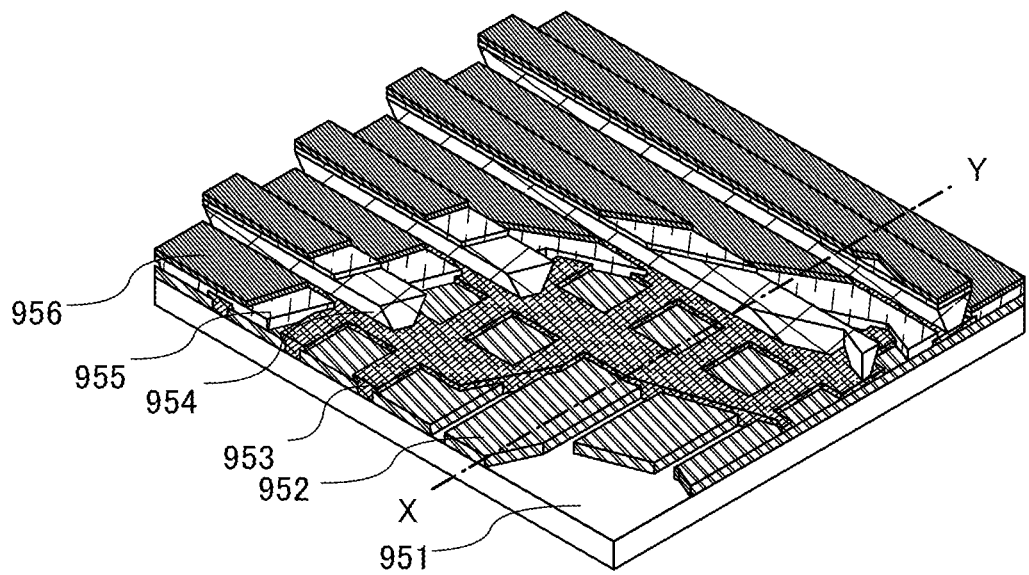
FIGS. 5A and 5B illustrate a passive matrix light-emitting apparatus.
Figure 5B:
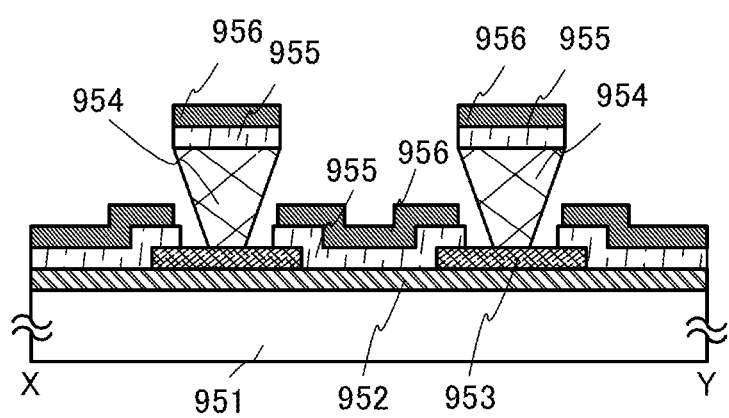

An active matrix light-emitting apparatus is described above, whereas a passive matrix light-emitting apparatus is described below. FIGS. 5A and 5B illustrate a passive matrix light-emitting apparatus manufactured using the present invention. Note that FIG. 5A is a perspective view of the light-emitting apparatus, and FIG. 5B is a cross-sectional view taken along the line X-Y in FIG. 5A. In FIGS. 5A and 5B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid that is parallel to the surface of the insulating layer 953 and is in contact with the insulating layer 953) is shorter than the upper side (a side of the trapezoid that is parallel to the surface of the insulating layer 953 and is not in contact with the insulating layer 953). The partition layer 954 thus provided can prevent defects in the light-emitting device due to static electricity or others. The passive matrix light-emitting apparatus also includes the light-emitting device described in Embodiment 1; thus, the light-emitting apparatus can have high reliability or low power consumption.

In the light-emitting apparatus described above, many minute light-emitting devices arranged in a matrix can each be controlled; thus, the light-emitting apparatus can be suitably used as a display device for displaying images.

This embodiment can be freely combined with any of the other embodiments.

Embodiment 3

Figure 6A:
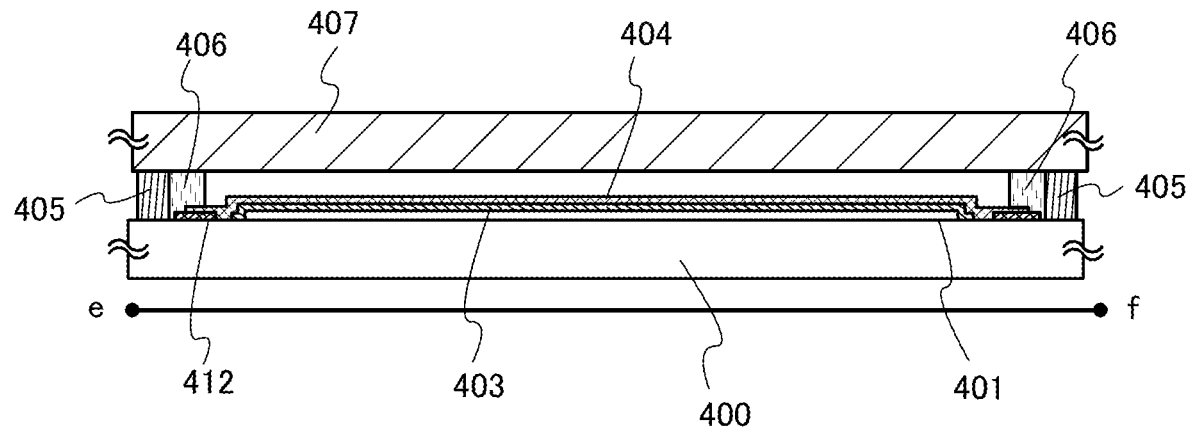
FIGS. 6A and 6B illustrate a lighting device.
Figure 6B:
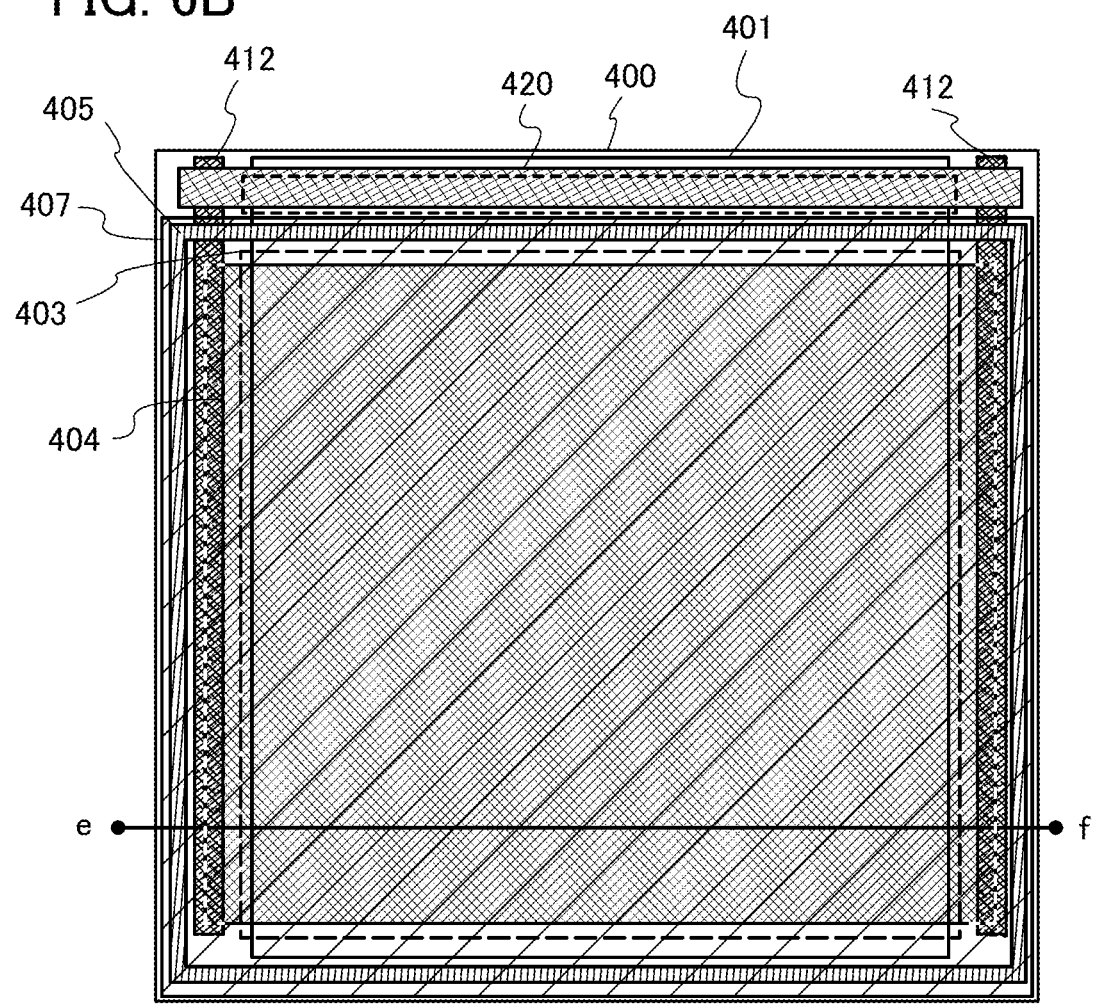

In this embodiment, an example in which the light-emitting device described in Embodiment 1 is used for a lighting device will be described with reference to FIGS. 6A and 6B. FIG. 6B is a top view of the lighting device, and FIG. 6A is a cross-sectional view taken along the line e-f in FIG. 6B.

In the lighting device in this embodiment, an anode 401 is formed over a substrate 400 which is a support with a light-transmitting property. The anode 401 corresponds to the anode 101 in Embodiment 1. When light is extracted through the anode 401, the anode 401 is formed using a material having a light-transmitting property.

A pad 412 for applying voltage to a cathode 404 is provided over the substrate 400.

An EL layer 403 is formed over the anode 401. The structure of the EL layer 403 corresponds to, for example, the structure of the EL layer 103 in Embodiment 1, or the structure in which the light-emitting units 511 and 512 and the charge-generation layer 513 are combined. Refer to the descriptions for the structure.

The cathode 404 is formed to cover the EL layer 403. The cathode 404 corresponds to the cathode 102 in Embodiment 1. The cathode 404 is formed using a material having high reflectance when light is extracted through the anode 401. The cathode 404 is connected to the pad 412, thereby receiving voltage.

As described above, the lighting device described in this embodiment includes a light-emitting device including the anode 401, the EL layer 403, and the cathode 404. Since the light-emitting device is a light-emitting device with high emission efficiency, the lighting device in this embodiment can have low power consumption.

The substrate 400 provided with the light-emitting device having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not illustrated in FIG. 6B) can be mixed with a desiccant which enables moisture to be adsorbed, increasing reliability.

When parts of the pad 412 and the anode 401 are extended to the outside of the sealing materials 405 and 406, the extended parts can serve as external input terminals. An IC chip 420 mounted with a converter or the like may be provided over the external input terminals.

The lighting device described in this embodiment includes as an EL element the light-emitting device described in Embodiment 1; thus, the lighting device can have low power consumption.

This embodiment can be freely combined with any of the other embodiments.

Embodiment 4

In this embodiment, examples of electronic apparatuses each including the light-emitting device described in Embodiment 1 will be described. The light-emitting device described in Embodiment 1 has high emission efficiency and low power consumption. As a result, the electronic apparatuses described in this embodiment can each include a light-emitting portion with low power consumption.

Examples of the electronic apparatus including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic apparatuses are shown below.

Figure 7A:
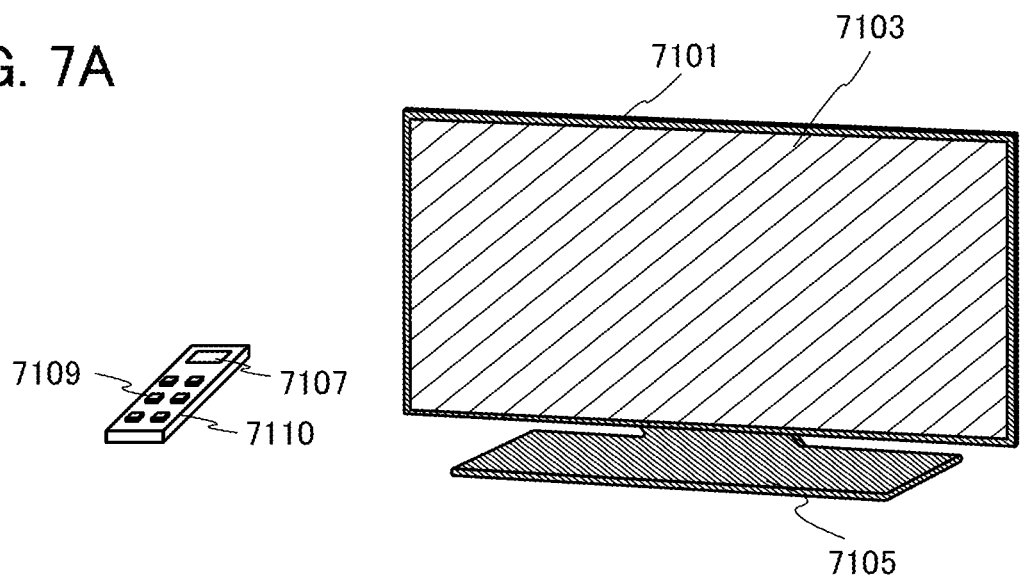
Figure 7A:
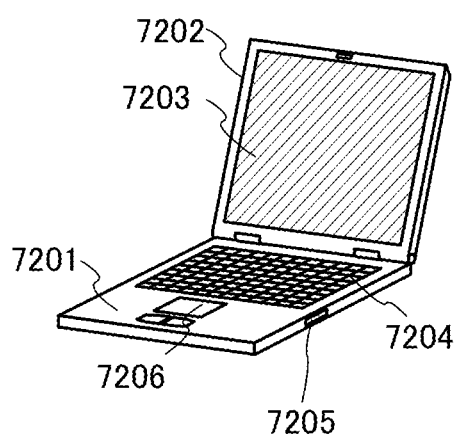
Figure 7A:
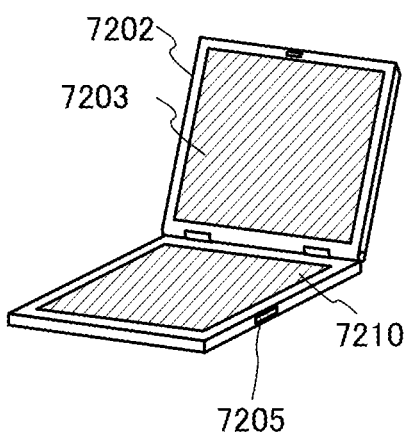

FIG. 7A shows an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in Embodiment 1 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110. The light-emitting devices described in Embodiment 1 may also be arranged in a matrix in the display portion 7107.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured using the light-emitting devices described in Embodiment 1 and arranged in a matrix in the display portion 7203. The computer illustrated in FIG. 7B1 may have a structure illustrated in FIG. 7B2. A computer illustrated in FIG. 7B2 is provided with a display portion 7210 instead of the keyboard 7204 and the pointing device 7206. The display portion 7210 is a touch panel, and input operation can be performed by touching display for input on the display portion 7210 with a finger or a dedicated pen. The display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 7C:
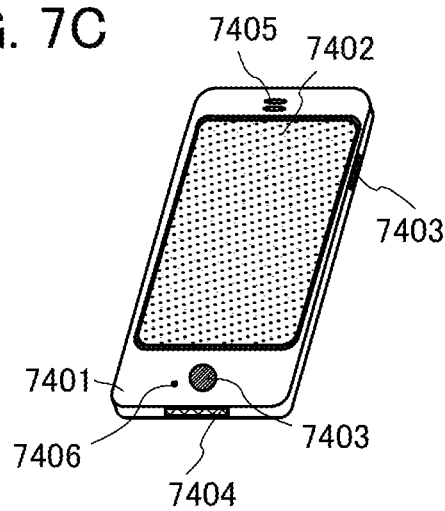

FIG. 7C shows an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 in which the light-emitting devices described in Embodiment 1 are arranged in a matrix.

When the display portion 7402 of the portable terminal illustrated in FIG. 7C is touched with a finger or the like, data can be input to the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Note that the structure described in this embodiment can be combined with any of the structures described in Embodiments 1 to 3 as appropriate.

As described above, the application range of the light-emitting apparatus having the light-emitting device described in Embodiment 1 or 2 is so wide that this light-emitting apparatus can be used in electronic apparatuses in a variety of fields. By using the light-emitting device described in Embodiment 1 or 2, an electronic apparatus with low power consumption can be obtained.

Figure 8A:
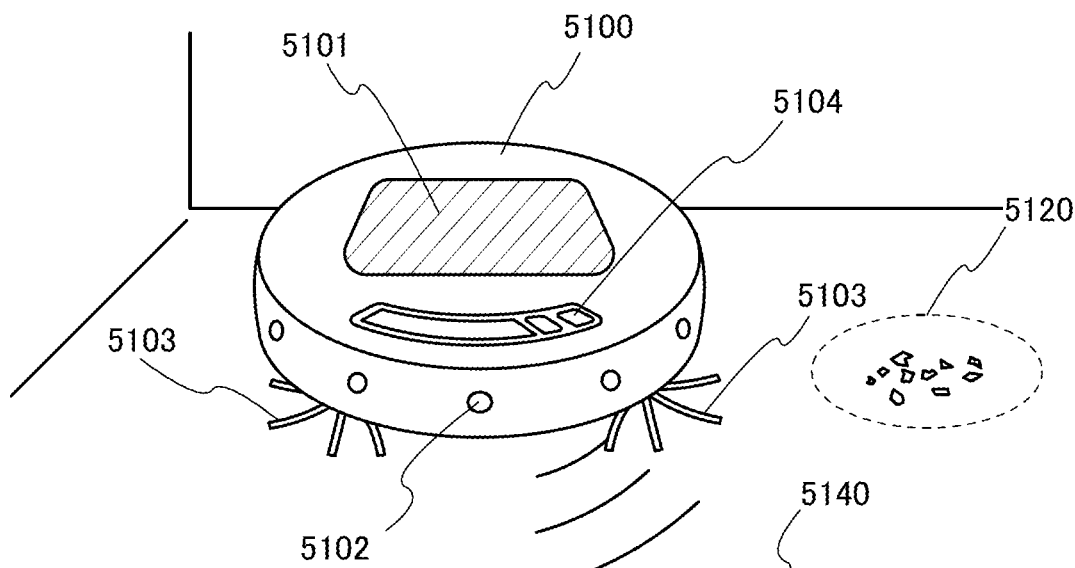
FIGS. 8A, 8B, and 8C illustrate electronic apparatuses.

FIG. 8A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic apparatus 5140 such as a smartphone. Images taken by the cameras 5102 can be displayed on the portable electronic apparatus 5140. Accordingly, an owner of the cleaning robot 5100 can monitor his/her room even when the owner is not at home. The owner can also check the display on the display 5101 by the portable electronic apparatus 5140 such as a smartphone.

The light-emitting apparatus of one embodiment of the present invention can be used for the display 5101.

Figure 8B:
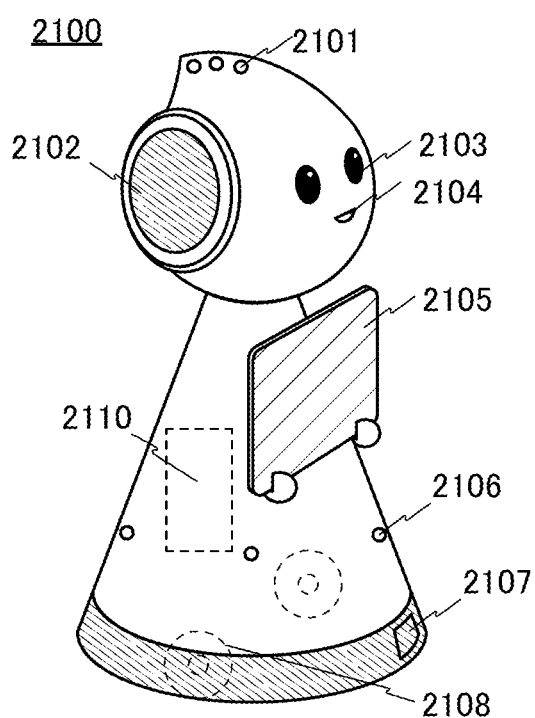

A robot 2100 illustrated in FIG. 8B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 8C:
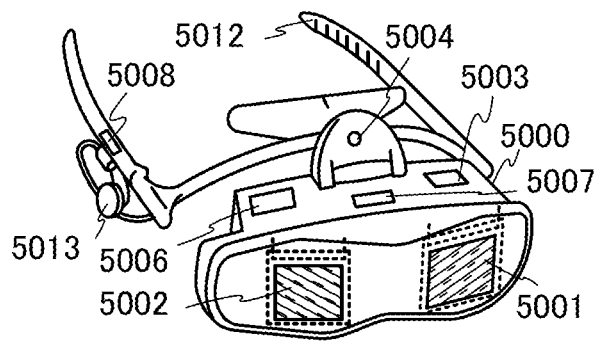

FIG. 8C shows an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 9:
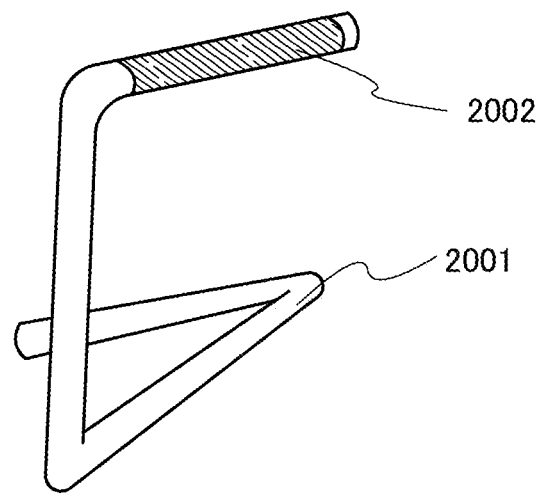
FIG. 9 illustrates a lighting device.

FIG. 9 shows an example in which the light-emitting device described in Embodiment 1 is used for a table lamp which is a lighting device. The table lamp illustrated in FIG. 9 includes a housing 2001 and a light source 2002, and the lighting device described in Embodiment 3 may be used for the light source 2002.

Figure 10:
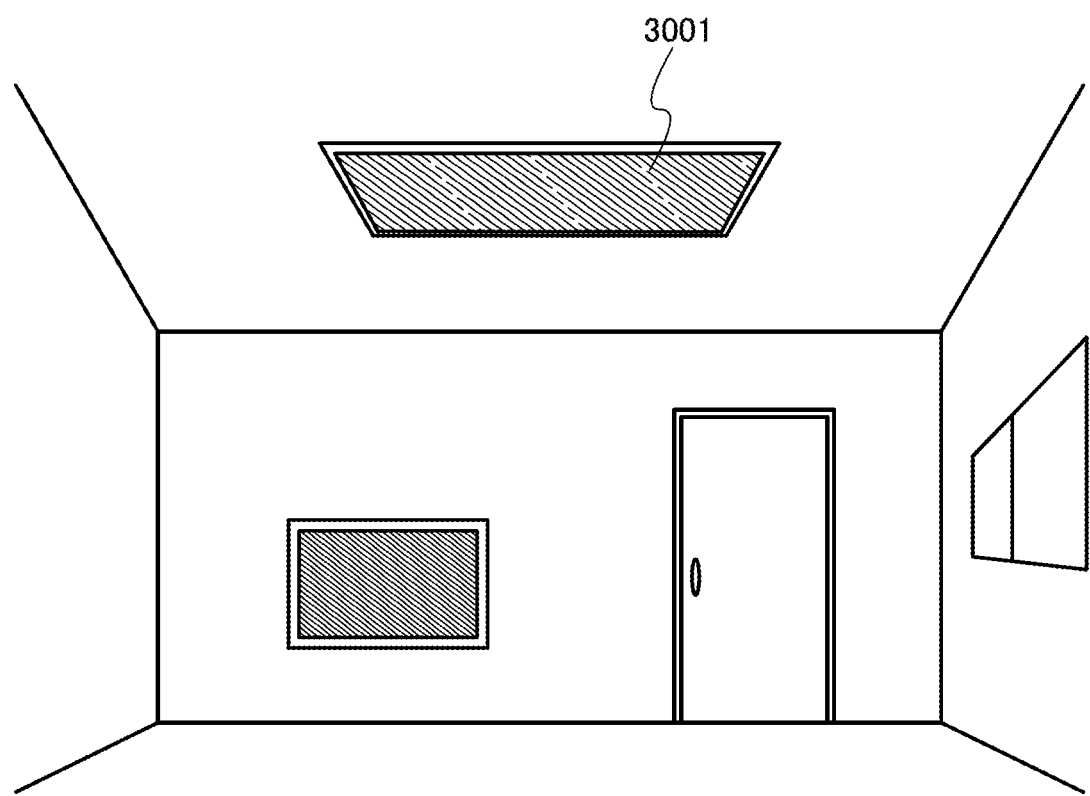
FIG. 10 illustrates a lighting device.

FIG. 10 shows an example in which the light-emitting device described in Embodiment 1 is used for an indoor lighting device 3001. Since the light-emitting device described in Embodiment 1 has high emission efficiency, the lighting device can have low power consumption. Furthermore, since the light-emitting device described in Embodiment 1 can have a large area, the light-emitting device can be used for a large-area lighting device. Furthermore, since the light-emitting device described in Embodiment 1 is thin, the light-emitting device can be used for a lighting device having a reduced thickness.

Figure 11:
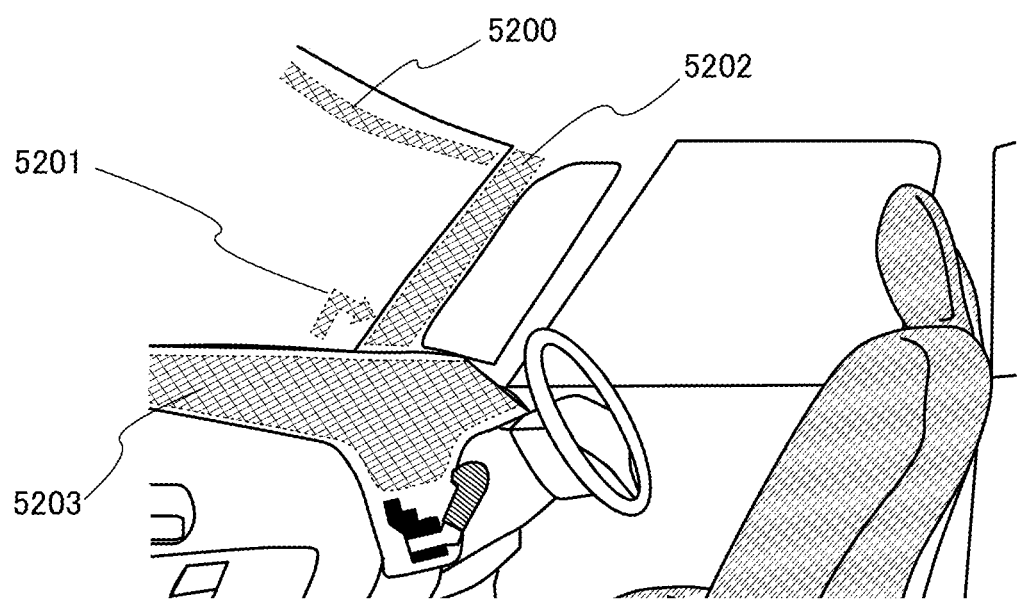
FIG. 11 illustrates in-vehicle display devices and lighting devices.

The light-emitting device described in Embodiment 1 can also be used for an automobile windshield, an automobile dashboard, or the like. FIG. 11 illustrates one mode in which the light-emitting devices described in Embodiment 1 are used for an automobile windshield and an automobile dashboard. Display regions 5200 to 5203 each include the light-emitting device described in Embodiment 1.

The display regions 5200 and 5201 are display devices which are provided in the automobile windshield and include the light-emitting device described in Embodiment 1. The light-emitting device described in Embodiment 1 can be formed into what is called a see-through display device, through which the opposite side can be seen, by including an anode and a cathode formed of light-transmitting electrodes. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

The display region 5202 is a display device which is provided in a pillar portion and includes the light-emitting device described in Embodiment 1. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Images that compensate for the areas which a driver cannot see enable the driver to ensure safety easily and comfortably.

The display region 5203 can provide a variety of kinds of information such as navigation data, a speedometer, a tachometer, air-condition setting, and the like. The content or layout of the display can be changed freely by a user as appropriate. Note that such information can also be displayed on the display regions 5200 to 5203. The display regions 5200 to 5203 can also be used as lighting devices.

Figure 12A:
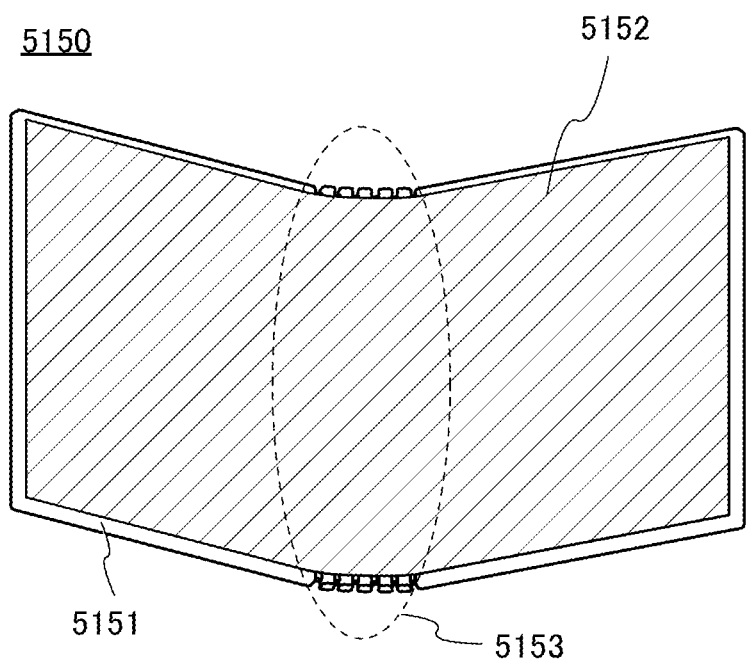
FIGS. 12A and 12B illustrate an electronic apparatus.
Figure 12B:
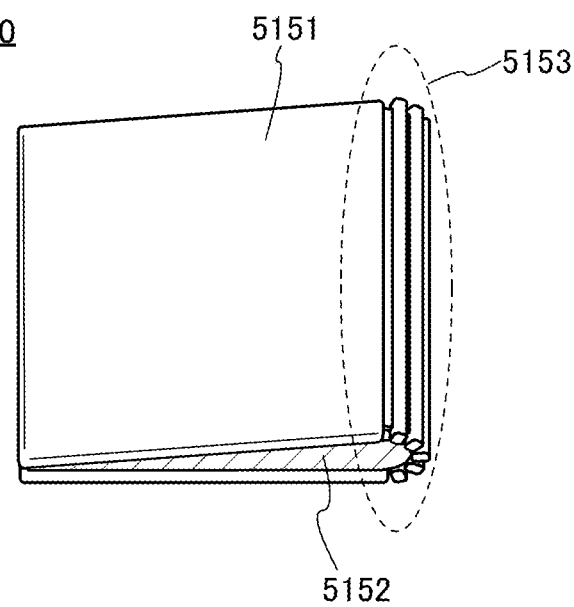

FIGS. 12A and 12B illustrate a foldable portable information terminal 5150. The foldable portable information terminal 5150 includes a housing 5151, a display region 5152, and a bend portion 5153. FIG. 12A illustrates the portable information terminal 5150 that is opened. FIG. 12B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members.

When the display region is folded, the flexible member expands and the bend portion 5153 has a radius of curvature greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 13A:
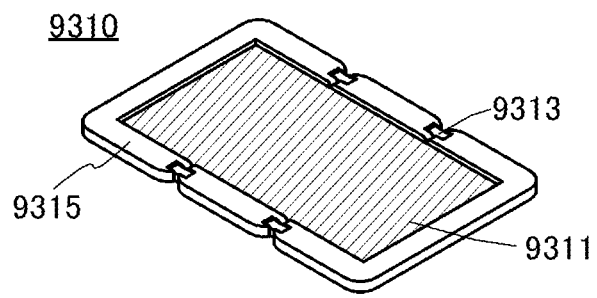
FIGS. 13A to 13C illustrate an electronic apparatus.
Figure 13B:
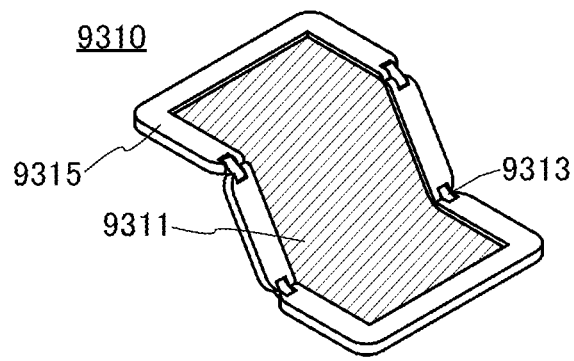
Figure 13C:
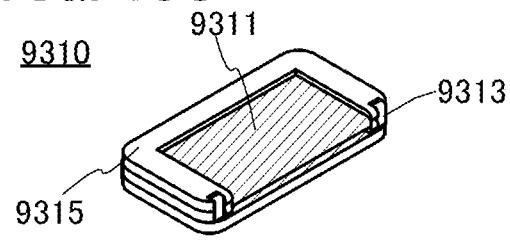

FIGS. 13A to 13C illustrate a foldable portable information terminal 9310. FIG. 13A illustrates the portable information terminal 9310 that is opened. FIG. 13B illustrates the portable information terminal 9310 that is being opened or being folded. FIG. 13C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Example 1

In this example, a light-emitting device 1 of one embodiment of the present invention and a comparative light-emitting device 1 are described. Structural formulae of organic compounds used in this example are shown below.

[Chemical Formula 16]

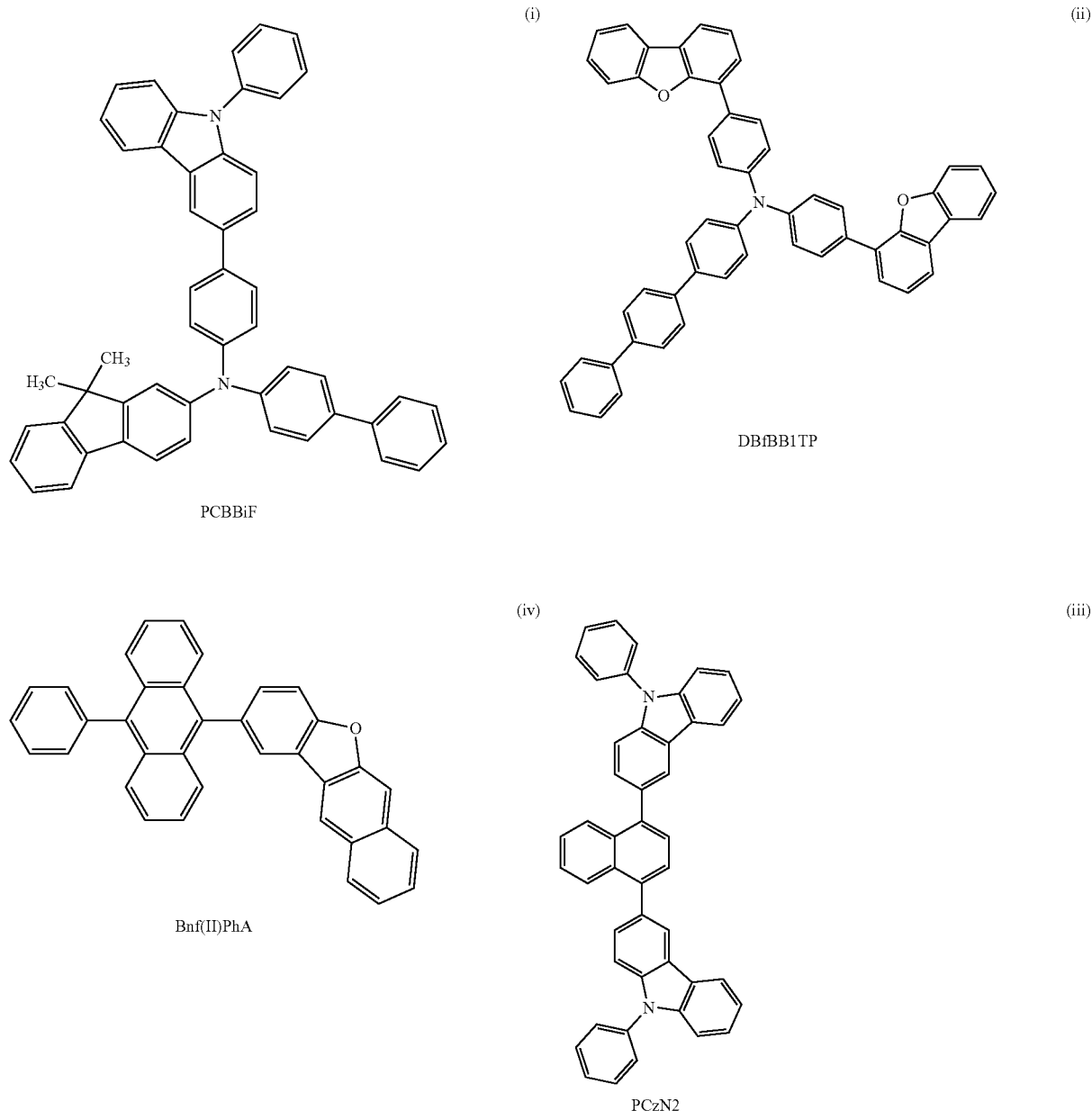

-continued
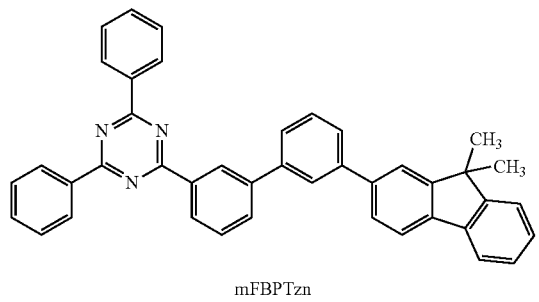
mFBPTzn (vi)
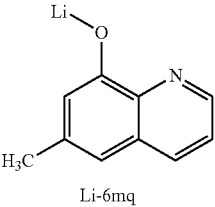
Li-6mq (vii)
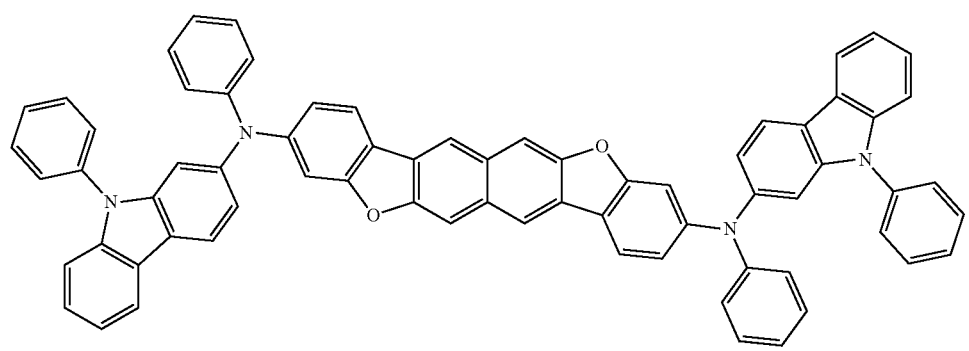
3,10PCA2Nbf(IV)-02 (v)
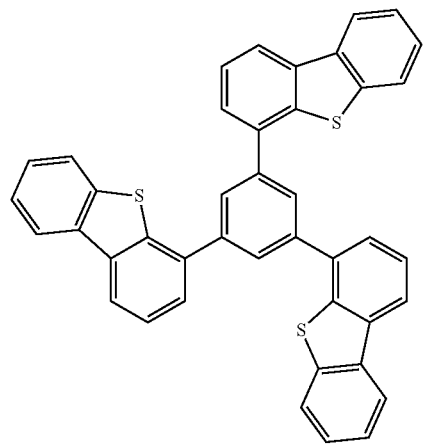
DBT3P-II (xi)
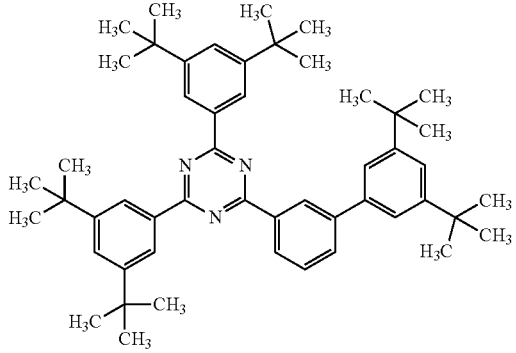
mmtBumBP-dmmtBuPTzn (x)
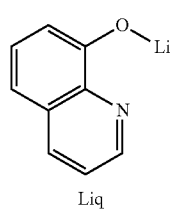
Liq (ix)
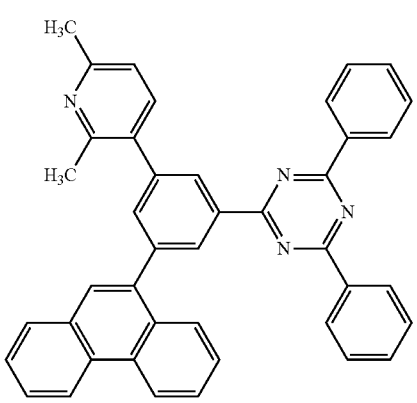
mPn-mDMePyPTzn (xix)

(Fabrication Method of Light-Emitting Device 1)

First, as a reflective electrode, an alloy film of silver (Ag), palladium (Pd), and copper (Cu), i.e., an Ag—Pd—Cu (APC) film, was formed over a glass substrate to a thickness of 100 nm by a sputtering method, and then, as a transparent electrode, indium tin oxide containing silicon oxide (ITSO) was formed to a thickness of 85 nm by a sputtering method, whereby the anode 101 was formed. The electrode area was set to 4 mm$^2$ (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately 10$^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by the above structural formula (i) and an electron acceptor material (OCHD-001) were deposited on the anode 101 to a thickness of 10 nm by co-evaporation such that the weight ratio of PCBBiF to OCHD-001 was 1:0.05, whereby the hole-injection layer 111 was formed.

Over the hole-injection layer 111, PCBBiF was deposited by evaporation to a thickness of 20 nm, and then N,N-bis[4-(dibenzofuran-4-yl)phenyl]-4-amino-p-terphenyl (abbreviation: DBfBB1TP) represented by the above structural formula (ii) was deposited by evaporation to a thickness of 10 nm, whereby the hole-transport layer 112 was formed.

Subsequently, over the hole-transport layer 112, 3,3'-(naphthalene-1,4-diyl)bis(9-phenyl-9H-carbazole) (abbreviation: PCzN2) represented by the above structural formula (iii) was deposited by evaporation to a thickness of 10 nm, whereby an electron-blocking layer was formed.

Then, 2-(10-phenyl-9-anthracenyl)-benzo[b]naphtho[2,3-d]furan (abbreviation: Bnf(II)PhA) represented by the above structural formula (iv) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the above structural formula (v) were deposited to a thickness of 25 nm by co-evaporation such that the weight ratio of Bnf(II)PhA to 3,10PCA2Nbf(IV)-02 was 1:0.015, whereby the light-emitting layer 113 was formed.

After that, 2-{(3',5'-di-tert-butyl)-1,1'-biphenyl-3-yl}-4,6-bis(3,5-di-tert-butylphenyl)-1,3,5-triazine (abbreviation: mmtBumBP-dmmtBuPTzn) represented by the above structural formula (x) was deposited by evaporation to a thickness of 10 nm, whereby a hole-blocking layer was formed. Then, mmtBumBP-dmmtBuPTzn and 6-methyl-8-quinolinolato-lithium (abbreviation: Li-6mq) represented by the above structural formula (vii) were deposited to a thickness of 20 nm by co-evaporation such that the weight ratio of mmtBumBP-dmmtBuPTzn to Li-6mq was 1:1, whereby the electron-transport layer 114 was formed.

After the electron-transport layer 114 was formed, Li-6mq was deposited to a thickness of 1 nm to form the electron-injection layer 115, and lastly silver (Ag) and magnesium (Mg) were deposited to a thickness of 15 nm by co-evaporation such that the volume ratio of Ag to Mg was 1:0.1 to form the cathode 102, whereby the light-emitting device 1 was fabricated. The cathode 102 is a transflective electrode having a function of reflecting light and a function of transmitting light; thus, the light-emitting device of this example is a top emission device in which light is extracted through the cathode 102. Over the cathode 102, 1,3,5-tri(dibenzothiophen-4-yl)-benzene (abbreviation: DBT3P-II) represented by the above structural formula (xi) was deposited to a thickness of 70 nm by evaporation so that light extraction efficiency can be improved.

(Fabrication Method of Comparative Light-Emitting Device 1)

The comparative light-emitting device 1 was fabricated in a manner similar to that for the light-emitting device 1 except that the film thickness of PCBBiF used in the hole-transport layer 112 of the light-emitting device 1 was changed to 15 nm, mmtBumBP-dmmtBuPTzn used in the hole-blocking layer was replaced with 2-[3'-(9,9-dimethyl-9H-fluoren-2-yl)-1,1'-biphenyl-3-yl]-4,6-diphenyl-1,3,5-triazine (abbreviation: mFBPTzn) represented by the above structural formula (vi), mmtBumBP-dmmtBuPTzn used in the electron-transport layer 114 was replaced with 2-[3-(2,6-dimethyl-3-pyridinyl)-5-(9-phenanthrenyl)phenyl]-4,6-diphenyl-1,3,5-triazine (abbreviation: mPn-mDMePyPTzn) represented by the above structural formula (xix), and Li-6mq used in the electron-transport layer 114 and the electron-injection layer 115 was replaced with 8-quinolinolato-lithium (abbreviation: Liq) represented by the above structural formula (ix). Note that the thickness of the hole-transport layer was adjusted so that the devices have the same chromaticity.

The structures of the light-emitting device 1 and the comparative light-emitting device 1 are listed in the following table.

TABLE 1

|  | film thickness | Light-emitting device 1 | Comparative light-emitting device 1 |
| --- | --- | --- | --- |
| electron-injection layer | 1 nm | Li-6mq | Liq |
| electron-transport layer | 20 nm | mmtBumBP-dmmtBuPTzn:Li-6mq (1:1) | mPn-mDMePyPTzn:Liq (1:1) |
| hole-blocking layer | 10 nm | mmtBumBP-dmmtBuPTzn | mFBPTzn |
| light-emitting layer | 25 nm | Bnf(II)PhA:3,10PCA2Nbf (IV)-02 (1:0.015) | |

TABLE 1-continued

|  | film thickness | Light-emitting device 1 | Comparative light-emitting device 1 |
|---|---|---|---|
| electron-blocking layer | 10 nm | PCzN2 | |
| hole-transport layer | 10 nm | DBfBB1TP | |
|  | *1 | PCBBiF | |
| hole-injection layer | 10 nm | PCBBiF:OCHD-001 (1:0.05) | |

*1 Light-emitting device 1:20 nm, Comparative light-emitting device 1:15 nm

Figure 14:
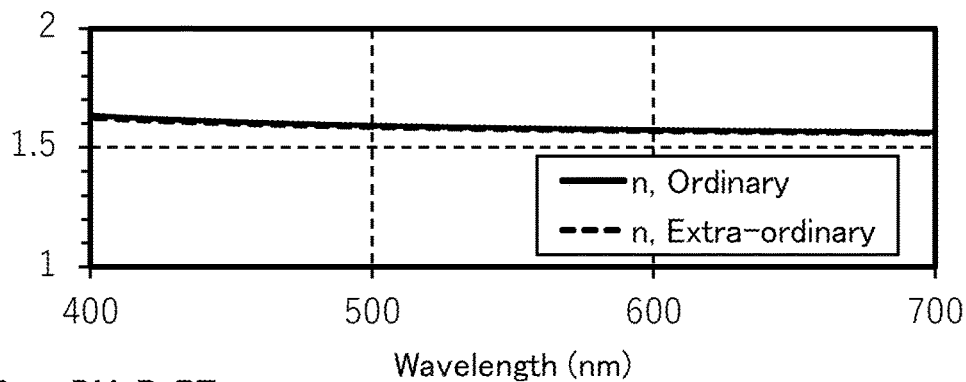
FIG. 14 shows the measurement data of the refractive indices of mmtBumBP-dmmtBuPTzn, mPn-mDMePyPTzn, Li-6mq, and Liq.
Figure 14:
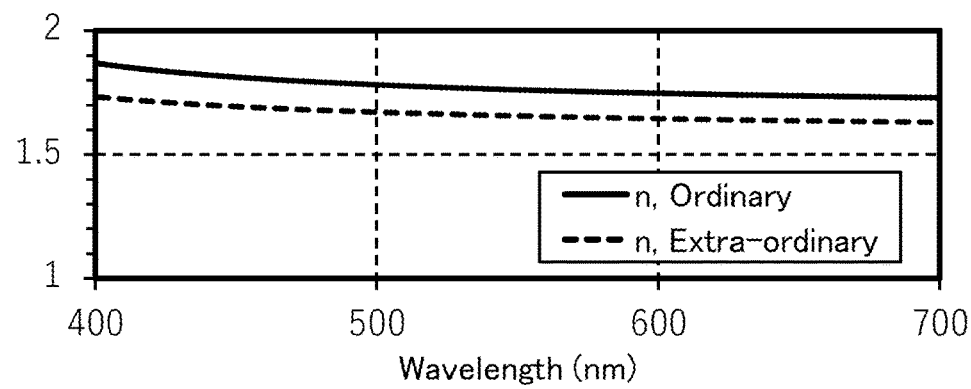
Figure 14:
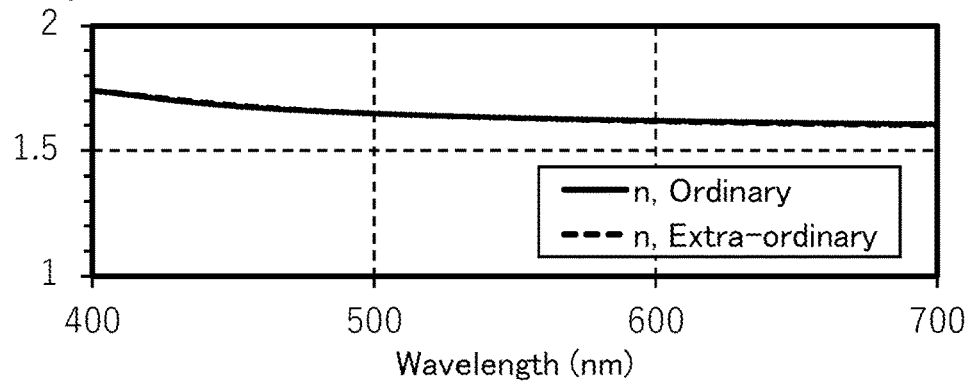
Figure 14:
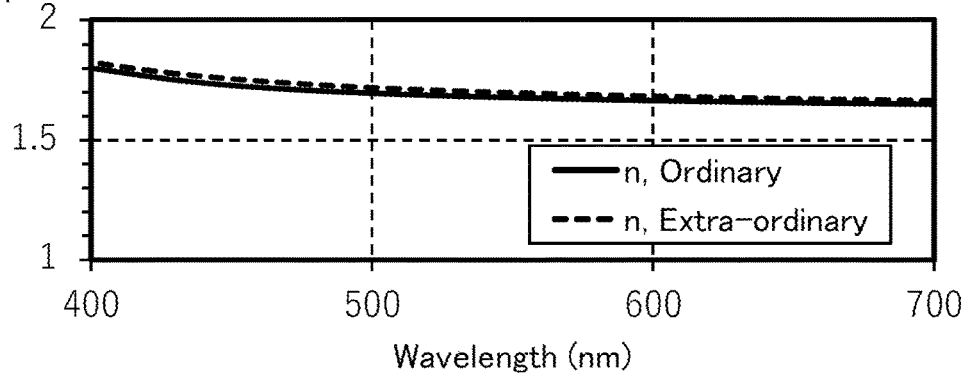

FIG. 14 shows the refractive indices of mmtBumBP-dmmtBuPTzn, mPn-mDMePyPTzn, Li-6mq, and Liq, and Table 2 shows the refractive indices thereof at 456 nm. The measurement was performed with a spectroscopic ellipsometer (M-2000U, produced by J. A. Woollam Japan Corp.). To obtain films used as measurement samples, the material for each layer was deposited to a thickness of approximately 50 nm over a quartz substrate by a vacuum evaporation method. Note that FIG. 14 shows the refractive index of an ordinary ray (n, Ordinary), and the refractive index of an extraordinary ray (n, Extra-ordinary).

FIG. 14 indicates that the ordinary refractive index of mmtBumBP-dmmtBuPTzn in the whole blue emission region (455 nm to 465 nm) is greater than or equal to 1.60 and less than or equal to 1.61, which is in the range of 1.50 to 1.75. In addition, the ordinary refractive index of mmtBumBP-dmmtBuPTzn at a wavelength of 633 nm is 1.57, which is in the range of 1.45 to 1.70, suggesting that mmtBumBP-dmmtBuPTzn is a material with a low refractive index. The ordinary refractive index of Li-6mq in the whole blue emission region (455 nm to 465 nm) is less than or equal to 1.67, which is in the range of 1.45 to 1.70. In addition, the ordinary refractive index of Li-6mq at a wavelength of 633 nm is 1.61, which is in the range of 1.40 to 1.65, suggesting that Li-6mq is a material with a low refractive index.

The above indicates that in the light-emitting device 1, the ordinary refractive index of the electron-transport layer 114 is in the range greater than or equal to 1.50 and less than 1.75 in the whole blue emission region (455 nm to 465 nm) and in the range greater than or equal to 1.45 and less than 1.70 at a wavelength of 633 nm.

TABLE 2

|  | ordinary refractive index (n, Ordinary) @456 nm |
|---|---|
| mmtBumBP-dmmtBuPTzn | 1.61 |
| mPn-mDMePyPTzn | 1.81 |
| Li-6mq | 1.67 |
| Liq | 1.72 |

The light-emitting device 1 and the comparative light-emitting device 1 were sealed using a glass substrate in a glove box containing a nitrogen atmosphere so as not to be exposed to the air. Specifically, a UV curable sealing material was applied to surround the elements, only the UV curable sealing material was irradiated with UV while the light-emitting devices were prevented from being irradiated with the UV, and heat treatment was performed at 80° C. under an atmospheric pressure for one hour. Then, the initial characteristics of the light-emitting devices were measured. Note that the sealed glass substrate was not subjected to particular treatment for improving light extraction efficiency.

Figure 15:
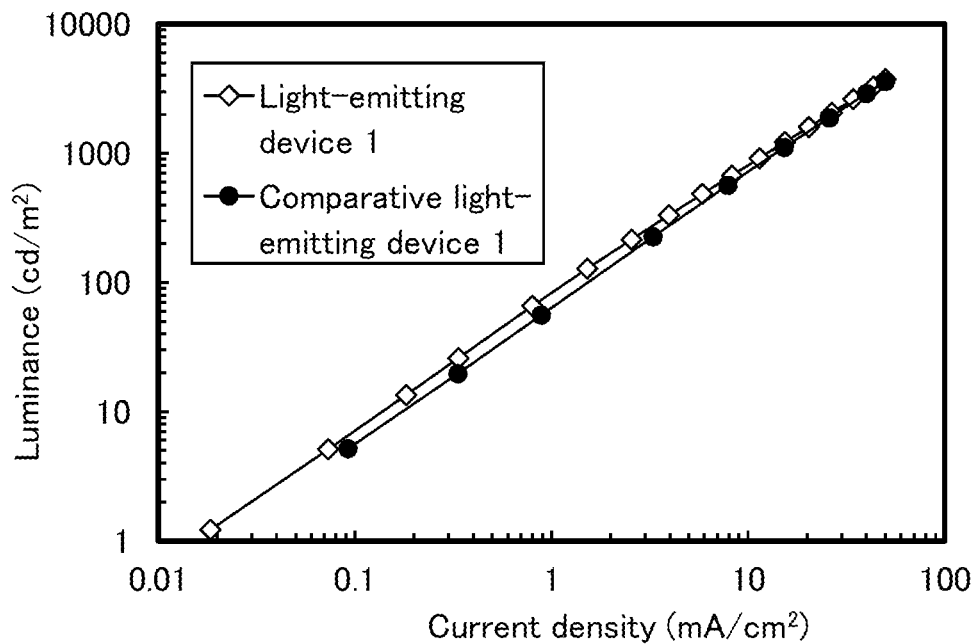
FIG. 15 shows the luminance-current density characteristics of a light-emitting device 1 and a comparative light-emitting device 1.
Figure 16:
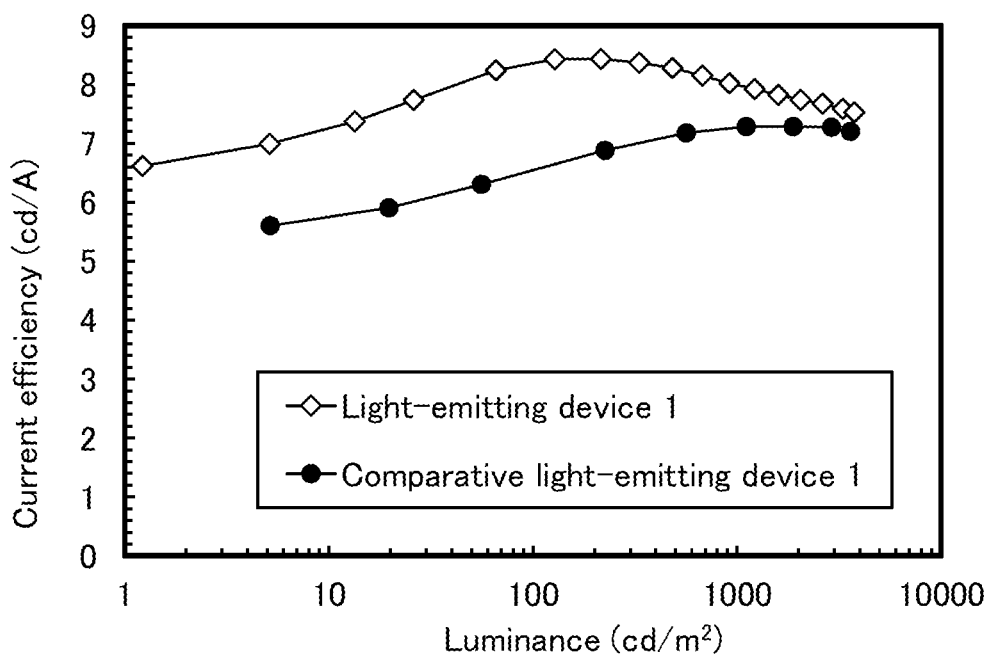
FIG. 16 shows the current efficiency-luminance characteristics of the light-emitting device 1 and the comparative light-emitting device 1.
Figure 17:
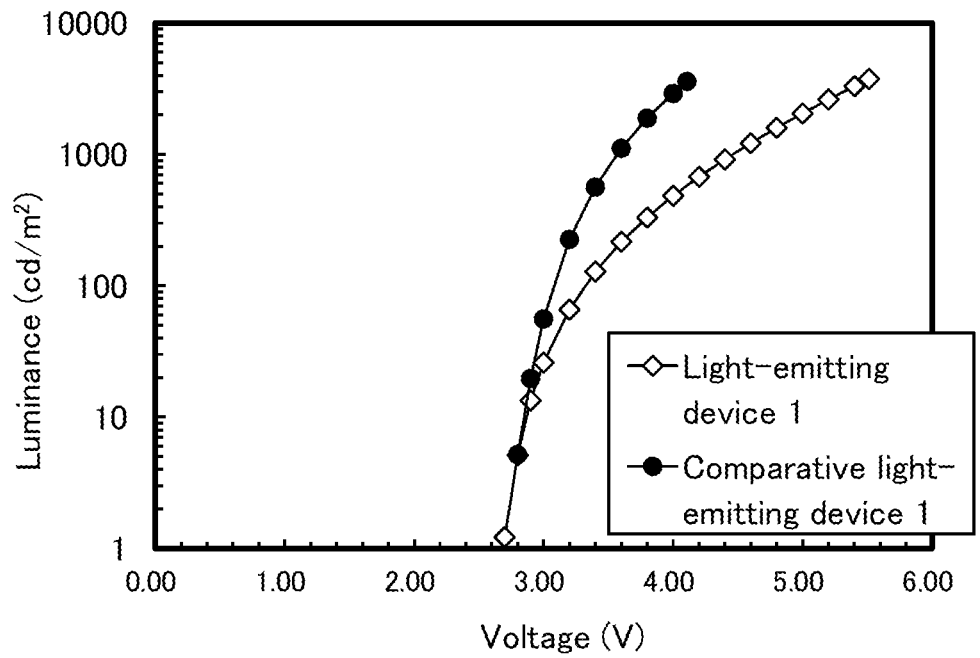
FIG. 17 shows the luminance-voltage characteristics of the light-emitting device 1 and the comparative light-emitting device 1.
Figure 18:
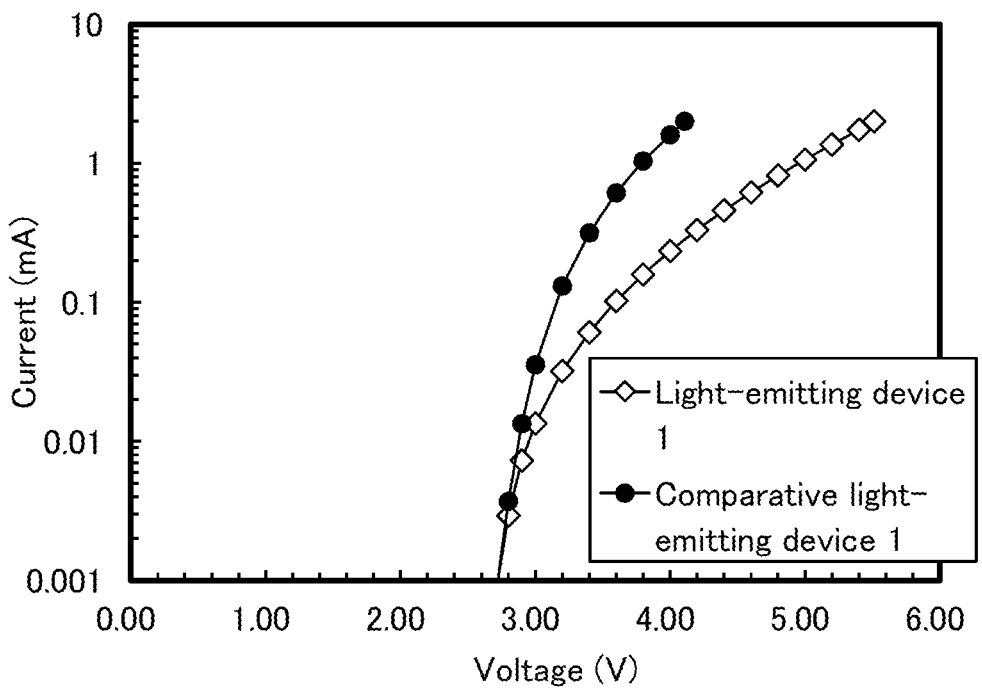
FIG. 18 shows the current-voltage characteristics of the light-emitting device 1 and the comparative light-emitting device 1.
Figure 19:
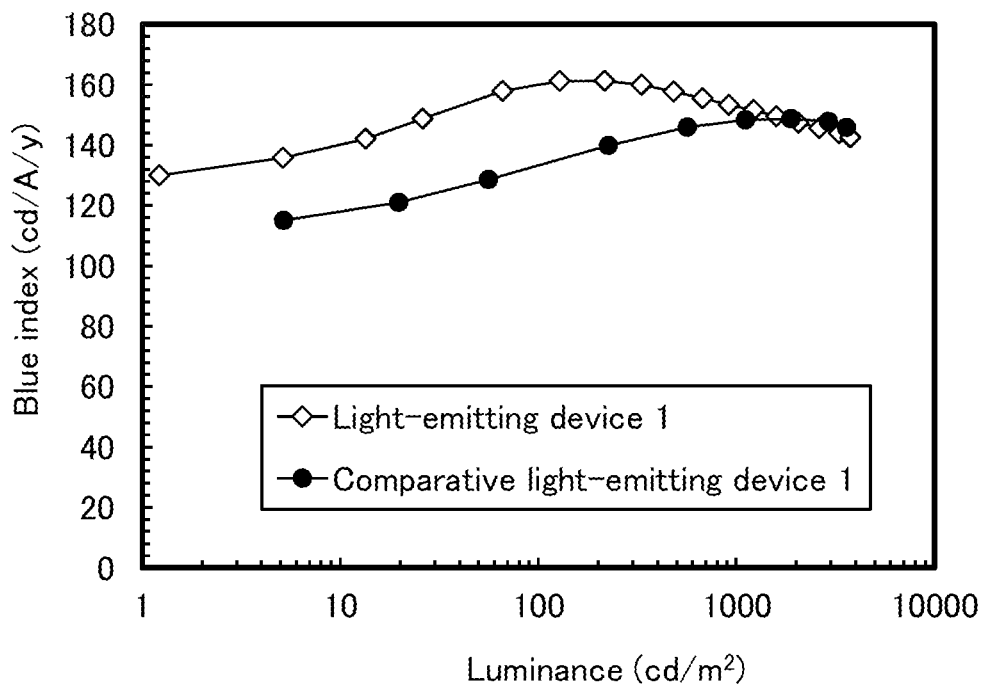
FIG. 19 shows the blue index-luminance characteristics of the light-emitting device 1 and the comparative light-emitting device 1.
Figure 20:
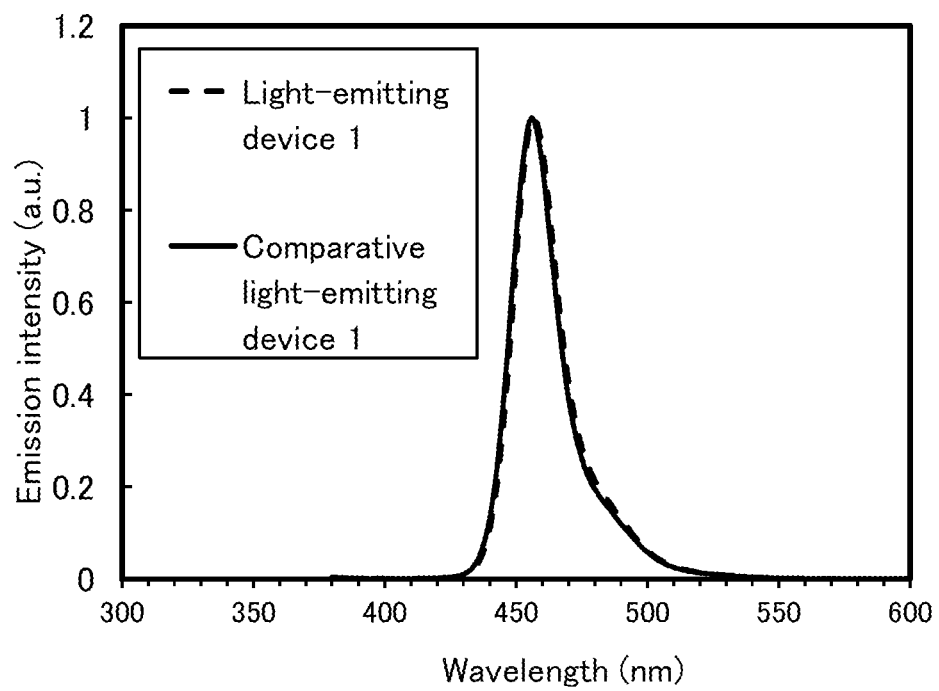
FIG. 20 shows the emission spectra of the light-emitting device 1 and the comparative light-emitting device 1.

FIG. 15 shows the luminance-current density characteristics of the light-emitting device 1 and the comparative light-emitting device 1. FIG. 16 shows the current efficiency-luminance characteristics thereof. FIG. 17 shows the luminance-voltage characteristics thereof. FIG. 18 shows the current-voltage characteristics thereof. FIG. 19 shows the blue index-luminance characteristics thereof. FIG. 20 shows the emission spectra thereof. Table 3 shows the main characteristics of the light-emitting device 1 and the comparative light-emitting device 1 at a luminance of about 1000 cd/m$^2$. Luminance, CIE chromaticity, and emission spectra were measured at normal temperature with a spectroradiometer (SR-UL1R manufactured by TOPCON TECHNOHOUSE CORPORATION).

Note that the blue index (BI) is a value obtained by dividing current efficiency (cd/A) by chromaticity y (cd/A/y), and is one of the indicators of characteristics of blue light emission. As the chromaticity y is smaller, the color purity of blue light emission tends to be higher. With high color purity, a wide range of blue can be expressed even with a small number of luminance components; thus, using blue light emission with high color purity reduces the luminance needed for expressing blue, leading to lower power consumption. Thus, BI that is based on chromaticity y, which is one of the indicators of color purity of blue, is suitably used as a mean for showing efficiency of blue light emission. The light-emitting device with higher BI can be regarded as a blue light emitting device having more favorable characteristics for a display.

TABLE 3

|  | voltage (V) | current (mA) | current density (mA/cm$^2$) | chromaticity x | chromaticity y | current efficiency (cd/A) | BI (cd/A/y) |
|---|---|---|---|---|---|---|---|
| Light-emitting device 1 | 4.4 | 0.46 | 11.4 | 0.14 | 0.05 | 8.0 | 153 |
| Comparative light-emitting device 1 | 3.6 | 0.61 | 15.3 | 0.14 | 0.05 | 7.3 | 148 |

FIGS. 15 to 20 and Table 3 show that the light-emitting device 1 of one embodiment of the present invention, which uses a material with a low refractive index, is an EL device that has more favorable current efficiency than the comparative light-emitting device 1 while exhibiting almost the same emission spectrum as that of the comparative light-emitting device 1.

The blue index (BI) of the light-emitting device 1 and the blue index (BI) of the comparative light-emitting device 1 at a luminance of about 1000 cd/m$^2$ are 153 (cd/A/y) and 148 (cd/A/y), respectively, and the maximum BI of the light-emitting device 1 and the maximum BI of the comparative light-emitting device 1 are 161 (cd/A/y) and 149 (cd/A/y), respectively. This suggests that the light-emitting device 1 is a light-emitting device particularly with favorable BI. Hence, one embodiment of the present invention is suitable for the light-emitting device used in a display.

Example 2

In this example, a light-emitting device 2 of one embodiment of the present invention and a comparative light-emitting device 2 are described. Structural formulae of organic compounds used in this example are shown below.

[Chemical Formula 17]

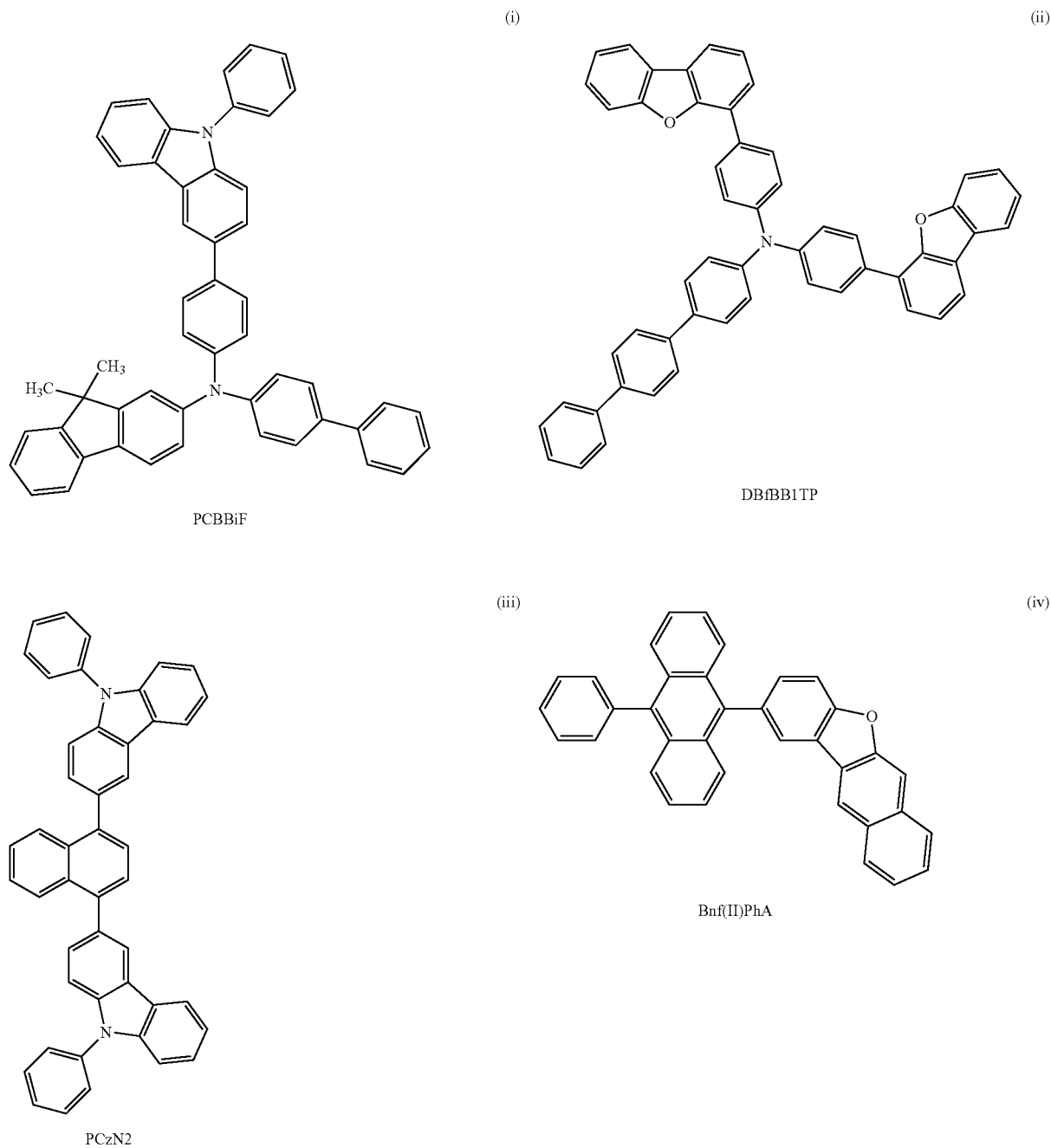

-continued

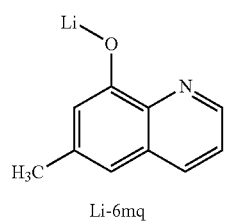
Li-6mq
(vii)

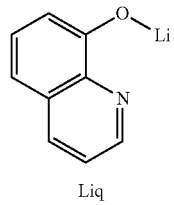
Liq
(ix)

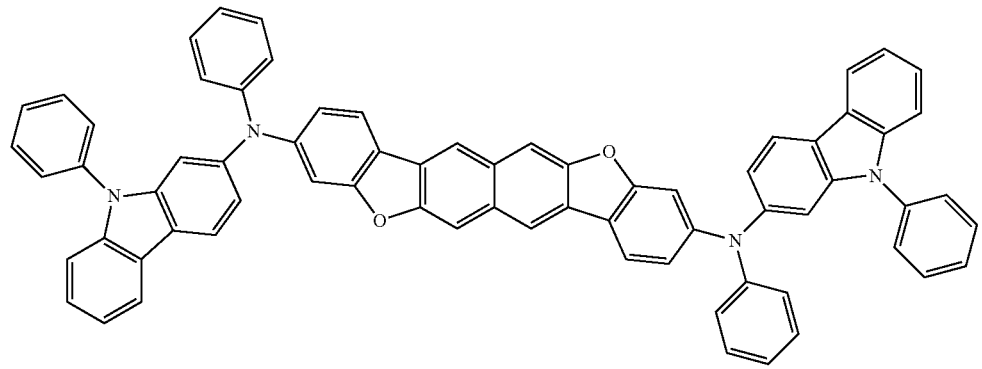
3,10PCA2Nbf(IV)-02
(v)

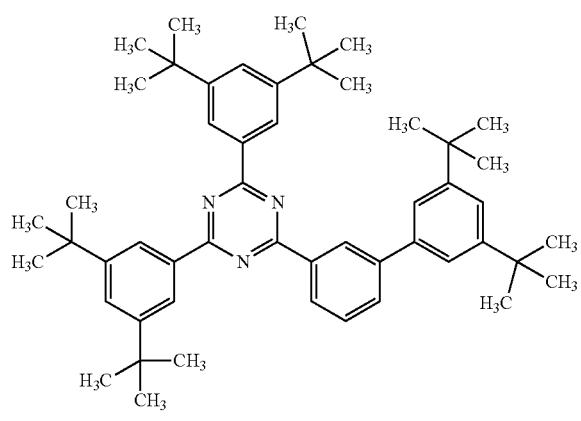
mmtBumBP-dmmtBuPTzn
(x)

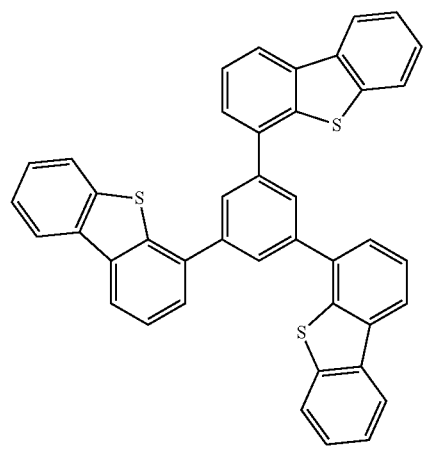
(xi) DBT3P-II
(xi)

(Fabrication Method of Light-Emitting Device 2)

First, as a reflective electrode, an alloy film of silver (Ag), palladium (Pd), and copper (Cu), i.e., an Ag—Pd—Cu (APC) film, was formed over a glass substrate to a thickness of 100 nm by a sputtering method, and then, as a transparent electrode, indium tin oxide containing silicon oxide (ITSO) was formed to a thickness of 10 nm by a sputtering method, whereby the anode 101 was formed. The electrode area was set to 4 mm$^2$ (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately 10$^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by the above structural formula (i) and an electron acceptor material (OCHD-001) were deposited on the anode 101 to a thickness of 10 nm by co-evaporation such that the weight ratio of PCBBiF to OCHD-001 was 1:0.05, whereby the hole-injection layer 111 was formed.

Over the hole-injection layer 111, PCBBiF was deposited by evaporation to a thickness of 105 nm, and then N,N-bis[4-(dibenzofuran-4-yl)phenyl]-4-amino-p-terphenyl (abbreviation: DBfBB1TP) represented by the above structural formula (ii) was deposited by evaporation to a thickness of 10 nm, whereby the hole-transport layer 112 was formed.

Subsequently, over the hole-transport layer 112, 3,3'-(naphthalene-1,4-diyl)bis(9-phenyl-9H-carbazole) (abbreviation: PCzN2) represented by the above structural formula (iii) was deposited by evaporation to a thickness of 10 nm, whereby an electron-blocking layer was formed.

Then, 2-(10-phenyl-9-anthracenyl)-benzo[b]naphtho[2,3-d]furan (abbreviation: Bnf(II)PhA) represented by the above structural formula (iv) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the above structural formula (v) were deposited to a thickness of 25 nm by co-evaporation such that the weight ratio of Bnf(II)PhA to 3,10PCA2Nbf(IV)-02 was 1:0.015, whereby the light-emitting layer 113 was formed.

After that, 2-{(3',5'-di-tert-butyl)-1,1'-biphenyl-3-yl}-4,6-bis(3,5-di-tert-butylphenyl)-1,3,5-triazine (abbreviation: mmtBumBP-dmmtBuPTzn) represented by the above structural formula (x) was deposited by evaporation to a thickness of 10 nm, whereby a hole-blocking layer was formed. Then, mmtBumBP-dmmtBuPTzn and 6-methyl-8-quinolinolato-lithium (abbreviation: Li-6mq) represented by the above structural formula (vii) were deposited to a thickness of 20 nm by co-evaporation such that the weight ratio of mmtBumBP-dmmtBuPTzn to Li-6mq was 1:1, whereby the electron-transport layer 114 was formed.

After the electron-transport layer 114 was formed, Li-6mq was deposited to a thickness of 1 nm to form the electron-injection layer 115, and lastly silver (Ag) and magnesium (Mg) were deposited to a thickness of 15 nm by co-evaporation such that the volume ratio of Ag to Mg was 1:0.1 to form the cathode 102, whereby the light-emitting device 2 was fabricated. The cathode 102 is a transflective electrode having a function of reflecting light and a function of transmitting light; thus, the light-emitting device of this example is a top emission device in which light is extracted through the cathode 102. Over the cathode 102, 1,3,5-tri(dibenzothiophen-4-yl)-benzene (abbreviation: DBT3P-II) represented by the above structural formula (xi) was deposited to a thickness of 70 nm by evaporation so that light extraction efficiency can be improved.

(Fabrication Method of Comparative Light-Emitting Device 2)

The comparative light-emitting device 2 was fabricated in a manner similar to that for the light-emitting device 2 except that Li-6mq used in the electron-transport layer 114 and the electron-injection layer 115 was replaced with 8-quinolinolato-lithium (abbreviation: Liq) represented by the above structural formula (ix), and the thickness of PCBBiF in the hole-transport layer 112 was changed to 100 nm. Note that the thickness of the hole-transport layer was adjusted so that the devices have the same chromaticity.

The structures of the light-emitting device 2 and the comparative light-emitting device 2 are listed in the following table.

TABLE 4

| | film thickness | Light-emitting device 2 | Comparative light-emitting device 2 |
|---|---|---|---|
| electron-injection layer | 1 nm | Li-6mq | Liq |
| electron-transport layer | 20 nm | mmtBumBP-dmmtBuPTzn:Li-6mq (1:1) | mmtBumBP-dmmtBuPTzn:Liq (1:1) |
| hole-blocking layer | 10 nm | mmtBumBP-dmmtBuPTzn | |
| light-emitting layer | 25 nm | Bnf(II)PhA:3,10PCA2Nbf(IV)-02 (1:0.015) | |
| electron-blocking layer | 10 nm | PCzN2 | |
| hole-transport layer | 10 nm | DBfBB1TP | |
| | *2 | PCBBiF | |
| hole-injection layer | 10 nm | PCBBiF:OCHD-001 (1:0.05) | |

*2 Light-emitting device 2:105 nm, Comparative light-emitting device 2:100 nm

Figure 21:
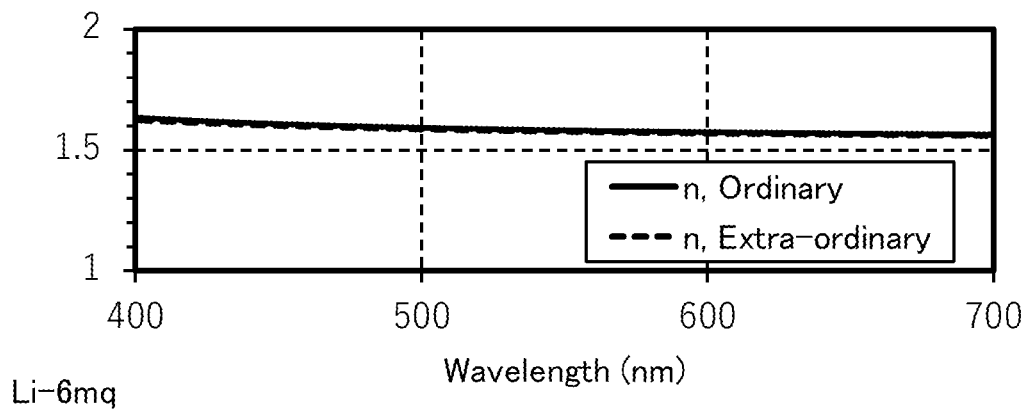
FIG. 21 shows the measurement data of the refractive indices of mmtBumBP-dmmtBuPTzn, Li-6mq, and Liq.
Figure 21:
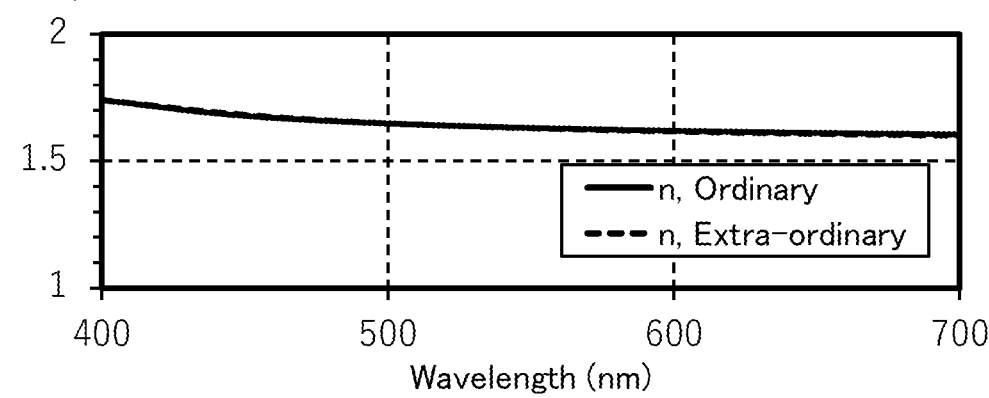
Figure 21:
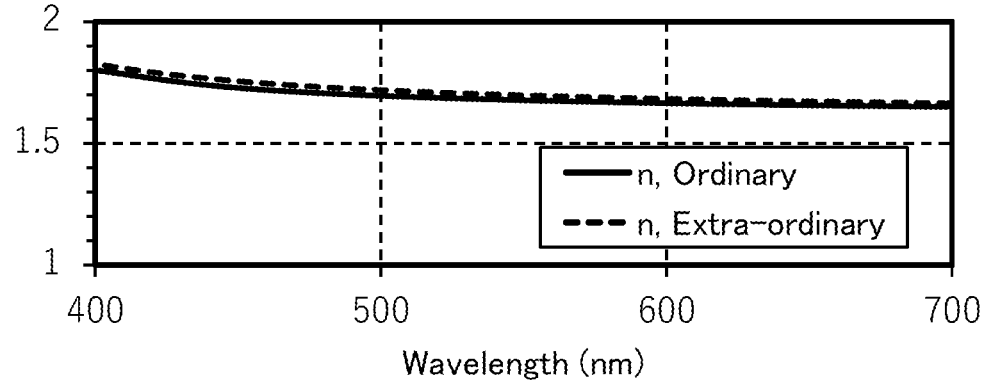

FIG. 21 shows the refractive indices of mmtBumBP-dmmtBuPTzn, Li-6mq, and Liq, and Table 5 shows the refractive indices thereof at 456 nm. The measurement was performed with a spectroscopic ellipsometer (M-2000U, produced by J. A. Woollam Japan Corp.). To obtain films used as measurement samples, the material for each layer was deposited to a thickness of approximately 50 nm over a quartz substrate by a vacuum evaporation method. Note that FIG. 21 shows the refractive index of an ordinary ray (n, Ordinary), and the refractive index of an extraordinary ray (n, Extra-ordinary).

FIG. 21 indicates that the ordinary refractive index of mmtBumBP-dmmtBuPTzn in the whole blue emission region (455 nm to 465 nm) is greater than or equal to 1.60 and less than or equal to 1.61, which is in the range of 1.50 to 1.75. In addition, the ordinary refractive index of mmtBumBP-dmmtBuPTzn at a wavelength of 633 nm is 1.57, which is in the range of 1.45 to 1.70, suggesting that mmtBumBP-dmmtBuPTzn is a material with a low refractive index. The ordinary refractive index of Li-6mq in the whole blue emission region (455 nm to 465 nm) is less than or equal to 1.67, which is in the range of 1.45 to 1.70. In addition, the ordinary refractive index of Li-6mq at a wavelength of 633 nm is 1.61, which is in the range of 1.40 to 1.65, suggesting that Li-6mq is a material with a low refractive index.

The above indicates that in the light-emitting device 2, the ordinary refractive index of the electron-transport layer 114 is in the range greater than or equal to 1.50 and less than 1.75 in the whole blue emission region (455 nm to 465 nm) and in the range greater than or equal to 1.45 and less than 1.70 at a wavelength of 633 nm.

TABLE 5

| | ordinary refractive index (n, Ordinary) @456 nm |
|---|---|
| mmtBumBP-dmmtBuPTzn | 1.61 |
| Li-6mq | 1.67 |
| Liq | 1.72 |

The light-emitting device 2 and the comparative light-emitting device 2 were sealed using a glass substrate in a glove box containing a nitrogen atmosphere so as not to be exposed to the air. Specifically, a UV curable sealing material was applied to surround the elements, only the UV curable sealing material was irradiated with UV while the light-emitting devices were prevented from being irradiated with the UV, and heat treatment was performed at 80° C. under an atmospheric pressure for one hour. Then, the initial characteristics of the light-emitting devices were measured. Note that the sealed glass substrate was not subjected to particular treatment for improving light extraction efficiency.

Figure 22:
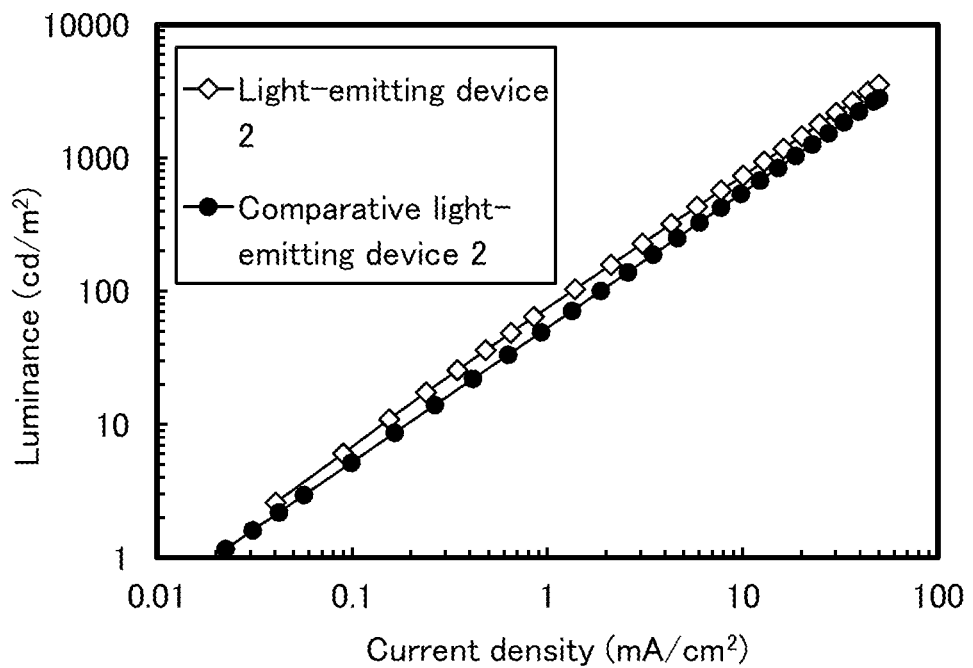
FIG. 22 shows the luminance-current density characteristics of a light-emitting device 2 and a comparative light-emitting device 2.
Figure 23:
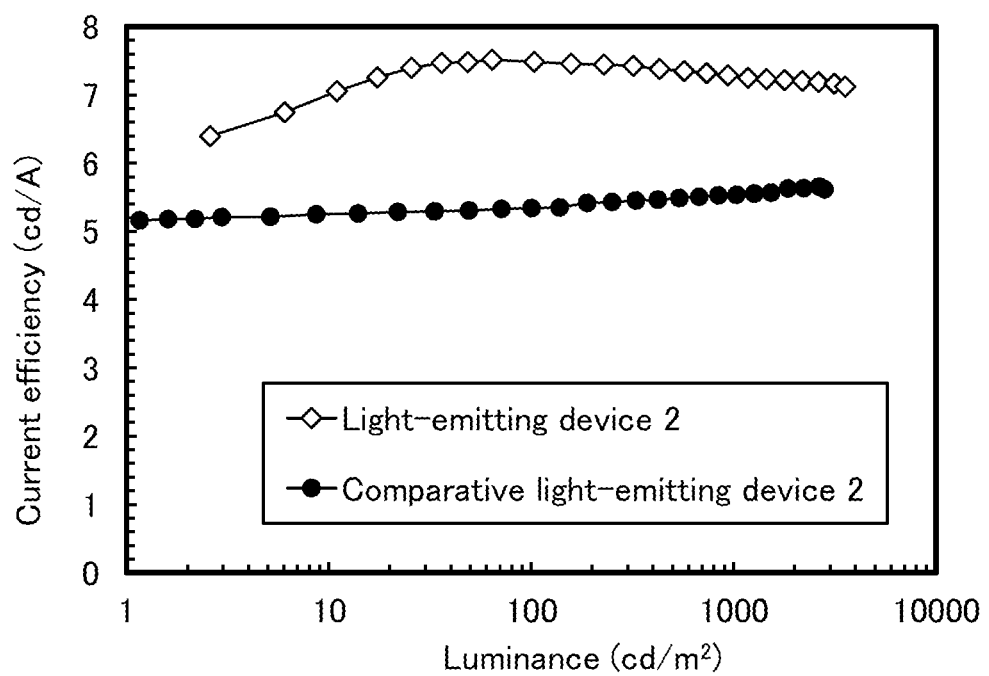
FIG. 23 shows the current efficiency-luminance characteristics of the light-emitting device 2 and the comparative light-emitting device 2.
Figure 24:
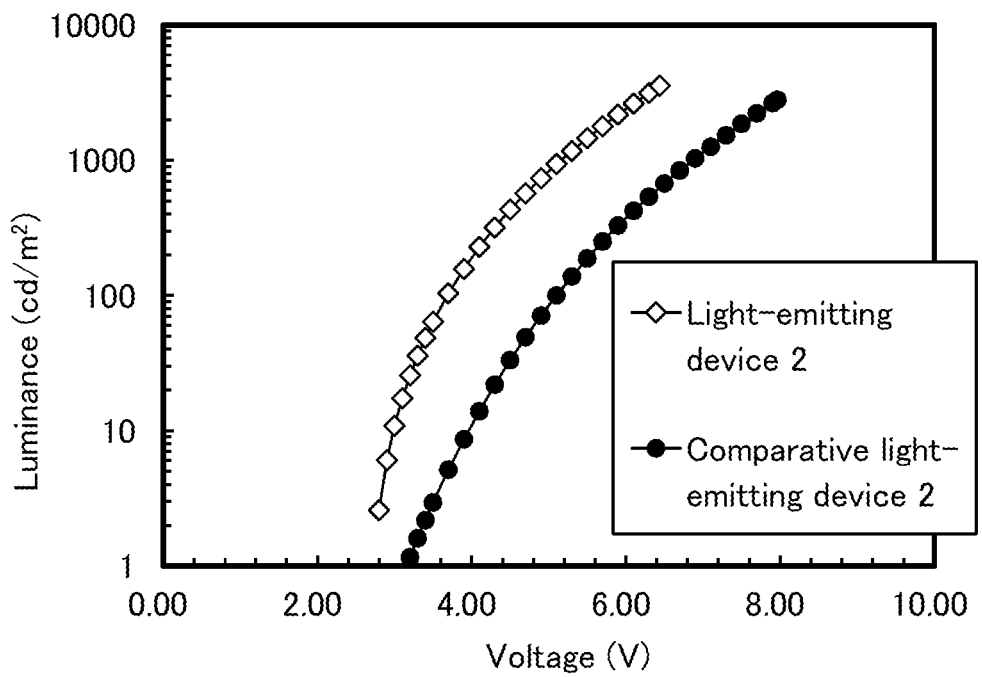
FIG. 24 shows the luminance-voltage characteristics of the light-emitting device 2 and the comparative light-emitting device 2.
Figure 25:
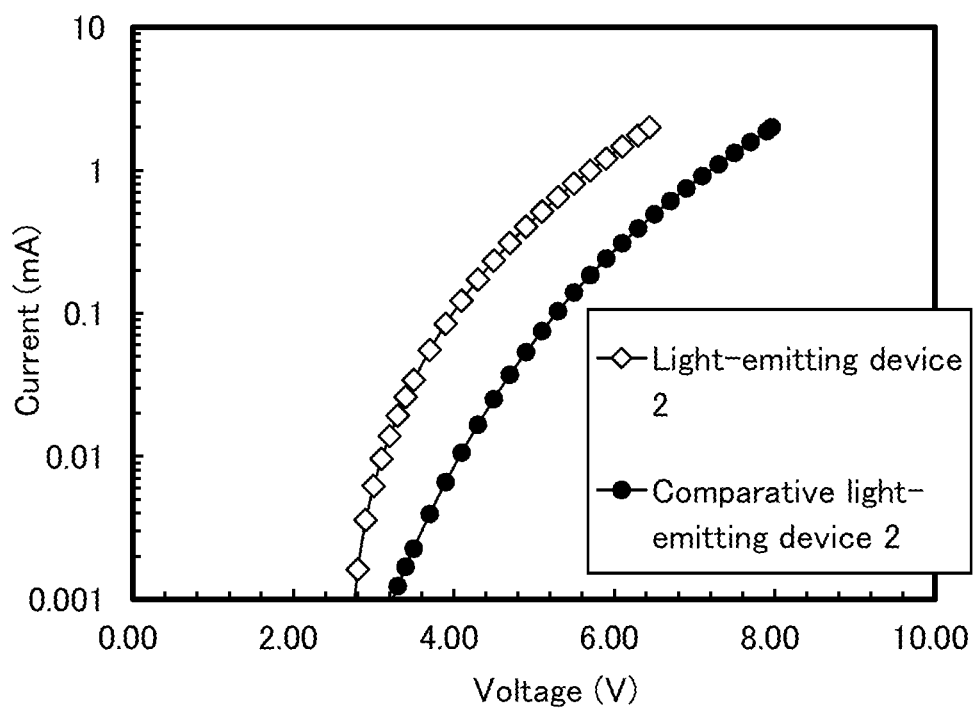
FIG. 25 shows the current-voltage characteristics of the light-emitting device 2 and the comparative light-emitting device 2.
Figure 26:
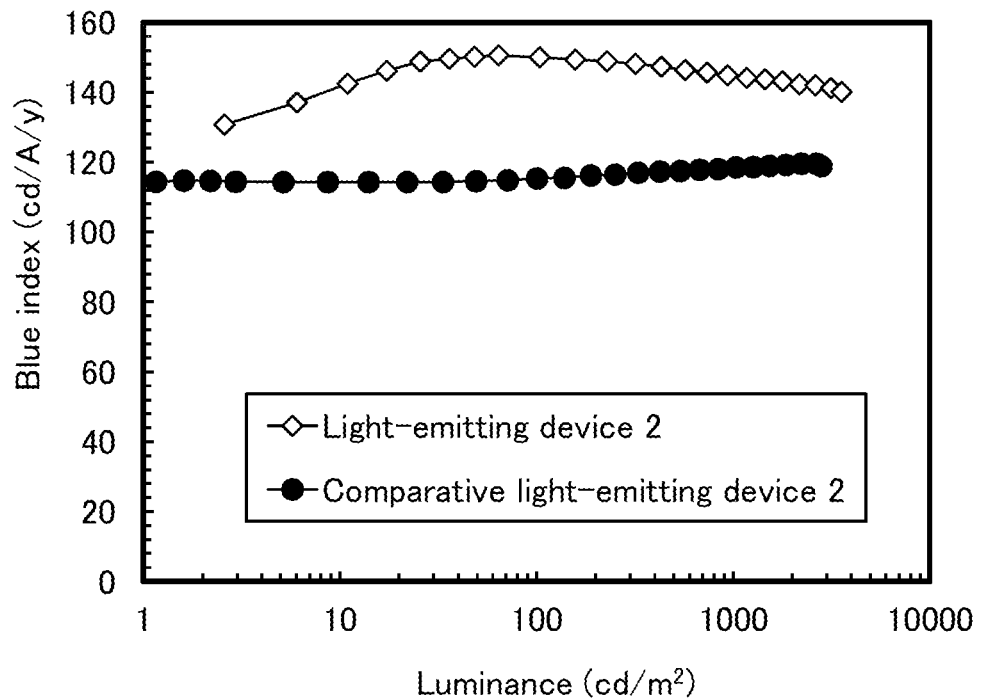
FIG. 26 shows the blue index-luminance characteristics of the light-emitting device 2 and the comparative light-emitting device 2.
Figure 27:
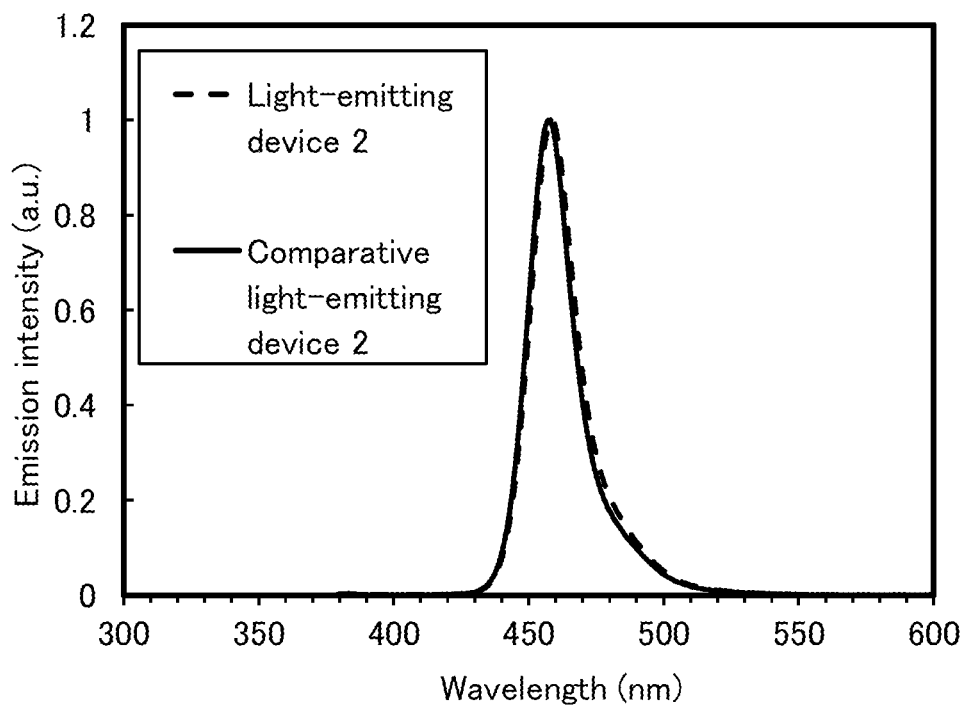
FIG. 27 shows the emission spectra of the light-emitting device 2 and the comparative light-emitting device 2.

FIG. 22 shows the luminance-current density characteristics of the light-emitting device 2 and the comparative light-emitting device 2. FIG. 23 shows the current efficiency-luminance characteristics thereof. FIG. 24 shows the luminance-voltage characteristics thereof. FIG. 25 shows the current-voltage characteristics thereof. FIG. 26 shows the blue index-luminance characteristics thereof. FIG. 27 shows the emission spectra thereof. Table 6 shows the main characteristics of the light-emitting device 2 and the comparative light-emitting device 2 at a luminance of about 1000 cd/m$^2$. Luminance, CIE chromaticity, and emission spectra were measured at normal temperature with a spectroradiometer (SR-UL1R manufactured by TOPCON TECHNOHOUSE CORPORATION).

Note that the blue index (BI) is a value obtained by dividing current efficiency (cd/A) by chromaticity y (cd/A/y), and is one of the indicators of characteristics of blue light emission. As the chromaticity y is smaller, the color purity of blue light emission tends to be higher. With high color purity, a wide range of blue can be expressed even with a small number of luminance components; thus, using blue light emission with high color purity reduces the luminance needed for expressing blue, leading to lower power consumption. Thus, BI that is based on chromaticity y, which is one of the indicators of color purity of blue, is suitably used as a mean for showing efficiency of blue light emission. The light-emitting device with higher BI can be regarded as a blue light emitting device having more favorable characteristics for a display.

FIGS. 22 to 27 and Table 6 show that the light-emitting device 2 of one embodiment of the present invention, which uses a material with a low refractive index, is an EL device that has a lower driving voltage and higher current efficiency than the comparative light-emitting device 2 while exhibiting almost the same emission spectrum as that of the comparative light-emitting device 2.

As described above, the driving voltage can be significantly reduced when Li-6mq, which is an organic complex of an alkali metal having an alkyl group at the 6-position, and an electron-transport material having many alkyl groups are used in the electron-transport layer 114. The existence of the alkyl group is generally thought to hinder the stacking between molecules, inhibit the interaction, and increase the driving voltage. In contrast, the light-emitting device of one embodiment of the present invention has a remarkable effect of reducing the driving voltage particularly when the alkyl group exists in both the organic complex of an alkali metal and the electron-transport material. This effect is important and unique to the organometallic complex of an alkali metal that includes a ligand having an 8-quinolinolato structure having an alkyl group at the 6-position. The driving voltage was found to be reduced rather than that in the metal complex which has an 8-quinolinolato structure and whose 6-position is unsubstituted (hydrogen). Note that the organometallic complex is preferably 6-alkyl-8-quinolinolato-lithium, particularly 6-methyl-8-quinolinolato-lithium (abbreviation: Li-6mq).

The blue index (BI) of the light-emitting device 2 and the blue index (BI) of the comparative light-emitting device 2 at a luminance of about 1000 cd/m$^2$ are 145 (cd/A/y) and 119 (cd/A/y), respectively. This suggests that the light-emitting device 2 is a light-emitting device particularly with favorable BI. Hence, one embodiment of the present invention is suitable for the light-emitting device used in a display.

The power efficiency of the light-emitting device 2 and the power efficiency of the comparative light-emitting device 2 at a luminance of about 1000 cd/m$^2$ are 4.5 (lm/W) and 2.5 (lm/W), respectively. This suggests that the light-emitting device 2 is a light-emitting device particularly with low power consumption.

Example 3

In this example, a light-emitting device 3 of one embodiment of the present invention and a comparative light-emitting device 3 are described. Structural formulae of organic compounds used in this example are shown below.

TABLE 6

| | voltage (V) | current (mA) | current density (mA/cm$^2$) | chromaticity x | chromaticity y | current efficiency (cd/A) | BI (cd/A/y) | power efficiency (lm/W) |
|---|---|---|---|---|---|---|---|---|
| Light-emitting device 2 | 5.1 | 0.51 | 12.9 | 0.14 | 0.05 | 7.3 | 145 | 4.5 |
| Comparative light-emitting device 2 | 6.9 | 0.75 | 18.7 | 0.14 | 0.05 | 5.5 | 119 | 2.5 |

[Chemical Formula 18]
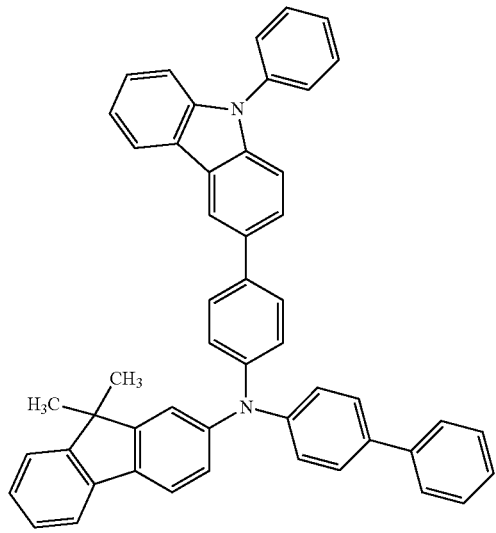
PCBBiF (i)
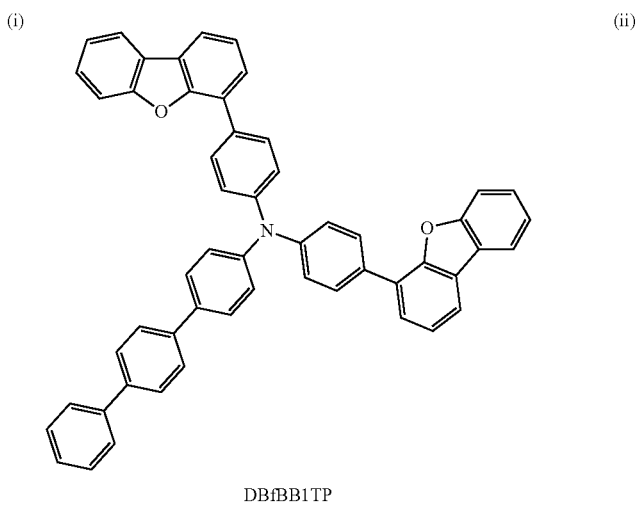
DBfBB1TP (ii)
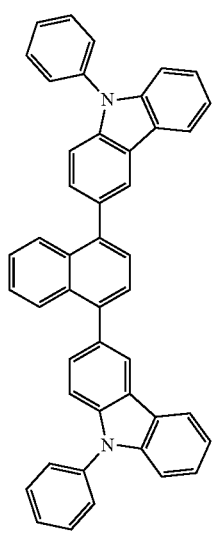
PCzN2 (iii)
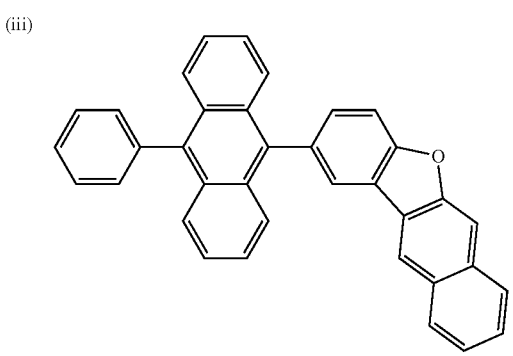
Bnf(II)PhA (iv)
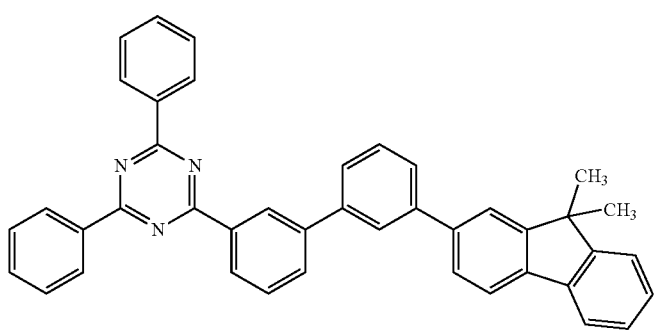
mFBPTzn (vi)

-continued

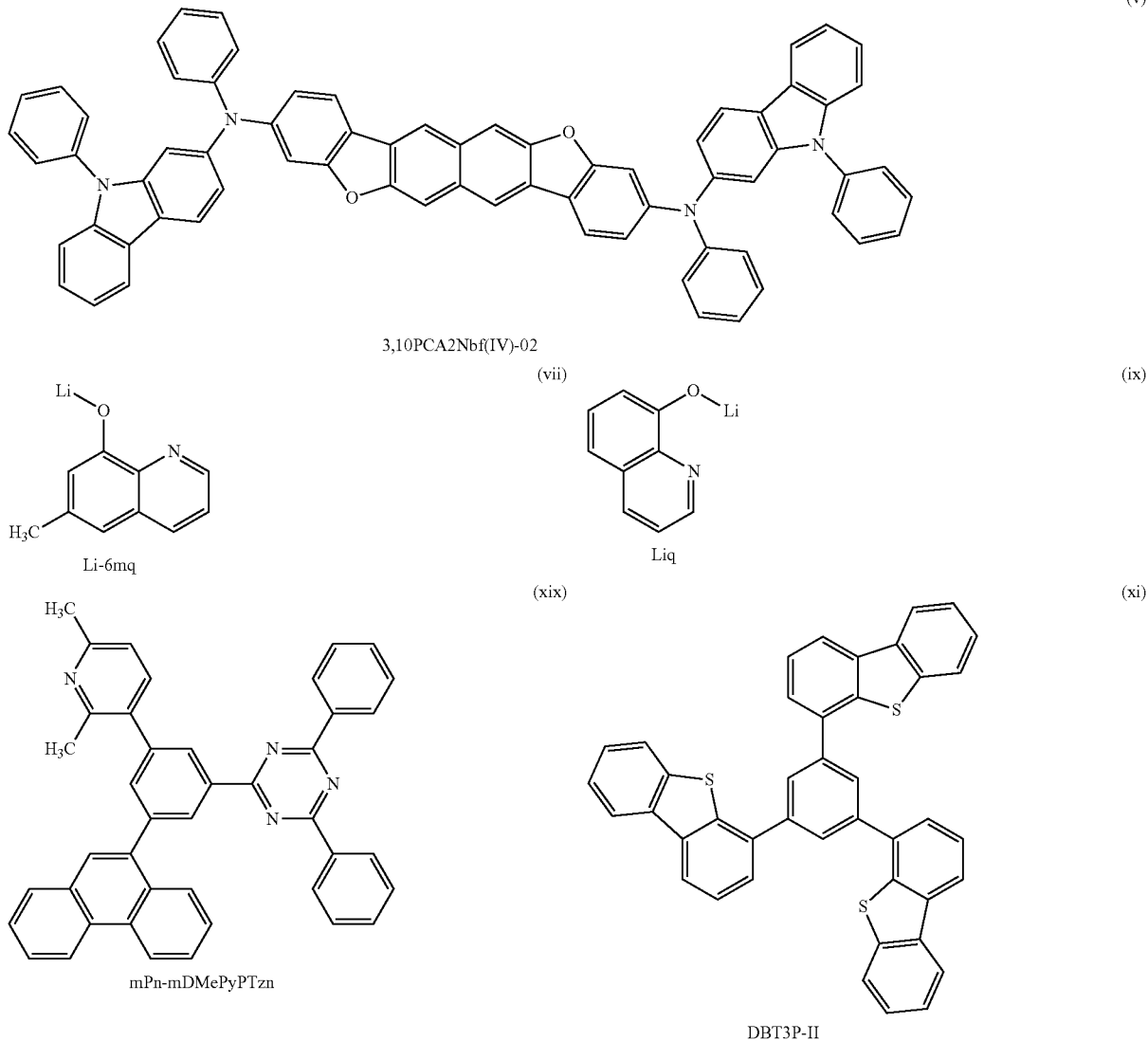

(Fabrication Method of Light-Emitting Device 3)

First, as a reflective electrode, an alloy film of silver (Ag), palladium (Pd), and copper (Cu), i.e., an Ag—Pd—Cu (APC) film, was formed over a glass substrate to a thickness of 100 nm by a sputtering method, and then, as a transparent electrode, indium tin oxide containing silicon oxide (ITSO) was formed to a thickness of 10 nm by a sputtering method, whereby the anode 101 was formed. The electrode area was set to 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by the above structural formula (i) and an electron acceptor material (OCHD-001) were deposited on the anode 101 to a thickness of 10 nm by co-evaporation such that the weight ratio of PCBBiF to OCHD-001 was 1:0.05, whereby the hole-injection layer 111 was formed.

Over the hole-injection layer 111, PCBBiF was deposited by evaporation to a thickness of 100 nm, and then N,N-bis [4-(dibenzofuran-4-yl)phenyl]-4-amino-p-terphenyl (abbreviation: DBfBB1TP) represented by the above structural formula (ii) was deposited by evaporation to a thickness of 10 nm, whereby the hole-transport layer 112 was formed.

Subsequently, over the hole-transport layer 112, 3,3'-(naphthalene-1,4-diyl)bis(9-phenyl-9H-carbazole) (abbreviation: PCzN2) represented by the above structural formula (iii) was deposited by evaporation to a thickness of 10 nm, whereby an electron-blocking layer was formed.

Then, 2-(10-phenyl-9-anthracenyl)-benzo[b]naphtho[2,3-d]furan (abbreviation: Bnf(II)PhA) represented by the above structural formula (iv) and 3,10-bis[N-(9-phenyl-9H-carbazol-2-yl)-N-phenylamino]naphtho[2,3-b;6,7-b]bisbenzofuran (abbreviation: 3,10PCA2Nbf(IV)-02) represented by the above structural formula (v) were deposited to a thickness of 25 nm by co-evaporation such that the weight ratio of Bnf(II)PhA to 3,10PCA2Nbf(IV)-02 was 1:0.015, whereby the light-emitting layer 113 was formed.

After that, 2-[3'-(9,9-dimethyl-9H-fluoren-2-yl)-1,1'-biphenyl-3-yl]-4,6-diphenyl-1,3,5-triazine (abbreviation: mFBPTzn) represented by the above structural formula (vi) was deposited by evaporation to a thickness of 10 nm, whereby a hole-blocking layer was formed. Then, 2-[3-(2,6-dimethyl-3-pyridinyl)-5-(9-phenanthrenyl)phenyl]-4,6-diphenyl-1,3,5-triazine (abbreviation: mPn-mDMePyPTzn) represented by the above structural formula (xix) and 6-methyl-8-quinolinolato-lithium (abbreviation: Li-6mq) represented by the above structural formula (vii) were deposited to a thickness of 20 nm by co-evaporation such that the weight ratio of mPn-mDMePyPTzn to Li-6mq was 1:1, whereby the electron-transport layer 114 was formed.

After the electron-transport layer 114 was formed, Li-6mq was deposited to a thickness of 1 nm to form the electron-injection layer 115, and lastly silver (Ag) and magnesium (Mg) were deposited to a thickness of 15 nm by co-evaporation such that the volume ratio of Ag to Mg was 1:0.1 to form the cathode 102, whereby the light-emitting device 3 was fabricated. The cathode 102 is a transflective electrode having a function of reflecting light and a function of transmitting light; thus, the light-emitting device of this example is a top emission device in which light is extracted through the cathode 102. Over the cathode 102, 1,3,5-tri(dibenzothiophen-4-yl)-benzene (abbreviation: DBT3P-II) represented by the above structural formula (xi) was deposited to a thickness of 70 nm by evaporation so that light extraction efficiency can be improved.

(Fabrication Method of Comparative Light-Emitting Device 3)

The comparative light-emitting device 3 was fabricated in a manner similar to that for the light-emitting device 3 except that Li-6mq used in the electron-transport layer was replaced with 8-quinolinolato-lithium (abbreviation: Liq) represented by the above structural formula (ix).

The structures of the light-emitting device 3 and the comparative light-emitting device 3 are listed in the following table.

Figure 28:
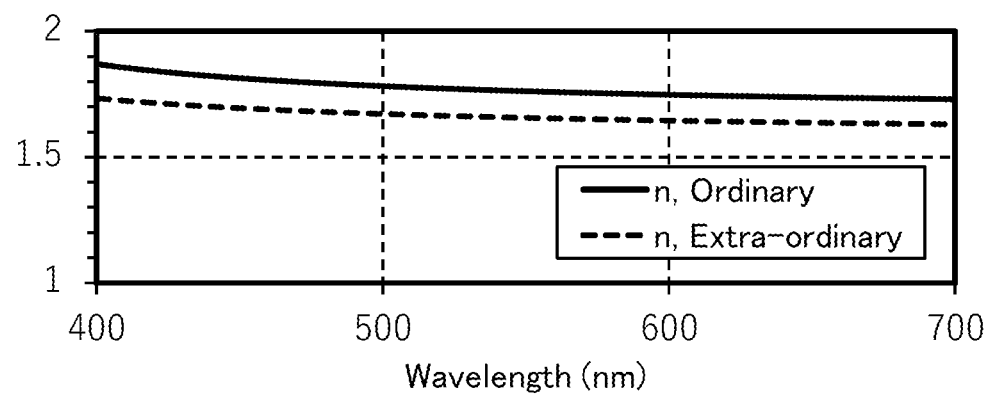
FIG. 28 shows the measurement data of the refractive indices of mPn-mDMePyPTzn, Li-6mq, and Liq.
Figure 28:
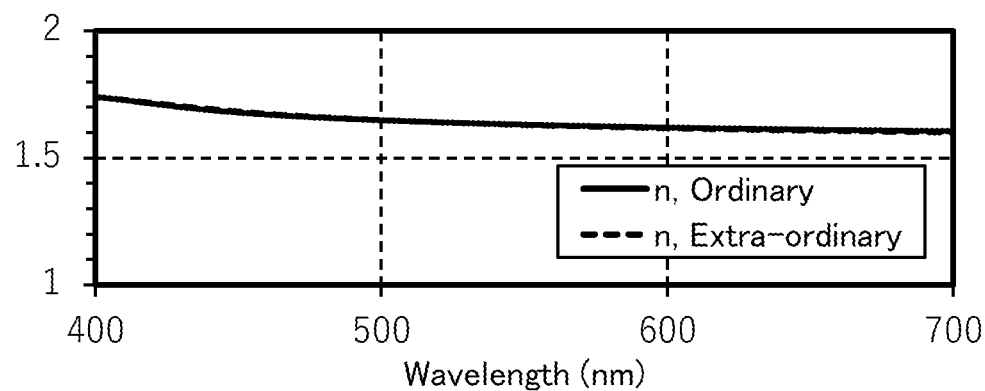
Figure 28:
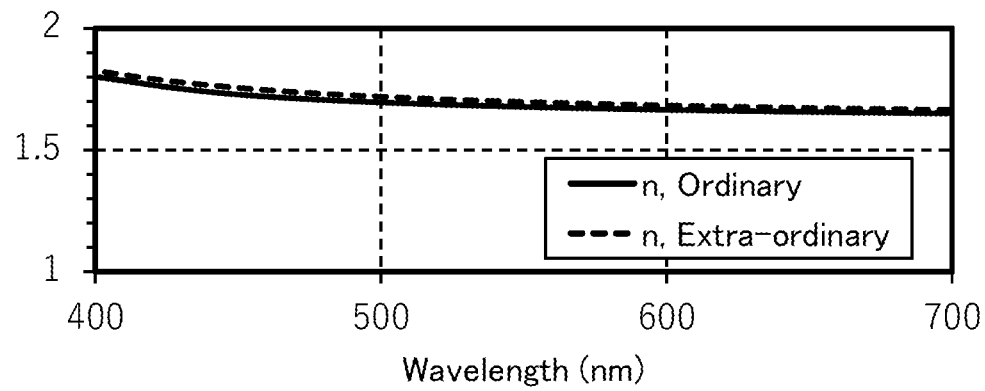

FIG. 28 shows the refractive indices of mPn-mDMePyPTzn, Li-6mq, and Liq, and Table 8 shows the refractive indices thereof at 456 nm. The measurement was performed with a spectroscopic ellipsometer (M-2000U, produced by J. A. Woollam Japan Corp.). To obtain films used as measurement samples, the material for each layer was deposited to a thickness of approximately 50 nm over a quartz substrate by a vacuum evaporation method. Note that FIG. 28 shows the refractive index of an ordinary ray (n, Ordinary), and the refractive index of an extraordinary ray (n, Extra-ordinary).

TABLE 8

|  | ordinary refractive index (n, Ordinary) @456 nm |
| --- | --- |
| mPn-mDMePyPTzn | 1.81 |
| Li-6mq | 1.67 |
| Liq | 1.72 |

The light-emitting device 3 and the comparative light-emitting device 3 were sealed using a glass substrate in a glove box containing a nitrogen atmosphere so as not to be exposed to the air. Specifically, a UV curable sealing material was applied to surround the elements, only the UV curable sealing material was irradiated with UV while the light-emitting devices were prevented from being irradiated with the UV, and heat treatment was performed at 80° C. under an atmospheric pressure for one hour. Then, the initial characteristics of the light-emitting devices were measured. Note that the sealed glass substrate was not subjected to particular treatment for improving light extraction efficiency.

Figure 29:
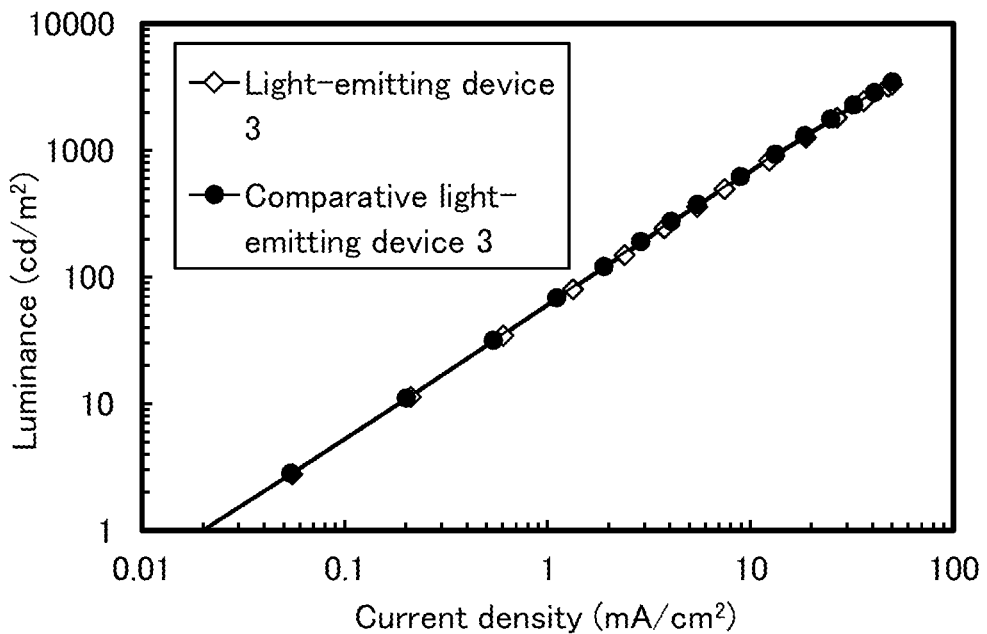
FIG. 29 shows the luminance-current density characteristics of a light-emitting device 3 and a comparative light-emitting device 3.
Figure 30:
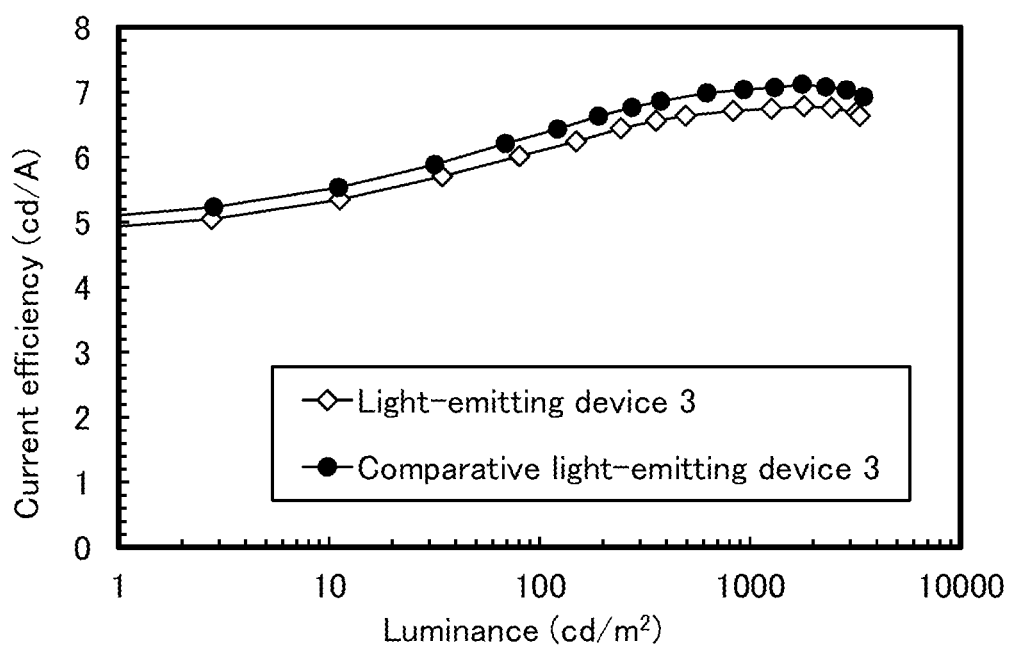
FIG. 30 shows the current efficiency-luminance characteristics of the light-emitting device 3 and the comparative light-emitting device 3.
Figure 31:
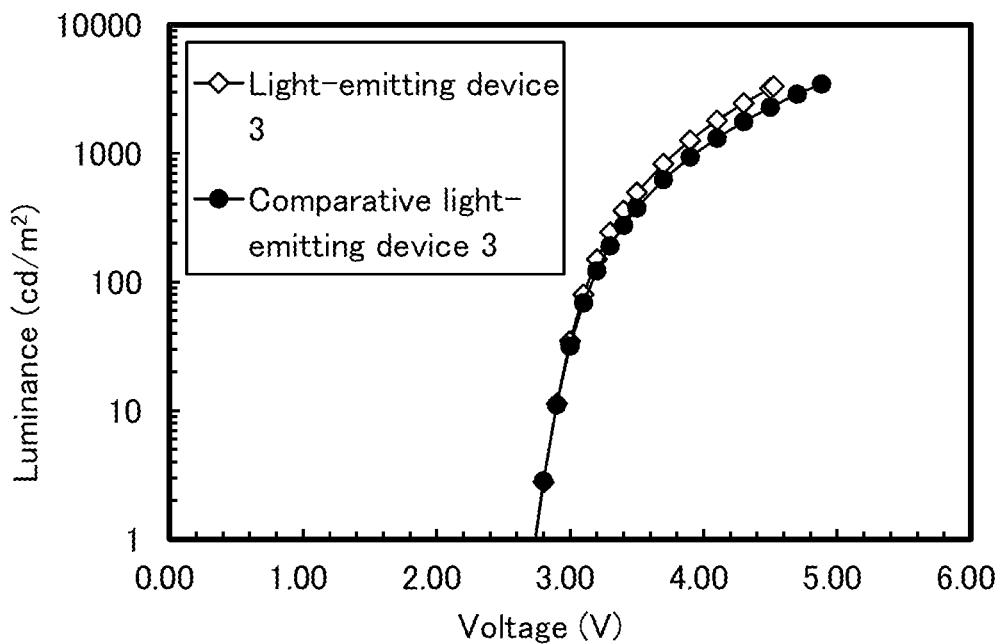
FIG. 31 shows the luminance-voltage characteristics of the light-emitting device 3 and the comparative light-emitting device 3.
Figure 32:
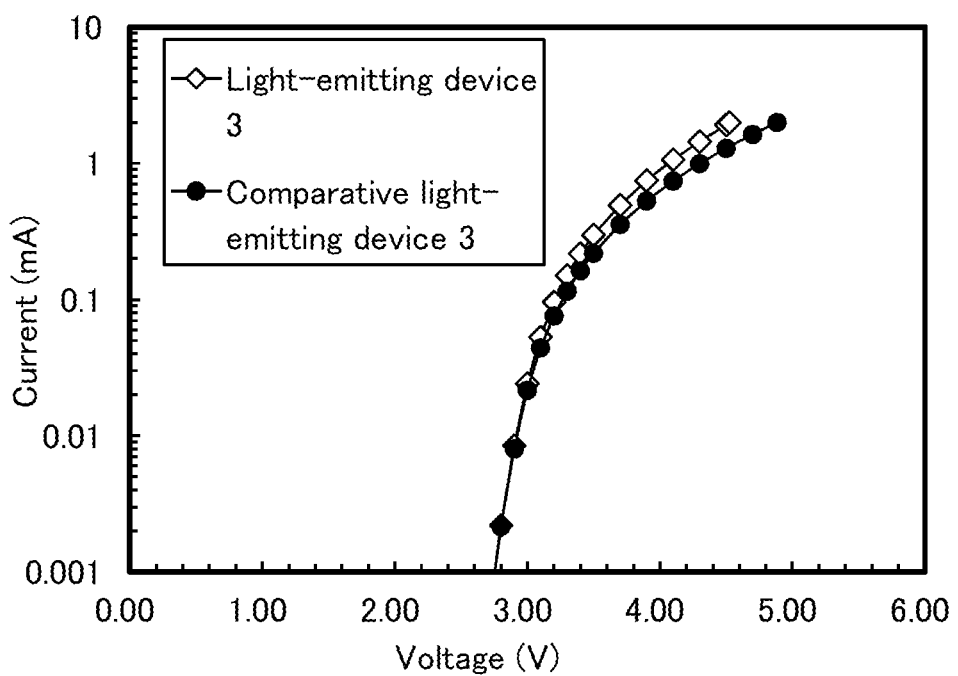
FIG. 32 shows the current-voltage characteristics of the light-emitting device 3 and the comparative light-emitting device 3.
Figure 33:
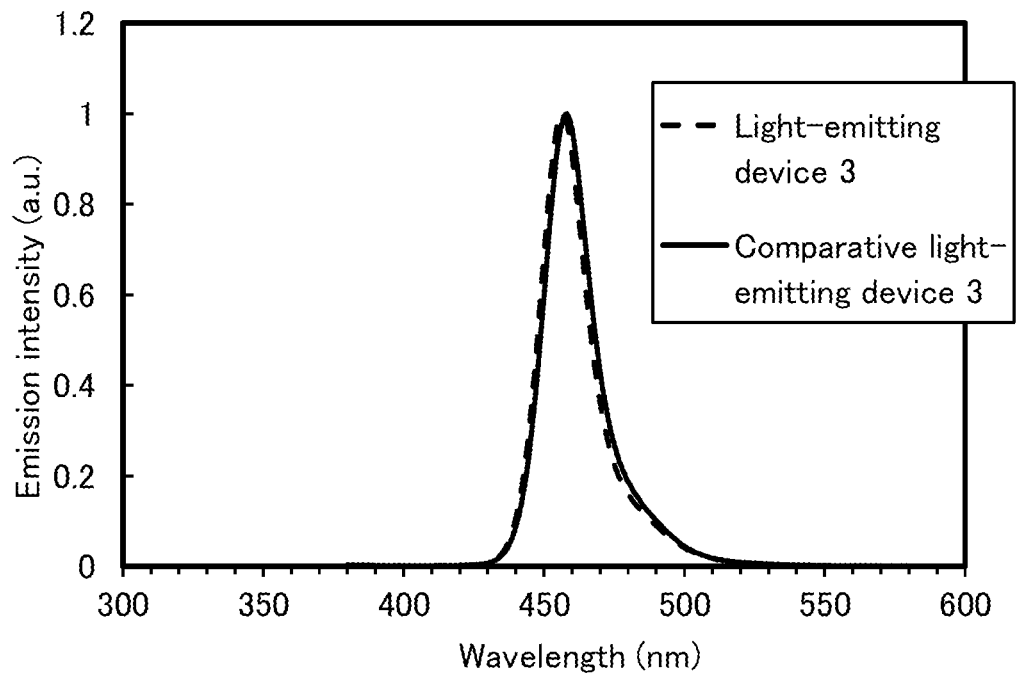
FIG. 33 shows the emission spectra of the light-emitting device 3 and the comparative light-emitting device 3.
Figure 34:
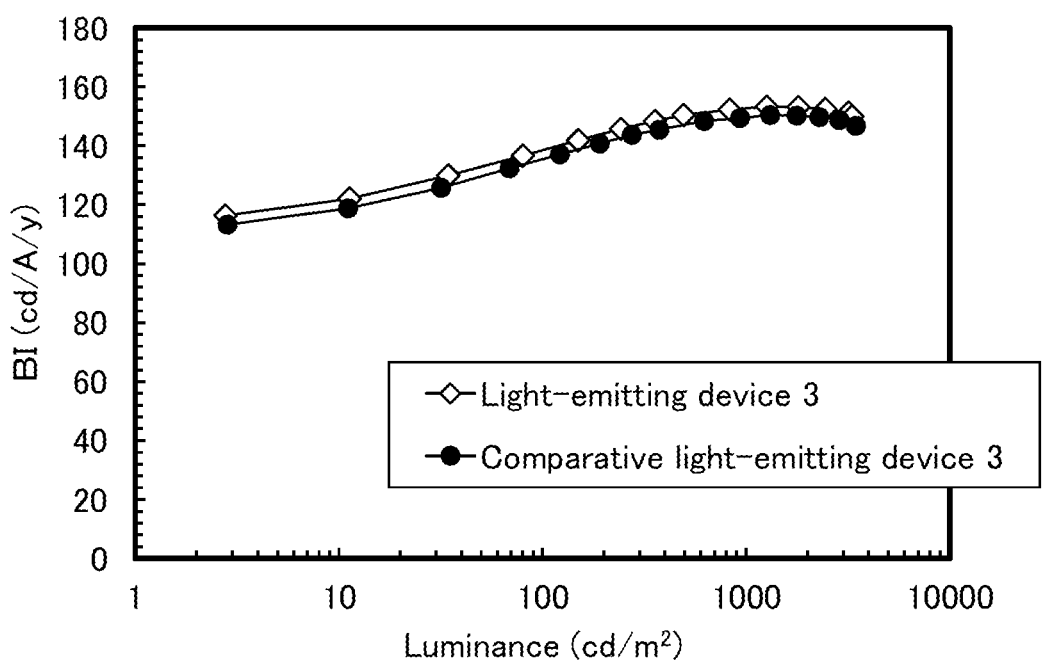
FIG. 34 shows the blue index-luminance characteristics of the light-emitting device 3 and the comparative light-emitting device 3.

FIG. 29 shows the luminance-current density characteristics of the light-emitting device 3 and the comparative light-emitting device 3. FIG. 30 shows the current efficiency-luminance characteristics thereof. FIG. 31 shows the luminance-voltage characteristics thereof. FIG. 32 shows the current-voltage characteristics thereof. FIG. 33 shows the emission spectra thereof. FIG. 34 shows the blue index (BI)-luminance characteristics thereof. Table 9 shows the main characteristics of the light-emitting device 3 and the

TABLE 7

|  | film thickness | Light-emitting device 3 | Comparative light-emitting device 3 |
| --- | --- | --- | --- |
| electron-injection layer | 1 nm | Li-6mq | Liq |
| electron-transport layer | 20 nm | mPn-mDMePyPTzn:Li-6mq (1:1) | mPn-mDMePyPTzn:Liq (1:1) |
| hole-blocking layer | 10 nm | mFBPTzn | |
| light-emitting layer | 25 nm | Bnf(II)PhA:3,10PCA2Nbf(IV)-02 (1:0.015) | |
| electron-blocking layer | 10 nm | PCzN2 | |
| hole-transport layer | 10 nm | DBfBB1TP | |
|  | 100 nm | PCBBiF | |
| hole-injection layer | 10 nm | PCBBiF:OCHD-001 (1:0.05) | | comparative light-emitting device 3 at a luminance of about 1000 cd/m². Luminance, CIE chromaticity, and emission spectra were measured at normal temperature with a spectroradiometer (SR-UL1R manufactured by TOPCON TECHNOHOUSE CORPORATION).

Note that the blue index (BI) is a value obtained by dividing current efficiency (cd/A) by chromaticity y (cd/A/y), and is one of the indicators of characteristics of blue light emission. As the chromaticity y is smaller, the color purity of blue light emission tends to be higher. With high color purity, a wide range of blue can be expressed even with a small number of luminance components; thus, using blue light emission with high color purity reduces the luminance needed for expressing blue, leading to lower power consumption. Thus, BI that is based on chromaticity y, which is one of the indicators of color purity of blue, is suitably used as a mean for showing efficiency of blue light emission. The light-emitting device with higher BI can be regarded as a blue light emitting device having more favorable characteristics for a display.

TABLE 9

|  | voltage (V) | current (mA) | current density (mA/cm²) | chromaticity x | chromaticity y | current efficiency (cd/A) | BI (cd/A/y) |
| --- | --- | --- | --- | --- | --- | --- | --- |
| Light-emitting device 3 | 3.7 | 0.49 | 12.4 | 0.14 | 0.04 | 6.7 | 152.3 |
| Comparative light-emitting device 3 | 3.9 | 0.53 | 13.2 | 0.14 | 0.05 | 7.0 | 149.4 |

FIGS. 29 to 34 and Table 9 show that the light-emitting device 3 of one embodiment of the present invention, which uses a material with a low refractive index, is an EL device that has a lower driving voltage and more favorable blue index than the comparative light-emitting device 3 while exhibiting almost the same emission spectrum as that of the comparative light-emitting device 3.

As described above, the driving voltage can be significantly reduced when Li-6mq, which is an organic complex of an alkali metal having an alkyl group at the 6-position, and an electron-transport material are used in the electron-transport layer 114. This effect is unique to the organometallic complex of an alkali metal that includes a ligand having an 8-quinolinolato structure having an alkyl group at the 6-position. Note that the organometallic complex is preferably 6-alkyl-8-quinolinolato-lithium, particularly 6-methyl-8-quinolinolato-lithium (abbreviation: Li-6mq).

The blue index (BI) of the light-emitting device 3 and the blue index (BI) of the comparative light-emitting device 3 at a luminance of about 1000 cd/m² are 152.3 (cd/A/y) and 149.4 (cd/A/y), respectively, and the maximum BI of the light-emitting device 3 and the maximum BI of the comparative light-emitting device 3 are 153.3 (cd/A/y) and 150.4 (cd/A/y), respectively. This suggests that the light-emitting device 3 is a light-emitting device particularly with favorable BI.

In this example, the effect of reducing the driving voltage of 6-alkyl-8-quinolinolato-lithium (preferably Li-6mq) was observed by using a low refractive index material only for the organometallic complex. When a low refractive index material is used for both the metal complex and the organic compound having an electron-transport property in the electron-transport layer as shown in Example 1, light extraction efficiency is significantly improved to increase the current efficiency and BI.

When both the electron-transport organic compound having an alkyl group and 6-alkyl-8-quinolinolato-lithium (preferably Li-6mq) are used as shown in Example 2, the driving voltage can be significantly reduced. Furthermore, the use of both the electron-transport organic compound having an alkyl group and a low refractive index and 6-alkyl-8-quinolinolato-lithium (preferably Li-6mq) was found to have a significant effect of reducing driving voltage and improving emission efficiency.

Example 4

Synthesis Example 1

Described in this example is a method for synthesizing 6-methyl-8-quinolinolato-lithium (abbreviation: Li-6mq), which is a metal complex of one embodiment of the present invention. The structural formula of Li-6mq is shown below.

[Chemical Formula 19]

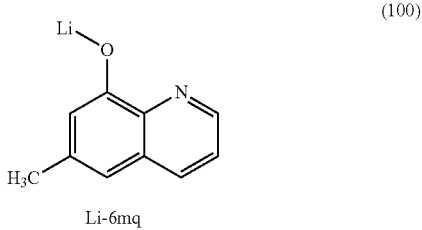

Li-6mq

Step 1: Synthesis of Li-6mq

First, 2.0 g (12.6 mmol) of 8-hydroxy-6-methylquinoline and 130 mL of dehydrated tetrahydrofuran (abbreviation: THF) were put into a three-neck flask and stirred. Then, 10.1 mL (10.1 mmol) of 1M THF solution of lithium tert-butoxide (abbreviation: tBuOLi) was added to this solution and stirred at room temperature for 47 hours. The reacted solution was concentrated to give a yellow solid. Acetonitrile was added to this solid and subjected to ultrasonic irradiation and filtration, so that a pale yellow solid was obtained. This washing step was performed twice. The obtained residue was 1.6 g of pale yellow solid of Li-6mq (yield: 95%). This synthesis scheme is shown below.

[Chemical Formula 20]

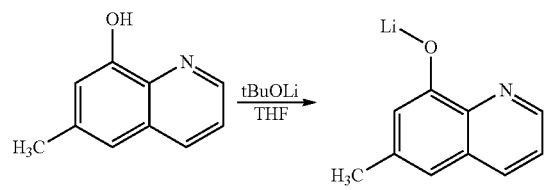

Figure 35:
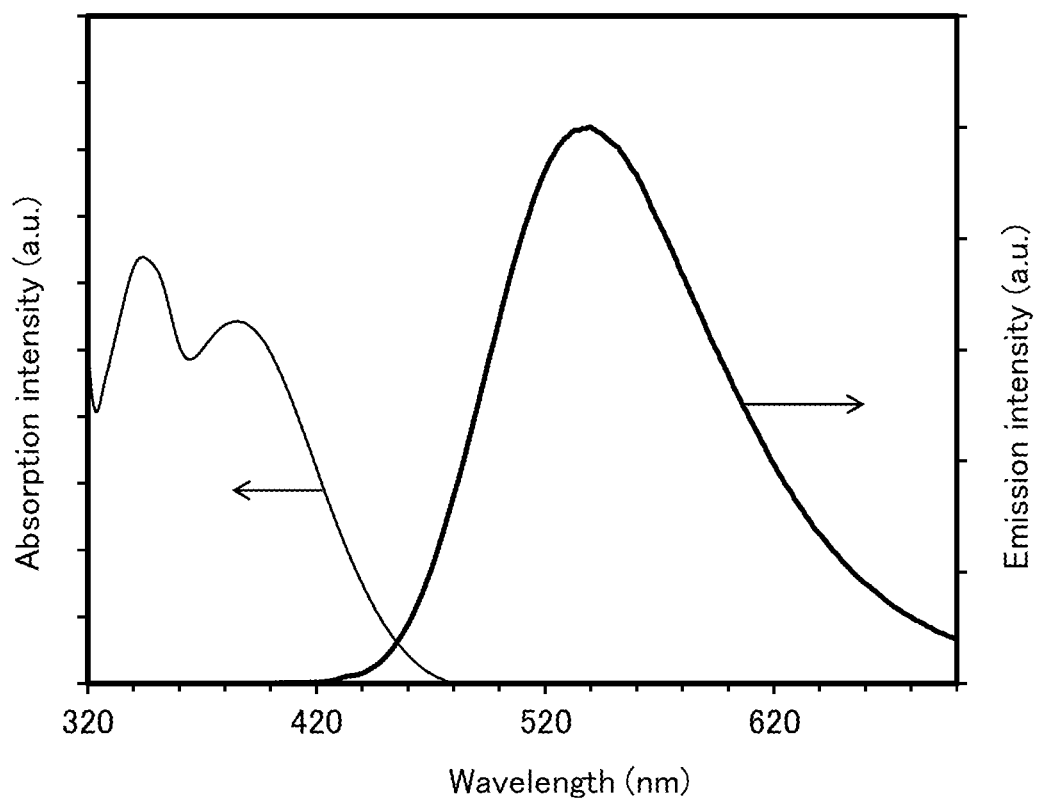
FIG. 35 shows the absorption and emission spectra of Li-6mq in a dehydrated acetone solution.

Next, the measurement results of the absorption and emission spectra of Li-6mq in a dehydrated acetone solution are shown in FIG. 35. The absorption spectrum of Li-6mq in the dehydrated acetone solution was measured with an ultraviolet-visible light spectrophotometer (V550, manufactured by JASCO Corporation), and the spectrum of dehydrated acetone alone in a quartz cell was subtracted. The emission spectrum was measured with a fluorescence spectrophotometer (FP-8600, produced by JASCO Corporation).

As shown in FIG. 35, Li-6mq in the dehydrated acetone solution has an absorption peak at 390 nm, and an emission wavelength peak at 540 nm (excitation wavelength: 385 nm).

Example 5

In this example, a light-emitting device 4 of one embodiment of the present invention and comparative light-emitting devices 4 and 5 are described. Structural formulae of organic compounds used in this example are shown below.

[Chemical Formula 21]

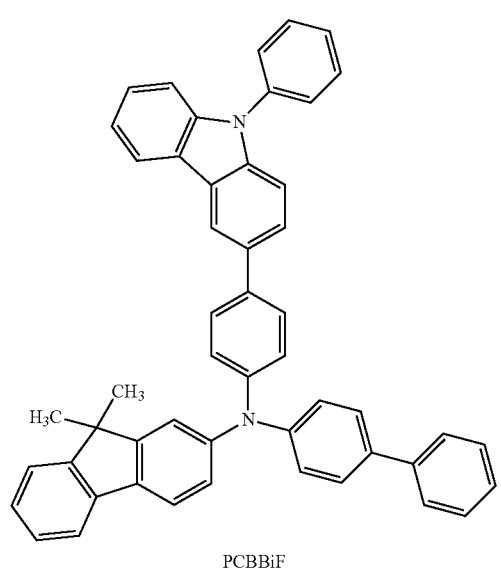

PCBBiF (i)

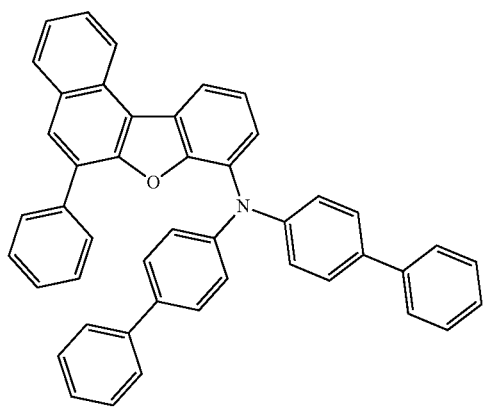

BBABnf (xii)

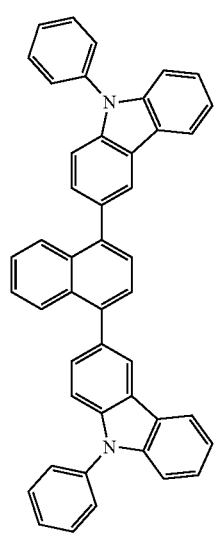

PCzN2 (iii)

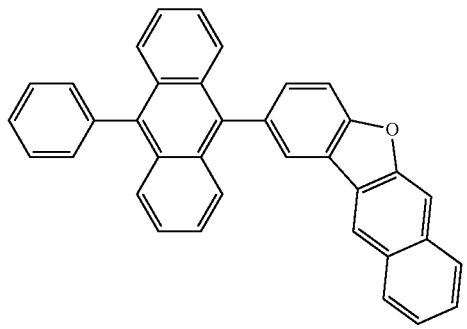

Bnf(II)PhA (iv)

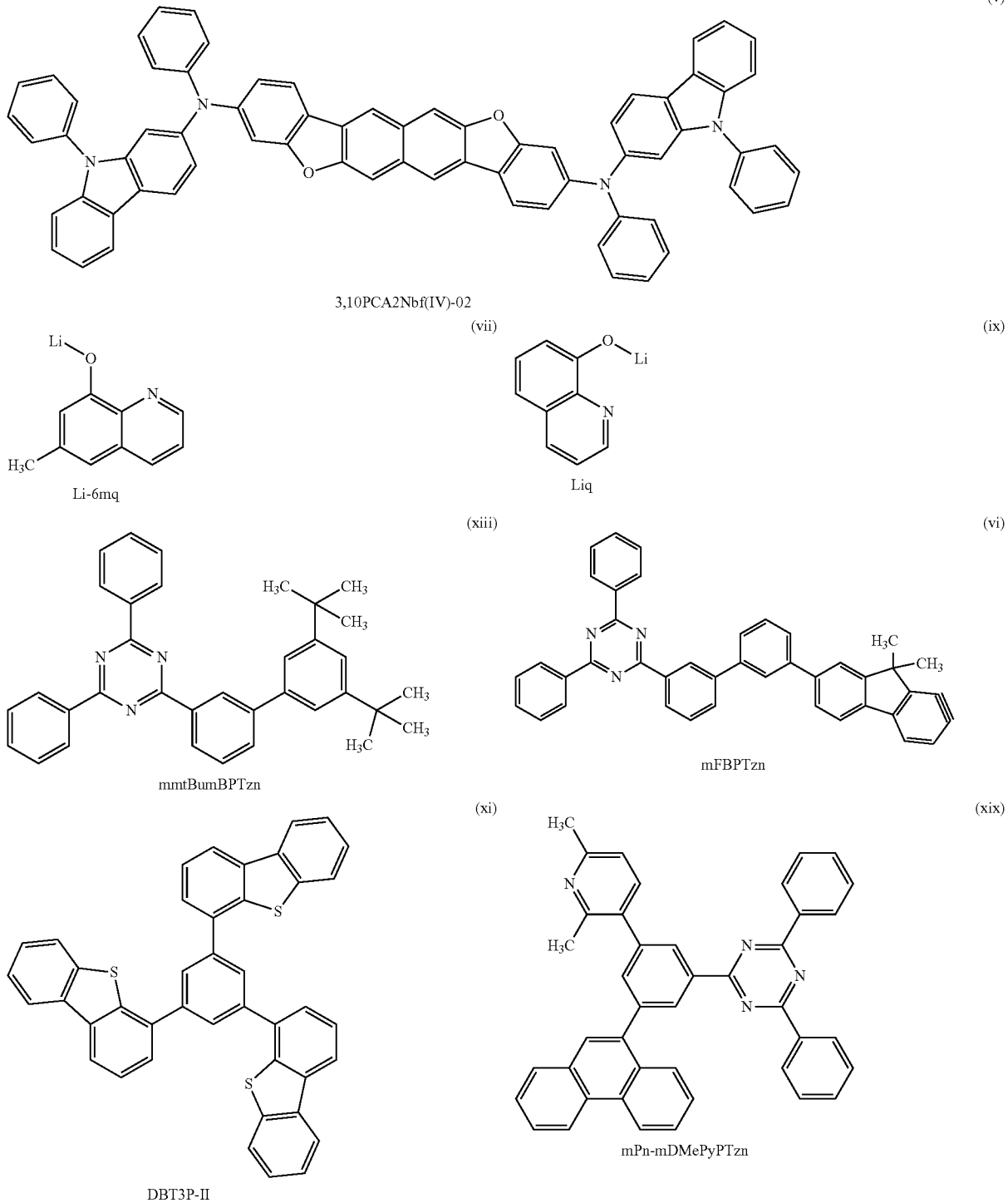

(Fabrication Method of Light-Emitting Device 4)

First, as a reflective electrode, silver (Ag) was deposited over a glass substrate to a thickness of 100 nm by a sputtering method, and then, as a transparent electrode, indium tin oxide containing silicon oxide (ITSO) was deposited to a thickness of 95 nm by a sputtering method, whereby the anode 101 was formed. The electrode area was set to 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by the above structural formula (i) and an electron acceptor material (OCHD-001) were deposited on the anode 101 to a thickness of 10 nm by co-evaporation such that the weight ratio of PCBBiF to OCHD-001 was 1:0.05, whereby the hole-injection layer 111 was formed.

Over the hole-injection layer 111, PCBBiF was deposited by evaporation to a thickness of 10 nm, and then N,N-bis(4-biphenyl)-6-phenylbenzo[b]naphtho[1,2-d]furan-8-amine (abbreviation: BBABnf) represented by the above structural formula (xii) was deposited by evaporation to a thickness of 10 nm, whereby the hole-transport layer 112 was formed.

Subsequently, over the hole-transport layer 112, 3,3'-(naphthalene-1,4-diyl)bis(9-phenyl-9H-carbazole) (abbreviation: PCzN2) represented by the above structural formula (iii) was deposited by evaporation to a thickness of 10 nm, whereby an electron-blocking layer was formed.

Then, 2-(10-phenyl-9-anthracenyl)-benzo[b]naphtho[2,3-d]furan (abbreviation: Bnf(II)PhA) represented by the above structural formula (iv) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the above structural formula (v) were deposited to a thickness of 25 nm by co-evaporation such that the weight ratio of Bnf(II)PhA to 3,10PCA2Nbf(IV)-02 was 1:0.015, whereby the light-emitting layer 113 was formed.

After that, 2-{(3',5'-di-tert-butyl)-1,1'-biphenyl-3-yl}-4,6-diphenyl-1,3,5-triazine (abbreviation: mmtBumBPTzn) represented by the above structural formula (xiii) was deposited by evaporation to a thickness of 10 nm, whereby a hole-blocking layer was formed. Then, mmtBumBPTzn and 6-methyl-8-quinolinolato-lithium (abbreviation: Li-6mq) represented by the above structural formula (vii) were deposited to a thickness of 20 nm by co-evaporation such that the weight ratio of mmtBumBPTzn to Li-6mq was 1:1, whereby the electron-transport layer 114 was formed.

After the electron-transport layer 114 was formed, lithium fluoride was deposited to a thickness of 1 nm to form the electron-injection layer 115, and lastly silver (Ag) and magnesium (Mg) were deposited to a thickness of 15 nm by co-evaporation such that the volume ratio of Ag to Mg was 1:0.1 to form the cathode 102, whereby the light-emitting device 4 was fabricated. The cathode 102 is a transflective electrode having a function of reflecting light and a function of transmitting light; thus, the light-emitting device of this example is a top emission device in which light is extracted through the cathode 102. Over the cathode 102, 1,3,5-tri(dibenzothiophen-4-yl)-benzene (abbreviation: DBT3P-II) represented by the above structural formula (xi) was deposited to a thickness of 70 nm by evaporation so that light extraction efficiency can be improved.

(Fabrication Method of Comparative Light-Emitting Device 4)

The comparative light-emitting device 4 was fabricated in a manner similar to that for the light-emitting device 4 except that Li-6mq used in the electron-transport layer 114 was replaced with 8-quinolinolato-lithium (abbreviation: Liq) represented by the above structural formula (ix).

(Fabrication Method of Comparative Light-Emitting Device 5)

The comparative light-emitting device 5 was fabricated in a manner similar to that for the comparative light-emitting device 4 except that mmtBumBPTzn used in the hole-blocking layer was replaced with 2-[3'-(9,9-dimethyl-9H-fluoren-2-yl)-1,1'-biphenyl-3-yl]-4,6-diphenyl-1,3,5-triazine (abbreviation: mFBPTzn) represented by the above structural formula (vi), and mmtBumBPTzn used in the electron-transport layer 114 was replaced with 2-[3-(2,6-dimethyl-3-pyridinyl)-5-(9-phenanthrenyl)phenyl]-4,6-diphenyl-1,3,5-triazine (abbreviation: mPn-mDMePyPTzn) represented by the above structural formula (xix). Note that the thickness of the hole-transport layer was adjusted so that the devices have the same chromaticity.

The structures of the light-emitting device 4 and the comparative light-emitting devices 4 and 5 are listed in the following table.

TABLE 10

| | film thickness | Light-emitting device 4 | Comparative light-emitting device 4 | Comparative light-emitting device 5 |
|---|---|---|---|---|
| electron-injection layer | 1 nm | Li-6mq | Liq | Liq |
| electron-transport layer | 20 nm | mmtBumBPTzn:Li-6mq (1:1) | mmtBumBPTzn:Liq (1:1) | mPn-mDMePyPTzn:Liq (1:1) |
| hole-blocking layer | *3 | mmtBumBPTzn | | mFBPTzn |
| light-emitting layer | 25 nm | Bnf(II)PhA:3,10PCA2Nbf(IV)-02 (1:0.015) | | |
| electron-blocking layer | 10 nm | PCzN2 | | |
| hole-transport layer | 10 nm | BBABnf | | |
| | 10 nm | PCBBiF | | |
| hole-injection layer | 10 nm | PCBBiF:OCHD-001 (1:0.05) | | |

Figure 37:
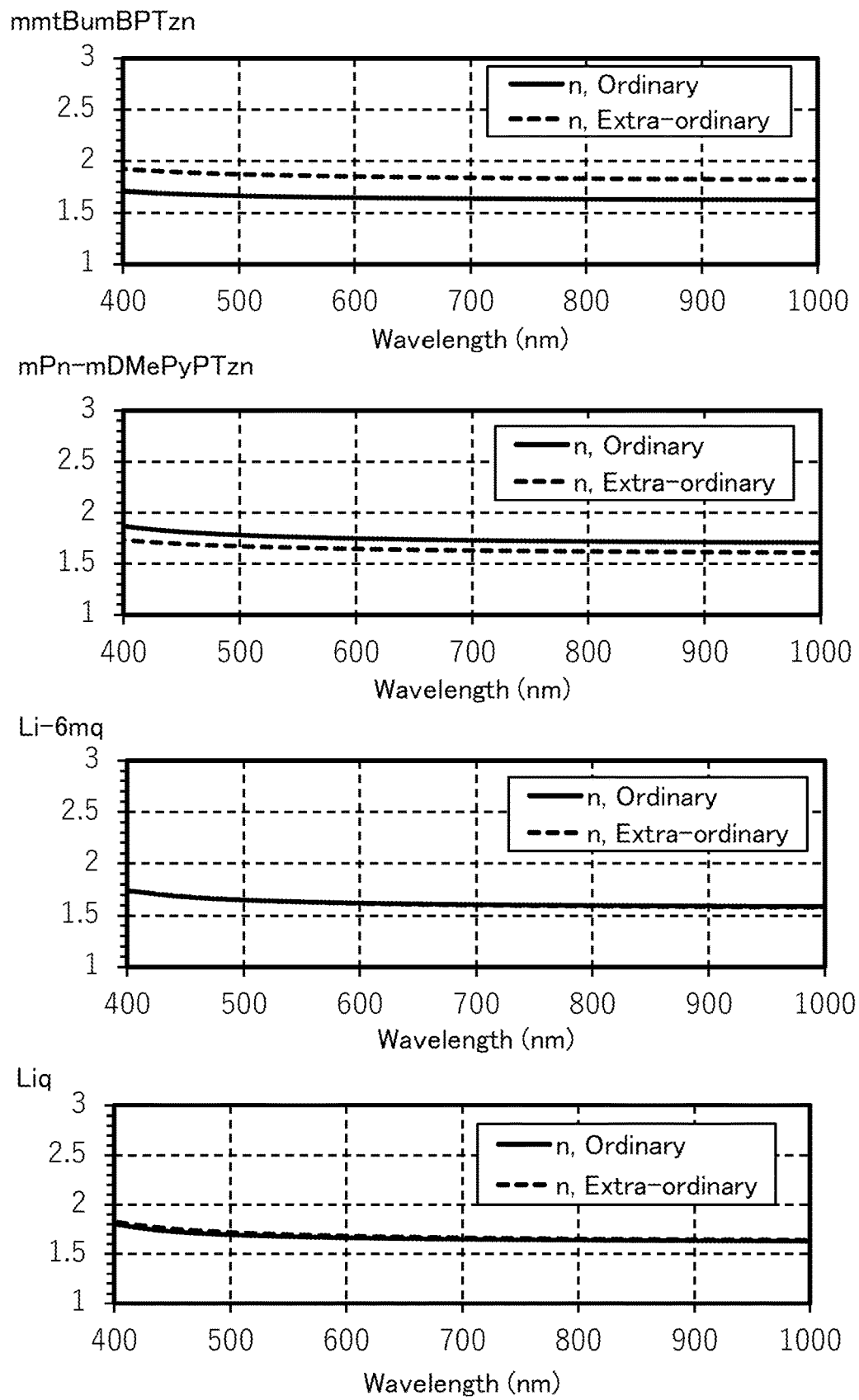
FIG. 37 shows the measurement data of the refractive indices of mmtBumBPTzn, mPn-mDMePyPTzn, Li-6mq, and Liq.

*3 Light-emitting device 4, Comparative light-emitting device 4:10 nm, Comparative light-emitting device 5:5 nm FIG. 37 shows the refractive indices of mmtBumBPTzn, mPn-mDMePyPTzn, Li-6mq, and Liq, and Table 11 shows the refractive indices thereof at 456 nm. The measurement was performed with a spectroscopic ellipsometer (M-2000U, produced by J. A. Woollam Japan Corp.). To obtain films used as measurement samples, the material for each layer was deposited to a thickness of approximately 50 nm over a quartz substrate by a vacuum evaporation method. Note that FIG. 37 shows the refractive index of an ordinary ray (n, Ordinary), and the refractive index of an extraordinary ray (n, Extra-ordinary).

FIG. 37 indicates that the ordinary refractive index of mmtBumBPTzn in the whole blue emission region (455 nm to 465 nm) is 1.68, which is in the range of 1.50 to 1.75. In addition, the ordinary refractive index of mmtBumBPTzn at a wavelength of 633 nm is 1.64, which is in the range of 1.45 to 1.70, suggesting that mmtBumBPTzn is a material with a low refractive index. The ordinary refractive index of Li-6mq in the whole blue emission region (455 nm to 465 nm) is 1.67, which is in the range of 1.45 to 1.70. In addition, the ordinary refractive index of Li-6mq at a wavelength of 633 nm is 1.61, which is in the range of 1.40 to 1.65, suggesting that Li-6mq is a material with a low refractive index.

The above indicates that in the light-emitting device 4, the ordinary refractive index of the electron-transport layer 114 is in the range greater than or equal to 1.50 and less than 1.75 in the whole blue emission region (455 nm to 465 nm) and in the range greater than or equal to 1.45 and less than 1.70 at a wavelength of 633 nm.

TABLE 11

| | ordinary refractive index (n, Ordinary) @456 nm |
|---|---|
| mmtBumBPTzn | 1.68 |
| mPn-mDMePyPTzn | 1.81 |
| Li-6mq | 1.67 |
| Liq | 1.72 |

The light-emitting device 4 and the comparative light-emitting devices 4 and 5 were sealed using a glass substrate in a glove box containing a nitrogen atmosphere so as not to be exposed to the air. Specifically, a UV curable sealing material was applied to surround the elements, only the UV curable sealing material was irradiated with UV while the light-emitting devices were prevented from being irradiated with the UV, and heat treatment was performed at 80° C. under an atmospheric pressure for one hour. Then, the initial characteristics of the light-emitting devices were measured. Note that the sealed glass substrate was not subjected to particular treatment for improving light extraction efficiency.

Figure 38:
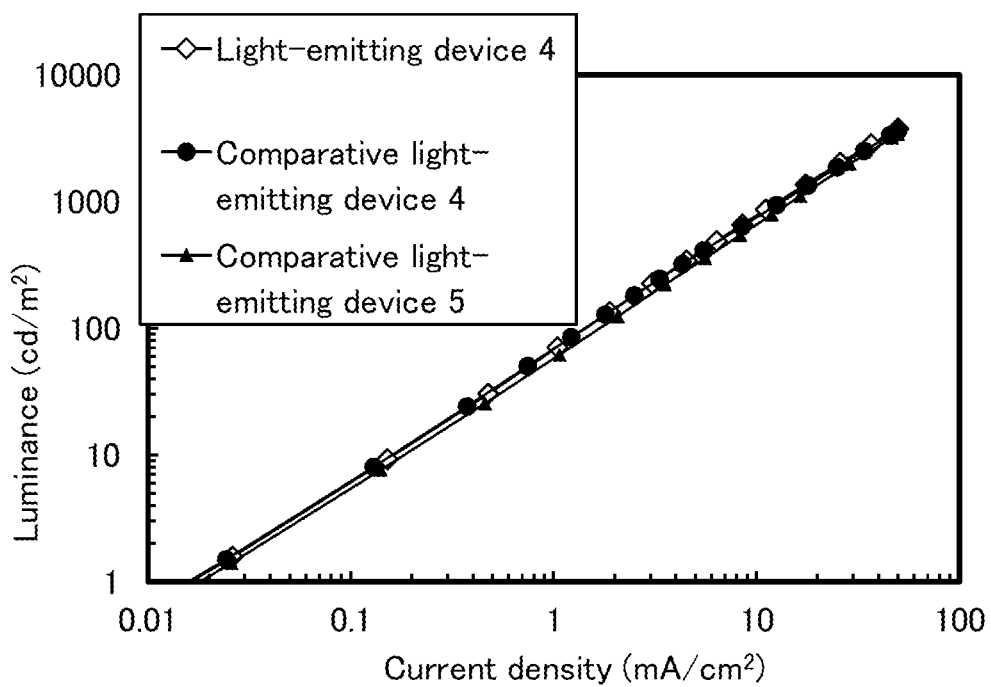
FIG. 38 shows the luminance-current density characteristics of a light-emitting device 4, a comparative light-emitting device 4, and a comparative light-emitting device 5.
Figure 39:
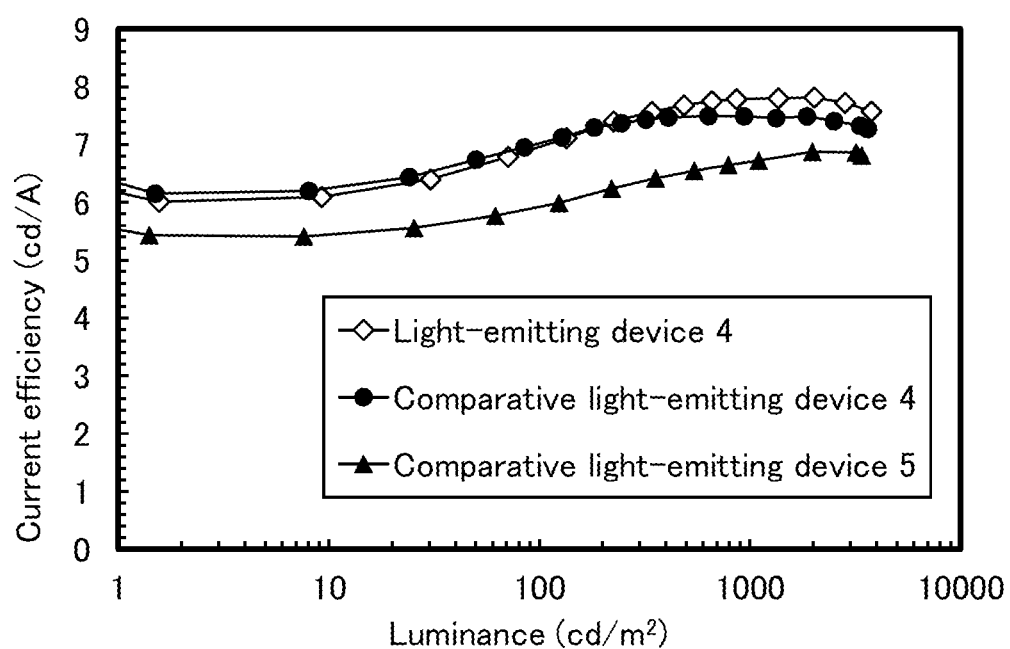
FIG. 39 shows the current efficiency-luminance characteristics of the light-emitting device 4, the comparative light-emitting device 4, and the comparative light-emitting device 5.
Figure 40:
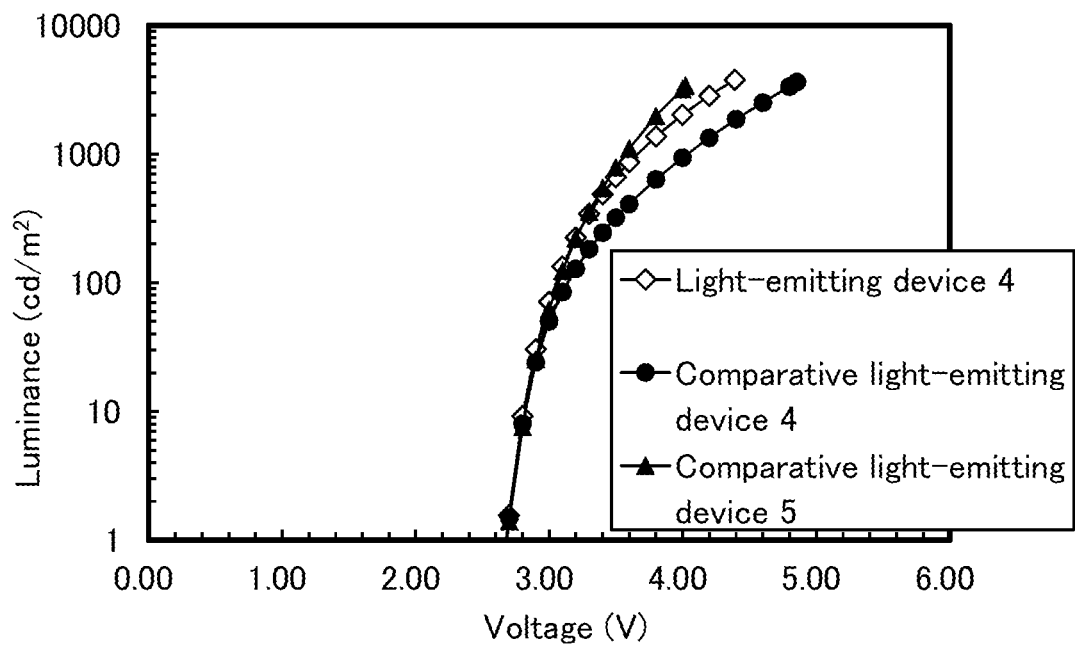
FIG. 40 shows the luminance-voltage characteristics of the light-emitting device 4, the comparative light-emitting device 4, and the comparative light-emitting device 5.
Figure 41:
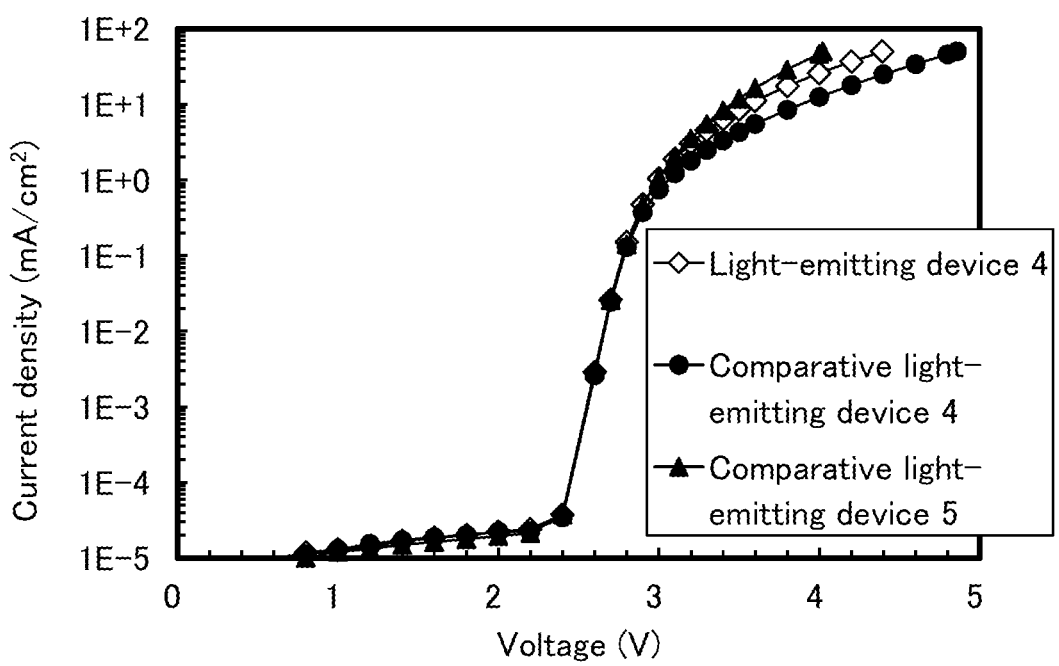
FIG. 41 shows the current density-voltage characteristics of the light-emitting device 4, the comparative light-emitting device 4, and the comparative light-emitting device 5.
Figure 42:
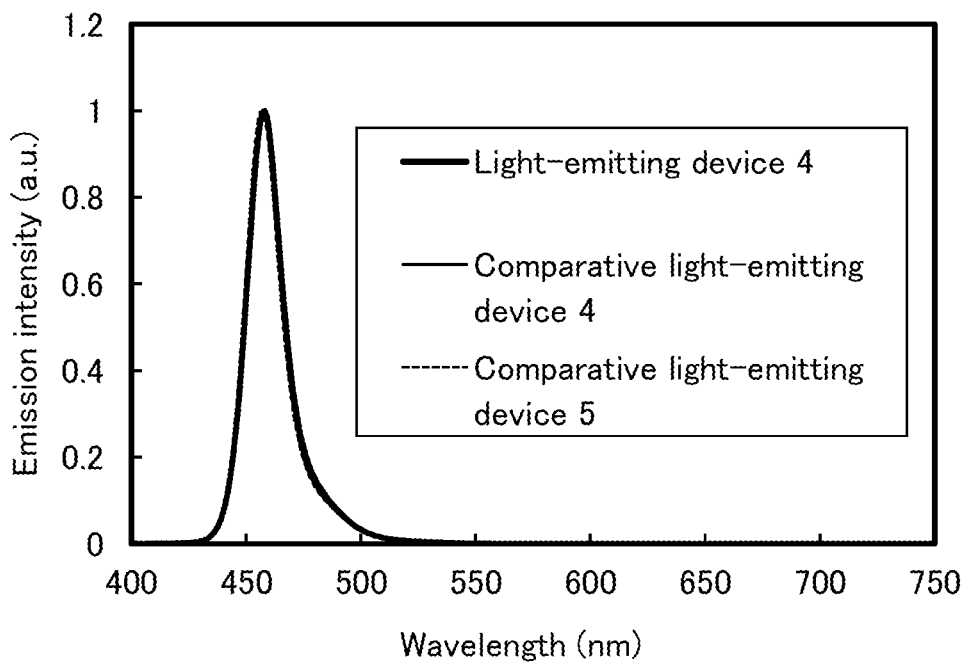
FIG. 42 shows the emission spectra of the light-emitting device 4, the comparative light-emitting device 4, and the comparative light-emitting device 5.
Figure 43:
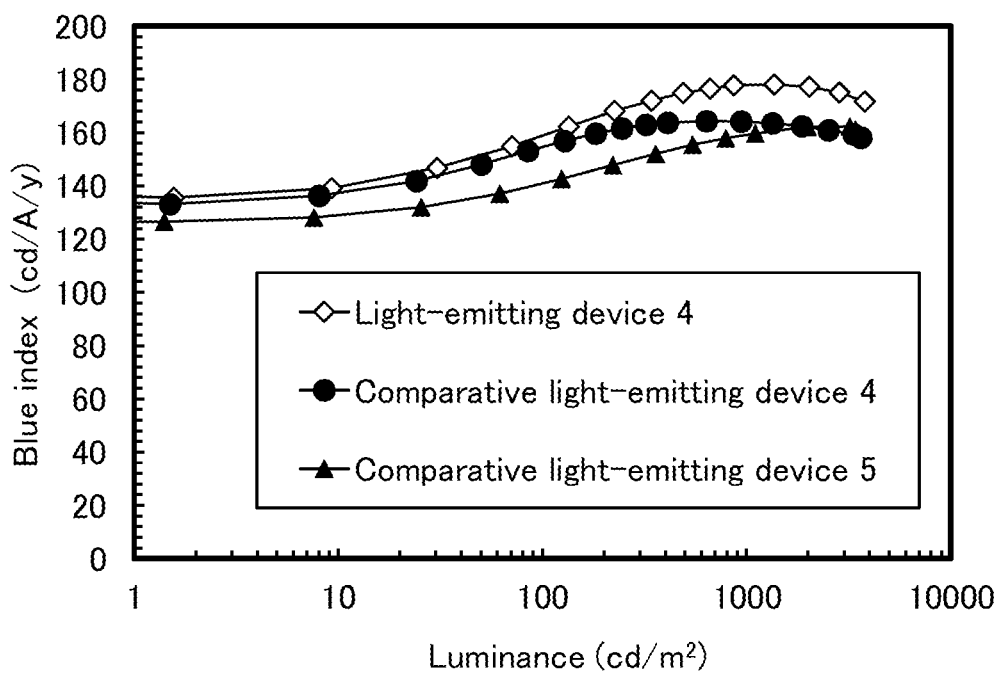
FIG. 43 shows the blue index-luminance characteristics of the light-emitting device 4, the comparative light-emitting device 4, and the comparative light-emitting device 5.

FIG. 38 shows the luminance-current density characteristics of the light-emitting device 4 and the comparative light-emitting devices 4 and 5. FIG. 39 shows the current efficiency-luminance characteristics thereof. FIG. 40 shows the luminance-voltage characteristics thereof. FIG. 41 shows the current density-voltage characteristics thereof. FIG. 42 shows the emission spectra thereof. FIG. 43 shows the blue index-luminance characteristics thereof. Table 12 shows the main characteristics of the light-emitting device 4 and the comparative light-emitting devices 4 and 5 at a luminance of about 1000 cd/m$^2$. Luminance, CIE chromaticity, and emission spectra were measured at normal temperature with a spectroradiometer (SR-UL1R manufactured by TOPCON TECHNOHOUSE CORPORATION).

Note that the blue index (BI) is a value obtained by dividing current efficiency (cd/A) by chromaticity y (cd/A/y), and is one of the indicators of characteristics of blue light emission. As the chromaticity y is smaller, the color purity of blue light emission tends to be higher. With high color purity, a wide range of blue can be expressed even with a small number of luminance components; thus, using blue light emission with high color purity reduces the luminance needed for expressing blue, leading to lower power consumption. Thus, BI that is based on chromaticity y, which is one of the indicators of color purity of blue, is suitably used as a mean for showing efficiency of blue light emission. The light-emitting device with higher BI can be regarded as a blue light emitting device having more favorable characteristics for a display.

TABLE 12

| | voltage (V) | current (mA) | current density (mA/cm$^2$) | chromaticity x | chromaticity y | current efficiency (cd/A) | BI (cd/A/y) | power efficiency (lm/W) |
|---|---|---|---|---|---|---|---|---|
| Light-emitting device 4 | 3.6 | 0.44 | 11.1 | 0.14 | 0.04 | 7.8 | 178 | 6.8 |
| Comparative light-emitting device 4 | 4.0 | 0.50 | 12.5 | 0.14 | 0.05 | 7.5 | 164 | 5.9 |
| Comparative light-emitting device 5 | 3.6 | 0.66 | 16.4 | 0.14 | 0.04 | 6.7 | 160 | 5.9 |

FIGS. 38 to 43 and Table 12 show that the light-emitting device 4 of one embodiment of the present invention is a light-emitting device that has more favorable current efficiency than the comparative light-emitting device 5 while exhibiting almost the same emission spectrum as that of the comparative light-emitting device 5. It is also found that the light-emitting device 4 of one embodiment of the present invention has a lower driving voltage than the comparative light-emitting device 4.

The blue index (BI) of the light-emitting device 4, the blue index (BI) of the comparative light-emitting device 4, and the blue index (BI) of the comparative light-emitting device 5 at a luminance of about 1000 cd/m$^2$ are 178 (cd/A/y), 164 (cd/A/y), and 160 (cd/A/y), respectively. This suggests that the light-emitting device 4 is a light-emitting device particularly with favorable BI. Hence, one embodiment of the present invention is suitable for the light-emitting device used in a display.

The power efficiency of the light-emitting device 4, the power efficiency of the comparative light-emitting device 4, and the power efficiency of the comparative light-emitting device 5 at a luminance of about 1000 cd/m² are 6.8 (lm/W), 5.9 (lm/W), and 5.9 (lm/W), respectively. This suggests that the light-emitting device 4 is a light-emitting device particularly with low power consumption.

A light-emitting device 15 and a light-emitting device 16 were fabricated and their initial characteristics were measured. The light-emitting device 15 is a bottom emission light-emitting device and has almost the same structure as the light-emitting device 4 except that the hole-transport layer is a stack of 20-nm-thick PCBBiF and 10-nm-thick N,N-bis[4-(dibenzofuran-4-yl)phenyl]-4-amino-p-terphenyl (abbreviation: DBfBB1TP), and the electron-injection layer is 1-nm-thick lithium fluoride. The light-emitting device 16 was fabricated by changing Li-6mq in the light-emitting device 15 into 2-methyl-8-quinolinolato-lithium (abbreviation: Li-mq). The current value at 4 V is 0.36 mA in the light-emitting device 15 and 0.27 mA in the light-emitting device 16, i.e., 30% or more higher in the light-emitting device 15 than in the light-emitting device 16. Thus, the light-emitting device using a metal complex that includes a ligand having an 8-quinolinolato structure having an alkyl group with 1 to 3 carbon atoms at the 6-position can particularly have a lower driving voltage than the light-emitting device using a metal complex that includes a ligand having an 8-quinolinolato structure having an alkyl group at the 2-position.

Example 6

Synthesis Example 2

Described in this example is a method for synthesizing 6-ethyl-8-quinolinolato-lithium (abbreviation: Li-6eq), which is a metal complex of one embodiment of the present invention. The structural formula of Li-6eq is shown below.

[Chemical Formula 22]

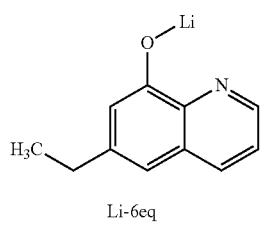

Li-6eq
(101)

Step 1: Synthesis of 6-ethyl-8-hydroxyquinoline

First, 5.21 g (38.0 mmol) of 2-amino-5-ethylphenol and 135 mL of 1N hydrochloric acid were put into a three-neck flask and stirred at 100° C. for 30 minutes. A mixed solution of 7.42 g (57.0 mmol) (8.73 mL) of acrolein diethyl acetal and 10 mL of ethanol was dropped onto this reacted solution in one hour and heated at 100° C. for 5 hours. After the reaction, the reacted solution was heated at 100° C. for 120 minutes. Dichloromethane was added to the reacted solution and then, an aqueous layer was adjusted to pH7 with use of 10% sodium hydroxide solution and 1N hydrochloric acid. The solution was filtered to separate an organic layer; then, the aqueous layer was subjected to extraction with dichloromethane. The extracted solution and the organic layer were washed with water and the organic layer was dried with magnesium sulfate and concentrated, so that a black solid containing the target substance was obtained.

The resulting solid was purified by silica gel column chromatography using the developing solvent of hexane and ethyl acetate, whose polarity was changed from 10:0 to 10:1 (hexane: ethyl acetate). This purification step was performed twice in total to give 3.4 g of a target white yellow solid (yield: 51%). The synthesis scheme in Step 1 is shown below.

[Chemical Formula 23]

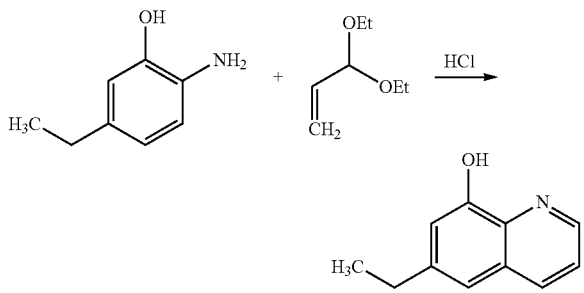

Step 2: Synthesis of Li-6eq

First, 3.0 g (17.4 mmol) of 6-ethyl-8-hydroxyquinoline obtained in Step 1 and 200 mL of dehydrated tetrahydrofuran (abbreviation: THF) were put into a three-neck flask and stirred. Then, 13.9 mL (13.9 mmol) of 1M THF solution of lithium tert-butoxide (abbreviation: tBuOLi) was added to this solution and stirred at room temperature for 68 hours. The reacted solution was concentrated to give a yellow solid. Acetonitrile was added to this solid and subjected to ultrasonic irradiation and filtration, so that a yellow solid was obtained. This washing step was performed twice. The obtained residue was 2.6 g of yellow solid (yield: 104%).

By a train sublimation method, 2.58 g of the obtained yellow solid was purified by sublimation while being heated for 15.5 hours at a pressure of 2.8 Pa and a temperature of 335° C. After the sublimation purification, 1.94 g of a yellow solid was obtained at a collection rate of 75%. The synthesis scheme in Step 2 is shown below.

[Chemical Formula 24]

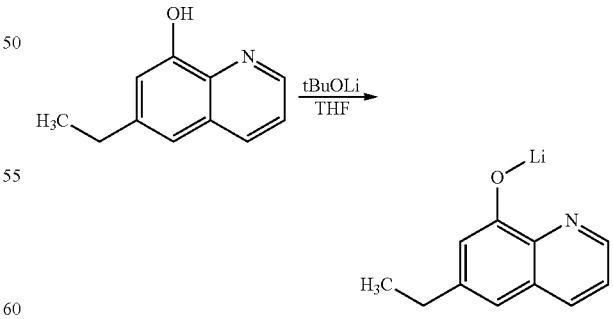

Analysis results by nuclear magnetic resonance spectroscopy (¹H-NMR) of the obtained yellow solid are shown below. The results reveal that Li-6eq, the organic compound of one embodiment of the present invention represented by the above structural formula (101), was obtained in this example.

H¹NMR(DMSO-d6, 300 MHz): δ=1.21 (t, 3H), 2.54 (t, 2H), 6.29 (s, 1H), 6.37 (s, 1H), 7.22 (q, 1H), 7.96 (d, 1H), 8.30 (d, 1H).

Figure 45:
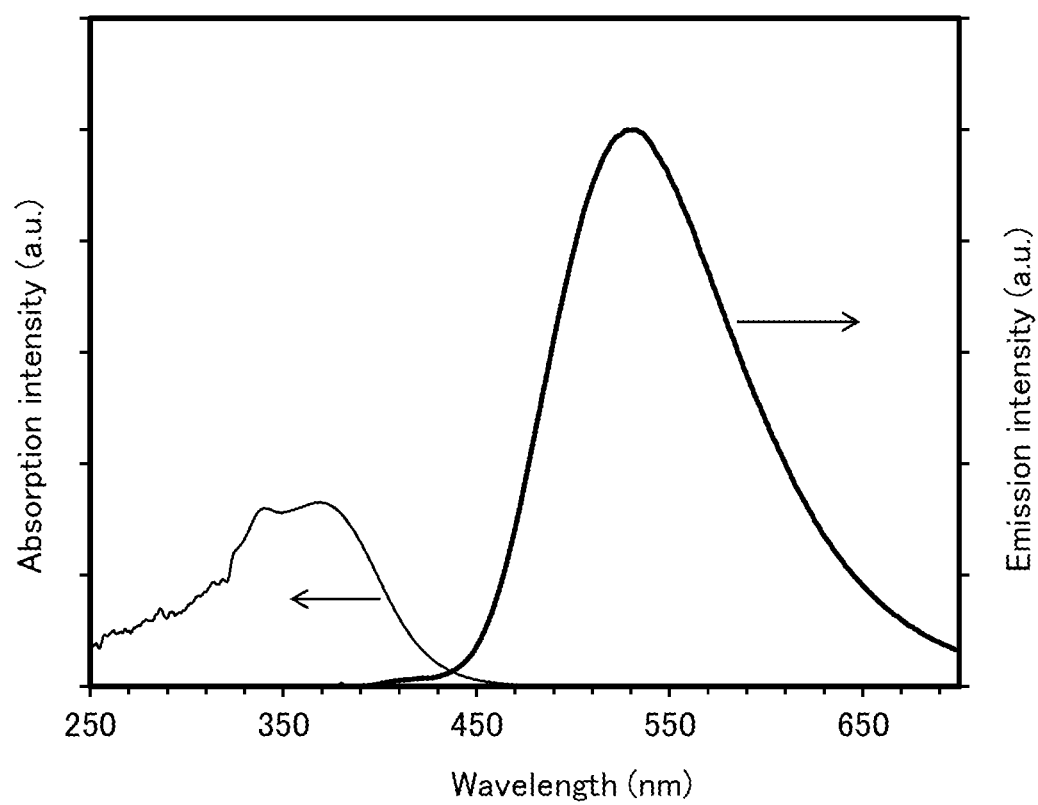
FIG. 45 shows the absorption and emission spectra of Li-6eq in a dehydrated acetone solution.

Next, the measurement results of the absorption and emission spectra of Li-6eq in a dehydrated acetone solution are shown in FIG. 45. The absorption spectrum of Li-6eq in the dehydrated acetone solution was measured with an ultraviolet-visible light spectrophotometer (V550, manufactured by JASCO Corporation), and the spectrum of dehydrated acetone alone in a quartz cell was subtracted. The emission spectrum was measured with a fluorescence spectrophotometer (FP-8600, produced by JASCO Corporation).

Li-6eq in the dehydrated acetone solution has an absorption peak at 369 nm, and an emission wavelength peak at 532 nm (excitation wavelength: 375 nm).

Figure 46:
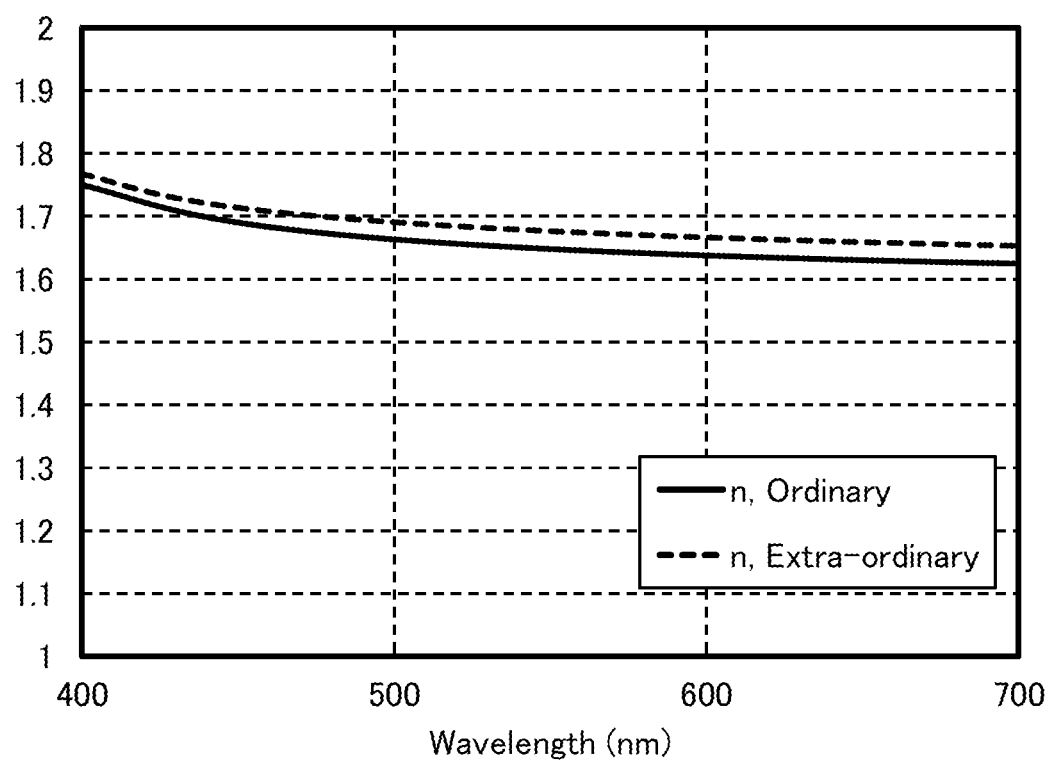
FIG. 46 shows the measurement data of the refractive index of Li-6eq.

FIG. 46 shows the refractive index of Li-6eq measured by a spectroscopic ellipsometer (M-2000U, produced by J. A. Woollam Japan Corp.). To obtain a film used for measurement, the material for each layer was deposited to a thickness of approximately 50 nm over a quartz substrate by a vacuum evaporation method. Note that FIG. 46 shows the refractive index of an ordinary ray (n, Ordinary), and the refractive index of an extraordinary ray (n, Extra-ordinary).

FIG. 46 indicates that the ordinary refractive index of Li-6eq in the whole blue emission region (455 nm to 465 nm) is 1.68, which is in the range of 1.45 to 1.70. In addition, the ordinary refractive index of Li-6eq at a wavelength of 633 nm is 1.63, which is in the range of 1.40 to 1.65, suggesting that Li-6eq is a material with a low refractive index.

Example 7

Synthesis Example 3

Described in this example is a method for synthesizing 6-methyl-8-quinolinolato-sodium (abbreviation: Na-6mq), which is a metal complex of one embodiment of the present invention. The structural formula of Na-6mq is shown below.

[Chemical Formula 25]

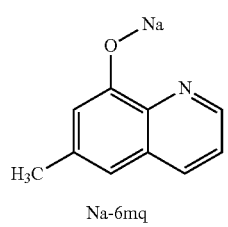

(102)

Na-6mq

Step 1: Synthesis of Na-6mq

First, 3.8 g (23.7 mmol) of 8-hydroxy-6-methylquinoline, 0.76 g (18.9 mmol) of sodium hydroxide, and 240 mL of methanol were put into a three-neck flask and stirred at 80° C. for 8 hours. The reacted solution was heated and distilled under normal pressure. When the solvent was reduced, 140 mL of toluene was added to the solution. This step was performed three times in total. The reacted solution was cooled in ice water and filtered. The obtained residue was 3.4 g of a target yellow-green solid (yield: 98%).

By a train sublimation method, 1.3 g of the obtained yellow-green solid was purified by sublimation for 16.5 hours at a pressure of $3.2 \times 10^{-2}$ Pa and a temperature of 358° C. After the sublimation purification, 1.0 g of a yellow solid was obtained at a collection rate of 77%.

Furthermore, 1.0 g of the obtained yellow solid was purified by sublimation for 16 hours at a pressure of $2.0 \times 10^{-2}$ Pa and a temperature of 356° C. After the sublimation purification, 0.84 g of a yellow solid was obtained at a collection rate of 84%. The synthesis scheme in Step 1 is shown below.

[Chemical Formula 26]

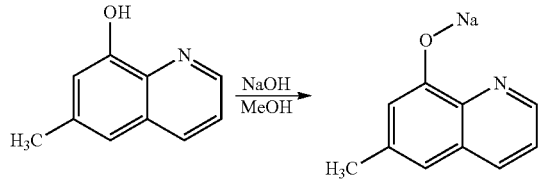

Analysis results by nuclear magnetic resonance spectroscopy (¹H-NMR) of the obtained yellow solid are shown below. The results reveal that Na-6mq, the organic compound of one embodiment of the present invention represented by the above structural formula (102), was obtained in this example.

H¹ NMR (DMSO-d6, 300 MHz): δ=2.24 (s, 3H), 6.32 (d, 2H), 7.18 (q, 1H), 7.86 (d, 1H), 8.37 (d, 1H).

Figure 47:
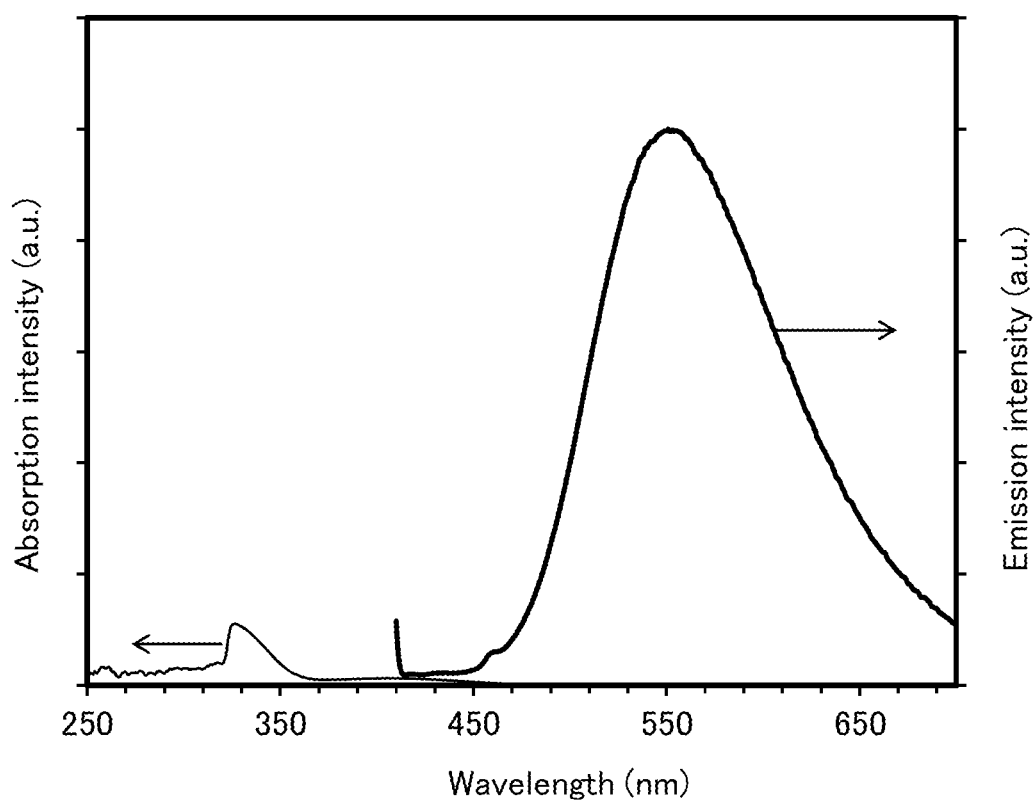
FIG. 47 shows the absorption and emission spectra of Na-6mq in a dehydrated acetone solution.

The measurement results of the absorption and emission spectra of Na-6mq in a dehydrated acetone solution are shown in FIG. 47. The absorption spectrum of Na-6mq in the dehydrated acetone solution was measured with an ultraviolet-visible light spectrophotometer (V550, manufactured by JASCO Corporation), and the spectrum of dehydrated acetone alone in a quartz cell was subtracted. The emission spectrum was measured with a fluorescence spectrophotometer (FP-8600, produced by JASCO Corporation). Na-6mq in the dehydrated acetone solution has an absorption peak at 405 nm, and an emission wavelength peak at 551 nm (excitation wavelength: 405 nm).

Example 8

In this example, a light-emitting device 5 and a light-emitting device 6 of one embodiment of the present invention are described. Structural formulae of organic compounds used in this example are shown below.

[Chemical Formula 27]
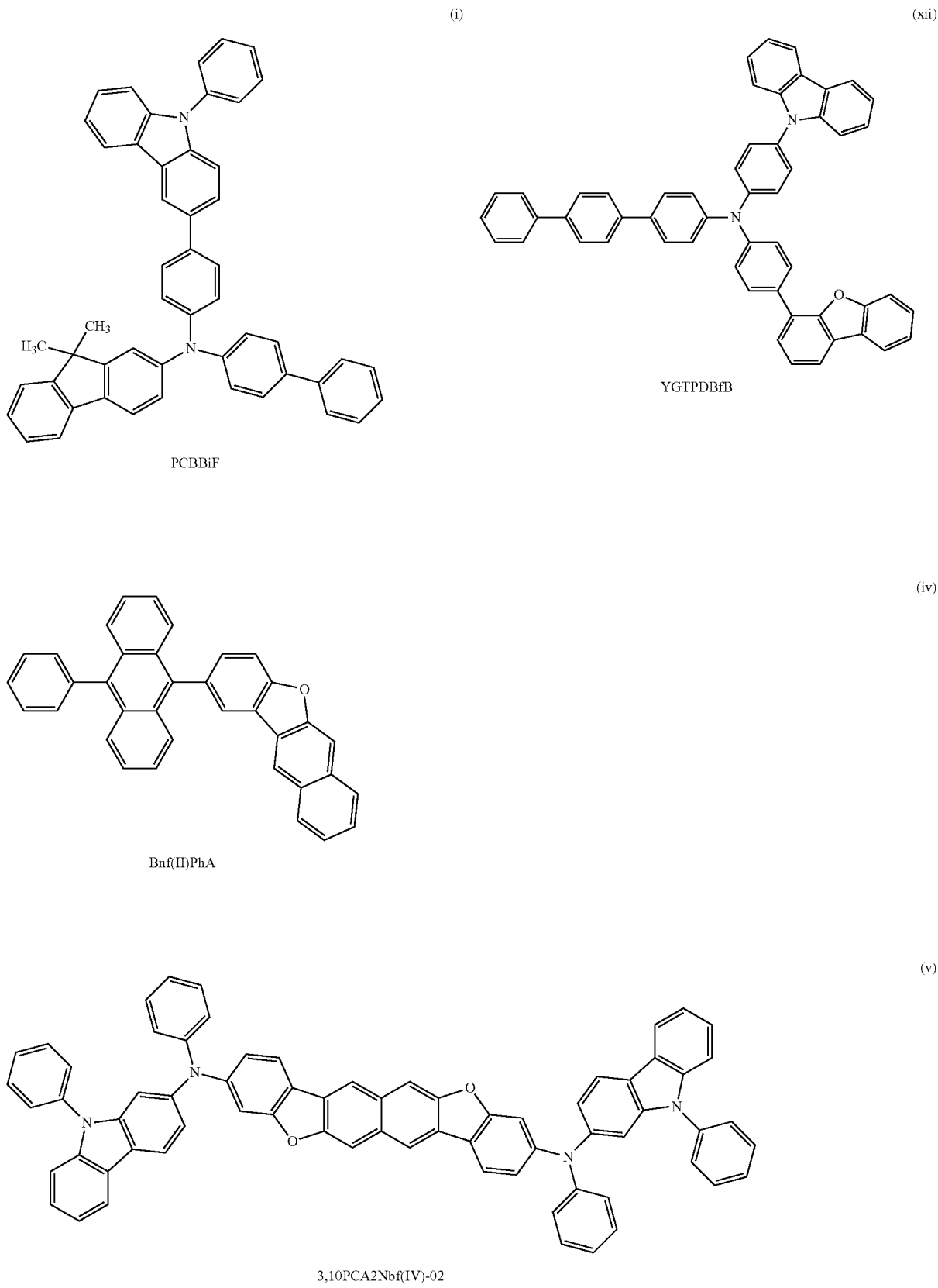

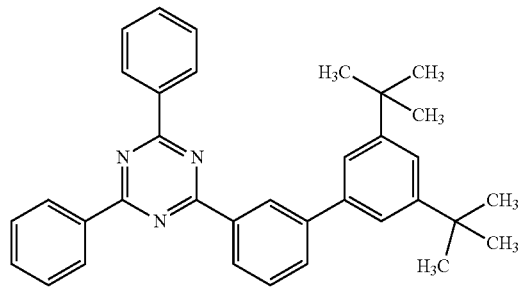

mmtBumBPTzn

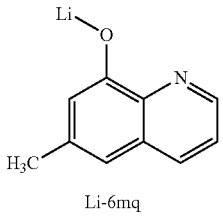

Li-6mq

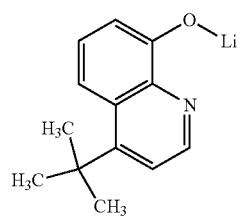

Li-6tBuq (Fabrication Method of Light-Emitting Device 5)

First, indium tin oxide containing silicon oxide (ITSO) was deposited over a glass substrate to a thickness of 70 nm by a sputtering method, whereby the anode 101 was formed. The electrode area was set to 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by the above structural formula (i) and an electron acceptor material (OCHD-001) were deposited on the anode 101 to a thickness of 10 nm by co-evaporation such that the weight ratio of PCBBiF to OCHD-001 was 1:0.05, whereby the hole-injection layer 111 was formed.

Over the hole-injection layer 111, PCBBiF was deposited by evaporation to a thickness of 20 nm, whereby the hole-transport layer 112 was formed.

Subsequently, over the hole-transport layer 112, N-[4-(9H-carbazol-9-yl)phenyl]-N-[4-(4-dibenzofuranyl)phenyl]-[1,1':4',1"-terphenyl]-4-amine (abbreviation: YGTPDBfB) represented by the above structural formula (xii) was deposited by evaporation to a thickness of 10 nm, whereby an electron-blocking layer was formed.

Then, 2-(10-phenyl-9-anthracenyl)-benzo[b]naphtho[2,3-d]furan (abbreviation: Bnf(II)PhA) represented by the above structural formula (iv) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the above structural formula (v) were deposited to a thickness of 25 nm by co-evaporation such that the weight ratio of Bnf(II)PhA to 3,10PCA2Nbf(IV)-02 was 1:0.015, whereby the light-emitting layer 113 was formed.

After that, 2-{(3',5'-di-tert-butyl)-1,1'-biphenyl-3-yl}-4,6-diphenyl-1,3,5-triazine (abbreviation: mmtBumBPTzn) represented by the above structural formula (xiii) was deposited by evaporation to a thickness of 10 nm, whereby a hole-blocking layer was formed. Then, mmtBumBPTzn and 6-methyl-8-quinolinolato-lithium (abbreviation: Li-6mq) represented by the above structural formula (vii) were deposited to a thickness of 20 nm by co-evaporation such that the weight ratio of mmtBumBPTzn to Li-6mq was 1:1, whereby the electron-transport layer 114 was formed.

After the electron-transport layer 114 was formed, lithium fluoride was deposited to a thickness of 1 nm to form the electron-injection layer 115, and lastly aluminum was deposited to a thickness of 200 nm by evaporation to form the cathode 102, whereby the light-emitting device 5 was fabricated. Note that the light-emitting device in this example is a bottom emission device in which light is extracted through the anode 101.

(Fabrication Method of Light-Emitting Device 6)

The light-emitting device 6 was fabricated in a manner similar to that for the light-emitting device 5 except that Li-6mq was replaced with 6-tert-butyl-8-quinolinolato-lithium (abbreviation: Li-6tBuq) represented by the above structural formula (xiii).

The ordinary refractive index of Li-6tBuq in the whole blue emission region (455 nm to 465 nm) is greater than or equal to 1.63 and less than or equal to 1.64, which is in the range of 1.45 to 1.70. In addition, the ordinary refractive index of Li-6tBuq at a wavelength of 633 nm is 1.59, which is in the range of 1.40 to 1.65, suggesting that Li-6tBuq is a material with a low refractive index.

The structures of the light-emitting devices 5 and 6 are listed in the following table.

TABLE 13

|  | film thickness | Light-emitting device 5 | Light-emitting device 6 |
| --- | --- | --- | --- |
| electron-injection layer | 1 nm | LiF | |
| electron-transport layer | 20 nm | mmtBumBPTzn:Li-6mq (1:1) | mmtBumBPTzn:Li-6tBuq (1:1) |
| hole-blocking layer | 10 nm | mmtBumBPTzn | |
| light-emitting layer | 25 nm | Bnf(II)PhA:3,10PCA2Nbf(IV)-02 (1:0.015) | |
| electron-blocking layer | 10 nm | YGTPDBfB | |
| hole-transport layer | 20 nm | PCBBiF | |
| hole-injection layer | 10 nm | PCBBiF:OCHD-001 (1:0.05) | |

The light-emitting devices 5 and 6 were sealed using a glass substrate in a glove box containing a nitrogen atmosphere so as not to be exposed to the air. Specifically, a UV curable sealing material was applied to surround the elements, only the UV curable sealing material was irradiated with UV while the light-emitting devices were prevented from being irradiated with the UV, and heat treatment was performed at 80° C. under an atmospheric pressure for one hour. Then, the initial characteristics of the light-emitting devices were measured. Note that the sealed glass substrate was not subjected to particular treatment for improving light extraction efficiency.

Figure 48:
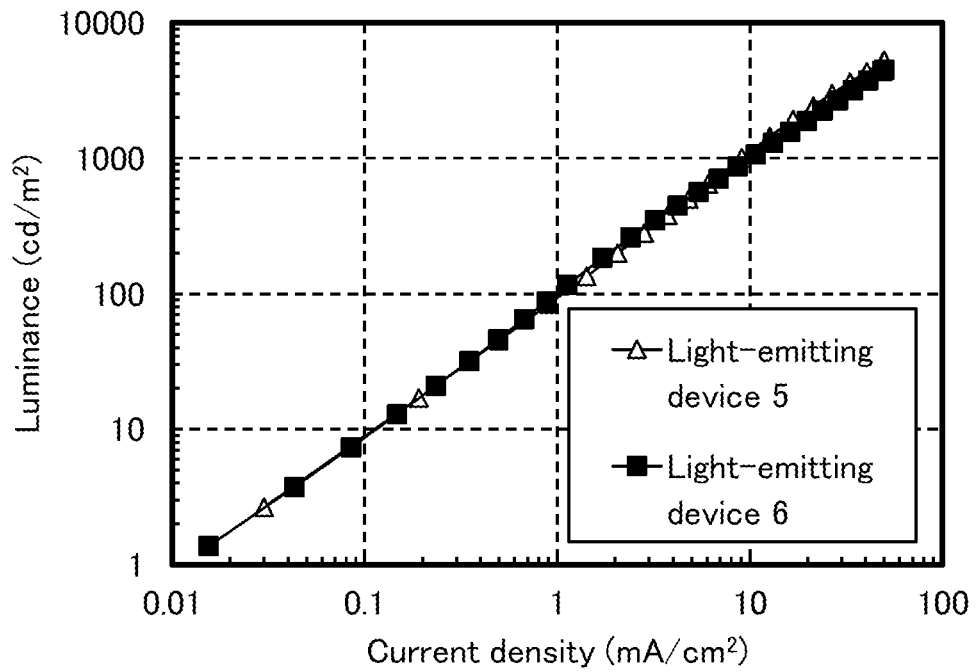
FIG. 48 shows the luminance-current density characteristics of a light-emitting device 5 and a light-emitting device 6.
Figure 49:
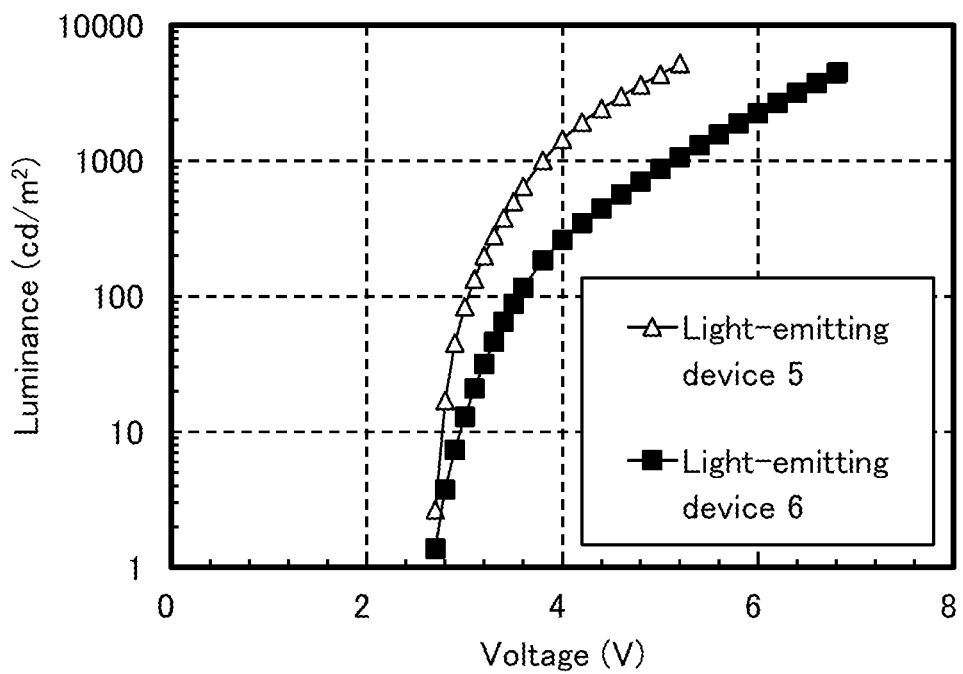
FIG. 49 shows the luminance-voltage characteristics of the light-emitting device 5 and the light-emitting device 6.
Figure 50:
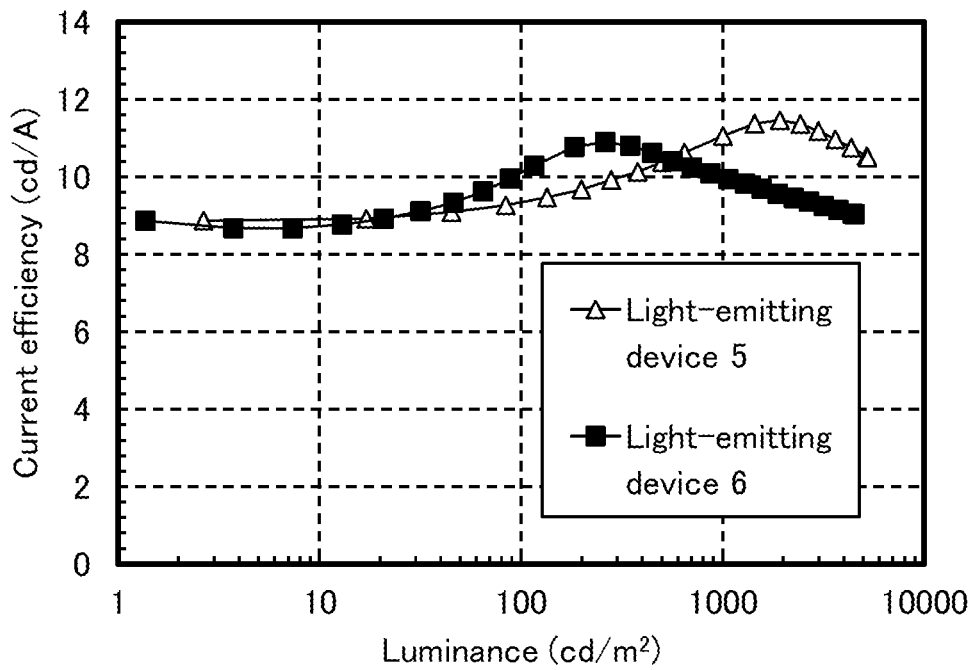
FIG. 50 shows the current efficiency-luminance characteristics of the light-emitting device 5 and the light-emitting device 6.
Figure 51:
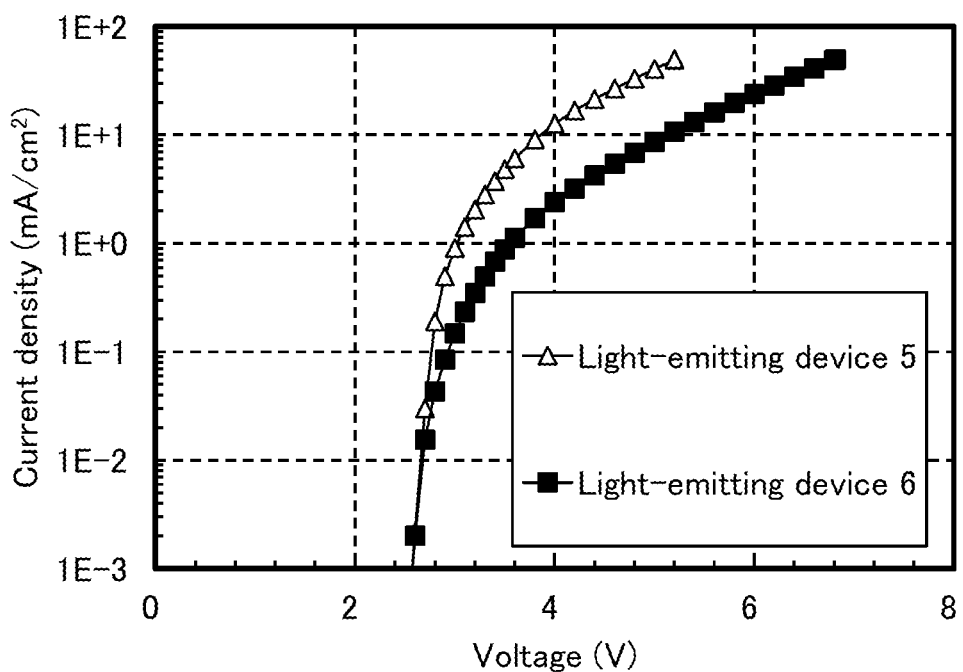
FIG. 51 shows the current density-voltage characteristics of the light-emitting device 5 and the light-emitting device 6.
Figure 52:
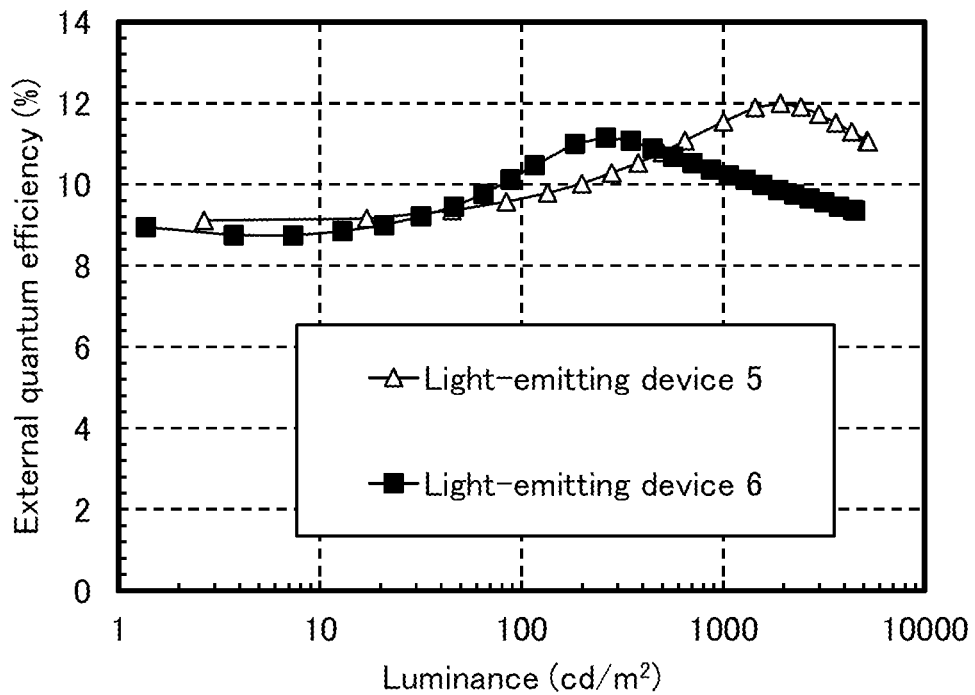
FIG. 52 shows the external quantum efficiency-luminance characteristics of the light-emitting device 5 and the light-emitting device 6.
Figure 53:
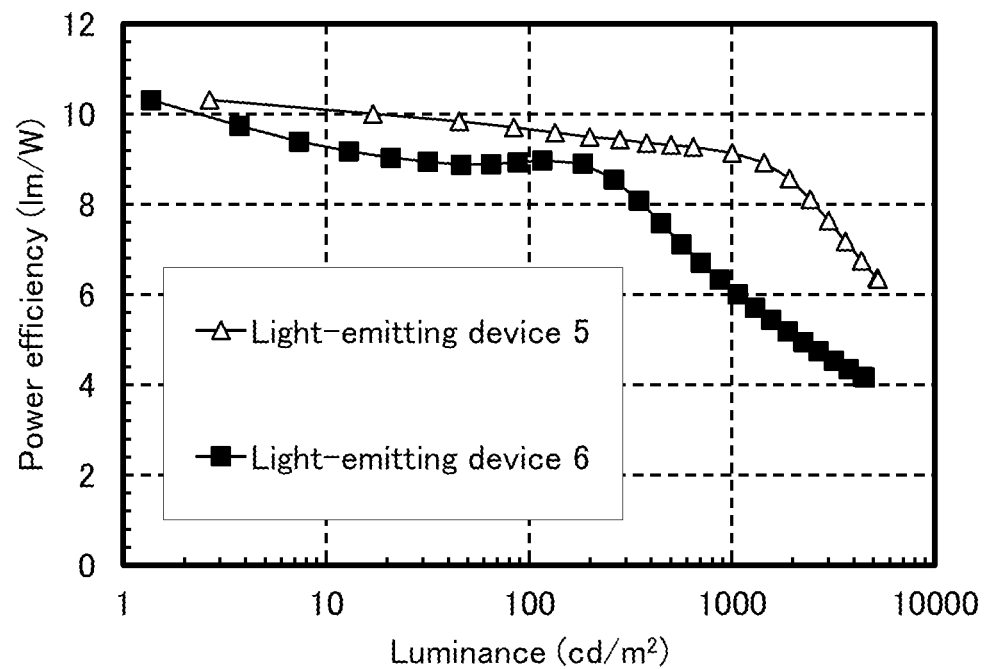
FIG. 53 shows the power efficiency-luminance characteristics of the light-emitting device 5 and the light-emitting device 6.
Figure 54:
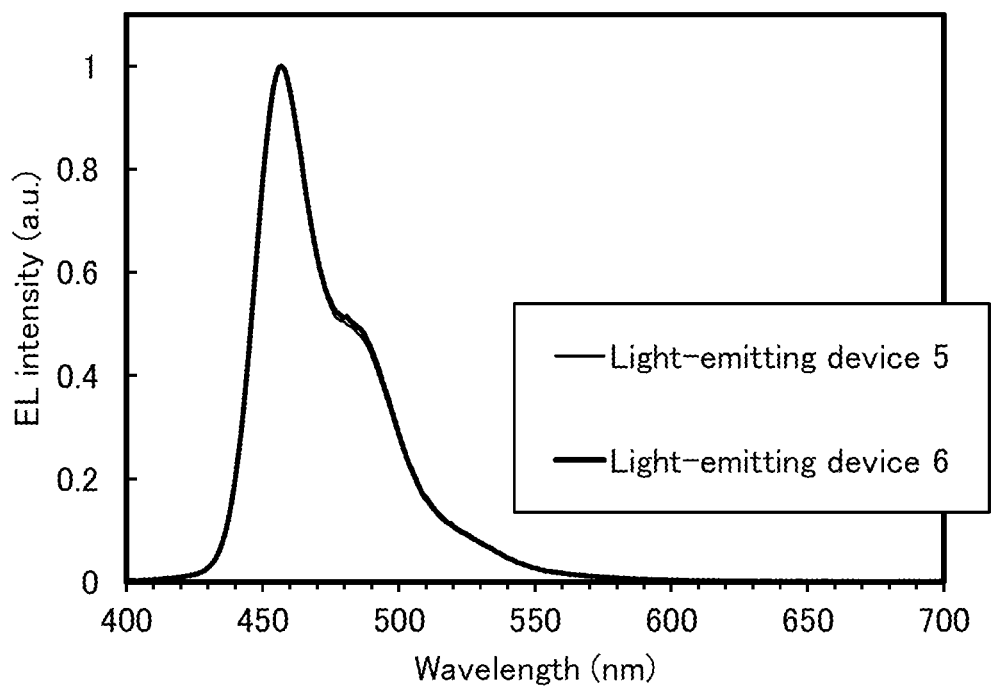
FIG. 54 shows the emission spectra of the light-emitting device 5 and the light-emitting device 6.

FIG. 48 shows the luminance-current density characteristics of the light-emitting devices 5 and 6. FIG. 49 shows the current efficiency-luminance characteristics thereof. FIG. 50 shows the luminance-voltage characteristics thereof. FIG. 51 shows the current density-voltage characteristics thereof. FIG. 52 shows the external quantum efficiency-luminance characteristics thereof. FIG. 53 shows the power efficiency-luminance characteristics thereof. FIG. 54 shows the emission spectra thereof. Table 14 shows the main characteristics of the light-emitting devices 5 and 6 at a luminance of about 1000 cd/m$^2$. Luminance, CIE chromaticity, and emission spectra were measured at normal temperature with a spectroradiometer (SR-UL1R manufactured by TOPCON TECHNOHOUSE CORPORATION).

FIGS. 48 to 54 and Table 14 show that both of the light-emitting devices 5 and 6 of one embodiment of the present invention have favorable characteristics. In particular, the light-emitting device 5 using Li-6mq has higher external quantum efficiency than the light-emitting device 6, and was found to be a light-emitting device particularly with a low driving voltage and favorable current efficiency and power efficiency. Thus, the light-emitting device using a metal complex that includes a ligand having an 8-quinolinolato structure having an alkyl group with 1 to 3 carbon atoms at the 6-position can particularly have a lower driving voltage than the light-emitting device using a metal complex that includes a ligand having an 8-quinolinolato structure having an alkyl group with four or more carbon atoms (e.g., t-butyl groups) at the 6-position.

Example 9

In this example, a light-emitting device 7 and a light-emitting device 8 of one embodiment of the present invention and a comparative light-emitting device 6 are described. Structural formulae of organic compounds used in this example are shown below.

TABLE 14

|  | voltage (V) | current (mA) | current density (mA/cm$^2$) | chromaticity x | chromaticity y | current efficiency (cd/A) | power efficiency (lm/W) | external quantum efficiency (%) |
| --- | --- | --- | --- | --- | --- | --- | --- | --- |
| Light-emitting device 5 | 3.8 | 0.36 | 9.1 | 0.14 | 0.11 | 11.1 | 9.1 | 11.5 |
| Light-emitting device 6 | 5.2 | 0.43 | 10.7 | 0.14 | 0.11 | 9.9 | 6.0 | 10.2 |

[Chemical Formula 28]
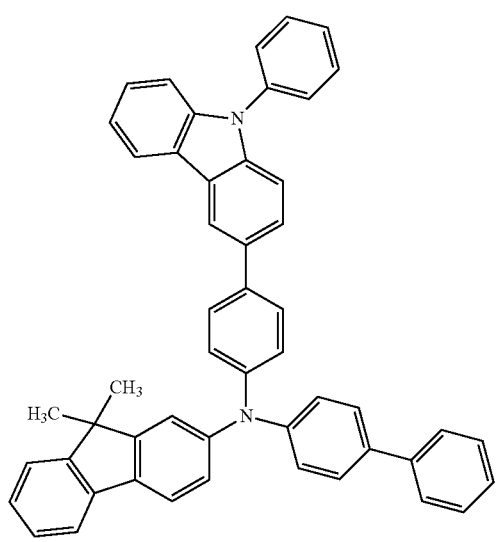
PCBBiF (i)
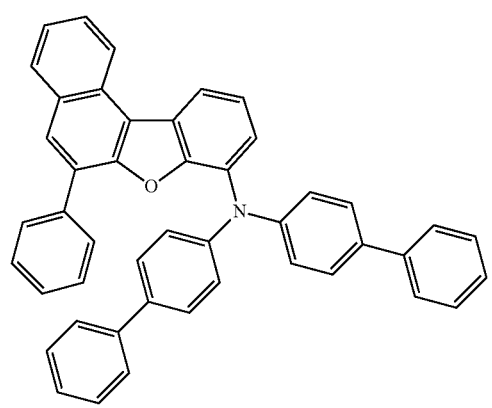
BBABnf (xii)
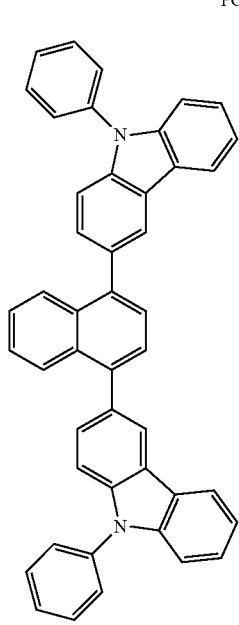
PCzN2 (iii)
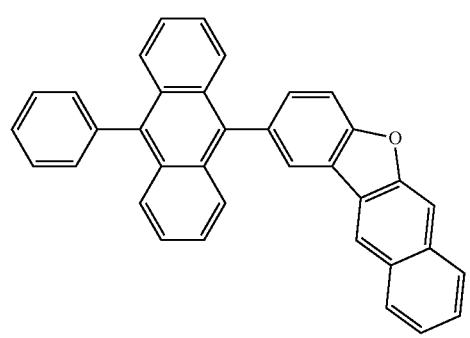
Bnf(II)PhA (iv)
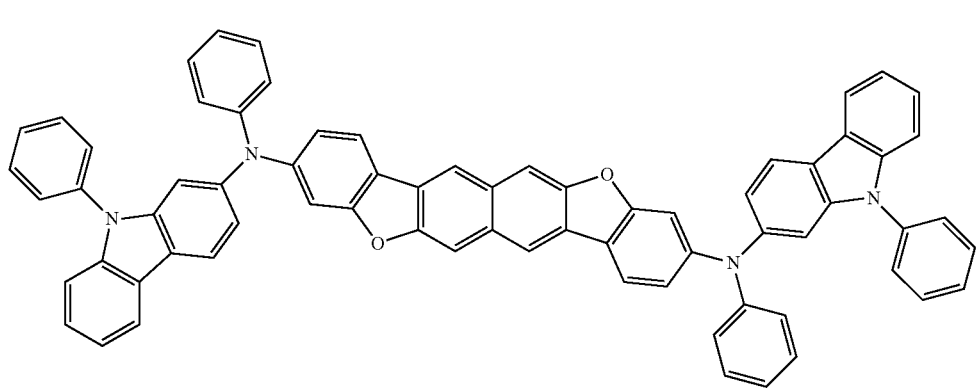
3,10PCA2Nbf(IV)-02 (v)

-continued

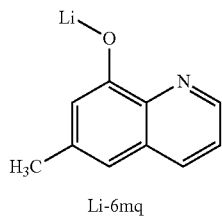
Li-6mq

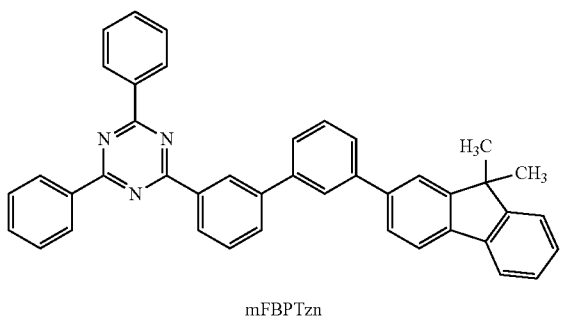
mFBPTzn

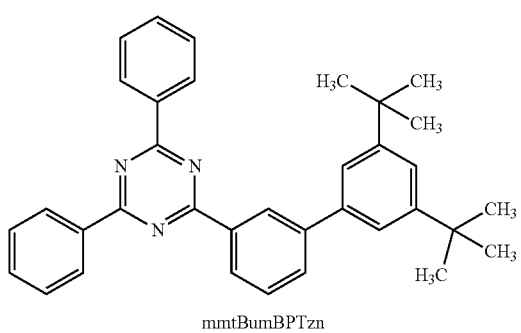
mmtBumBPTzn

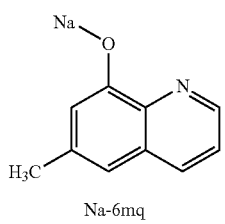
Na-6mq

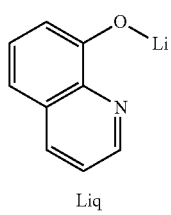
Liq (Fabrication Method of Light-Emitting Device 7)

First, indium tin oxide containing silicon oxide (ITSO) was deposited over a glass substrate to a thickness of 70 nm by a sputtering method, whereby the anode 101 was formed. The electrode area was set to 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by the above structural formula (i) and an electron acceptor material (OCHD-001) were deposited on the anode 101 to a thickness of 10 nm by co-evaporation such that the weight ratio of PCBBiF to OCHD-001 was 1:0.05, whereby the hole-injection layer 111 was formed.

Over the hole-injection layer 111, PCBBiF was deposited by evaporation to a thickness of 10 nm, and then N,N-bis(4-biphenyl)-6-phenylbenzo[b]naphtho[1,2-d]furan-8-amine (abbreviation: BBABnf) represented by the above structural formula (xii) was deposited by evaporation to a thickness of 10 nm, whereby the hole-transport layer 112 was formed.

Subsequently, over the hole-transport layer 112, 3,3'-(naphthalene-1,4-diyl)bis(9-phenyl-9H-carbazole) (abbreviation: PCzN2) represented by the above structural formula (iii) was deposited by evaporation to a thickness of 10 nm, whereby an electron-blocking layer was formed.

Then, 2-(10-phenyl-9-anthracenyl)-benzo[b]naphtho[2,3-d]furan (abbreviation: Bnf(II)PhA) represented by the above structural formula (iv) and 3,10-bis[N-(9-phenyl-9H-carbazol-2-yl)-N-phenylamino]naphtho[2,3-b;6,7-b]bisbenzofuran (abbreviation: 3,10PCA2Nbf(IV)-02) represented by the above structural formula (v) were deposited to a thickness of 25 nm by co-evaporation such that the weight ratio of Bnf(II)PhA to 3,10PCA2Nbf(IV)-02 was 1:0.015, whereby the light-emitting layer 113 was formed.

After that, 2-[3'-(9,9-dimethyl-9H-fluoren-2-yl)-1,1'-biphenyl-3-yl]-4,6-diphenyl-1,3,5-triazine (abbreviation: mFBPTzn) represented by the above structural formula (vi) was deposited by evaporation to a thickness of 10 nm, whereby a hole-blocking layer was formed. Then, 2-{(3',5'-di-tert-butyl)-1,1'-biphenyl-3-yl}-4,6-diphenyl-1,3,5-triazine (abbreviation: mmtBumBPTzn) represented by the above structural formula (xiii) and 6-methyl-8-quinolinolato-lithium (abbreviation: Li-6mq) represented by the above structural formula (vii) were deposited to a thickness of 20 nm by co-evaporation such that the weight ratio of mmtBumBPTzn to Li-6mq was 1:1, whereby the electron-transport layer 114 was formed.

After the electron-transport layer 114 was formed, lithium fluoride was deposited to a thickness of 1 nm to form the electron-injection layer 115, and lastly aluminum was deposited to a thickness of 200 nm by evaporation to form the cathode 102, whereby the light-emitting device 7 was fabricated. Note that the light-emitting device in this example is a bottom emission device in which light is extracted through the anode 101.

(Fabrication Method of Light-Emitting Device 8)

The light-emitting device 8 was fabricated in a manner similar to that for the light-emitting device 7 except that Li-6mq was replaced with 6-methyl-8-quinolinolato-sodium (abbreviation: Na-6mq) represented by the above structural formula (xiv).

(Fabrication Method of Comparative Light-Emitting Device 6)

The comparative light-emitting device 6 was fabricated in a manner similar to that for the light-emitting device 7 except that Li-6mq was replaced with 8-quinolinolato-lithium (abbreviation: Liq) represented by the above structural formula (ix).

The structures of the light-emitting devices 7 and 8 and the comparative light-emitting device 6 are listed in the following table.

TABLE 15

| | film thickness | Light-emitting device 7 | Light-emitting device 8 | Comparative light-emitting device 6 |
|---|---|---|---|---|
| electron-injection layer | 1 nm | | LiF | |
| electron-transport layer | 20 nm | mmtBumBPTzn:Li-6mq (1:1) | mmtBumBPTzn:Na-6mq (1:1) | mmtBumBPTzn:Liq (1:1) |
| hole-blocking layer | 10 nm | | mFBPTzn | |
| light-emitting layer | 25 nm | | Bnf(II)PhA:3,10PCA2Nbf(IV)-02 (1:0.015) | |
| electron-blocking layer | 10 nm | | PCzN2 | |
| hole-transport layer | 10 nm | | BBABnf | |
| | 10 nm | | PCBBiF | |
| hole-injection layer | 10 nm | | PCBBiF:OCHD-001 (1:0.05) | |

The light-emitting devices 7 and 8 and the comparative light-emitting device 6 were sealed using a glass substrate in a glove box containing a nitrogen atmosphere so as not to be exposed to the air. Specifically, a UV curable sealing material was applied to surround the elements, only the UV curable sealing material was irradiated with UV while the light-emitting devices were prevented from being irradiated with the UV, and heat treatment was performed at 80° C. under an atmospheric pressure for one hour. Then, the initial characteristics of the light-emitting devices were measured. Note that the sealed glass substrate was not subjected to particular treatment for improving light extraction efficiency.

Figure 55:
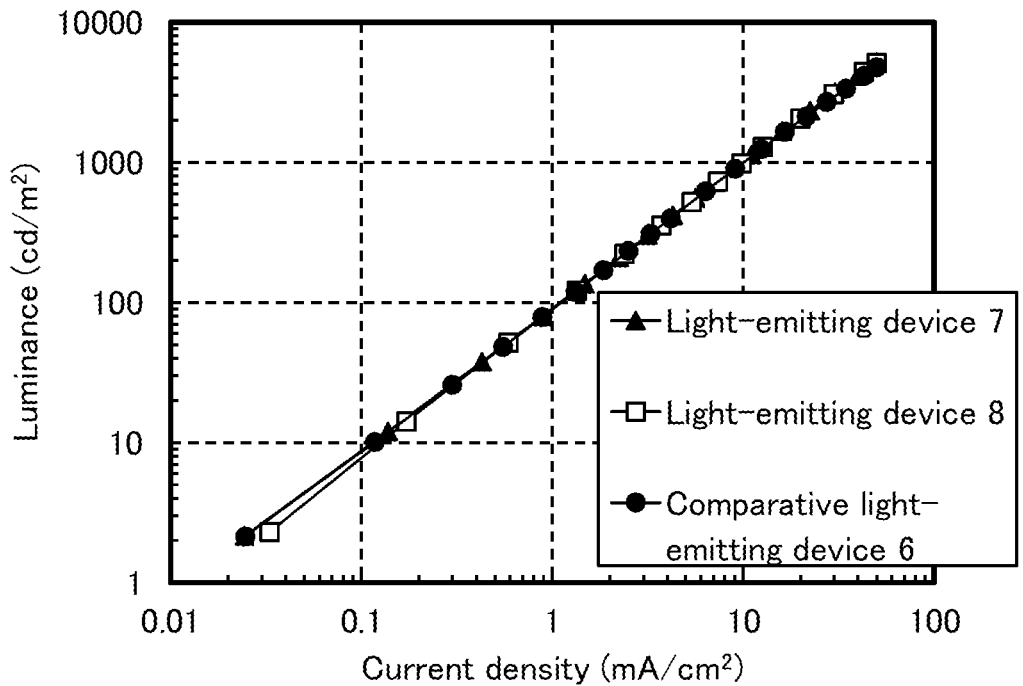
FIG. 55 shows the luminance-current density characteristics of a light-emitting device 7, a light-emitting device 8, and a comparative light-emitting device 6.
Figure 56:
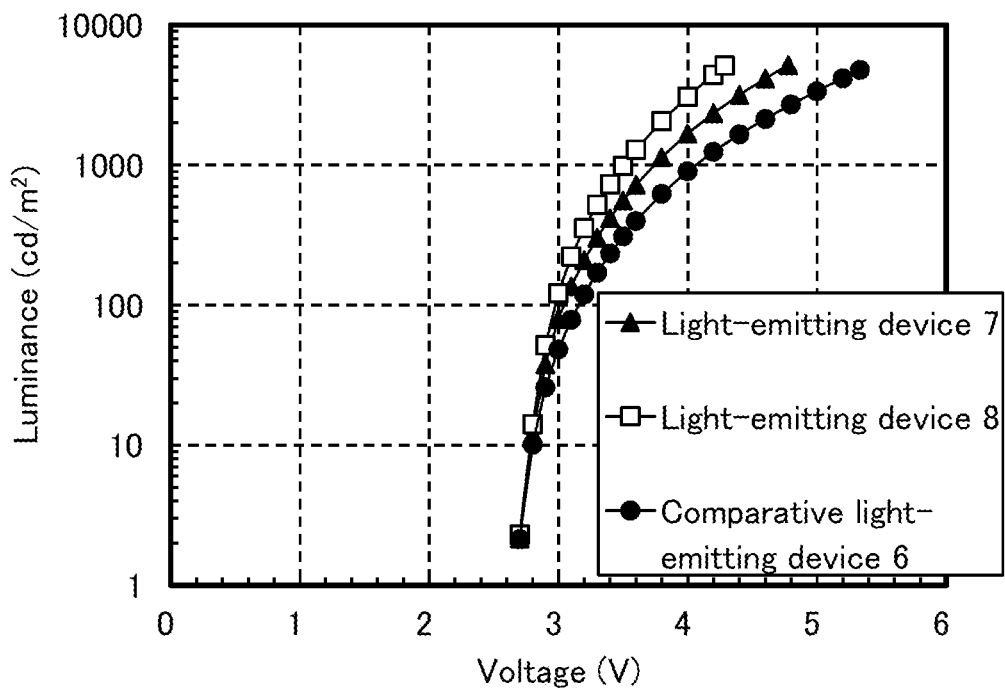
FIG. 56 shows the luminance-voltage characteristics of the light-emitting device 7, the light-emitting device 8, and the comparative light-emitting device 6.
Figure 57:
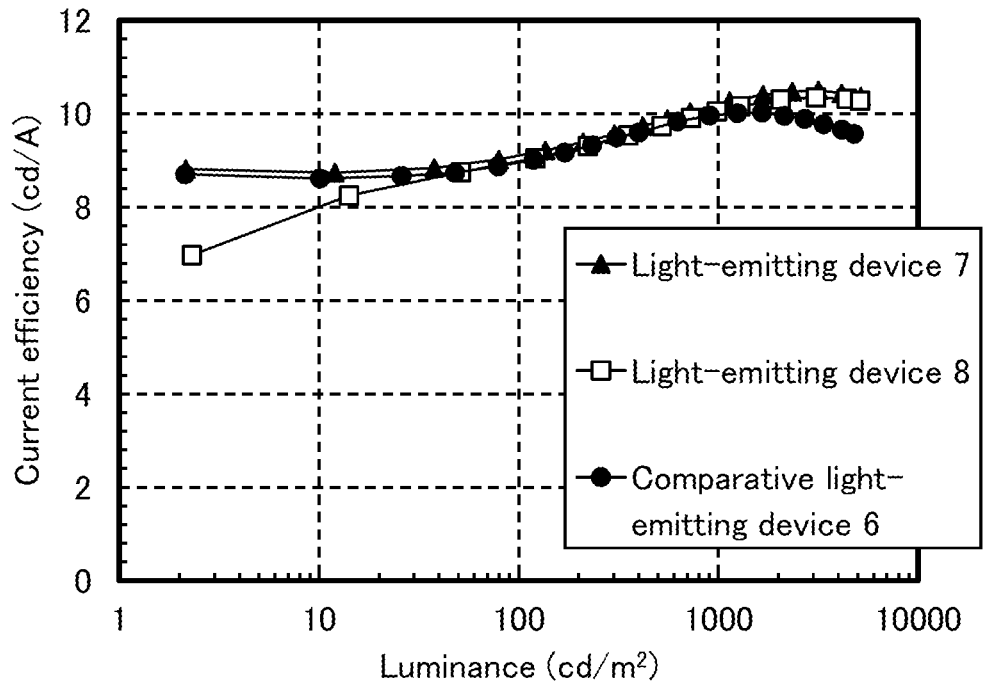
FIG. 57 shows the current efficiency-luminance characteristics of the light-emitting device 7, the light-emitting device 8, and the comparative light-emitting device 6.
Figure 58:
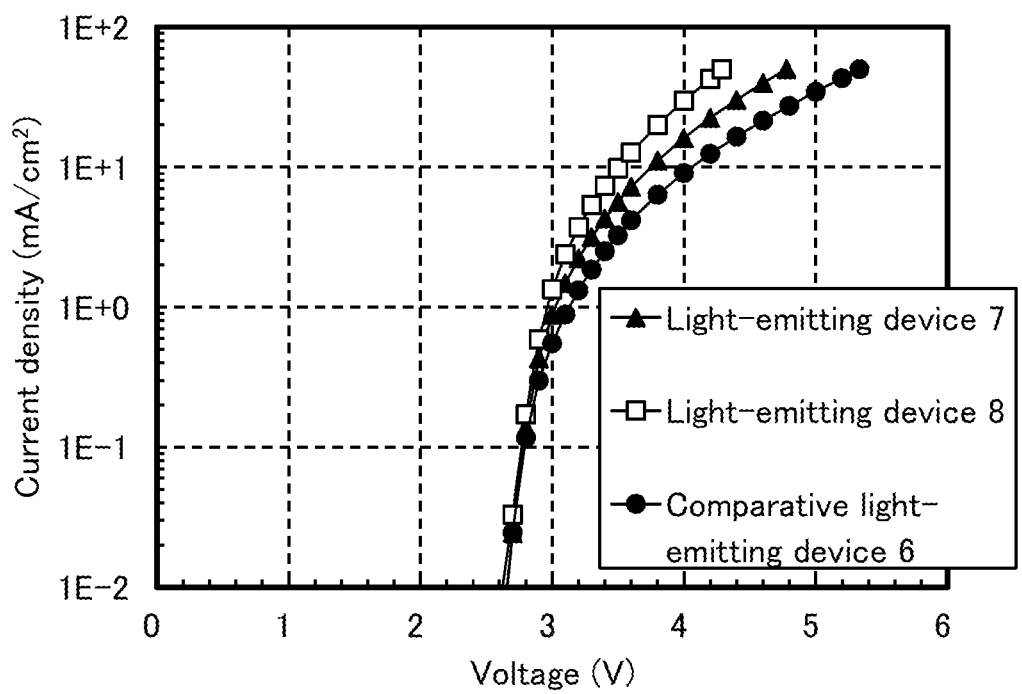
FIG. 58 shows the current density-voltage characteristics of the light-emitting device 7, the light-emitting device 8, and the comparative light-emitting device 6.
Figure 59:
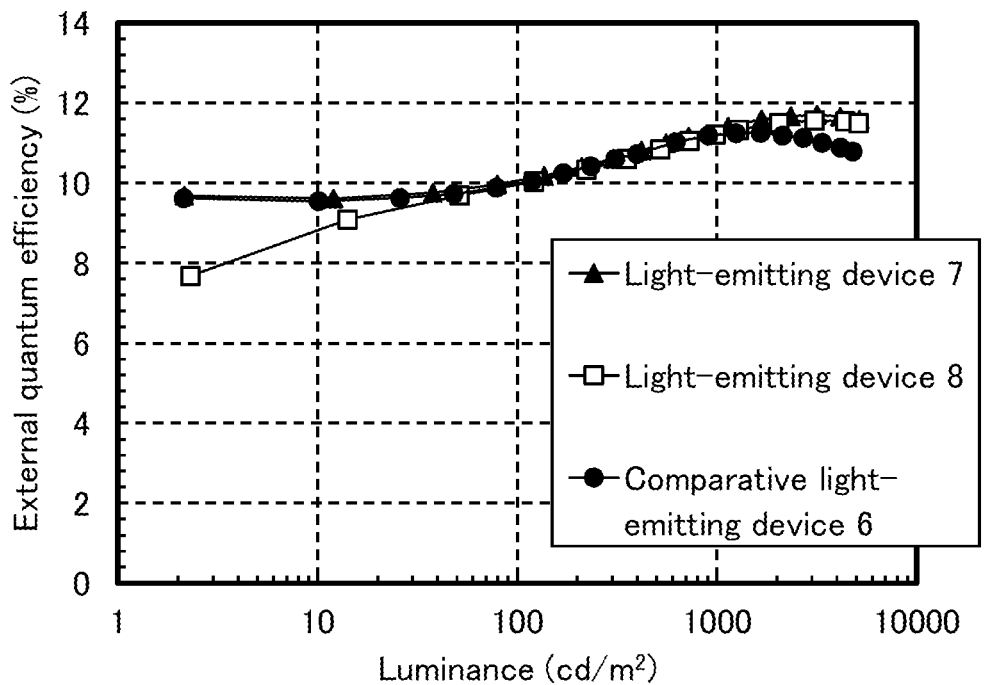
FIG. 59 shows the external quantum efficiency-luminance characteristics of the light-emitting device 7, the light-emitting device 8, and the comparative light-emitting device 6.
Figure 60:
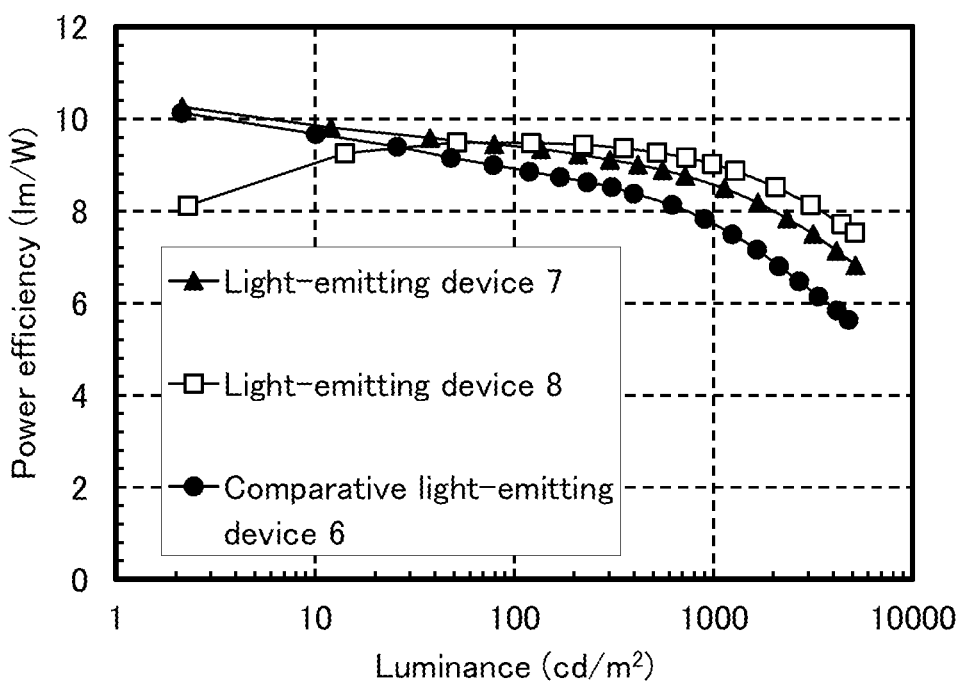
FIG. 60 shows the power efficiency-luminance characteristics of the light-emitting device 7, the light-emitting device 8, and the comparative light-emitting device 6.
Figure 61:
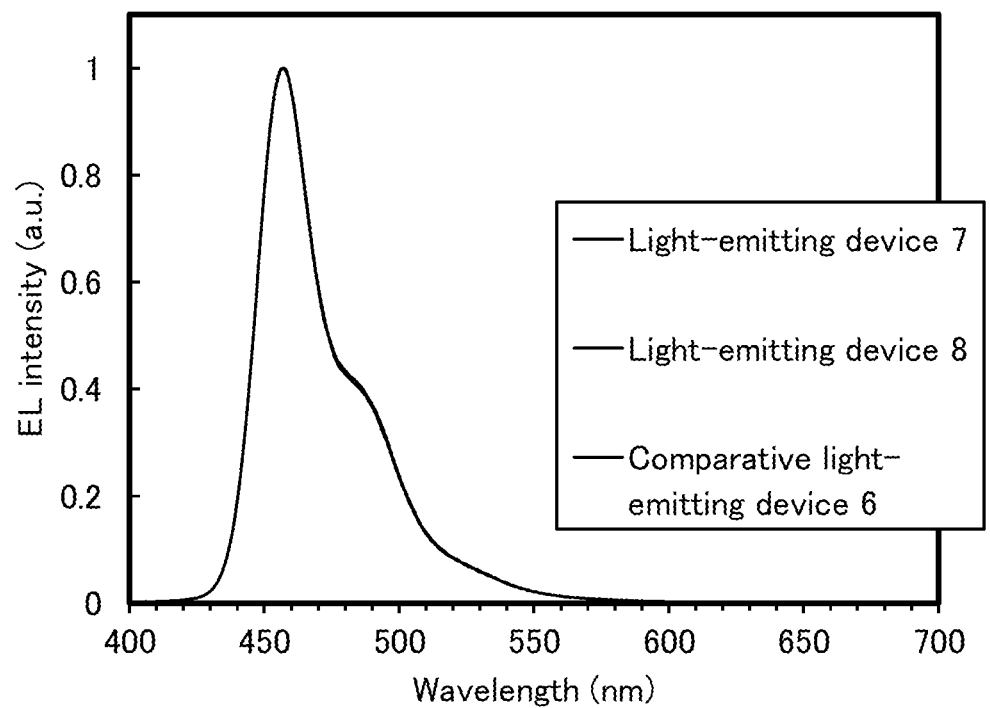
FIG. 61 shows the emission spectra of the light-emitting device 7, the light-emitting device 8, and the comparative light-emitting device 6.

FIG. 55 shows the luminance-current density characteristics of the light-emitting devices 7 and 8 and the comparative light-emitting device 6. FIG. 56 shows the current efficiency-luminance characteristics thereof. FIG. 57 shows the luminance-voltage characteristics thereof. FIG. 58 shows the current density-voltage characteristics thereof. FIG. 59 shows the external quantum efficiency-luminance characteristics thereof. FIG. 60 shows the power efficiency-luminance characteristics thereof. FIG. 61 shows the emission spectra thereof. Table 16 shows the main characteristics of the light-emitting devices 7 and 8 and the comparative light-emitting device 6 at a luminance of about 1000 cd/m$^2$. Luminance, CIE chromaticity, and emission spectra were measured at normal temperature with a spectroradiometer (SR-UL1R manufactured by TOPCON TECHNOHOUSE CORPORATION).

TABLE 16

| | voltage (V) | current (mA) | current density (mA/cm$^2$) | chromaticity x | chromaticity y | current efficiency (cd/A) | power efficiency (lm/W) | external quantum efficiency (%) |
|---|---|---|---|---|---|---|---|---|
| Light-emitting device 7 | 3.8 | 0.44 | 11.1 | 0.14 | 0.10 | 10.3 | 8.5 | 11.4 |
| Light-emitting device 8 | 3.5 | 0.39 | 9.8 | 0.14 | 0.10 | 10.1 | 9.0 | 11.2 |
| Comparative light-emitting device 6 | 4.0 | 0.36 | 9.1 | 0.14 | 0.10 | 10.0 | 7.8 | 11.2 |

FIGS. 55 to 61 and Table 16 show that the light-emitting devices 7 and 8 of one embodiment of the present invention and the comparative light-emitting device 6 have favorable characteristics. In particular, each of the light-emitting devices 7 and 8 using a quinolinol complex of a metal having an alkyl group at the 6-position was found to be a light-emitting device with a low driving voltage and favorable current efficiency and power efficiency. In particular, the light-emitting device 8 using a quinolinol complex of a sodium metal was found to be a light-emitting device with a low driving voltage and favorable current efficiency and power efficiency.

Example 10

In this example, a light-emitting device 9 to a light-emitting device 12 of one embodiment of the present invention are described. Structural formulae of organic compounds used in this example are shown below.

[Chemical Formula 29]

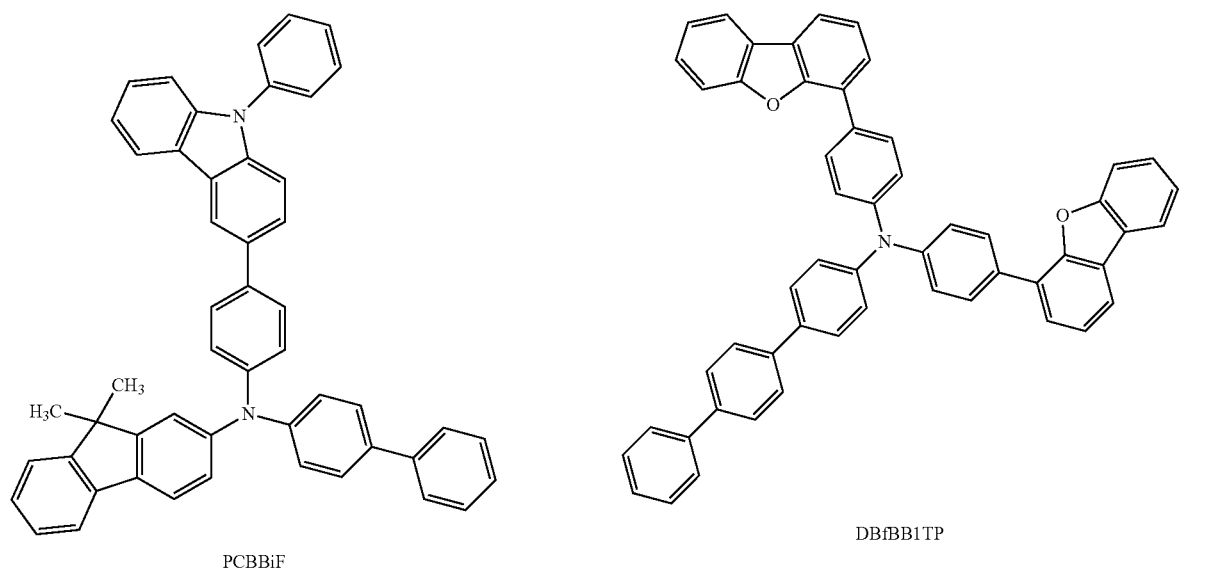

(i) PCBBiF (ii) DBfBB1TP

-continued
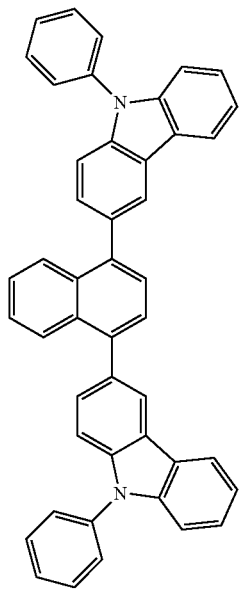
PCzN2
(iii)
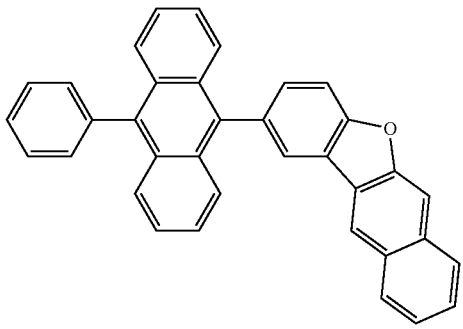
Bnf(II)PhA
(iv)
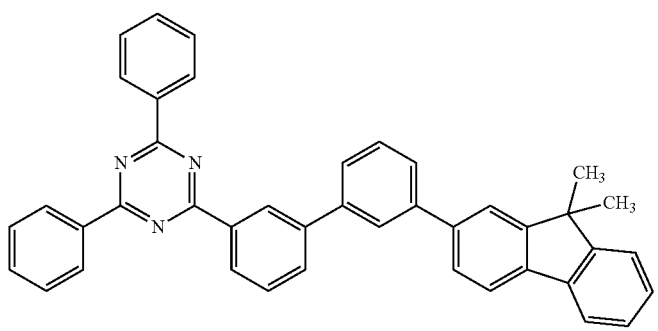
mFBPTzn
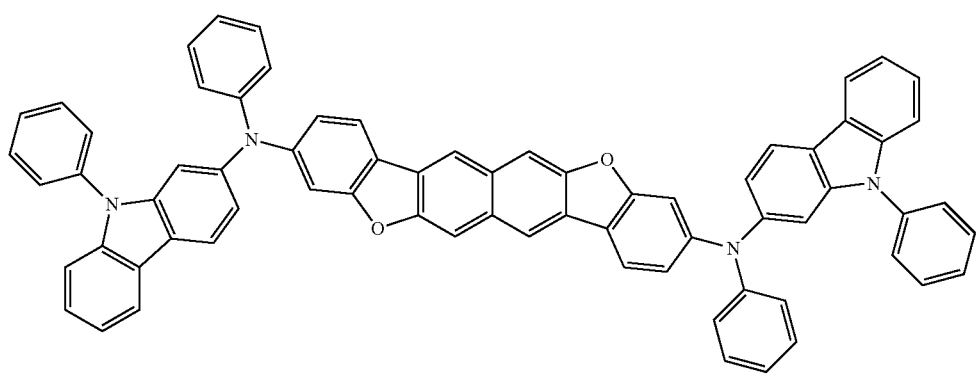
3,10PCA2Nbf(IV)-02
(v)
(vi)

-continued

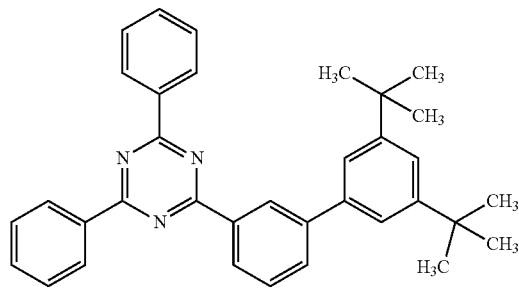

mmtBumBPTzn (xiii)

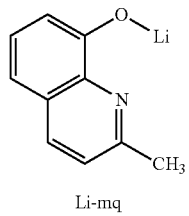

Li-mq (xv)

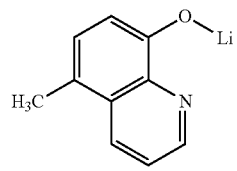

Li-5mq (xvi)

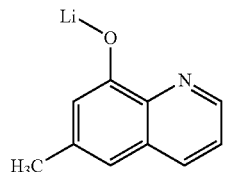

Li-6mq (vii)

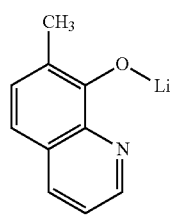

Li-7mq (xvii)

(Fabrication Method of Light-Emitting Device 9)

First, indium tin oxide containing silicon oxide (ITSO) was deposited over a glass substrate to a thickness of 55 nm by a sputtering method, whereby the anode 101 was formed. The electrode area was set to 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by the above structural formula (i) and an electron acceptor material (OCHD-001) were deposited on the anode 101 to a thickness of 10 nm by co-evaporation such that the weight ratio of PCBBiF to OCHD-001 was 1:0.05, whereby the hole-injection layer 111 was formed.

Over the hole-injection layer 111, PCBBiF was deposited by evaporation to a thickness of 20 nm, and then N,N-bis[4-(dibenzofuran-4-yl)phenyl]-4-amino-p-terphenyl (abbreviation: DBfBB1TP) represented by the above structural formula (ii) was deposited by evaporation to a thickness of 10 nm, whereby the hole-transport layer 112 was formed.

Subsequently, over the hole-transport layer 112, 3,3'-(naphthalene-1,4-diyl)bis(9-phenyl-9H-carbazole) (abbreviation: PCzN2) represented by the above structural formula (iii) was deposited by evaporation to a thickness of 10 nm, whereby an electron-blocking layer was formed.

Then, 2-(10-phenyl-9-anthracenyl)-benzo[b]naphtho[2,3-d]furan (abbreviation: Bnf(II)PhA) represented by the above structural formula (iv) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the above structural formula (v) were deposited to a thickness of 25 nm by co-evaporation such that the weight ratio of Bnf(II)PhA to 3,10PCA2Nbf(IV)-02 was 1:0.015, whereby the light-emitting layer 113 was formed.

After that, 2-[3'-(9,9-dimethyl-9H-fluoren-2-yl)-1,1'-biphenyl-3-yl]-4,6-diphenyl-1,3,5-triazine (abbreviation: mFBPTzn) represented by the above structural formula (vi) was deposited by evaporation to a thickness of 10 nm, whereby a hole-blocking layer was formed. Then, 2-{(3',5'-di-tert-butyl)-1,1'-biphenyl-3-yl}-4,6-diphenyl-1,3,5-triazine (abbreviation: mmtBumBPTzn) represented by the above structural formula (xiii) and 2-methyl-8-quinolinolato-lithium (abbreviation: Li-mq) represented by the above structural formula (xv) were deposited to a thickness of 20 nm by co-evaporation such that the weight ratio of mmtBumBPTzn to Li-mq was 0.5:0.5, whereby the electron-transport layer 114 was formed.

After the electron-transport layer 114 was formed, lithium fluoride was deposited to a thickness of 1 nm to form the electron-injection layer 115, and lastly aluminum was deposited to a thickness of 200 nm by evaporation to form the cathode 102, whereby the light-emitting device 9 was fabricated.

(Fabrication Method of Light-Emitting Device 10)

The light-emitting device 10 was fabricated in a manner similar to that for the light-emitting device 9 except that Li-mq used in the electron-transport layer 114 was replaced with 5-methyl-8-quinolinolato-lithium (abbreviation: Li-5mq) represented by the above structural formula (xvi).

(Fabrication Method of Light-Emitting Device 11)

The light-emitting device 11 was fabricated in a manner similar to that for the light-emitting device 9 except that Li-mq used in the electron-transport layer 114 was replaced with 6-methyl-8-quinolinolato-lithium (abbreviation: Li-6mq) represented by the above structural formula (vii) and the weight ratio of mmtBumBPTzn to Li-6mq was set to 0.4:0.6.

(Fabrication Method of Light-Emitting Device 12)

The light-emitting device 12 was fabricated in a manner similar to that for the light-emitting device 9 except that Li-mq used in the electron-transport layer 114 was replaced with 7-methyl-8-quinolinolato-lithium (abbreviation: Li-7mq) represented by the above structural formula (xvii).

The structures of the light-emitting devices 9 to 12 are listed in the following table.

TABLE 17

|  | film thickness | Light-emitting device 9 | Light-emitting device 10 | Light-emitting device 11 | Light-emitting device 12 |
|---|---|---|---|---|---|
| electron-injection layer | 1 nm | LiF | | | |
| electron-transport layer | 20 nm | mmtBumBPTzn:Li-complex | | | |
| | | (0.5:0.5) | | (0.4:0.6) | (0.5:0.5) |
| hole-blocking layer | 10 nm | mFBPTzn | | | |
| light-emitting layer | 25 nm | Bnf(II)PhA:3,10PCA2Nbf(IV)-02 | | | |
| | | (1:0.015) | | | |
| electron-blocking layer | 10 nm | PCzN2 | | | |
| hole-transport layer | 10 nm | DBfBB1TP | | | |
| | 20 nm | PCBBiF | | | |
| hole-injection layer | 10 nm | PCBBiF:OCHD-001 | | | |
| | | (1:0.1) | | | |

Figure 75:
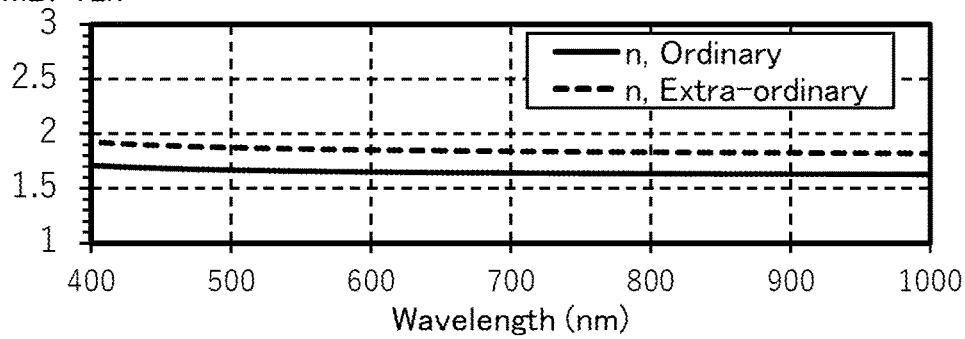
FIG. 75 shows the measurement data of the refractive indices of mmtBumBPTzn, Li-mq, Li-5mq, Li-6mq, and Li-7mq.
Figure 75:
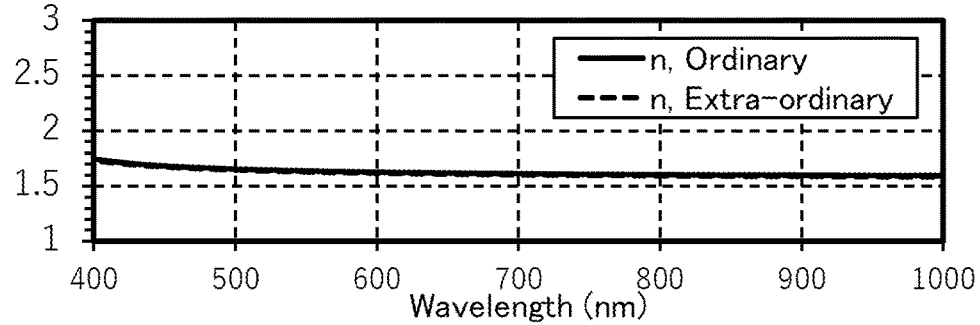
Figure 75:
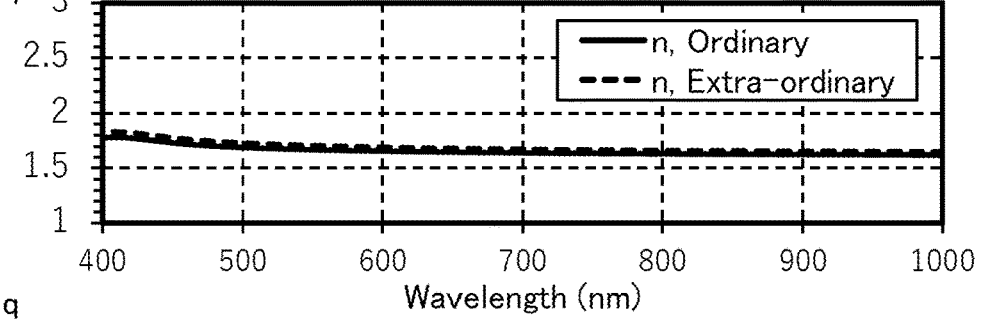
Figure 75:
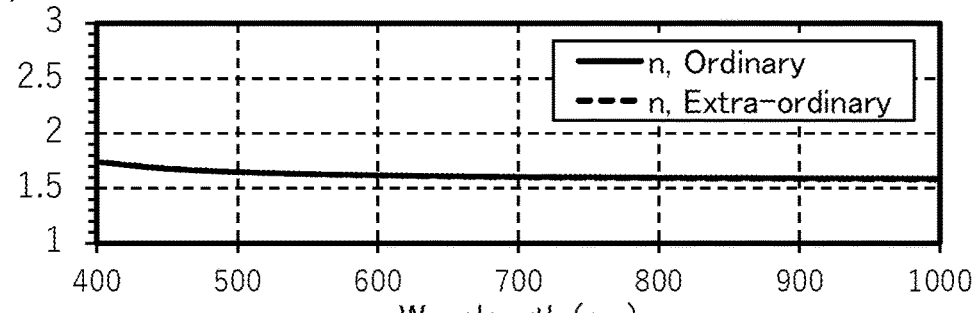
Figure 75:
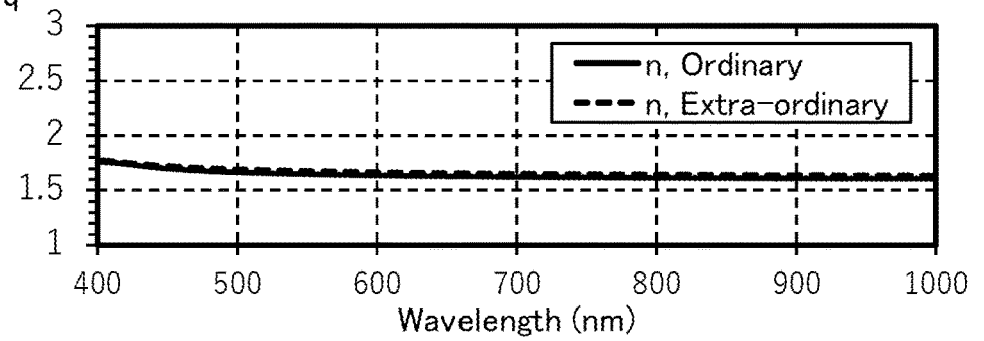

Li-complex
Light-emitting device 9: Li-mq
Light-emitting device 10: Li-5mq
Light-emitting device 11: Li-6mq
Light-emitting device 12: Li-7mq FIG. 75 shows the refractive indices of mmtBumBPTzn, Li-mq, Li-5mq, Li-6mq, and Li-7mq, and Table 18 shows the refractive indices thereof at 456 nm. The measurement was performed with a spectroscopic ellipsometer (M-2000U, produced by J. A. Woollam Japan Corp.). To obtain films used as measurement samples, the material for each layer was deposited to a thickness of approximately 50 nm over a quartz substrate by a vacuum evaporation method. Note that FIG. 75 shows the refractive index of an ordinary ray (n, Ordinary), and the refractive index of an extraordinary ray, (n, Extra-ordinary).

TABLE 18

|  | ordinary refractive index (n, Ordinary) @456 nm |
|---|---|
| mmtBumBPTzn | 1.68 |
| Li-mq | 1.68 |
| Li-5mq | 1.72 |
| Li-6mq | 1.67 |
| Li-7mq | 1.69 |

FIG. 75 and Table 18 indicate that the ordinary refractive index of mmtBumBPTzn in the whole blue emission region (455 nm to 465 nm) is 1.68, which is in the range of 1.50 to 1.75. In addition, the ordinary refractive index of mmtBumBPTzn at a wavelength of 633 nm is 1.64, which is in the range of 1.45 to 1.70, suggesting that mmtBumBPTzn is a material with a low refractive index. The ordinary refractive index of Li-mq in the whole blue emission region (455 nm to 465 nm) is greater than or equal to 1.67 and less than or equal to 1.68, which is in the range of 1.45 to 1.70. In addition, the ordinary refractive index of Li-mq at a wavelength of 633 nm is 1.62, which is in the range of 1.40 to 1.65, suggesting that Li-mq is a material with a low refractive index. The ordinary refractive index of Li-6mq in the whole blue emission region (455 nm to 465 nm) is 1.67, which is in the range of 1.45 to 1.70. In addition, the ordinary refractive index of Li-6mq at a wavelength of 633 nm is 1.61, which is in the range of 1.40 to 1.65, suggesting that Li-6mq is a material with a low refractive index. The ordinary refractive index of Li-7mq in the whole blue emission region (455 nm to 465 nm) is greater than or equal to 1.68 and less than or equal to 1.69, which is in the range of 1.45 to 1.70. In addition, the ordinary refractive index of Li-7mq at a wavelength of 633 nm is 1.63, which is in the range of 1.40 to 1.65, suggesting that Li-7mq is a material with a low refractive index.

The ordinary refractive index of Li-5mq at a wavelength of 633 nm is 1.65, which is in the range of 1.40 to 1.65; in contrast, the ordinary refractive index of Li-5mq in the whole blue emission region (455 nm to 465 nm) is 1.71 to 1.72, which is greater than or equal to 1.70, suggesting that Li-5mq is a material with a higher refractive index than the other Li complexes in this example. However, mmtBumBPTzn, which is an organic compound having an electron-transport property, has an ordinary refractive index in the blue emission region as low as 1.68; thus, the value obtained by dividing by 2 the sum of the ordinary refractive indices of Li-5mq and mmtBumBPTzn is less than or equal to 1.75. Hence, the light-emitting device 10 using Li-5mq exhibits adequate characteristics for a light-emitting device.

The above indicates that in the light-emitting devices 9 to 12, the ordinary refractive index of the electron-transport layer 114 is in the range greater than or equal to 1.50 and less than 1.75 in the whole blue emission region (455 nm to 465 nm) and in the range greater than or equal to 1.45 and less than 1.70 at a wavelength of 633 nm.

The light-emitting devices 9 to 12 were sealed using a glass substrate in a glove box containing a nitrogen atmosphere so as not to be exposed to the air. Specifically, a UV curable sealing material was applied to surround the elements, only the UV curable sealing material was irradiated with UV while the light-emitting devices were prevented from being irradiated with the UV, and heat treatment was performed at 80° C. under an atmospheric pressure for one hour. Then, the initial characteristics of the light-emitting devices were measured. Note that the sealed glass substrate was not subjected to particular treatment for improving light extraction efficiency.

Figure 62:
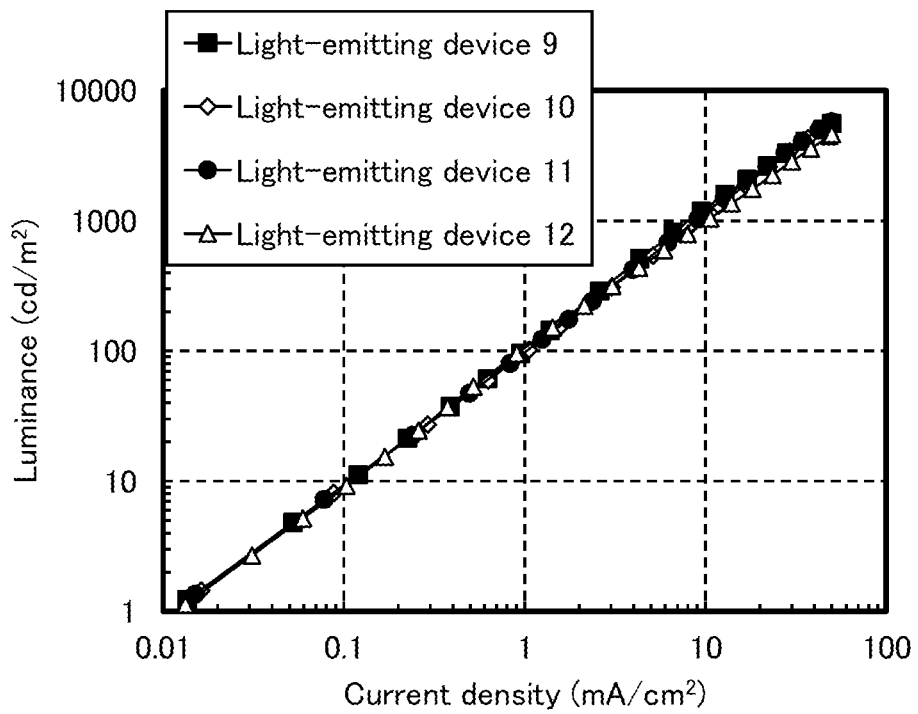
FIG. 62 shows the luminance-current density characteristics of a light-emitting device 9, a light-emitting device 10, a light-emitting device 11, and a light-emitting device 12.
Figure 63:
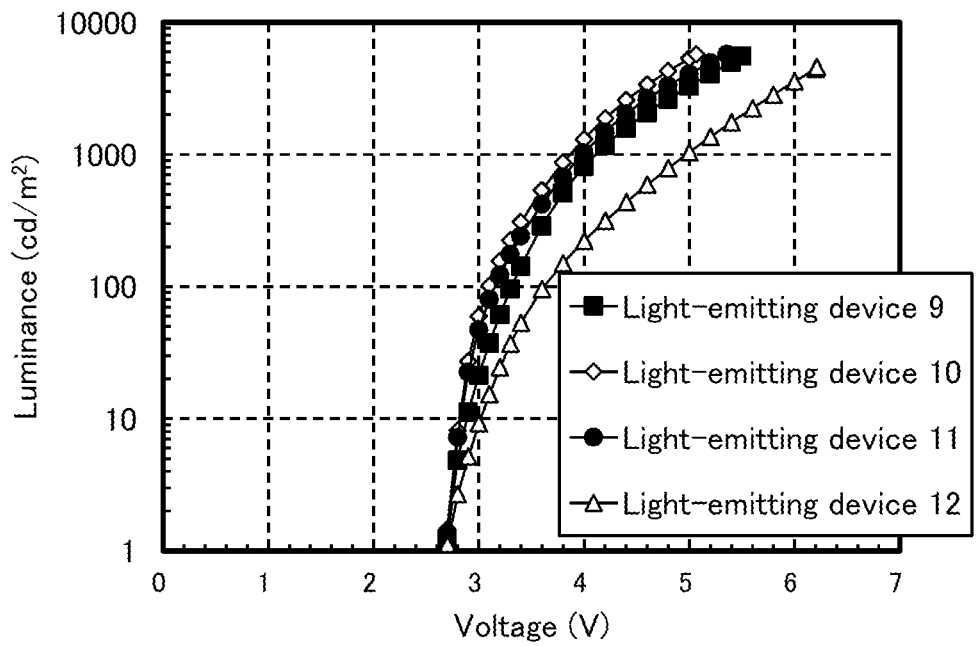
FIG. 63 shows the luminance-voltage characteristics of the light-emitting device 9, the light-emitting device 10, the light-emitting device 11, and the light-emitting device 12.
Figure 64:
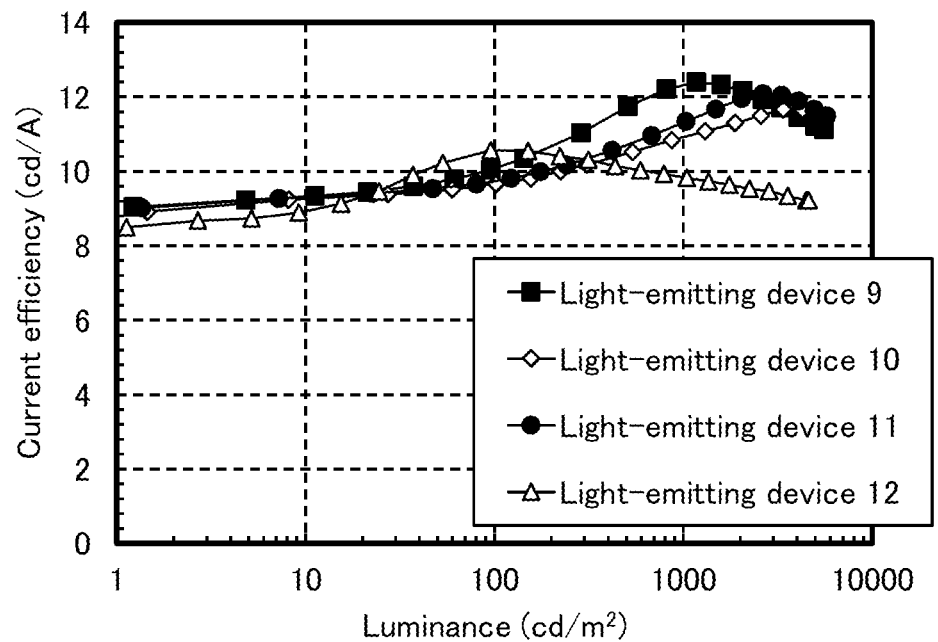
FIG. 64 shows the current efficiency-luminance characteristics of the light-emitting device 9, the light-emitting device 10, the light-emitting device 11, and the light-emitting device 12.
Figure 65:
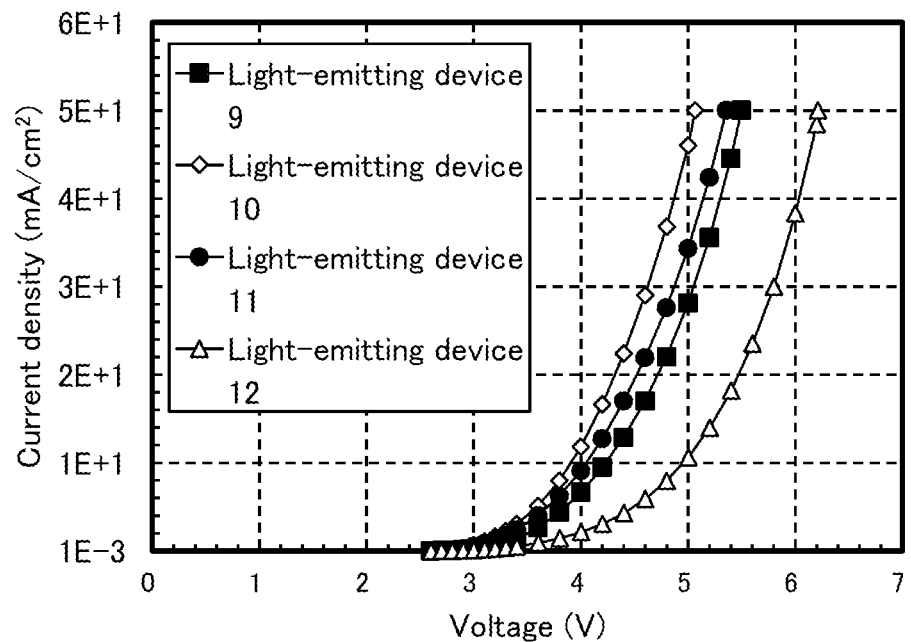
FIG. 65 shows the current density-voltage characteristics of the light-emitting device 9, the light-emitting device 10, the light-emitting device 11, and the light-emitting device 12.
Figure 66:
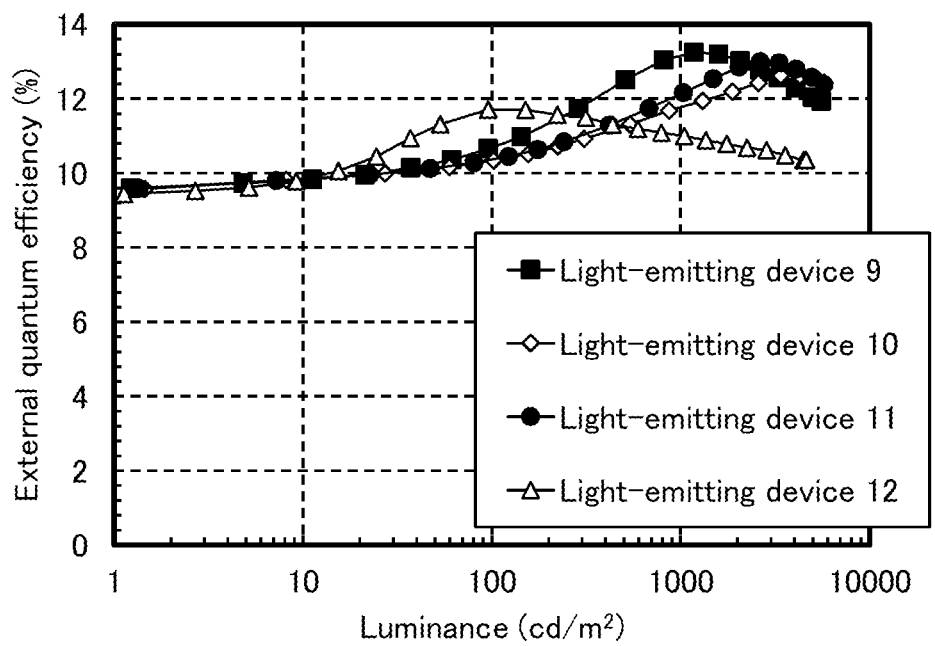
FIG. 66 shows the external quantum efficiency-luminance characteristics of the light-emitting device 9, the light-emitting device 10, the light-emitting device 11, and the light-emitting device 12.
Figure 67:
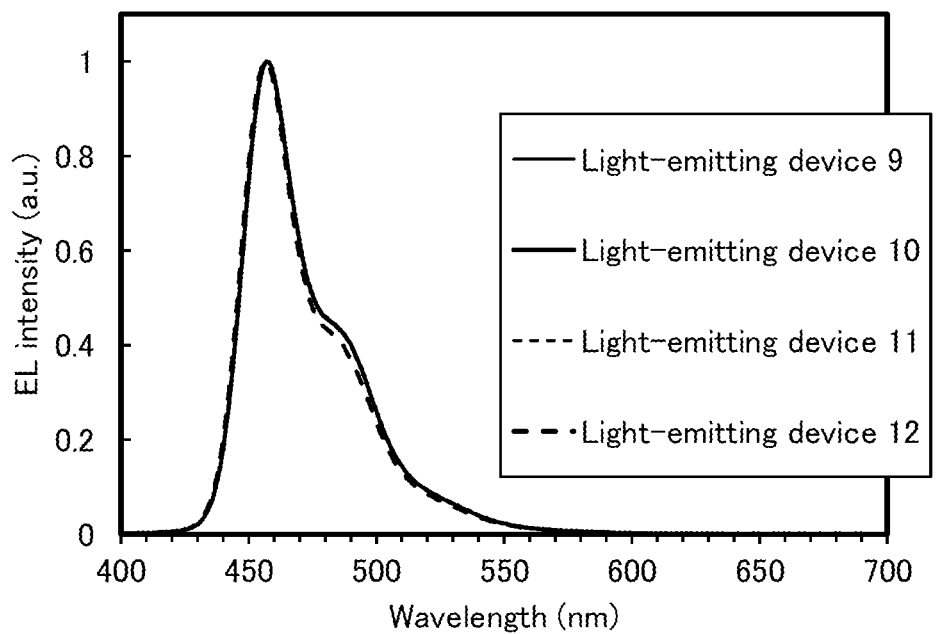
FIG. 67 shows the emission spectra of the light-emitting device 9, the light-emitting device 10, the light-emitting device 11, and the light-emitting device 12.

FIG. 62 shows the luminance-current density characteristics of the light-emitting devices 9 to 12. FIG. 63 shows the current efficiency-luminance characteristics thereof. FIG. 64 shows the luminance-voltage characteristics thereof. FIG. 65 shows the current density-voltage characteristics thereof. FIG. 66 shows the external quantum efficiency-luminance characteristics thereof. FIG. 67 shows the emission spectra thereof. Table 19 shows the main characteristics of the light-emitting devices 9 to 12 at a luminance of about 1000 cd/m$^2$. Luminance, CIE chromaticity, and emission spectra were measured at normal temperature with a spectroradiometer (SR-UL1R manufactured by TOPCON TECHNOHOUSE CORPORATION).

TABLE 19

| | voltage (V) | current (mA) | current density (mA/cm$^2$) | chromaticity x | chromaticity y | current efficiency (cd/A) | power efficiency (lm/W) | external quantum efficiency (%) |
|---|---|---|---|---|---|---|---|---|
| Light-emitting device 9 | 4.2 | 0.38 | 9.5 | 0.14 | 0.11 | 12.4 | 9.3 | 13.2 |
| Light-emitting device 10 | 3.8 | 0.32 | 8.0 | 0.14 | 0.11 | 10.8 | 9.0 | 11.7 |
| Light-emitting device 11 | 4.0 | 0.36 | 9.1 | 0.14 | 0.11 | 11.3 | 8.9 | 12.2 |
| Light-emitting device 12 | 5.0 | 0.42 | 10.6 | 0.14 | 0.10 | 9.8 | 6.2 | 11.0 |

FIGS. 62 to 67 and Table 19 show that the light-emitting devices 9 to 12 of one embodiment of the present invention have favorable characteristics.

FIG. 65 shows that the light-emitting device 10 using Li-5mq and the light-emitting device 11 using Li-6mq are particularly favorable light-emitting devices with a low driving voltage. As described above, a light-emitting device with a low driving voltage can be obtained when a methyl group bonded to an 8-quinolinolato complex of lithium is apart from a lithium atom or a nitrogen atom of a quinoline skeleton. Note that Li-5mq tends to have a relatively high refractive index; thus, Li-6mq is more useful because offering a light-emitting device with high external quantum efficiency and favorable characteristics. Although the bottom emission light-emitting devices are shown in this example, Li-6mq is particularly suitable for top emission light-emitting devices that have a significant effect of improving external quantum efficiency with a low refractive index. Thus, the light-emitting device using a metal complex that includes a ligand having an 8-quinolinolato structure having an alkyl group with 1 to 3 carbon atoms at the 6-position can have more favorable characteristics than the light-emitting device using a metal complex that includes a ligand having an 8-quinolinolato structure having an alkyl group at a position other than the 6-position.

Example 11

Synthesis Example 4

Described in this example is a method for synthesizing 3,6-dimethyl-8-quinolinolato-lithium (abbreviation: Li-3, 6dmq), which is a metal complex of one embodiment of the present invention. The structural formula of Li-3,6dmq is shown below.

[Chemical Formula 30]

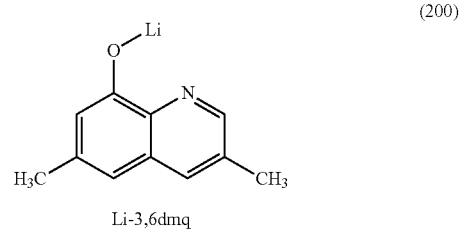

Li-3,6dmq (200)

Step 1: Synthesis of 8-hydroxy-3,6-dimethylquinoline

First, 6.28 g (51.0 mmol) of 6-amino-m-cresol and 175 mL of 1N hydrochloric acid were put into a three-neck flask and stirred at 100° C. for 30 minutes. A mixed solution of 5.36 g (76.5 mmol) (6.38 mL) of methacrolein and 15 mL of ethanol was dropped onto this reacted solution in one hour and heated at 100° C. for 2 hours. After the reaction, the reacted solution was heated at 100° C. for 2 hours. Dichloromethane was added to the reacted solution and then, an aqueous layer was adjusted to pH7 with use of 10% sodium hydroxide solution and 1N hydrochloric acid. The solution was filtered to separate an organic layer; then, the aqueous layer was subjected to extraction with dichloromethane. The extracted solution and the organic layer were washed with water and the organic layer was dried with magnesium sulfate and concentrated, so that a black solid containing the target substance was obtained.

The resulting solid was purified by silica gel column chromatography using the developing solvent of hexane and ethyl acetate, whose polarity was changed from 10:0 to 10:1 (hexane: ethyl acetate). This purification step was performed twice in total to give 4.3 g of a target white yellow solid (yield: 49%). The synthesis scheme in Step 1 is shown below.

[Chemical Formula 31]

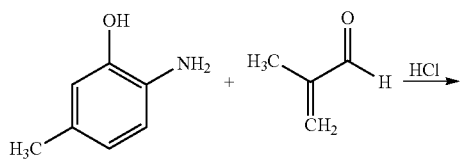

[Chemical Formula 32]

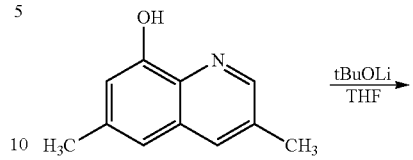

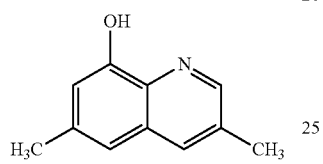

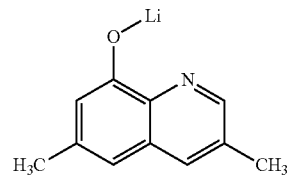

Step 2: Synthesis of Li-3,6dmq

First, 2.00 g (11.6 mmol) of 8-hydroxy-3,6-dimethylquinoline obtained in Step 1 and 130 mL of dehydrated tetrahydrofuran (abbreviation: THF) were put into a three-neck flask and stirred. Then, 9.24 mL (9.24 mmol) of 1M THF solution of lithium tert-butoxide (abbreviation: tBuOLi) was added to this solution and stirred at room temperature for 96 hours. The reacted solution was concentrated to give a yellow solid. Acetonitrile was added to this solid and subjected to ultrasonic irradiation and filtration, so that a yellow solid was obtained. This washing step was performed twice. The obtained residue was 1.7 g of yellow solid of Li-3,6dmq (yield: 100%).

By a train sublimation method, 1.65 g of the obtained yellow solid was purified by sublimation for 17 hours at a pressure of 2.7 Pa and a temperature of 330° C. After the sublimation purification, 1.40 g of a target yellow solid was obtained at a collection rate of 84%.

Note that methacrolein used as a material in this synthesis is less expensive than acrolein diethyl acetal. This means that the material having a methyl group at the 3-position of an 8-hydroxyquinoline skeleton can be synthesized at lower costs than the material having no methyl group. In other words, the quinolinol complex of Li-3,6dmq or the like of one embodiment of the present invention, which is synthesized with 8-hydroxy-3,6-dimethylquinoline synthesized using methacrolein, is an inexpensive and favorable material.

Analysis results by nuclear magnetic resonance spectroscopy ($^1$H-NMR) of the obtained yellow solid are shown below. The results reveal that Li-3,6dmq, the organic compound of one embodiment of the present invention represented by the above structural formula (200), was obtained in this example.

$H^1$NMR(DMSO-d6, 300 MHz): δ=2.23 (s, 3H), 2.36 (s, 3H), 6.17 (s, 1H), 6.23 (s, 1H), 7.69 (s, 1H), 8.14 (s, 1H).

Figure 68:
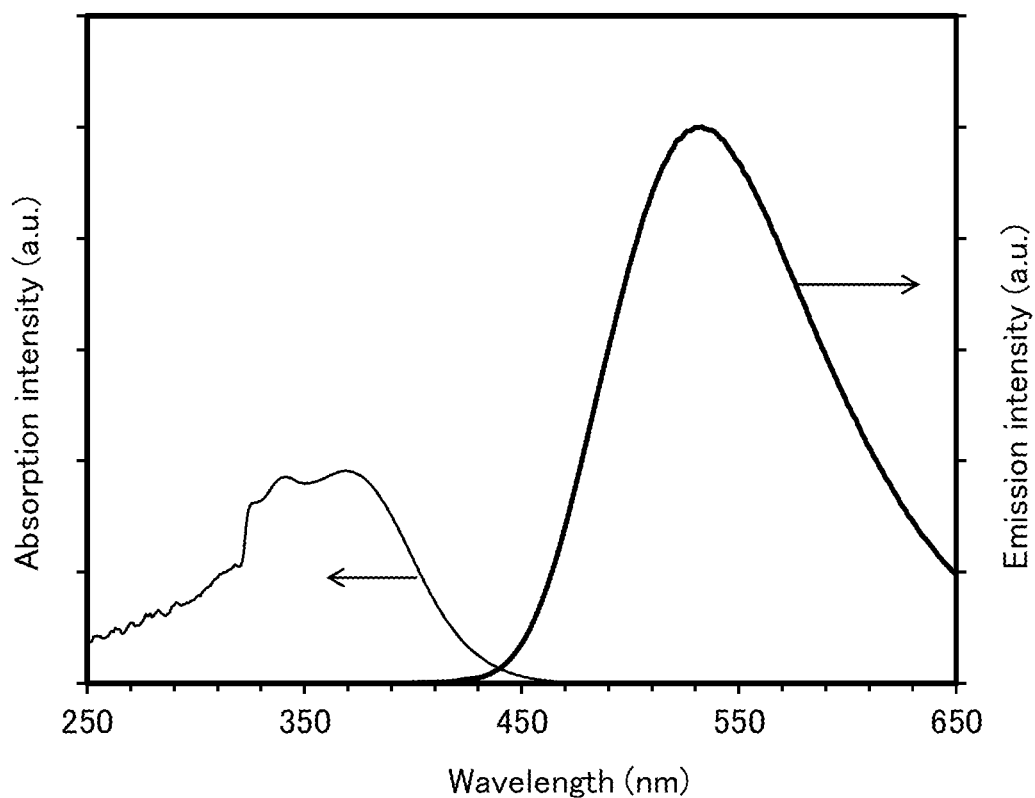
FIG. 68 shows the absorption and emission spectra of Li-3,6mq in a dehydrated acetone solution.

The measurement results of the absorption and emission spectra of Li-3,6dmq in a dehydrated acetone solution are shown in FIG. 68. The absorption spectrum of Li-3,6dmq in the dehydrated acetone solution was measured with an ultraviolet-visible light spectrophotometer (V550, manufactured by JASCO Corporation), and the spectrum of dehydrated acetone alone in a quartz cell was subtracted. The emission spectrum was measured with a fluorescence spectrophotometer (FP-8600, produced by JASCO Corporation). Li-3,6dmq in the dehydrated acetone solution has an absorption peak at 376 nm, and an emission wavelength peak at 533 nm (excitation wavelength: 378 nm).

Example 12

Described in this example are a light-emitting device 13 and a light-emitting device 14, each of which uses the organometallic complex of one embodiment of the present invention described in the embodiments, and a comparative light-emitting device 7 using a known organometallic complex. Structural formulae of organic compounds used in this example are shown below.

[Chemical Formula 33]
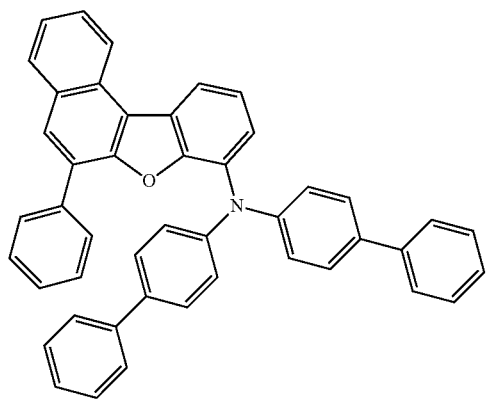
BBABnf (xii)
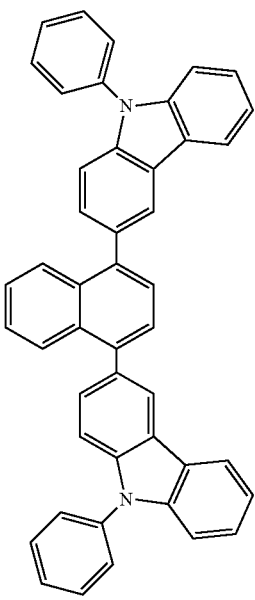
PCzN2 (iii)
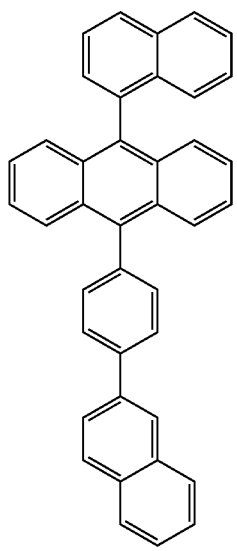
αN-βNP Anth
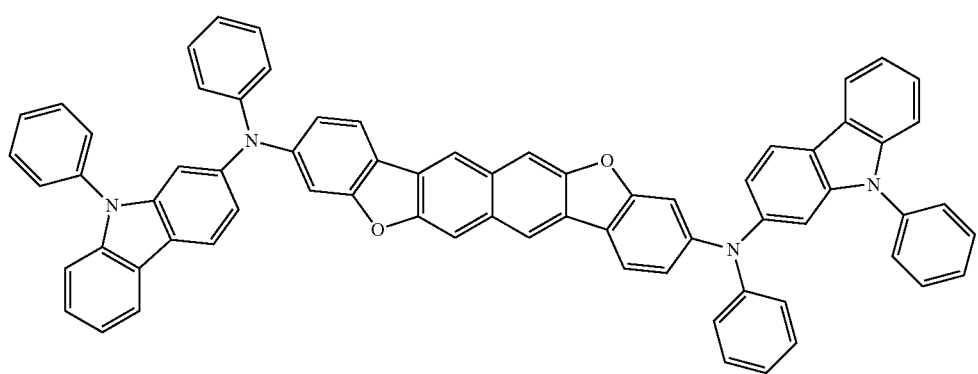
3,10PCA2Nbf(IV)-02 (v)
(xviii)

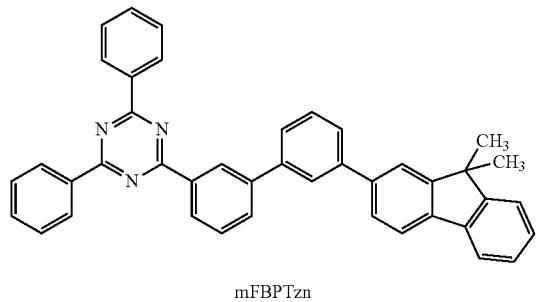

mFBPTzn

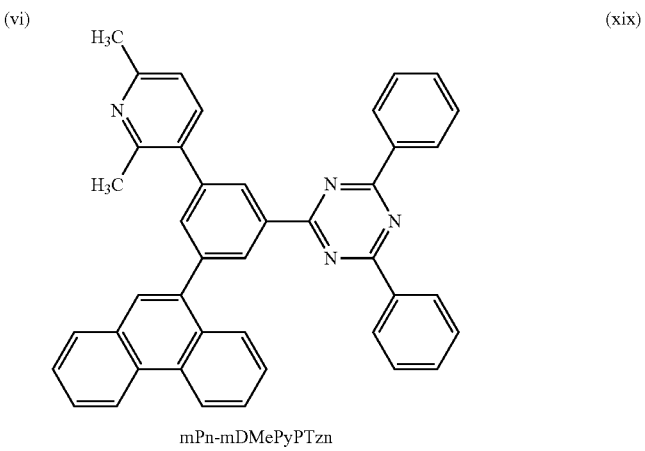

mPn-mDMePyPTzn

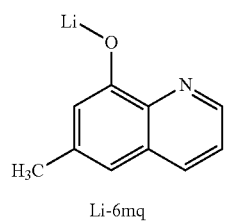

Li-6mq

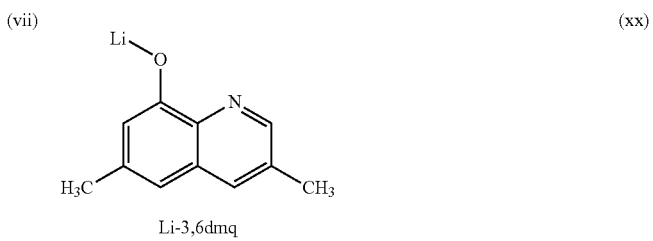

Li-3,6dmq

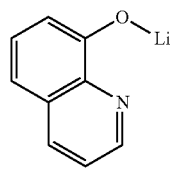

Liq (Fabrication Method of Light-Emitting Device 13)

First, indium tin oxide containing silicon oxide (ITSO) was deposited over a glass substrate to a thickness of 70 nm by a sputtering method, whereby the anode 101 was formed. The electrode area was set to 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by the above structural formula (xii) and an electron acceptor material (OCHD-001) were deposited on the anode 101 to a thickness of 10 nm by co-evaporation such that the weight ratio of BBABnf to OCHD-001 was 1:0.1, whereby the hole-injection layer 111 was formed.

Over the hole-injection layer 111, BBABnf was deposited by evaporation to a thickness of 20 nm, whereby the hole-transport layer 112 was formed.

Subsequently, over the hole-transport layer 112, 3,3'-(naphthalene-1,4-diyl)bis(9-phenyl-9H-carbazole) (abbreviation: PCzN2) represented by the above structural formula (iii) was deposited by evaporation to a thickness of 10 nm, whereby an electron-blocking layer was formed.

Then, 9-(1-naphthyl)-10-[4-(2-naphthyl)phenyl]anthracene (abbreviation: αN-βNPAnth) represented by the above structural formula (xviii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the above structural formula (v) were deposited to a thickness of 20 nm by co-evaporation such that the weight ratio of αN-βNPAnth to 3,10PCA2Nbf(IV)-02 was 1:0.015, whereby the light-emitting layer 113 was formed.

After that, 2-[3'-(9,9-dimethyl-9H-fluoren-2-yl)-1,1'-biphenyl-3-yl]-4,6-diphenyl-1,3,5-triazine (abbreviation: mFBPTzn) represented by the above structural formula (vi) was deposited by evaporation to a thickness of 10 nm, whereby a hole-blocking layer was formed. Then, 2-[3-(2, 6-dimethyl-3-pyridinyl)-5-(9-phenanthrenyl)phenyl]-4,6-diphenyl-1,3,5-triazine (abbreviation: mPn-mDMePyPTzn) represented by the above structural formula (xix) and 6-methyl-8-quinolinolato-lithium (abbreviation: Li-6mq) represented by the above structural formula (vii) were deposited to a thickness of 20 nm by co-evaporation such that the weight ratio of mPn-mDMePyPTzn to Li-6mq was 1:1, whereby the electron-transport layer 114 was formed.

After the electron-transport layer 114 was formed, 8-quinolinolato-lithium (abbreviation: Liq) represented by the above structural formula (ix) was deposited to a thickness of 1 nm to form the electron-injection layer 115, and lastly aluminum was deposited to a thickness of 200 nm by evaporation to form the cathode 102, whereby the light-emitting device 13 was fabricated. Note that the light-emitting device in this example is a bottom emission device in which light is extracted through the anode 101.

(Fabrication Method of Light-Emitting Device 14)

The light-emitting device 14 was fabricated in a manner similar to that for the light-emitting device 13 except that Li-6mq was replaced with 3,6-dimethyl-8-quinolinolato-lithium (abbreviation: Li-3,6mq) represented by the above structural formula (xx).

(Fabrication Method of Comparative Light-Emitting Device 7)

The comparative light-emitting device 7 was fabricated in a manner similar to that for the light-emitting device 13 except that Li-6mq was replaced with 8-quinolinolato-lithium (abbreviation: Liq) represented by the above structural formula (ix).

The structures of the light-emitting devices 13 and 14 and the comparative light-emitting device 7 are listed in the following table.

The light-emitting devices 13 and 14 and the comparative light-emitting device 7 were sealed using a glass substrate in a glove box containing a nitrogen atmosphere so as not to be exposed to the air. Specifically, a UV curable sealing material was applied to surround the elements, only the UV curable sealing material was irradiated with UV while the light-emitting devices were prevented from being irradiated with the UV, and heat treatment was performed at 80° C. under an atmospheric pressure for one hour. Then, the initial characteristics of the light-emitting devices were measured. Note that the sealed glass substrate was not subjected to particular treatment for improving light extraction efficiency.

Figure 69:
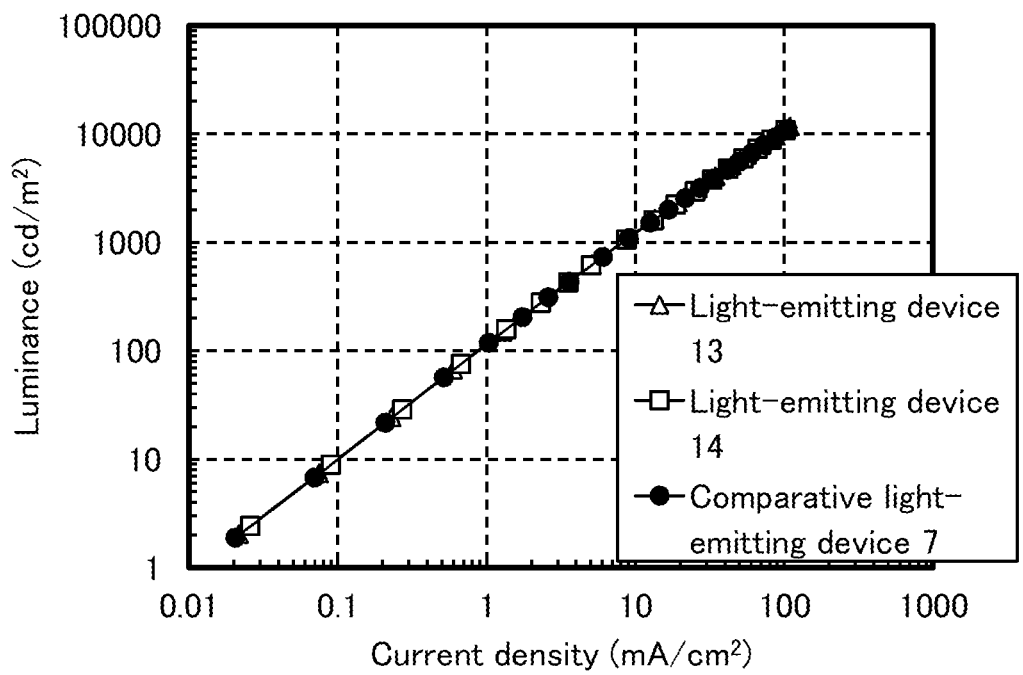
FIG. 69 shows the luminance-current density characteristics of a light-emitting device 13, a light-emitting device 14, and a comparative light-emitting device 7.
Figure 70:
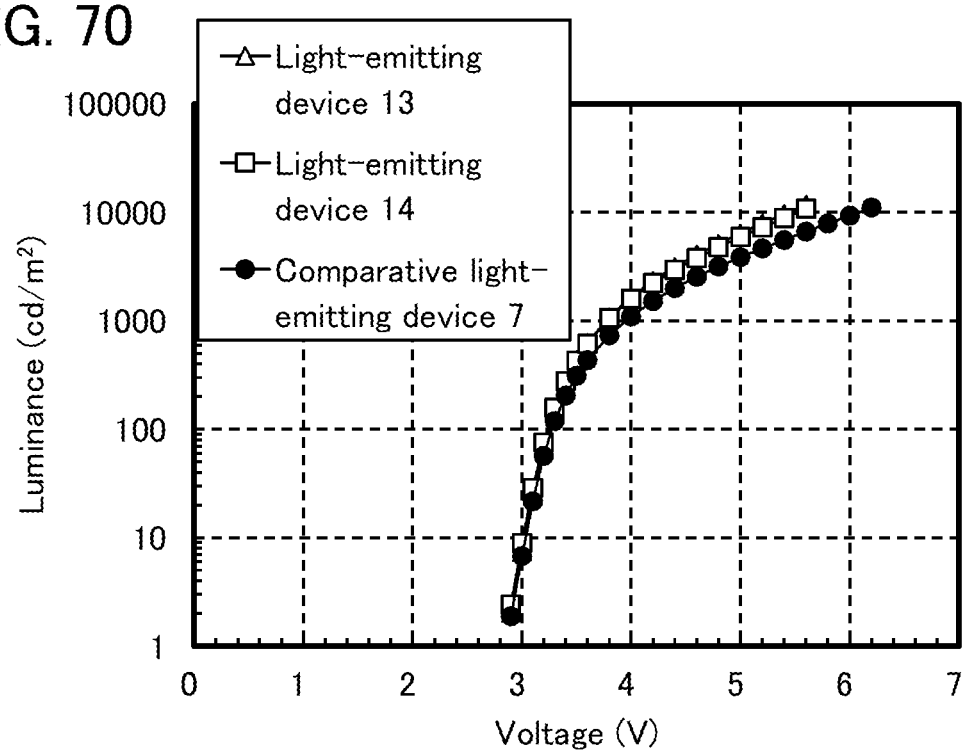
FIG. 70 shows the luminance-voltage characteristics of the light-emitting device 13, the light-emitting device 14, and the comparative light-emitting device 7.
Figure 71:
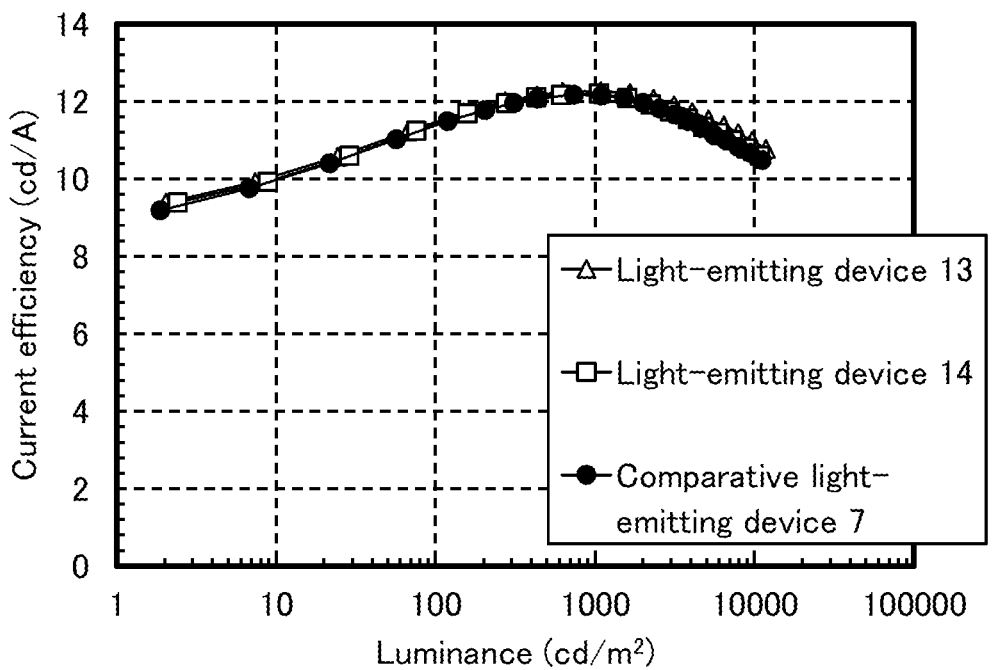
FIG. 71 shows the current efficiency-luminance characteristics of the light-emitting device 13, the light-emitting device 14, and the comparative light-emitting device 7.
Figure 72:
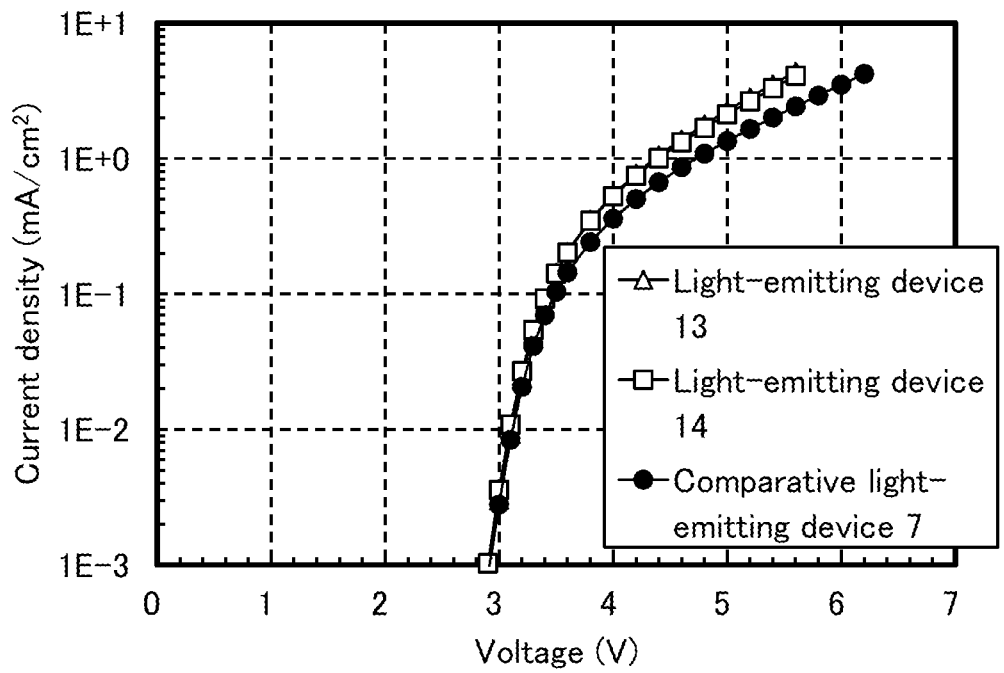
FIG. 72 shows the current density-voltage characteristics of the light-emitting device 13, the light-emitting device 14, and the comparative light-emitting device 7.
Figure 73:
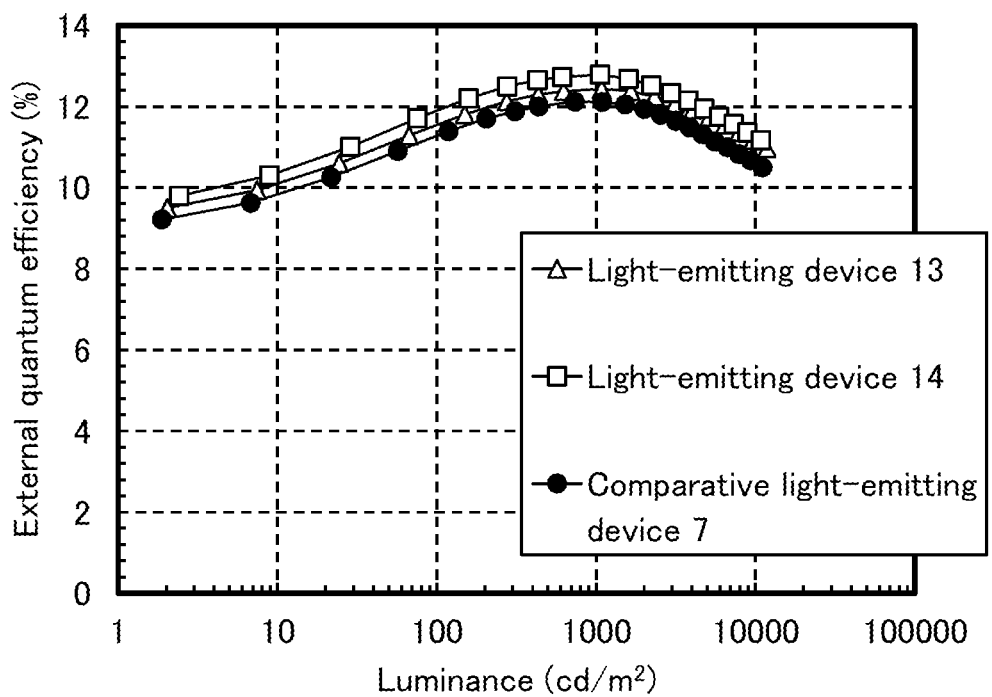
FIG. 73 shows the external quantum efficiency-luminance characteristics of the light-emitting device 13, the light-emitting device 14, and the comparative light-emitting device 7.
Figure 74:
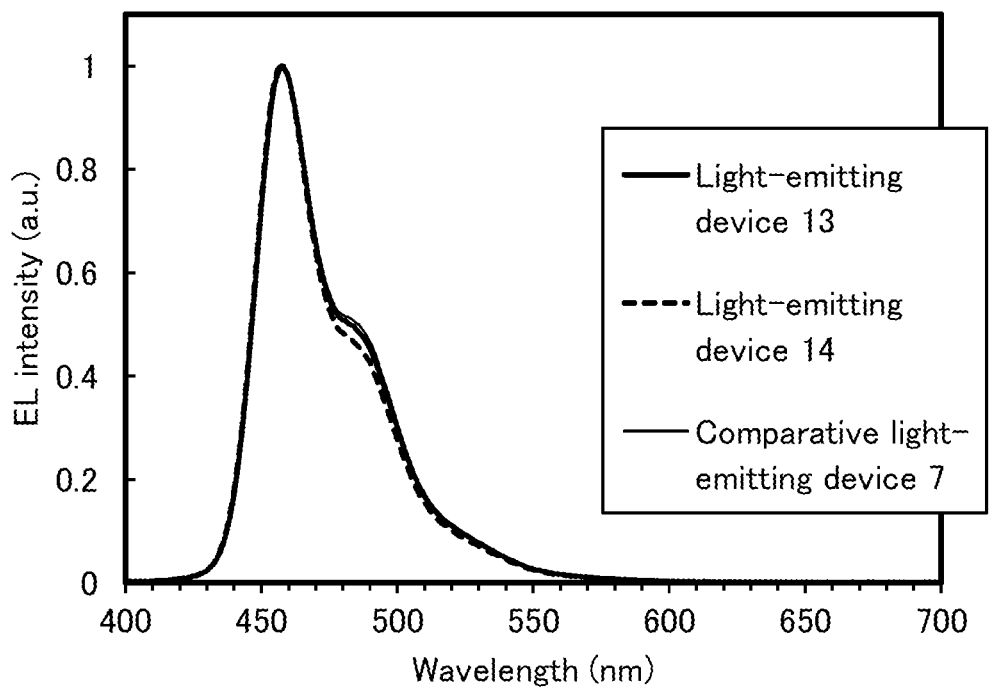
FIG. 74 shows the emission spectra of the light-emitting device 13, the light-emitting device 14, and the comparative light-emitting device 7.

FIG. 69 shows the luminance-current density characteristics of the light-emitting devices 13 and 14 and the comparative light-emitting device 7. FIG. 70 shows the current efficiency-luminance characteristics thereof. FIG. 71 shows the luminance-voltage characteristics thereof. FIG. 72 shows the current density-voltage characteristics thereof. FIG. 73 shows the external quantum efficiency-luminance characteristics thereof. FIG. 74 shows the emission spectra thereof. Table 21 shows the main characteristics of the light-emitting devices 13 and 14 and the comparative light-emitting device 7 at a luminance of about 1000 cd/m$^2$. Luminance, CIE chromaticity, and emission spectra were measured at normal temperature with a spectroradiometer (SR-UL1R manufactured by TOPCON TECHNOHOUSE CORPORATION).

TABLE 20

|  | film thickness | Light-emitting device 13 | Light-emitting device 14 | Comparative light-emitting device 7 |
| --- | --- | --- | --- | --- |
| electron-injection layer | 1 nm | | Liq | |
| electron-transport layer | 20 nm | mPn-mDMePyPTzn:Li-6mq (1:1) | mPn-mDMePyPTzn:Li-3,6dmq (1:1) | mPn-mDMePyPTzn:Liq (1:1) |
| hole-blocking layer | 10 nm | | mFBPTzn | |
| light-emitting layer | 20 nm | | Bnf(II)PhA:3,10PCA2Nbf(IV)-02 (1:0.015) | |
| electron-blocking layer | 10 nm | | PCzN2 | |
| hole-transport layer | 20 nm | | BBABnf | |
| hole-injection layer | 10 nm | | BBABnf:OCHD-001 (1:0.1) | |

TABLE 21

| | voltage (V) | current (mA) | current density (mA/cm²) | chromaticity x | chromaticity y | current efficiency (cd/A) | power efficiency (lm/W) | external quantum efficiency (%) |
|---|---|---|---|---|---|---|---|---|
| Light-emitting device 13 | 3.8 | 0.35 | 8.8 | 0.13 | 0.12 | 12.3 | 10.1 | 12.4 |
| Light-emitting device 14 | 3.8 | 0.35 | 8.7 | 0.14 | 0.11 | 12.2 | 10.1 | 12.8 |
| Comparative light-emitting device 7 | 4.0 | 0.36 | 9.0 | 0.13 | 0.12 | 12.2 | 9.5 | 12.1 |

FIGS. 69 to 74 and Table 21 show that the light-emitting devices 13 and 14 of one embodiment of the present invention, which use a metal complex, have a low driving voltage and favorable emission efficiency.

In particular, Li-3,6dmq is a favorable material because it can be deposited by vacuum evaporation with a stable rate to form devices.

Reference Synthesis Example 1

A synthesis method of 2-{(3',5'-di-tert-butyl)-1,1'-biphenyl-3-yl}-4,6-bis(3,5-di-tert-butylphenyl)-1,3,5-triazine (abbreviation: mmtBumBP-dmmtBuPTzn) used in Examples 1 and 2 is described. The structure of mmtBumBP-dmmtBuPTzn is shown below.

[Chemical Formula 34]

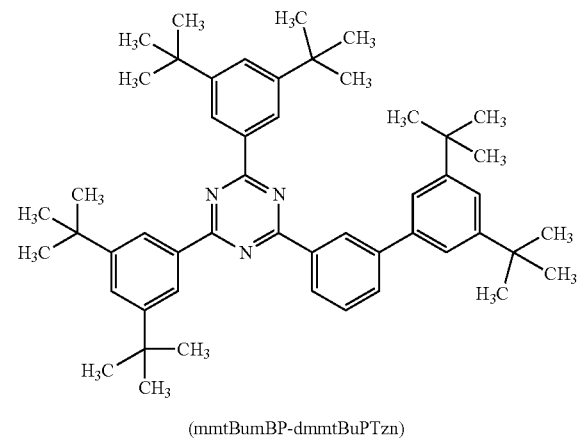

(mmtBumBP-dmmtBuPTzn)

Step 1: Synthesis of 3-bromo-3',5'-di-tert-butylbiphenyl

First, 1.0 g (4.3 mmol) of 3,5-di-t-butylphenylboronic acid, 1.5 g (5.2 mmol) of 1-bromo-3-iodobenzene, 4.5 mL of 2 mol/L aqueous solution of potassium carbonate, 20 mL of toluene, and 3 mL of ethanol were put into a three-neck flask and stirred under reduced pressure to be degassed. Furthermore, 52 mg (0.17 mmol) of tris(2-methylphenyl)phosphine and 10 mg (0.043 mmol) of palladium(II) acetate were added to this mixture, and reacted under a nitrogen atmosphere at 80° C. for 14 hours. After the reaction, extraction with toluene was performed and the resulting organic layer was dried with magnesium sulfate. This mixture was subjected to gravity filtration and the filtrate was purified by silica gel column chromatography (the developing solvent: hexane) to give 1.0 g of a target white solid (yield: 68%). The synthesis scheme of Step 1 is shown below.

[Chemical Formula 35]

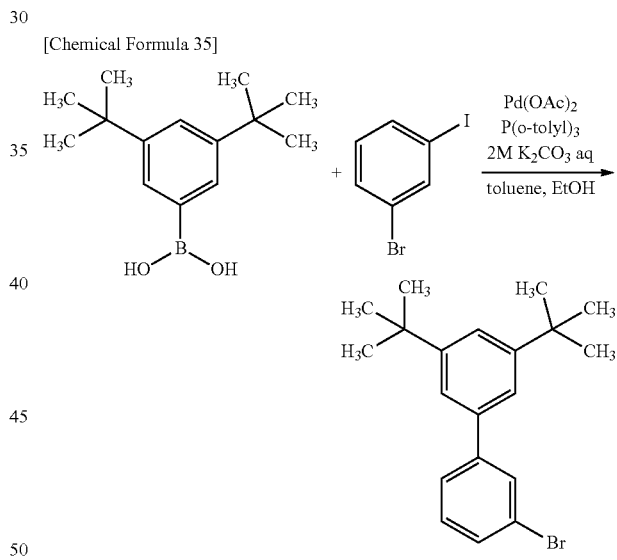

Step 2: Synthesis of 2-(3',5'-di-tert-butylbiphenyl-3-yl)-4,4,5,5-tetramethyl-1,3,2-dioxaborolane First, 1.0 g (2.9 mmol) of 3-bromo-3',5'-di-tert-butylbiphenyl, 0.96 g (3.8 mmol) of bis(pinacolato)diboron, 0.94 g (9.6 mmol) of potassium acetate, and 30 mL of 1,4-dioxane were put into a three-neck flask and stirred under reduced pressure to be degassed. Furthermore, 0.12 g (0.30 mmol) of 2-dicyclohexylphosphino-2',6'-dimethoxybiphenyl and 0.12 g (0.15 mmol) of [1,1'-bis(diphenylphosphino)ferrocene]palladium(II) dichloride dichloromethane adduct were added to this mixture, and reacted under a nitrogen atmosphere at 110° C. for 24 hours. After the reaction, extraction with toluene was performed and the resulting organic layer was dried with magnesium sulfate. This mixture was subjected to gravity filtration and the filtrate was purified by silica gel column chromatography (the developing solvent: toluene) to give 0.89 g of a target yellow oil (yield: 78%). The synthesis scheme of Step 2 is shown below.

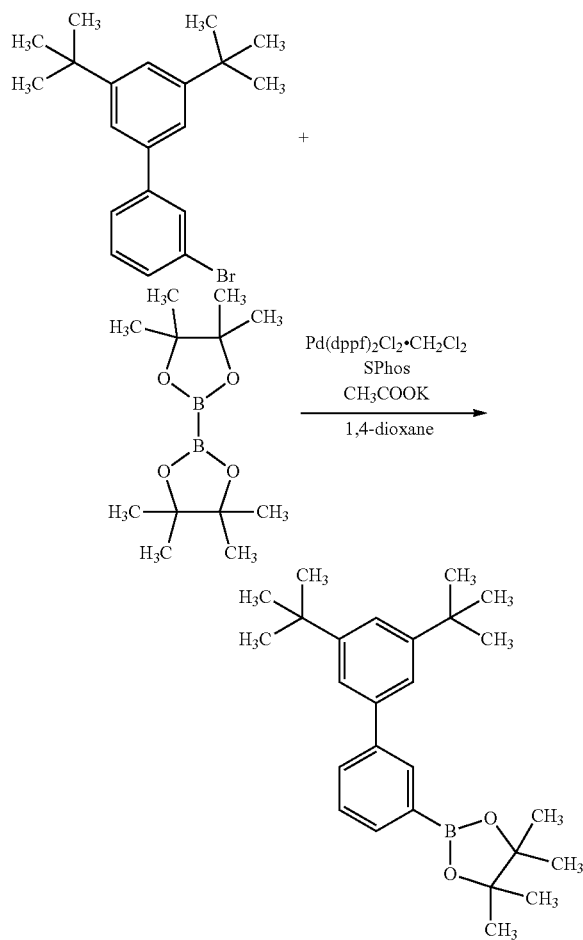

<Step 3: Synthesis of 2-{(3',5'-di-tert-butyl)-1,1'-biphenyl-3-yl}-4,6-bis(3,5-di-tert-butylphenyl)-1,3,5-triazine (abbreviation: mmtBumBP-dmmt-BuPTzn)>

First, 0.8 g (1.6 mmol) of 4,6-bis(3,5-di-tert-butylphenyl)-2-chloro-1,3,5-triazine, 0.89 g (2.3 mmol) of 2-(3',5'-di-tert-butylphenyl-3-yl)-4,4,5,5-tetramethyl-1,3,2-dioxaborolane, 0.68 g (3.2 mmol) of tripotassium phosphate, 3 mL of water, 8 mL of toluene, and 3 mL of 1,4-dioxane were put into a three-neck flask and stirred under reduced pressure to be degassed. Furthermore, 3.5 mg (0.016 mmol) of palladium (II) acetate and 10 mg (0.032 mmol) of tris(2-methylphenyl)phosphine were added to this mixture, and heated and refluxed under a nitrogen atmosphere for 12 hours. After the reaction, extraction with ethyl acetate was performed and the resulting organic layer was dried with magnesium sulfate. This mixture was subjected to gravity filtration. The resulting filtrate was concentrated, followed by purification by silica gel column chromatography (the developing solvent, ethyl acetate:hexane=1:20) to give a solid. The solid was purified by silica gel column chromatography (the developing solvent, chloroform:hexane=5:1 changed to 1:0). The obtained solid was recrystallized with hexane to give 0.88 g of a target white solid in a yield of 76%. The synthesis scheme of Step 3 is shown below.

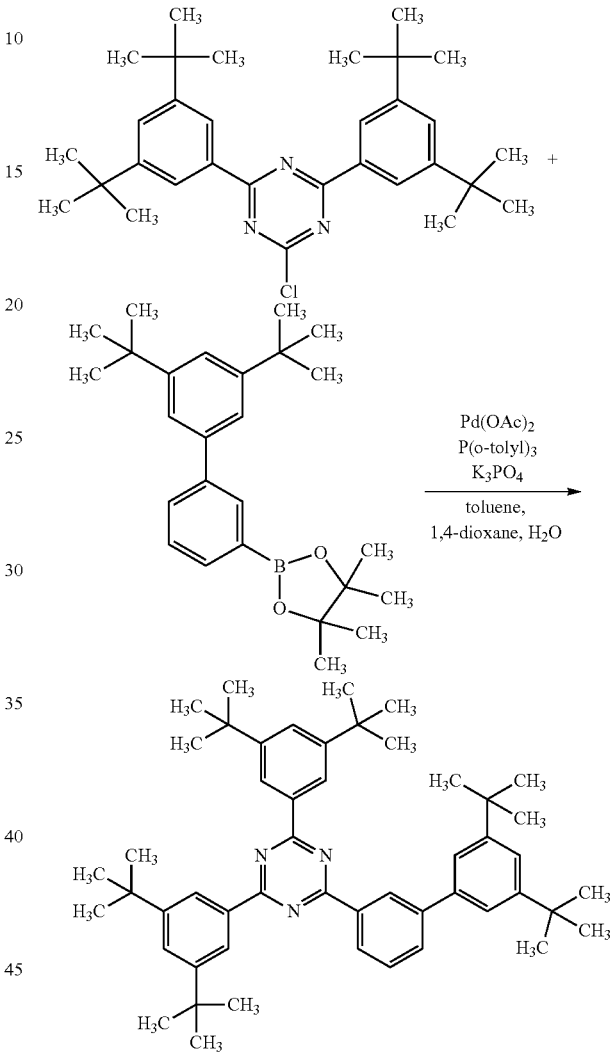

By a train sublimation method, 0.87 g of the obtained white solid was purified by sublimation while being heated at a pressure of 5.8 Pa and a temperature of 230° C. with an argon gas flowing. After the sublimation purification, 0.82 g of a target white solid was obtained at a collection rate of 95%.

Figure 36:
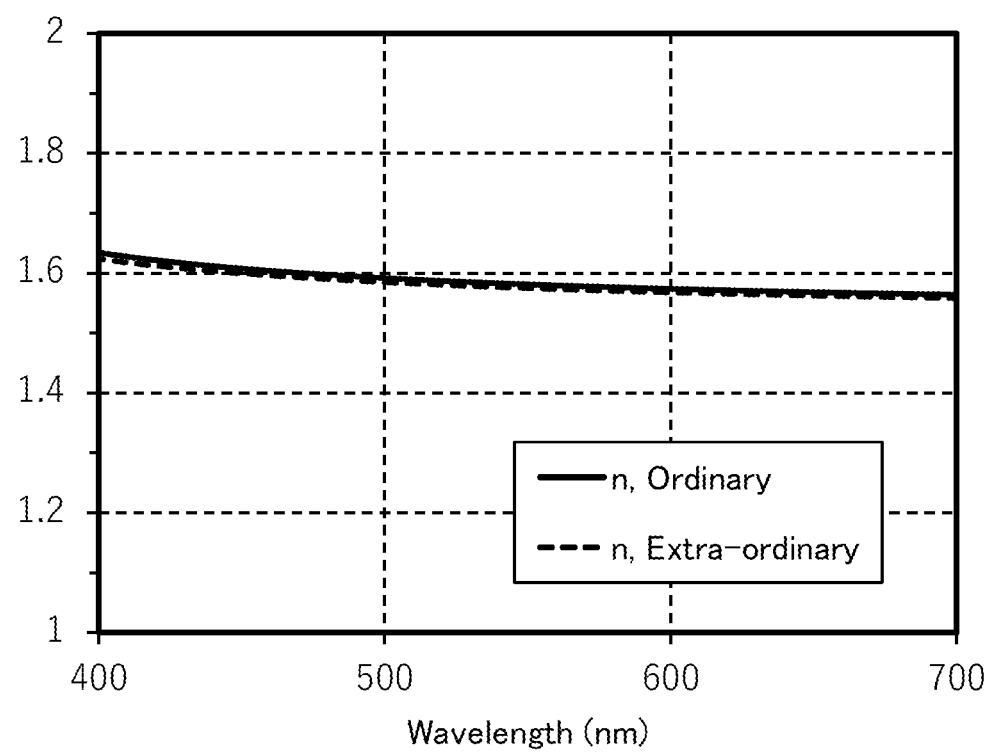
FIG. 36 shows the measurement data of the refractive index of mmtBumBP-dmmtBuPTzn.

FIG. 36 shows the refractive index of mmtBumBP-dmmtBuPTzn obtained in the above synthesis method, which was measured by a spectroscopic ellipsometer (M-2000U, produced by J. A. Woollam Japan Corp.). To obtain a film used for measurement, the material for each layer was deposited to a thickness of approximately 50 nm over a quartz substrate by a vacuum evaporation method. Note that FIG. 36 shows the refractive index of an ordinary ray (n, Ordinary), and the refractive index of an extraordinary ray (n, Extraordinary).

FIG. 36 indicates that the ordinary refractive index of mmtBumBP-dmmtBuPTzn in the whole blue emission region (455 nm to 465 nm) is in the range of 1.50 to 1.75. In addition, the ordinary refractive index of mmtBumBP-dmmtBuPTzn at a wavelength of 633 nm is in the range of 1.45 to 1.70, suggesting that mmtBumBP-dmmtBuPTzn is a material with a low refractive index.

Reference Synthesis Example 2

A synthesis method of 2-{(3',5'-di-tert-butyl)-1,1'-biphenyl-3-yl}-4,6-diphenyl-1,3,5-triazine (abbreviation: mmtBumBPTzn) used in Example 5 is described. The structure of mmtBumBPTzn is shown below.

[Chemical Formula 38]

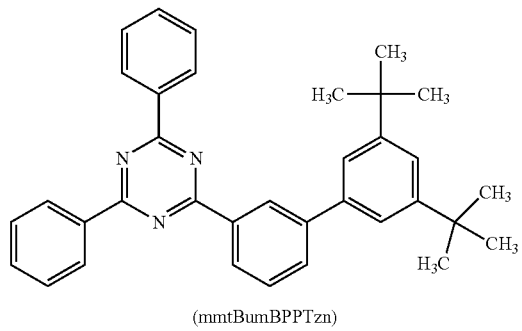

(mmtBumBPPTzn)

Step 1: Synthesis of
3-bromo-3',5'-di-tert-butylbiphenyl

This synthesis step is similar to Step 1 in Reference Synthesis Example 1.

Step 2: Synthesis of 2-(3',5'-di-tert-butylbiphenyl-3-yl)-4,4,5,5-tetramethyl-1,3,2-dioxaborolane This synthesis step is similar to Step 2 in Reference Synthesis Example 1.

Step 3: Synthesis of mmtBumBPTzn

First, 1.5 g (5.6 mmol) of 4,6-diphenyl-2-chloro-1,3,5-triazine, 2.4 g (6.2 mmol) of 2-(3',5'-di-tert-butylphenyl-3-yl)-4,4,5,5-tetramethyl-1,3,2-dioxaborolane, 2.4 g (11 mmol) of tripotassium phosphate, 10 mL of water, 28 mL of toluene, and 10 mL of 1,4-dioxane were put into a three-neck flask and stirred under reduced pressure to be degassed. Furthermore, 13 mg (0.056 mmol) of palladium(II) acetate and 34 mg (0.11 mmol) of tris(2-methylphenyl)phosphine were added to this mixture, and heated and refluxed under a nitrogen atmosphere for 14 hours. After the reaction, extraction with ethyl acetate was performed and the resulting organic layer was removed with magnesium sulfate. This mixture was subjected to gravity filtration and the filtrate was purified by silica gel column chromatography (the developing solvent, chloroform:hexane=1:5 changed to 1:3). The obtained solid was recrystallized with hexane to give 2.0 g of a target white solid (yield: 51%). The synthesis scheme of Step 3 is shown in the following formula (b-1).

[Chemical Formula 39]

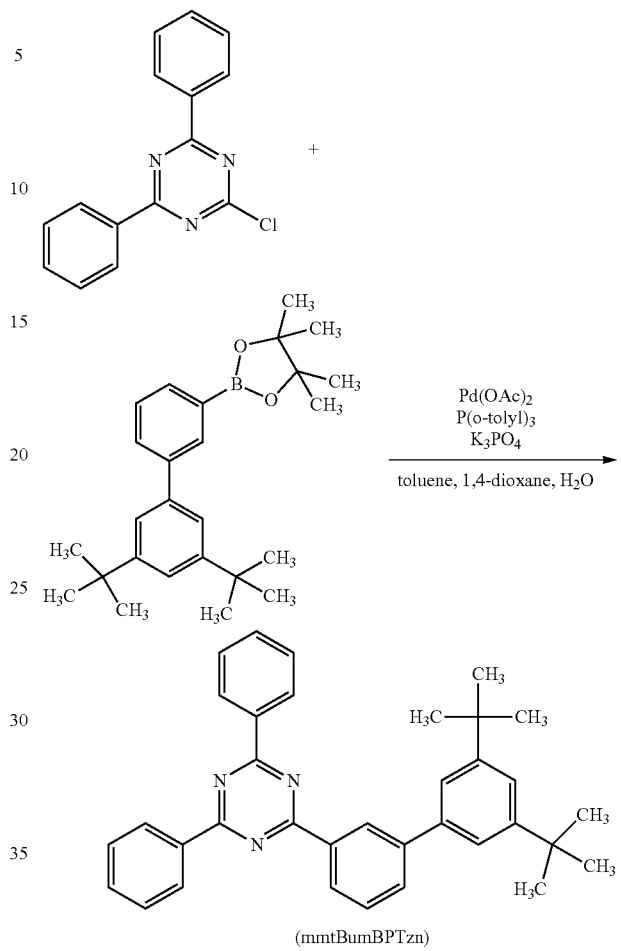

(mmtBumBPTzn)

By a train sublimation method, 2.0 g of the obtained white solid was purified by sublimation under an argon gas stream at a pressure of 3.4 Pa and a temperature of 220° C. The solid was heated. After the sublimation purification, 1.8 g of a target white solid was obtained at a collection rate of 80%.

Analysis results by nuclear magnetic resonance spectroscopy ($^1$H-NMR) of the white solid obtained in Step 3 are shown below. The results reveal that mmtBumBPTzn was obtained in this example.

$H^1$ NMR (CDCl3, 300 MHz): δ=1.44 (s, 18H), 7.51-7.68 (m, 10H), 7.83 (d, 1H), 8.73-8.81 (m, 5H), 9.01 (s, 1H).

Figure 44:
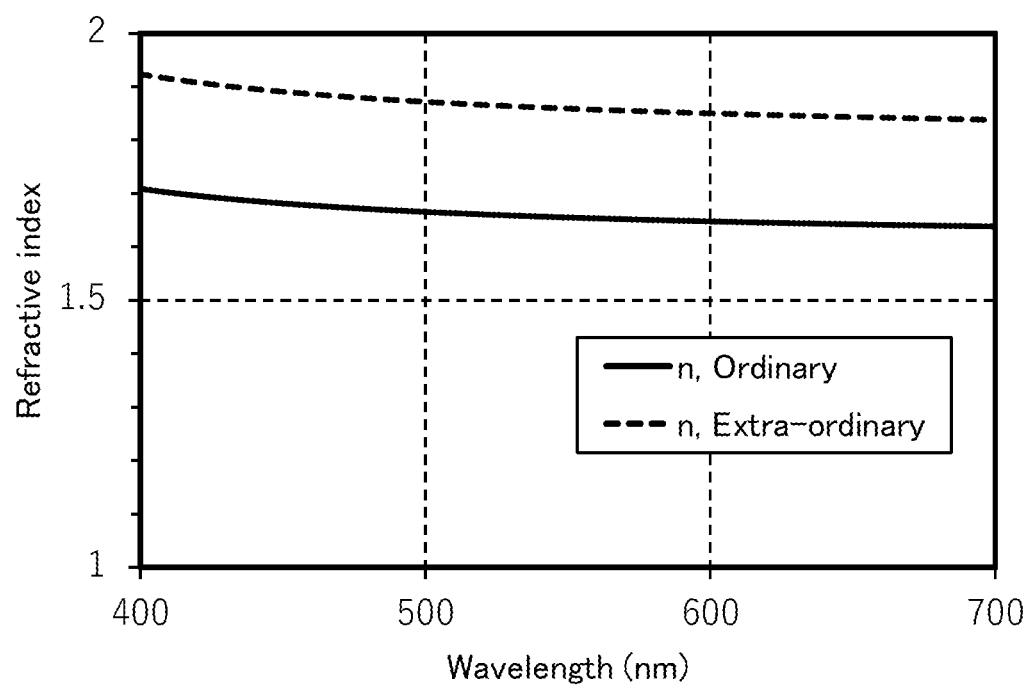
FIG. 44 shows the measurement data of the refractive index of mmtBumBPTzn.

FIG. 44 shows the refractive index of mmtBumBPTzn measured by a spectroscopic ellipsometer (M-2000U, produced by J. A. Woollam Japan Corp.). To obtain a film used for measurement, the material for each layer was deposited to a thickness of approximately 50 nm over a quartz substrate by a vacuum evaporation method. Note that FIG. 44 shows the refractive index of an ordinary ray (n, Ordinary), and the refractive index of an extraordinary ray (n, Extraordinary).

FIG. 44 indicates that the ordinary refractive index of mmtBumBPTzn in the whole blue emission region (455 nm to 465 nm) is 1.68, which is in the range of 1.50 to 1.75. In addition, the ordinary refractive index of mmtBumBPTzn at a wavelength of 633 nm is 1.64, which is in the range of 1.45 to 1.70, suggesting that mmtBumBPTzn is a material with a low refractive index.

This application is based on Japanese Patent Application Serial No. 2020-078826 filed with Japan Patent Office on Apr. 28, 2020, Japanese Patent Application Serial No. 2020-098260 filed with Japan Patent Office on Jun. 5, 2020, and Japanese Patent Application Serial No. 2020-202413 filed with Japan Patent Office on Dec. 7, 2020, the entire contents of which are hereby incorporated by reference.

What is claimed is:

1. A light-emitting device comprising:
an anode;
a cathode; and
an EL layer between the anode and the cathode,
wherein the EL layer includes a light-emitting layer and an electron-transport layer,
wherein the light-emitting layer includes a light-emitting material,
wherein the electron-transport layer includes an organic compound having an electron-transport property and a metal complex of an alkali metal,
wherein the organic compound having the electron-transport property comprises a π-electron deficient heteroaromatic ring skeleton,
wherein an ordinary refractive index of the organic compound having the electron-transport property in a peak wavelength of light emitted from the light-emitting material is greater than or equal to 1.50 and less than or equal to 1.75, and
wherein an ordinary refractive index of the metal complex of the alkali metal in the peak wavelength of the light emitted from the light-emitting material is greater than or equal to 1.45 and less than or equal to 1.70.

2. The light-emitting device according to claim 1,
wherein a value obtained by dividing by 2 the sum of the ordinary refractive index of the organic compound having the electron-transport property in the peak wavelength of the light emitted from the light-emitting material and the ordinary refractive index of the metal complex of the alkali metal in the peak wavelength of the light emitted from the light-emitting material is greater than or equal to 1.50 and less than 1.75.

3. The light-emitting device according to claim 1,
wherein an ordinary refractive index of the electron-transport layer in the peak wavelength of the light emitted from the light-emitting material is greater than or equal to 1.50 and less than 1.75.

4. The light-emitting device according to claim 1,
wherein each of the organic compound having the electron-transport property and the metal complex of the alkali metal comprises an alkyl group or a cycloalkyl group.

5. The light-emitting device according to claim 4,
wherein the alkyl group of the organic compound having the electron-transport property is any one of a branched alkyl group and an alkyl group having 3 or 4 carbon atoms, and
wherein the alkyl group of the metal complex of the alkali metal is an alkyl group having 1 to 3 carbon atoms.

6. The light-emitting device according to claim 4,
wherein the alkyl group of the organic compound having the electron-transport property is a t-butyl group, and
wherein the alkyl group of the metal complex of the alkali metal is a methyl group.

7. The light-emitting device according to claim 1,
wherein a proportion of carbon atoms forming a bond by $sp^3$ hybrid orbitals in the total number of carbon atoms in the organic compound having the electron-transport property is higher than or equal to 10% and lower than or equal to 60%.

8. The light-emitting device according to claim 1,
wherein an integral value of signals at lower than 4 ppm exceeds an integral value of signals at 4 ppm or higher in a result of $^1$H-NMR measurement conducted on the organic compound having the electron-transport property.

9. The light-emitting device according to claim 1,
wherein the π-electron deficient heteroaromatic ring skeleton comprises a triazine skeleton or a diazine skeleton.

10. The light-emitting device according to claim 1,
wherein the metal complex comprises a ligand having an 8-quinolinolato structure.

11. The light-emitting device according to claim 10,
wherein the metal complex comprises one or two alkyl groups, and
wherein the one or two alkyl groups each have 1 to 3 carbon atoms.

12. The light-emitting device according to claim 1,
wherein the metal complex is a metal complex of lithium.

13. A light-emitting device comprising:
an anode;
a cathode; and
an EL layer between the anode and the cathode,
wherein the EL layer includes a light-emitting layer and an electron-transport layer,
wherein the electron-transport layer includes an organic compound having an electron-transport property and a metal complex of an alkali metal,
wherein the organic compound having the electron-transport property comprises a π-electron deficient heteroaromatic ring skeleton,
wherein an ordinary refractive index of the organic compound having the electron-transport property with respect to light with any of wavelengths in the range of 455 nm to 465 nm is greater than or equal to 1.50 and less than or equal to 1.75, and
wherein an ordinary refractive index of the metal complex of the alkali metal with respect to light with any of wavelengths in the range of 455 nm to 465 nm is greater than or equal to 1.45 and less than or equal to 1.70.

14. The light-emitting device according to claim 13,
wherein a value obtained by dividing by 2 the sum of the ordinary refractive index of the organic compound having the electron-transport property with respect to light with any of wavelengths in the range of 455 nm to 465 nm and the ordinary refractive index of the metal complex of the alkali metal with respect to light with any of wavelengths in the range of 455 nm to 465 nm is greater than or equal to 1.50 and less than 1.75.

15. The light-emitting device according to claim 13,
wherein an ordinary refractive index of the electron-transport layer with respect to light with any of wavelengths in the range of 455 nm to 465 nm is greater than or equal to 1.50 and less than 1.75.

16. The light-emitting device according to claim 13,
wherein each of the organic compound having the electron-transport property and the metal complex of the alkali metal comprises an alkyl group or a cycloalkyl group.

17. The light-emitting device according to claim 13,
wherein the π-electron deficient heteroaromatic ring skeleton comprises a triazine skeleton or a diazine skeleton.

18. The light-emitting device according to claim 13,
wherein the metal complex comprises a ligand having an 8-quinolinolato structure.

19. The light-emitting device according to claim 18,
wherein the metal complex comprises one or two alkyl groups, and
wherein the one or two alkyl groups each have 1 to 3 carbon atoms.

20. The light-emitting device according to claim 13,
wherein the metal complex is a metal complex of lithium.

21. A light-emitting device comprising:
an anode;
a cathode; and
an EL layer between the anode and the cathode,
wherein the EL layer includes a light-emitting layer and an electron-transport layer,
wherein the electron-transport layer includes an organic compound having an electron-transport property and a metal complex of an alkali metal,
wherein the organic compound having the electron-transport property comprises a π-electron deficient heteroaromatic ring skeleton,
wherein an ordinary refractive index of the organic compound having the electron-transport property with respect to light with a wavelength of 633 nm is greater than or equal to 1.45 and less than or equal to 1.70, and
wherein an ordinary refractive index of the metal complex of the alkali metal with respect to the light with the wavelength of 633 nm is greater than or equal to 1.40 and less than or equal to 1.65.

22. The light-emitting device according to claim 21,
wherein a value obtained by dividing by 2 the sum of the ordinary refractive index of the organic compound having the electron-transport property with respect to the light with the wavelength of 633 nm and the ordinary refractive index of the metal complex of the alkali metal with respect to the light with the wavelength of 633 nm is greater than or equal to 1.45 and less than 1.70.

23. The light-emitting device according to claim 21,
wherein an ordinary refractive index of the electron-transport layer with respect to the light with the wavelength of 633 nm is greater than or equal to 1.45 and less than 1.70.

24. The light-emitting device according to claim 21,
wherein each of the organic compound having the electron-transport property and the metal complex of the alkali metal comprises an alkyl group or a cycloalkyl group.

25. The light-emitting device according to claim 21,
wherein the π-electron deficient heteroaromatic ring skeleton comprises a triazine skeleton or a diazine skeleton.

26. The light-emitting device according to claim 21,
wherein the metal complex comprises a ligand having an 8-quinolinolato structure.

27. The light-emitting device according to claim 26,
wherein the metal complex comprises one or two alkyl groups, and
wherein the one or two alkyl groups each have 1 to 3 carbon atoms.

28. The light-emitting device according to claim 21,
wherein the metal complex is a metal complex of lithium.

* * * * *